(12) United States Patent
Vorenkamp et al.

(10) Patent No.: US 7,423,699 B2
(45) Date of Patent: *Sep. 9, 2008

(54) FULLY INTEGRATED TUNER ARCHITECTURE

(75) Inventors: Pieter Vorenkamp, Laguna Niguel, CA (US); Klaas Bult, Bosch en Duin (AN); Frank Carr, Dove Canyon, CA (US); Christopher M. Ward, AJ Bunnik (AN); Ralph Duncan, Brentwood, CA (US); Tom W. Kwan, Milpitas, CA (US); James Y. C. Chang, Irvine, CA (US); Haideh Khorramabadi, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 194 days.

This patent is subject to a terminal disclaimer.

(21) Appl. No.: 11/393,899

(22) Filed: Mar. 31, 2006

(65) Prior Publication Data

US 2007/0077908 A1 Apr. 5, 2007

Related U.S. Application Data

(63) Continuation of application No. 09/439,101, filed on Nov. 12, 1999, now Pat. No. 7,092,043.

(60) Provisional application No. 60/108,459, filed on Nov. 12, 1998, provisional application No. 60/108,209, filed on Nov. 12, 1998, provisional application No. 60/108,210, filed on Nov. 12, 1998, provisional application No. 60/117,609, filed on Jan. 28, 1999, provisional application No. 60/136,115, filed on May 26, 1999, provisional application No. 60/136,116, filed on May 26, 1999, provisional application No. 60/136,654, filed on May 27, 1999, provisional application No. 60/159,726, filed on Oct. 15, 1999.

(51) Int. Cl.
H04N 5/455 (2006.01)

(52) U.S. Cl. .................. 348/726; 348/731; 455/314; 455/302; 725/151

(58) Field of Classification Search ............. 348/731, 348/725–727; 455/266, 296, 313–315, 337, 455/302, 338–340, 179.1, 207, 196.1, 305, 455/202, 205, 188.1, 208, 189.1, 209, 190.1, 455/303, 191.1; 725/151; H04N 5/44, 7/10
See application file for complete search history.

(56) References Cited

U.S. PATENT DOCUMENTS

| | | |
|---|---|---|
| 1,342,885 A | 6/1920 | Armstrong |
| 1,773,980 A | 8/1930 | Farnsworth |
| 2,650,265 A | 8/1953 | Mountjoy |
| 3,824,491 A | 7/1974 | Treadway |
| 3,839,676 A | 10/1974 | Linnecar |
| 3,939,429 A | 2/1976 | Lohn et al. |
| 4,027,242 A | 5/1977 | Yamanaka |
| 4,061,980 A | 12/1977 | Sato |
| 4,097,899 A | 6/1978 | Yu |
| 4,139,866 A | 2/1979 | Wegner |
| 4,141,209 A | 2/1979 | Barnett et al. |
| 4,162,452 A | 7/1979 | Ash |
| 4,169,659 A | 10/1979 | Marlowe |
| 4,176,351 A | 11/1979 | DeVita et al. |
| 4,211,975 A | 7/1980 | Kuroda |
| 4,282,549 A | 8/1981 | Balaban et al. |
| 4,305,053 A | 12/1981 | Naitoh et al. |
| 4,321,565 A | 3/1982 | Ward |
| 4,322,856 A | 3/1982 | Ohta et al. |
| 4,328,531 A | 5/1982 | Nagashima et al. |
| 4,340,975 A | 7/1982 | Onishi et al. |
| 4,352,209 A | 9/1982 | Ma |
| 4,353,039 A | 10/1982 | Huntley |
| 4,353,132 A | 10/1982 | Saitoh et al. |
| 4,395,777 A | 7/1983 | Oki et al. |
| 4,402,089 A | 8/1983 | Knight et al. |
| 4,408,347 A | 10/1983 | Ash |
| 4,419,770 A | 12/1983 | Yagi et al. |
| 4,467,272 A | 8/1984 | Hassler et al. |
| 4,496,979 A | 1/1985 | Yu et al. |
| 4,499,602 A | 2/1985 | Hermeling, Jr. et al. |
| 4,520,507 A | 5/1985 | Moon |
| 4,553,264 A | 11/1985 | Hasegawa et al. |

| | | | | | | |
|---|---|---|---|---|---|---|
| 4,554,584 A | 11/1985 | Elam et al. | | 5,423,076 A | 6/1995 | Westergren et al. |
| 4,555,809 A | 11/1985 | Carlson | | 5,428,829 A | 6/1995 | Osburn et al. |
| 4,569,084 A | 2/1986 | Takahama | | 5,428,836 A | 6/1995 | Sanecki et al. |
| 4,580,289 A | 4/1986 | Enderby | | 5,442,318 A | 8/1995 | Badyal et al. |
| 4,581,643 A | 4/1986 | Carlson | | 5,479,449 A | 12/1995 | Patel et al. |
| 4,584,715 A | 4/1986 | Baars et al. | | 5,493,210 A | 2/1996 | Orndorff et al. |
| 4,614,925 A | 9/1986 | Kane | | 5,500,650 A | 3/1996 | Snodgrass et al. |
| 4,619,001 A | 10/1986 | Kane | | 5,524,281 A | 6/1996 | Bradley et al. |
| 4,627,100 A | 12/1986 | Takano | | 5,563,545 A | 10/1996 | Scheinberg |
| 4,631,603 A | 12/1986 | Ryan | | 5,564,098 A | 10/1996 | Rodal et al. |
| 4,633,315 A | 12/1986 | Kasperkovittz | | 5,568,512 A | 10/1996 | Rotzoll |
| 4,661,995 A | 4/1987 | Kashiwagi | | 5,581,213 A | 12/1996 | Linder et al. |
| 4,688,263 A | 8/1987 | Aldridge | | 5,583,850 A | 12/1996 | Snodgrass et al. |
| 4,689,740 A | 8/1987 | Moelands et al. | | 5,584,066 A | 12/1996 | Okanobu |
| 4,726,072 A | 2/1988 | Yamashita et al. | | 5,587,688 A | 12/1996 | Mulbrook |
| 4,739,390 A | 4/1988 | Achiha et al. | | 5,625,307 A | 4/1997 | Scheinberg |
| 4,742,566 A | 5/1988 | Nordholt et al. | | 5,625,325 A | 4/1997 | Rotzoll et al. |
| 4,745,478 A | 5/1988 | Nakagawa et al. | | 5,627,544 A | 5/1997 | Snodgrass et al. |
| 4,776,040 A | 10/1988 | Ichikawa et al. | | 5,630,214 A | 5/1997 | Yamamoto et al. |
| 4,789,976 A | 12/1988 | Fujishima | | 5,633,927 A | 5/1997 | Ryan et al. |
| 4,812,772 A | 3/1989 | Hatfield | | 5,640,213 A | 6/1997 | Miyahara et al. |
| 4,818,903 A | 4/1989 | Kawano | | 5,648,744 A | 7/1997 | Prakash et al. |
| 4,855,835 A | 8/1989 | Tobita | | 5,686,864 A | 11/1997 | Martin et al. |
| 4,876,737 A | 10/1989 | Woodworth et al. | | 5,715,012 A | 2/1998 | Patel et al. |
| 4,879,758 A | 11/1989 | DeLuca et al. | | 5,715,282 A | 2/1998 | Mansouri et al. |
| 4,885,802 A | 12/1989 | Ragan | | 5,717,718 A | 2/1998 | Rowsell et al. |
| 4,903,329 A | 2/1990 | Marik et al. | | 5,717,730 A | 2/1998 | Prakash et al. |
| 4,918,532 A | 4/1990 | O'Connor | | 5,722,040 A | 2/1998 | Bjerede et al. |
| 4,918,748 A | 4/1990 | Shahriary et al. | | 5,737,035 A | 4/1998 | Rotzoll |
| 4,979,230 A | 12/1990 | Marz | | 5,739,730 A | 4/1998 | Rotzoll |
| 5,006,727 A | 4/1991 | Rogosch et al. | | 5,757,220 A | 5/1998 | Murden et al. |
| 5,010,400 A | 4/1991 | Oto | | 5,784,523 A | 7/1998 | Quan et al. |
| 5,014,349 A | 5/1991 | Kubo et al. | | 5,790,946 A | 8/1998 | Rotzoll |
| 5,020,147 A | 5/1991 | Okanobu | | 5,805,988 A | 9/1998 | Clayton et al. |
| 5,028,887 A | 7/1991 | Gilmore | | 5,828,589 A | 10/1998 | Degenhardt |
| 5,031,233 A | 7/1991 | Ragan | | 5,847,612 A | 12/1998 | Birleson |
| 5,038,404 A | 8/1991 | Marz | | 5,874,857 A | 2/1999 | Roth et al. |
| 5,049,831 A | 9/1991 | Westwick | | 5,914,630 A | 6/1999 | Peterson |
| 5,060,297 A | 10/1991 | Ma et al. | | 5,920,241 A | 7/1999 | Mazzochette |
| 5,077,541 A | 12/1991 | Gilbert | | 5,930,696 A | 7/1999 | Tzuang et al. |
| 5,093,922 A | 3/1992 | Kubo et al. | | 5,949,295 A | 9/1999 | Schmidt |
| 5,140,198 A | 8/1992 | Atherly et al. | | 5,953,417 A | 9/1999 | Quan |
| 5,142,369 A | 8/1992 | Grubbs et al. | | 6,101,371 A | 8/2000 | Barber et al. |
| 5,142,370 A | 8/1992 | Wignot et al. | | 6,160,571 A | 12/2000 | Wang |
| 5,142,371 A | 8/1992 | Lehmann | | 6,163,684 A | 12/2000 | Birleson |
| 5,144,439 A | 9/1992 | Wignot | | 6,169,569 B1 | 1/2001 | Widmer et al. |
| 5,144,440 A | 9/1992 | Wignot et al. | | 6,177,964 B1 | 1/2001 | Birleson et al. |
| 5,146,337 A | 9/1992 | Grubbs | | 6,308,056 B1 | 10/2001 | Abe et al. |
| 5,146,338 A | 9/1992 | Lehmann et al. | | 6,377,315 B1 | 4/2002 | Carr et al. |
| 5,148,280 A | 9/1992 | Wignot et al. | | 6,591,091 B1 | 7/2003 | Vorenkamp et al. |
| 5,179,729 A | 1/1993 | Mishima et al. | | 2001/0007151 A1 | 7/2001 | Vorenkamp et al. |
| 5,200,826 A | 4/1993 | Seong | | 2001/0008430 A1 | 7/2001 | Carr et al. |
| 5,203,032 A | 4/1993 | Usui | | 2002/0140869 A1 | 10/2002 | Carr et al. |
| 5,212,817 A | 5/1993 | Atkinson | | | | |
| 5,212,824 A | 5/1993 | Mishima et al. | | FOREIGN PATENT DOCUMENTS | | |
| 5,251,324 A | 10/1993 | McMullan, Jr. | | | | |
| 5,265,267 A | 11/1993 | Martin et al. | | DE | 30 07 907 A1 | 9/1981 |
| 5,280,639 A | 1/1994 | Kubo | | DE | 37 23 778 A1 | 1/1988 |
| 5,311,318 A | 5/1994 | Dobrovolny | | DE | 43 17 220 A1 | 12/1994 |
| 5,317,216 A | 5/1994 | Hosoya et al. | | DE | 43 21 565 A1 | 1/1995 |
| 5,321,852 A | 6/1994 | Seong | | DE | 195 06 324 C1 | 10/1995 |
| 5,355,524 A | 10/1994 | Higgins, Jr. | | EP | 0 076 153 A2 | 4/1983 |
| 5,355,532 A | 10/1994 | Kubo et al. | | EP | 0 133 618 A1 | 3/1985 |
| 5,361,406 A | 11/1994 | Wignot et al. | | EP | 0 305 602 A1 | 3/1989 |
| 5,361,407 A | 11/1994 | Sawada et al. | | EP | 0 365 085 | 4/1990 |
| 5,365,551 A | 11/1994 | Snodgrass et al. | | EP | 0 393 717 A2 | 10/1990 |
| 5,369,440 A | 11/1994 | Sussman | | EP | 0 406 851 A2 | 1/1991 |
| 5,390,346 A | 2/1995 | Marz | | EP | 0 431 887 | 6/1991 |
| 5,392,011 A | 2/1995 | Li | | EP | 0 469 898 A2 | 2/1992 |
| 5,398,080 A | 3/1995 | Sakashita et al. | | EP | 0 502 449 A1 | 9/1992 |
| 5,410,270 A | 4/1995 | Rybicki et al. | | EP | 0 545 342 A1 | 6/1993 |
| 5,410,735 A | 4/1995 | Borchardt et al. | | EP | 0 601 560 A1 | 6/1994 |
| 5,420,646 A | 5/1995 | Dobrovolny | | EP | 0 629 040 A1 | 12/1994 |

| | | |
|---|---|---|
| EP | 0 767 532 A1 | 4/1997 |
| EP | 0 803 977 | 10/1997 |
| EP | 0 809 351 A2 | 11/1997 |
| FR | 2 586 872 A1 | 3/1987 |
| GB | 2 058 505 A | 4/1981 |
| GB | 2 120 478 A | 11/1983 |
| GB | 2 143 691 A | 2/1985 |
| GB | 2 168 864 A | 6/1986 |
| GB | 2 170 368 A | 7/1986 |
| GB | 2 171 570 A | 8/1986 |
| GB | 2 183 970 A | 6/1987 |
| GB | 2 215 565 A | 9/1989 |
| GB | 2 218 871 A | 11/1989 |
| GB | 2 223 900 A | 4/1990 |
| GB | 2 224 912 A | 5/1990 |
| GB | 2 236 225 A | 3/1991 |
| GB | 2 242 588 A | 10/1991 |
| GB | 2 250 877 A | 6/1992 |
| GB | 2 282 286 A | 3/1995 |
| JP | 58-70614 | 4/1983 |
| JP | 1-273432 | 11/1989 |
| JP | 4-340803 | 11/1992 |
| JP | 6-69829 | 3/1994 |
| JP | 8-130690 | 5/1996 |
| JP | 9-181628 | 7/1997 |
| WO | WO 89/06072 A1 | 4/1983 |
| WO | WO 94/29948 A1 | 12/1994 |
| WO | WO 97/09786 | 3/1997 |
| WO | WO 97/32393 | 9/1997 |
| WO | WO 98/47237 | 1/1998 |

OTHER PUBLICATIONS

Poole et al., "A CMOS Subscriber Line Audio Processing Circuit Including Adaptive Balance," IEEE Proceedings of the International Symposium on Circuits and Systems, US, New York, vol. Conf. 21, 1988, pp. 1931-1934.

Leung, et al., "10-MHZ 60-DB Dynamic-Range 6-DB Variable Gain Amplifier", IEEE International Symposium on Circuits and Systems, US, New York, Jun. 1997, pp. 173-176.

Gilbert, "A Low-Noise Wideband Variable-Gain Amplifier Using An Interpolated Ladder Attenuator", IEEE International Solid State Circuits Conference, US, IEEE Inc., New York, vol. 34, Feb. 1991, pp. 280-281, 330.

Mensink, et al., "A CMOS 'Soft-Switched' Transconductor and Its Application in Gain Control and Filters", IEEE Journal of Solid-State Circuits, Jul. 1997, vol. 32, No. 7, pp. 989-998.

Bao, J.W. et al., "An MCM Upconverter for Double Conversion Data Tuner Applications," IEEE GaAs Digest, 2000, pp. 107-109.

Brady, V. et al., "Development of a Monolithic FET Ka-Band Single Side Band Upconverter and Image Reject Downconverter," IEEE GaAs IC Symposium, Oct. 22-25, 1989, San Diego, California, IEEE Press, pp. 189-192.

Craninckx, J. et al., "A 1.8-Ghz Low-Phase-Noise CMOS VCO Using Optimized Hollow Spiral Inductors," IEEE Journal of Solid-State Circuits IEEE, vol. 32, No. 5, pp. 736-744 (May 1997).

Ducourant, T. et al., "A 3 Chip GaAs Double Conversion TV Tuner System with 70dB Image Rejection," IEEE 1989 Microwave and Millimeter-Wave Monolithic Circuits Symposium Digest of Papers, IEEE Press, 1989, pp. 87-90.

Farmer, James O., "Specifications for Tuner Design for Use in Cable Ready Television Receivers and VCRs," IEEE Transactions on Consumer Electronics, vol. 36, No. 3, Aug. 1990, IEEE Press, pp. 660-668.

Giles, Martin, The LM1823: A High Quality TV Video I.F. Amplifier and Synchronous Detector for Cable Receivers, National Semiconductor Application Note 391, National Semiconductor Corporation, Mar. 1985, 16 pages.

Long, J.R. et al., "The Modeling, Characterization, and Design of Monolithic Inductors for Silicon RF IC's" IEEE Journal of Solid-State Circuits, IEEE, vol. 32, No. 3, pp. 357-369 (Mar. 1997).

Maas, Stephen A., Microwave Mixers, Artech House, Inc., 1986, U.S.A., pp. 248-251.

Maier, G.M. et al., "Double Conversion Tuner a Must for the Future?," IEEE Transactions on Consumer Electronics, vol. 38, No. 3, Aug. 1992, pp. 384-388.

Moloney, D.M. et al., "Expanded Bandwidth Requirements in CATV Applications," 1992 NCTA Technical Papers, pp. 200-206.

Müller, J.-E. et al., "A Double-Conversion Broad Band TV-Tuner with GaAs Ics," GaAs IC Symposium, IEEE Press, 1984, pp. 97-100.

Nakatsuka, T. et al., "Low Distortion and Low Noise Oscillator Mixer IC for CATV Converters," GaAs IC Symposium Technical Digest 1988, Nov. 6-9, 1998, pp. 161-164.

Operation and Programming Manual: HP 8561A and HP 8562A/B Portable Spectrum Analyzers, Hewlett-Packard Company 1989, p. E-1.

Plas, J. and Nordholt, E.H., "A Novel Extended Dynamic Range Synchronous Detector for AM Shortwave Upconversion Receivers," IEEE Transactions on Consumer Electronics, IEEE Press, vol. 35, No. 3, Aug. 1989, pp. 390-396.

Poole, S.J. et al., "A CMOS Subscriber Line Audio Processing Circuit Including Adaptive Balance," IEEE International Symposium on Circuits and Systems, Finland, Espoo, vol. 2 of 3, Jun. 7-9, 1988, pp. 1931-1934.

Scheinberg, N. et al., "A GaAs Up Converter Integrated Circuit for a Double-Conversion Cable TV 'Set-Top' Tuner," IEEE Journal of Solid-State Circuits, vol. 29, No. 6, Jun. 1994, pp. 688-692.

Okanobu, Taiwa et al., "Advanced Low Voltage Single Chip Radio IC", IEEE Transactions on Consumer Electronics, vol. 38, No. 3, Aug. 1992, pp. 465-475.

Goldberg, L., "Integrated Tuner Circuits Puts Television In New Places," Electronic Design, vol. 47, No. 2, Penton Media, Inc., pp. 34, 36, 38 and 40 (Jan. 25, 1999).

CXA1951AQ GPS Down Converter, Sony Corporation, pp. 1-16.

GSM Receiver Circuit, Siemens, PMB 2402, Semiconductor Group, pp. 1-21.

HD155111F RF Single-Chip Linear IC For PCN Cellular Systems, ADE-207-257 (Z), 1st Edition, Aug. 1998, Renesas Technology Corporation, pp. 1-44.

HD155121F RF Transceiver IC for GSM and PCN Dual Band Cellular Systems, ADE-207-265A (Z) 2nd Edition, May 1999, Renesas Technology Corporation, pp. 1-57.

TRF1020 GSM Receiver EVM, Texas Instruments, Application Brief SWRA018, Digital Signal Processing Solutions, Sep. 22, 1998, pp. 1-25.

TUA 4300 G, Siemens AG, IC-Specification, HL DCK, V66047-S695-G100-G1, Dec. 11, 1996, pp. 2-39.

Abidi, Low-Power Radio-Frequency IC's for Portable Communications, Proceedings of the IEEE, vol. 83, No. 4, Apr. 1995, pp. 544-569.

Badura, New Integrated Circuits for GSM Mobile Radio, Siemens Components XXVI (1991) No. 2, Engineering Integrated Circuits, pp. 72-76.

Cathelin et al., A Fully Integrated CMOS PM Radio Receiver for Wristwatch Calibration, IEEE Journal of Solid-State Circuits, vol. 33, No. 7, Jul. 1998, pp. 1014-1022.

Durec, An Integrated Silicon Bipolar Receiver Subsystem for 900-MHz ISM Band Applications, IEEE Journal of Solid-State Circuits, vol. 33, No. 9, Sep. 1998, pp. 1352-1372.

GSM Receiver Circuit, Siemens, PMB 2401, Semiconductor Group, pp. 1-23.

Koullias et al., A 900MHz Transceiver Chip Set fo Dual-Mode Cellular Radio Mobile Terminals, 1993 IEEE International Solid-State Circuits Conference, ISSCC 93, Session 9, Radio Communication Circuits, Paper TP 9.2, pp. 140-141 and 278.

McCullagh, A Single-Chip Silicon Bipolar Receiver for GPS/GLONASS Applications, IEEE International Solid-State Circuits Conference 1999, Communications Session, pp. 1-14.

Murphy et al., A Low-Power, Low-Cost Bipolar GPS Receiver Chip, IEEE Journal of Solid-State Circuits, vol. 32, No. 4, Apr. 1997, pp. 587-591.

Razavi, A 900MHz/1.8GHz CMOS Receiver for Dual Band Applications, IEEE 1998, pp. 8.2-1 thru 8.2.8.

Stetzler et al., A 2.7-4.5 V Single Chip GSM Transceiver RF Integrated Circuit, IEEE Journal of Solid-State Circuits, vol. 30, No. 12, Dec. 1995, pp. 1421-1429.

Veit et al., *A 2.7V 800MHz-2.1GHz Transceiver Chipset for Mobile Radio Applications in 25GHz $f_1$ Si-Bipolar*, 1994 Bipolar/BiCMOS Circuits & Technology Meeting 11.2, 1994 IEEE, pp. 175-178.

Yamawaki et al., *A 2.7-V GSM RF Transceiver IC*, IEEE Journal of Solid-State Circuits, vol. 32, No. 12, Dec. 1997, pp. 2089-2096.

English Abstract of Japanese Patent Publication No. 9181628, 1 Page (Jul. 11, 1997-Date of publication of application).

English Abstract and Patent Family of German Patent Publication No. 30 07 907 A1, from Dialog File 351: Derwent WPI, 1 page (Date of publication of application-Sep. 17, 1981).

English Abstract of German Patent Publication No. DE4321565, 1 Page (Jan. 12, 1995—Date of publication of application).

Crols, J. and Steyaert, M., "A Fully Integrated 900MHz CMOS Double Quadrature Downconverter," *1995 IEEE International Solid-State Circuits Conference*, IEEE, pp. 136-137 (1995).

Crols, J. and Steyaert, M., "A Single-Chip 900 MHz CMOS Receiver Front-End with a High Performance Low-IF Topology," *IEEE Journal of Solid-State Circuits*, vol. 30, No. 12, IEEE, pp. 1483-1492 (Dec. 1995).

Crols, J. and Steyaert, M., "A Full CMOS 1.5 GHz Highly Linear Broadband Downconversion Mixer," pp. 248-251.

Wilson, J.F. et al., "A Single-Chip VHF and UHF Receiver for Radio Paging," *IEEE Journal of Solid-State Circuits*, vol. 26, No. 12, IEEE, pp. 1944-1950 (Dec. 1991).

Thomas, V. et al., "A One-Chip 2GHz Single Superhet Receiver for 2Mb/s FSK Radio Communication," *IEEE International Solid-State Circuits Conference*, IEEE, pp. 42-43 (1994).

Abidi, A.A., "Radio-Frequency Integrated Circuits for Portable Communications," *Custom IC Conference*, San Diego, CA, pp. 151-158 (May 1994).

Long, J.R. and Copeland, M.A., "The Modeling, Characterization, and Design of Monolithic Inductors for Silicon RF IC's," *IEEE Journal of Solid-State Circuits*, vol. 32, No. 3, IEEE, pp. 357-369 (Mar. 1997).

Van Dooremolen, W.H.A. and Hufschmidt, M., *Application Note: AN192: A complete FM radio on a chip*, Philips Semiconductors, 14 pages (Dec. 1991).

Meyer, R.G. and Mack, W.D., "A 1-GHz BiCMOS RF Front-End IC," *IEEE Journal of Solid-State Circuits*, vol. 29, No. 3, IEEE, pp. 350-355 (Mar. 1994).

Dautriche, P. et al., "GaAs Monolithic Circuits for TV Tuners," *GaAS IC Symposium*, IEEE, pp. 165-168 (Nov. 12-14, 1985).

Rauscher, C., "Distributed Microwave Active Filters with GaAs FETs," *IEEE MTT-S Digest*, IEEE, pp. 273-276 (1985).

Driscoll, M.M. et al., "UHF Film Resonator Evaluation and Resonator-Controlled Oscillator and Filter Design Using Computer-Aided Design Techniques," *IEEE MTT-S Digest*, IEEE, pp. 239-242 (1985).

Abidi, A.A., "Low-Power Radio-Frequency IC's for Portable Communications," *Proceedings of the IEEE*, vol. 83, No. 4, IEEE, pp. 544-569 (Apr. 1995).

Benson, K.B., *Television Engineering Handbook*, McGraw-Hill Book Company, pp. 13.5 and 13.73 (1986).

Bonek, E. et al., "Personal Communications Transceiver Architectures for Monolithic Integration," *5th IEEE International Symposium on Personal, Indoor and Mobile Radio Communications Proceedings*, IEEE, pp. 363-368 (Sep. 18-22, 1994).

Couch II, L.W., *Digital and Analog Communication Systems*, Macmillan Publishing Co. Inc., pp. 62, 63 and 301-304 (1983).

Dautriche, P. et al., "VHF-UHF GaAs Monolithic Front End," *IEEE International Solid-State Circuits Conference*, IEEE, pp. 216-217 (1987).

Fenk, J. and Täuber, R., "TV VHF/Hyperband Tuner ICs," *IEEE Transactions on Consumer Electronics*, vol. CE-32, No. 4, IEEE, pp. 723-733 (Nov. 1986).

Gilbert, B., *Design Considerations for BJT Active Mixers*, Analog Devices Inc., 58 pages (1994).

Henderson, B.C. and Cook, J.A., "Image-Reject and Single-Sideband Mixers," *WJ Tech Notes*, vol. 12, No. 3, Watkins-Johnson Company, pp. 1-13 (May/Jun. 1985).

Kasperkovitz, W.G., "FM receivers for mono and stereo on a single chip," *Philips Technical Review*, vol. 41, No. 6, pp. 169-182 (1983/1984).

Khorramabadi, H., *High-Frequency CMOS Continuous Time Filters*, Dissertation, University of California, Berkeley, pp. i-iv and 1-140 (1985).

Koullias, I.A. et al., "A 900MHz Transceiver Chip Set for Dual-Mode Cellular Radio Mobile Terminals," *IEEE International Solid-State Circuits Conference*, pp. 140-141 (1993).

Kurpis, G.P. *The New IEEE Standard Dictionary of Electrical and Electronics Terms: Fifth Edition*, IEEE, pp. 1347 and 1420 (Jan. 15, 1993).

Lakshmikumar, K.R. et al., "A Baseband Codec for Digital Cellular Telephony," *IEEE Journal of Solid-State Circuits*, vol. 26, No. 12, IEEE, pp. 1951-1958 (Dec. 1991).

Larson, L.E., "An Improved GaAs MESFET Equivalent Circuit Model for Analog Integrated Circuit Applications," *IEEE Journal of Solid-State Circuits*, vol. SC-22, No. 4, pp. 567-574 (Aug. 1987).

Longo, L. et al., "A Cellular Analog Front End with a 98dB IF Receiver," *IEEE International Solid-State Circuits Conference*, IEEE, pp. 36-37 (1994).

Makram-Ebeid, S. and Minondo, P., "The Roles of the Surface and Bulk of the Semi-Insulating Substrate in Low-Frequency Anomalies of GaAs Integrated Circuits," *IEEE Transactions on Electron Devices*, vol. ED-32, No. 3, IEEE, pp. 632-642 (Mar. 1985).

Marshall, C. et al., "A 2.7V GSM Transceiver ICs with On-Chip Filtering," *IEEE International Solid-State Circuits Conference*, IEEE, pp. 148-149 (1995).

McDonald, M.D., "A 2.5GHz BiCMOS Image-Reject Front-End," *International Solid-State Circuits Conference*, IEEE, pp. 144, 145 and 279 (1993).

Mills, T.B. and Suzuki, H.S., "Design Concepts for Low-Cost Transistor AGC Systems," pp. 38-43.

Moon, T.H., "A High Performance VHF Solid-State TV Tuner," pp. 209-219.

Nabe-Yama, H. and Miyazaki, G., "An AGC System Design Based Upon the DC Restoration and the Dynamic Characteristics," pp. 329-338 (Sep. 24, 1970).

Okanobu, T. et al., "A New Radio Receiver System for Personal Communications," IEEE, pp. 334-335 (1995).

Okanobu, T. and Tomiyama, H., "An Advanced Low Power Radio 1 Chip IC," *International Conference on Consumer Electronics Digest of Technical Papers*, IEEE, pp. 242-243 (1994).

Okanobu, T. and Yamazaki, D., "Single Chip Radio IC Including Synchromous Detector," *IEEE Transactions on Computer Electronics*, vol. 38, No. 3, IEEE, pp. 476-481 (Aug. 1992).

Pavio, A.M. and Halladay, R.H., "A Distributed Double-Balanced Dual-Gate FET Mixer," *GaAs IC Symposium*, IEEE, pp. 177-180 (1988).

Poch, W.J. and Epstein, D.W., "Partial Suppression of One Side Band in Television Reception," *Proceedings of the Institute of Radio Engineers*, vol. 25, No. 1, Part 1, pp. 15-31 (Jan. 1937).

Scheinberg, N. et al., "A Low-Frequency GaAs MESFET Circuit Model," *IEEE Journal of Solid-State Circuits*, vol. 23, No. 2, IEEE, pp. 605-608 (Apr. 1988).

Sevenhans, J. et al., "An Analog Radio Front-end Chip Set for a 1.9GHz Mobile Radio Telephone Application," *IEEE International Solid-State Circuits Conference*, IEEE, pp. 44-45 (1994).

Steyaert, M., "RF Integrated Circuits in Standard CMOS Technologies," pp. 1-8.

Van Dooremolen, W.H.A. and Hufschmidt, M., "A complete f.m. radio on a chip," *Electronic Components and Applications*, vol. 5, No. 3, pp. 159-170 (Jun. 1983).

Yamamoto, A. et al., "A Compact Satellite 1 GHz Tuner With GaAs ICs," *IEEE Transactions on Consumer Electronics*, vol. 35, No. 3, IEEE, pp. 397-405 (Aug. 1989).

Yamazaki, D. et al., "A Complete Single Chip AM Stereo/FM Stereo Radio IC," *IEEE Transactions on Consumer Electronics*, IEEE, vol. 40, No. 3, pp. 563-569 (Aug. 1994).

Yamazaki, D. et al., "A Complete Single Chip AM Stereo/FM Stereo Radio IC," *International Conference on Consumer Electronics Digest of Technical Papers*, IEEE, pp. 244-245 (1994).

Murakami, T. and Sonnenfeldt, R.W., "Detection of Asymmetric Sideband Signals in the Presence of Noise," *IRE Transactions on Broadcast and Television Receivers (Reprinted from RCA Review)*, pp. 46-75 (Sep. 1958).

Goldman, S., "Television Detail and Selective-Sideband Transmission," *Proceedings of the I.R.E.*, pp. 725-732 (Nov. 1939).
Loughlin, B.D., "Color Signal Distortions in Envelope Type of Second Detectors," *IRE Transactions on Broadcast and Television Receivers*, pp. 81-93 (1957).
Eckersley, P.P., "Asymmetric-Side-Band Broadcasting," *Proceedings of the Institute of Radio Engineers*, vol. 26, No. 9, pp. 1041-1092 (Sep. 1938).
Hollywood, J.M., "Single-Sideband Filter Theory with Television Applications," *Proceedings of the I.R.E.*, pp. 457-472 (Jul. 1939).
Brownlee, P., "Running the MC44802 PLL Circuit," 19 Pages.
Nyquist, H. and Pfleger, K.W., "Effect of the Quadrature Component in Single Sideband Transmission," *Bell System Technical Journal*, pp. 63-73.
Taeuber, R. and Fenk, J., "VHF Tuner IC for Use in Television Receivers and CATV Receivers," *IEEE Transactions on Consumer Electronics*, vol. CE-28, No. 4, IEEE, pp. 508-518 (Nov. 1982).
*ACD0900S3C VHF/UHF CATV/TV Tuner Downconverter Advanced Product Information Rev. 7*, Anadigics, 5 Pages (Apr. 22, 1998).
*Anadigics Technical Brief: Upconverter MMIC for CATV Preliminary*, Anadigics, 12 pages (Jan. 11, 1994).
*ACU50751 CATV/TV/Cable Modem Upconverter MMIC Advanced Product Information Rev. 1*, Anadigics, 5 Pages (Apr. 22, 1998).
*Data Sheet: SA602A Double-balanced mixer and oscillator*, Product Specification, Philips Semiconductors, 11 Pages (Nov. 7, 1997).
*Data Sheet: TDA9887 $I^2C$-bus controlled multistandard alignment-free IF-PLL with FM radio*, Preliminary Specification, Philips Semiconductors, pp. 1, 2, 5, 6 and 43-46 (Dec. 15, 1999).
*Data Sheet: TDA7040T Low voltage PLL stereo decoder*, Product Specification, Philips Semiconductors, 11 Pages (Sep. 1986).
$I^2C$ *bus specification*, Philips Semiconductors, pp. 1, 3, 5, 7, 9, 11, 13, 15, 17, 19, 21, 23, 25 and 27.
*ACU50751 CATV/TV/Cable Modem Upconverter MMIC Advanced Product Information Rev. 1*, Anadigics, 6 Pages (Feb. 25, 1999).
*ACU50752 CATV/TV/Cable Modem Upconverter MMIC Advanced Product Information Rev. 0*, Anadigics, 5 Pages (Sep. 8, 1998).
"New zero IF chipset from Philips," *Electronic Engineering*, vol. 67, No. 825, Miller Freeman plc, p. 10 (Sep. 1995).
Sandys, J., "NavCore v—an OEM component for a satellite based global positioning and navigation system," *Electronic Engineering*, vol. 64, No. 786, Morgan-Grampian plc, pp. 41, 42, 44 and 46 (Jun. 1992).
McDonald, M., "A transceiver chip set for DECT," *Electronic Engineering*, vol. 64, No. 786, Morgan-Grampian plc, pp. 81, 83 and 84 (Jun. 1992).
Banks, D.K. et al., "The INMARSAT Second Generation Communications Payload," pp. 781-788.
Imai, K., "A 22GHz Band Low Noise Down Converter for Satellite Broadcast Receivers," pp. 549-554.
Johnson, P., "Saws and superhets," *Filters*, 2 pages.
"Applications Summary: Dual-conversion f.m. receiver/ Intelligent modem," vol. 95, No. 1637, p. 271 (Mar. 1989).
Kraus, K., "Circuit Ideas: Digitally-programmable filter functions," vol. 96, No. 1638, p. 359 (Apr. 1989).
*Television Engineering*, pp. 312-315.
Narayanan, S., "Application of Volterra Series to Intermodulation Distortion Analysis of Transistor Feedback Amplifiers," *IEEE Transactions on Circuit Theory*, vol. CT-17, No. 4, IEEE, pp. 518-527 (Nov. 1970).
Scheinberg, N. et al., "A GaAs Up Converter Integrated Circuit for a Double Conversion Cable TV 'Set-Top' Tuner," *IEEE Journal of Solid-State Circuits*, vol. 29, No. 6, IEEE, pp. 688-692 (Jun. 1994).
Pache, D. et al., "An improved 3V 2GHz BICMOS Image Reject Mixer IC," *Integrated Circuits Conference*, IEEE, pp. 95-98 (1995).
*Data Sheet: Bipolar Analog Integrated Circuits μPC2711TB, μPC2712TB*, NEC Corporation, 2 pages (Apr. 1997).
*Surface Mount RF Schottky Barrier Diodes Technical Data*, Hewlett Packard, 2 Pages (Jun. 1999).
*Type B4F/B4FL Balun Transformers for Surface Mounting*, Toko, 1 Page.
"Phono Plugs and Jacks," *Mouser Electronics Catalog*, No. 601, p. 112 (Feb.-Apr. 2000).

*NPN Silicon High Frequency Transistor: NE856 Series*, NEC, 4 Pages (Sep. 1998).
Leffel, M., "Intermodulation Distortion in a Multi-Signal Environment," *RF Design*, pp. 78-84 (Jun. 1995).
Jordana, J., "Comments on IMD Article," *RF Design*, p. 15 (Mar. 1996).
Long, J.R. et al., "A Low-Voltage Silicon Bipolar RF Front-End for PCN Receive Applications," *IEEE International Solid-State Circuits Conference*, IEEE, pp. 140-141 (1995).
Long, J.R. et al., "A Low-Voltage Silicon Bipolar RF Front-End for PCN Receiver Applications," *IEEE ISSCC Slide Supplement*, IEEE, pp. 104-105 (1995).
Lovelace, D. et al., "Silicon Upconverter RF IC Simplifies Cable Moden Designs," *Microwaves & RF*, pp. 136, 137, 139, 140 and 142 (Mar. 1997).
Lovelace, D. et al., "Innovative Simulator Models Silicon Upconverter RF IC," *Microwaves & RF*, pp. 106, 108 and 109 (Apr. 1997).
*CATV Test Equipment Catalog*, Matrix Test Equipment Incorporated, 15 Pages.
"Analog and Mixed Analog-Digital Layout," *Analog VLSI Signal and Information Processing*, pp. 699-726.
*Data Sheet: BC849: BC850 NPN general purpose transistors*, Product Specification, Philips Semiconductors, 8 Pages (Apr. 8, 1999).
Bult, K., "Analog Broadband Communication Circuits in Pure Digital Deep Sub-Micron CMOS," *IEEE International Solid-State Circuits Conference*, IEEE, pp. 76-77 (1999).
Farmer, J.A. "Specifications for Tuner Design for Use in Cable Ready Television Receivers and VCRs," *IEEE Transactions on Consumer Electronics*, vol. 36, No. 3, IEEE, pp. 660-668 (Aug. 1990).
*SAW Components: IF Filter for Intercarrier Applications*, Siemens Matsushita Components, 4 Pages (Jan. 1, 1998).
*Bandpass Filter*, Siemens Matsushita Components, pp. 2-7 (Jan. 1996).
*LMV321 Single/ LMV358 Dual/ LMV324 Quad General Purpose, Low Voltage, Rail-to-Rail Output Operational Amplifiers*, National Semiconductor Corporation, 10 Pages (1999).
*+2.5V to +5.5V, 120 μA, 2-Wire Interface, Voltage Output 8-/10-/12-Bit DACs: AD5301/AD5311/AD5321*, Analog Devices, Inc., pp. 1, 4, 5 and 15 (1999).
*DCK (R-PDSO-G5) Mechanical Data*, Texas Instruments, 2 Pages (Jun. 1999).
*General Purpose Transistor: NPN Silicon*, Motorola, pp. 1, 7 and 8 (1996).
*CSM-7 SMD Quartz Crystal*, *SMD Crystals*, ECS International, Inc., p. 18.
*PIC16C63A/65B/73B/74B: 8-bit CMOS Microcontrollers with A/D Converter*, Microchip Technology Inc., 3 Pages (1999).
*AH2 High Dynamic Range Amplifier*, Rev. 2.0, WJ Wireless Products Group, 2 pages (Sep. 1998).
*NPN 9 Ghz wideband transistor BFR540*, Philips Semiconductors, pp. 2 and 11 (Aug. 23, 1999).
*NPN general purpose transistors BC846; BC847; BC848*, Philips Semiconductors, p. 2 (Mar. 12, 1997).
*Silicon PIN Diodes: BAR 14-1 . . . BAR16-1*, Infineon Technologies, pp. 1-3 (Oct. 4, 1999).
*Surface Mount EMI Filters Chip Filters NFM51R Series*, Murata Electronics, p. 192.
Simons, K.A., "The Decibel Relationships Between Amplifier Distortion Products," *Proceedings of the IEEE*, vol. 58, No. 7, IEEE, pp. 1071-1086 (Jul. 1970).
Jones, B.L., "Subjective Assessment of Cable Impairments on Television Picture Quality," *NCTA-Technical Papers*, pp. 1-25 (1992).
*Microtuner™ 2000 Product Brief: MT2000, MT2000PAL, MT2000N/P*, Microtune, pp. 1-4 (Jul. 1999).
*Microtuner 2003 Product Brief: MT2003, MT2003PAL, MT2003N/P*, Mircotune, pp. 1-5 (Dec. 1999).
Mensink, C.H.J. et al., "A CMOS 'Soft-Switched' Transconductor and Its Application in Gain Control and Filters," *IEEE Journal of Solid-State Circuits*, vol. 32, No. 7, IEEE, pp. 989-998 (Jul. 1997).
*The LM1823: A High Quality TV Video I.F. Amplifier and Synchronous Detector for Cable Receivers*, National Semiconductor Corporation, pp. 1-16 (Mar. 1985).

*Operation and Programming Manual: HP 8561A abd HP8562A/B Portable Spectrum Analyzers*, Hewlett-Packard Company, Figure E-1 (Jul. 1989).

Scheinberg, N. et al., "A GaAs Up Converter Integrated Circuit for a Double Conversion Cable TV 'Set-Top' Tuner," *International Conference on Consumer Electronics Digest of Technical Papers*, IEEE, pp. 108-109 (Jun. 8-10, 1993).

Torii, K. et al., "Monolithic Integrated VHF TV Tuner," *IEEE Transactions on Consumer Electronics*, vol. CE-26, IEEE, pp. 180-189 (May 1980).

Ablassmeier, U. et al., "GaAs FET Upconverter for TV Tuner," *IEEE Transactions on Electron Devices*, vol. ED-27, No. 6, IEEE, pp. 1156-1159 (Jun. 1980).

Shreve, W.R. and Stigall, R.E., "Surface Acoustic Wave Devices for Use in a High Performance Television Tuner," *IEEE Transactions on Consumer Electronics*, vol. CE-24, No. 1, IEEE, pp. 96-104 (Feb. 1978).

Archer, J.W. et al., "A Broad-Band UHF Mixer Exhibiting High Image Rejection over a Multidecade Baseband Frequency Range," *IEEE Journal of Solid-State Circuits*, vol. SC-16, No. 4, IEEE, pp. 385-392 (Aug. 1981).

Putnam, J. and Puente, R., "A Monolithic Image-Rejection Mixer on GaAs Using Lumped Elements," *Microwave Journal*, pp. 107, 108, 110, 114 and 116 (Nov. 1987).

Taddiken, B. et al., "Broadband Tuner on a Chip for Cable Modem, HDTV, and Legacy Analog Standards (Invited)," *IEEE Radio Frequency Integrated Circuits Symposium*, IEEE, pp. 17-20 (Jun. 11-13, 2000).

*Secure Signals*, National Cable Television Association, pp. 1-7 (Aug. 1995).

*From The Source*, vol. 8, No. 1, National Cable Television Association, pp. 1-10 (Nov. 1995).

*NFM2012P13C105F*, Murata Manufacturing Co., Ltd., 5 Pages (1999).

*Mouser Stock No. 163-5003, 163-5004*, Mouser Electronics, 1 Page (Jan. 4, 2000).

*Surface Mount EMI Filters: Chip Filters NFM☐☐P Series*, Murata Electronics, pp. 186-187.

*Surface Mount EMI Filters: Soldering*, Murata Electronics, p. 204.

*SS22 thru SS26: Surface Mount Schottky Rectifiers*, General Semiconductor, 2 Pages (Jan. 11, 2001).

*Aluminum Electrolytic Capacitors*, 2 Pages.

*Type 594D Solid Tantalum Chip Capacitors*, Vishay Sprague, pp. 59-63.

"4.0 Receiver Performance" Carl T. Jones Corporation, pp. 4.1-4.84.

Boutin, N., "Complex Signals: Part I," *RF Design*, pp. 27-33 (Dec. 1989).

Boutin, N., "Complex Signals: Part II," *RF Design*, pp. 57-60 and 62-65 (Jan. 1990).

Boutin, N., "Complex Signals: Part III," *RF Design*, pp. 109-111 and 113-115 (Mar. 1990).

Boutin, N., "Complex Signals: Part IV," *RF Design*, pp. 65-70 and 73-75 (May 1990).

*LM117/LM317A/LM317 3-Terminal Adjustable Regulator*, National Semiconductor Corporation, pp. 1-26 (Aug. 1999).

*Wideband RF Transformers*, Mini-Circuits Distribution Centers, 3 Pages.

*Decoder Interface Standard Draft IS-105.1*, Rev. 6.0, Decoder Interface Subcommittee in conjunction with Working Party 9—Drafting, pp. i and 1-26 (Mar. 12, 1996).

*EIA Interim Standard: Immunity of Television Receivers and Video Cassette Recorders (VCR's) to Direct Radiation From Radio Transmissions, 0.5 to 30 MHz*Electronic Industries Association Engineering Department, pp. i and 1-10 (May 1987).

*EIA Interim Standard: Recommended Design Guideline Rejection of Educational FM Interference to CH 6 Television Reception*, Electronic Industries Association Engineering Department, pp. 1-19 (Jul. 1987).

*Data Sheet: TDA6402; TDA6403: 5 V mixer/oscillator and synthesizer for cable TV and VCR 2-band tuners*, Preliminary Specification, Philips Semiconductors, 37 Pages (Oct. 15, 1996).

Gharpurey, R. and Meyer, R.G., "Modeling and Analysis of Substrate Coupling in Integrated Circuits," *IEEE Journal of Solid-State Circuits*, vol. 31, No. 3, IEEE, pp. 344-353 (Mar. 1996).

*Tuners*, TEMIC Microsystems, 6 Pages.

*Data Sheet: FI1236MK2: Desktop video tuner system RTMA M/N*, Preliminary Specification, Philips Semiconductors, 20 Pages (Mar. 1, 1996).

*Data Sheet: TDA5737M: Low power VHF, UHF and hyperband mixer/oscillator for TV and VCR 3-band tuners* Product Specification, Philips Semiconductors, 20 Pages (Mar. 21, 1995).

*Data Sheet: TDA5636; TDA5637: 9 V VHF, hyperband and UHF mixers-oscillators for TV and VCR 3-band tuners*, Product Specification, Philips Semiconductors, 28 Pages (Jun. 10, 1996).

*Data Sheet: FR1236: Desktop video & radio module system RTMN M/N*, Preliminary Specification, Philips Semiconductors, 20 Pages (Mar. 1, 1996).

*Philips Components Desktop Video Tuner Specification FI1236 (System M/N)*, Philips Display Components Company, 31 Pages (Sep. 1993).

Burghartz, J.N. et al., "High-Q Inductors in Standard Silicon Interconnect Technology and its Application to an Integrated RF Power Amplifier," *IEDM*, pp. 1015-1017 (1995).

Craninckx, J. and Steyaert, M.S.J., "A 1.8-Ghz Low-Phase-Noise CMOS VCO Using Optimized Hollow Spiral Inductors," *IEEE Journal of Solid-State Circuits*, vol. 32, No. 5, IEEE, pp. 736-744 (May 1997).

English Translation of French Patent Publication No. 2 586 872 A1, prepared by Ralph McElroy Translation Company, 12 Pages (Mar. 6, 1987—Date of publication of application).

English Translation of Japanese Patent Publication No. 58-70614, prepared by Ralph McElroy Translation Company, 6 Pages (Apr. 27, 1983—Date of publication of application).

English Translation of German Patent Publication No. 43 17 220 A1, prepared by Ralph McElroy Translation Company, 9 Pages (Dec. 1, 1994—Date of publication of application).

English Abstract of Japanese Patent Publication No. 01-273432, 2 Pages (Nov. 1, 1989—Date of publication of application).

English Abstract of Japanese Patent Publication No. 04-340803, 2 Pages (Nov. 27, 1992—Date of publication of application).

English Abstract of Japanese Patent Publication No. 08-130690, 2 Pages (May 21, 1996—Date of publication of application).

English Abstract of European Patent Publication No. 502449, Dialog File 348 (European Patents), 2 pages (Sep. 9, 1992—Date of publication of application).

English Abstract of PCT International Patent Publication No. WO 8906072, from Dialog File 349 (PCT Fulltext), 2 pages (Jun. 29, 1982—Date of publication of application).

English Abstract of Japanese Patent Publication No. 6069829, 1 Page (Mar. 11, 1994—Date of publication of application).

Groshong, R. and Ruscak, S., "Exploit Digital Advantages in an SSB Receiver," *Analog-To-Digital Converters (Reprinted from Electronic Design)*, pp. 3-103 thru 3-107 (Jun. 13, 1991).

Wirbel, L., "Broadcom demodulator fits cable's Docsis spec," *Electronic Engineering Times*, pp. 33 and 40 (Jul. 13, 1998).

Kinget, P. and Steyaert, M., "A 1 Ghz CMOS Upconversion Mixer," *IEEE 1996 Custom Integrated Circuits Conference*, IEEE, pp. 197-200 (1996).

Pratt, W.J., "High Linearity HBT Amplifier Targets Multicarrier Systems," *RF Design*, pp. 47, 48, 50, 52 and 54 (Mar. 1996).

Weaver, D.K., "Design of RC Wide-Band 90-Degree Phase-Difference Network," *Proceedings of the I.R.E.*, pp. 671-676 (Apr. 1954).

*SCM-L Product Description and Design Guide*, IBM Microelectronics, pp. 16-25.

*BCM3116 QAMLink MCNS/DOCSIS Receiver*, Broadcom Corporation, 2 Pages (1998).

*BCM93300i Overview*, Broadcom Corporation, 1 Page (1998).

Ohr, S., "Broadcom hits Hot Chips with home, office thrusts," *Electronic Engineering Times*, p. 22 (Aug. 16, 1999).

Schonfeld, E., "Leading the New Chip Revolution," *Fortune*, pp. 136-138 and 140 (May 10, 1999).

Gardner, F.M., "Charge-Pump Phase-Lock Loops," *IEEE Transactions on Communications*, vol. COM-28, No. 11, IEEE, pp. 321-330 (Nov. 1980).

Czarnul, Z. et al., "Common-Mode Feedback Circuit with Differential-Difference Amplifier," *IEEE Transactions on Circuits and System-I:Fundamental Theory and Applications*, vol. 41, No. 3, IEEE, pp. 243-246 (Mar. 1994).

Hull, C.D. and Meyer, R.G., "A Systematic Approach to the Analysis of Noise in Mixers," *IEEE Transactions on Circuits and Systems-I: Fundamental Theory and Applications*, vol. 40, No. 12, IEEE, pp. 909-919 (Mar. 1994).

Child, J. (ed.), "Last mile connection: a mish-mash of modulations," *Computer Design*, 5 Pages (Nov. 1997).

McConnell, M., "LANs View Gigabit Ethernet Benefits," *Electronic Engineering Times*, CMP Media Inc., 2 Pages (Jun. 8, 1998).

McHale, T., "New Transceivers Cut Fast Ethernet Cost," *Electronic Buyer's News*, Issue 1043, CMP Media Inc., p. 35 (Feb. 3, 1997).

Ellis, L., "Broadcom Collapses Cable-Modem Chip," *Multichannel News*, 1 Page (Sep. 2, 1996).

Ellis, L., "Broadcom Ships MCNS Gear to CableLabs," *Multichannel News*, vol. 18, No. 26, 1 Page (Jun. 30, 1997).

Yoshida, J., "Cable industry embraces modern standard," *Electronic Engineering Times*, CMP Media Inc., 2 Pages (Mar. 24, 1997).

Wirbel, L., "QAM eyes cable modems," *Electronic Engineering Times*, CMP Media Inc., 2 Pages (Sep. 2, 1996).

Thryft, A.R., "Two-Chip Cable-Modem Set Gains Support," *Electronic Buyer's News*, CMP Media Inc., 2 Pages (Sep. 2, 1996).

Wright, M., "Delivering Digital Video," *EDN*, Cahners Publishing Company, p. 38(3) (Mar. 14, 1996).

Goldberg, L., "MCNS/DOCSIS MAC Clears A Path for The Cable-Modem Invasion," *Communications Technology*, Penton Publishing, Inc., p. 69(5) (Dec. 1, 1997).

Goldberg, L., "IC Opens 500-Channel Frontier To Cable Systems," *Electronic Design*, Penton Publishing, Inc., 6 Pages (Nov. 7, 1994).

Rosen, C., "Broadcom turns defense technology know-how into communication ICs," *Electronic Business Buyer*, Cahners Publishing Company, 1 Page (Mar. 1995).

Burke, J., "Absolutely fabless," *The Red Herring*, 2 Pages (May 1997).

*Electronic Products*, from http://electronicproducts.com/SHowPage.asp?SECTION=3700&PRIMID=&FileName=JANPOYBI.JAN2000, 10 Pages (Printed Dec. 4, 2001).

Saraga, W., "The Design of Wide-Band Phase Splitting Networks," *Proceedings of the I.R.E.*, vol. 38, No. 7, The Institute of Radio Engineers, Inc., pp. 754-770 (Jul. 1950).

*Microtune Announces World's First NTSC/PAL and Multi-standard PAL TV Tuners-on-a-Chip*, from http://www.microtune.com/news/1999%20Releases/061499.html, 3 Pages (Jun. 14, 1999).

*Microtune™ Expands Sales Organization and International Presence with Three New Rep Firms*, from http://www.microtune.com/news/1999%20Releases/092099.html, 3 Pages (Sep. 1999).

Luck, D.G.C., "Properties of Some Wide-Band Phase-Splitting Networks," *Proceedings of the I.R.E.*, vol. 37, No. 2, The Institute of Radio Engineers, Inc., pp. 147-151 (Feb. 1949).

Inamori, H. et al., "A 2GHz Down Converter IC Fabricated by an Advanced Si Bipolar Process (DNP-III)," *IEEE Transactions on Consumer Electronics*, vol. 36, No. 3, IEEE Consumer Electronics Society, pp. 707-711 (Aug. 1990).

Lenati, C., "Chipmaker mantra: 'Broadband now'," *Upside*, 6 Pages (Nov. 1998).

Rose, F., "Broadcom Set to Unveil TV-Internet Chip," *The Wall Street Journal*, vol. CXXXIX, No. 92, Dow Jones & Company, Inc., 1 Page (Nov. 9, 1998).

Ohr, S., "Signals: Gbit Ethernet shift kicks into high gear," *Electronic Engineering Times*, CMP Media Inc., 1 Page (Oct. 5, 1998).

Barthold, J., "Broadcom Unveils Cable Modem Single Chip," *Cable World*, Primedia Intertec, 1 Page (Sep. 28, 1998).

Rose, F., "Broadcom Puts Cable-Modem Circuitry On Single Chip, a Leap for the Industry," *The Wall Street Journal*, vol. CXXXIX, No. 57, Dow Jones & Company, Inc., 1 Page (Sep. 21, 1998).

Darlington, S., "Realization of a Constant Phase Difference," *The Bell System Technical Journal*, vol. XXIX, No. 1, American Telephone and Telegraph Company, pp. 94-104 (Jan. 1950).

Quigley, T. and Hartman, D., "Future proofing: MCNS Data-Over-Cable Protocol," *CED Magazine*, 4 Pages (Mar. 1998).

*Microtune Fast Facts*, Microtune Inc., 2 Pages (1998).

*Market Issues Solved by the MicroTuner Market Bckground Briefing*, 2 Pages.

*Microtune*, Microtune, Inc., 3 Pages.

*Conexant/Microtune Launch Plan*, 2 Pages (Jun. 1998).

*Microtune Corporate Profile*, Microtune Inc., 5 Pages (1998).

*Conexant—broadband access for the next century*, Microtune Inc., 4 Pages (1999).

Press Release, "Broadcom Announces New, Low-Cost, Low-Power, DSP-Based Fast-Ethernet Transceivers," Broadcom Corporation, 4 Pages (Mar. 5, 1998).

Press Release, "General Instrument and Broadcom Announce Strategic Partnership for Next-Generation Digital Set-Top Terminal Silicon," Broadcom Corporation, 3 Pages (Mar. 25, 1998).

Press Release, "Broadcom Corporation Wins Award For Cable Technology Innovation," Broadcom Corporation, 2 Pages (Apr. 28, 1998).

Press Release, "Broadcom Demonstrates Voice-Over IP for Next-Generation MCNS Cable Modems," Broadcom Corporation, 3 Pages (May 4, 1998).

Press Release, "Broadcom Announces a Low-Cost Unmanaged 100Base-TX Integrated Repeater," Broadcom Corporation, 3 Pages (May 5, 1998).

Press Release, "Broadcom Launches First Integrated Universal Satellite Receiver Chip to Support DVB, DSS and Primestar Satellite Systems," Broadcom Corporation, 3 Pages (May 18, 1998).

Press Release, "Broadcom to Cooperate with Sony on the Development of Integrated Circuits for the Digital-TV Market," Broadcom Corporation, 2 Pages (May 19, 1998).

Press Release, "3Com Uses Broadcom's High-performance Quad-PHY Chips for New Dual-Speed, Stackable Hubs," Broadcom Corporation, 4 Pages (May 28, 1998).

Press Release, "Broadcom Announces Breakthrough VDSL Solution Offering Significant Bandwidth Improvements Over ADSL," Broadcom Corporation, 3 Pages (Jun. 9, 1998).

Press Release, "Next Level Communications Selects Broadcom Corp.'s VDSL Silicon for Broadband Access Equipment," Broadcom Corporation, 4 Pages (Jun. 9, 1998).

Press Release, "Broadcom Announces Demodulator Chip That Doubles the Upstream Bandwidth for Two-way Cable Modem Deployment," Broadcom Corporation, 4 Pages (Jul. 8, 1998).

Press Release, "RELTEC Selects Broadcom's VDSL Silicon for Its DISC☐S® Broadband Access Equipment," Broadcom Corporation, 3 Pages (Jul. 13, 1998).

*Using SpectreS in Analog Artist 4.3*, 3 Pages.

*Obtaining Accurate Distortion Measurements Using the Analog Workbench*Cadence Design Systems, Inc., 29 Pages (1995).

*2.85 To 12 Volt Fixed Positive Local Voltage Regulator*, Issue 2, 18 Pages (Apr. 1997).

Press Release, "Broadcom Demonstrates World's First Gigabit Ethernet Chip for Existing Copper Cabling," Broadcom Corporation, 5 Pages (May 11, 1999).

*BAR 63-02W Silicon Bar Diode*, Siemens, 2 Pages.

*PC/TV Applications With The Microtuner™ 2000*, Microtune, Inc., 3 Pages (1999).

Press Release, "Broadcom Delivers Second-Generation VDSL Silicon," Broadcom Corporation, 5 Pages (Jun. 8, 1999).

Press Release, "Broadcom Demonstrates Its Advanced TV Graphics Capability Using the Excite@Home TV Client Software Environment," Broadcom Corporation, 3 Pages (Jun. 14, 1999).

Press Release, "Broadcom's Chips Lead Industry in Cable Modem Customer Certification," Broadcom Corporation, 4 Pages (Jun. 14, 1999).

Press Release, "Pace, Panasonic, Philips, Pioneer and Scientific-Atlanta Select Broadcom's New Chip for Digital Cable-TV Interactive Set-Top Boxes," Broadcom Corporation, 6 Pages (Jun. 14, 1999).

Press Release, "Broadcom Demonstrates Microsoft TV on OpenCable™ Development Platform," Broadcom Corporation, 3 Pages (Jun. 14, 1999).

Press Release, "Broadcom, Stanford Telecommunications Settle Litigation," Broadcom Corporation, 2 Pages (Jun. 22, 1999).

Press Release, "Broadcom Corporation to Acquire HotHaus Technologies Inc., a VoIP Telecommunications Software Leader," Broadcom Corporation, 5 Pages (Jul. 18, 1999).

Press Release, "Broadcom Corporation Reports Second Quarter Revenue and Profit," Broadcom Corporation, 6 Pages (Jul. 21, 1999).
Press Release, "Microtune™ Revolutionizes Traditional Tuner Industry with the World's First TV Tuner on a Single Chip," Shelton Communications Group and Microtune Inc., 3 Pages (Jan. 26, 1999).
*E-Series RF 1:1 Transformer 0.3-200 MHz*, M/A-Com, Inc., 1 Page.
*E-Series RF 4:1 Transformer 300-2500 MHz*, M/A-Com, Inc., 1 Page.
*E-Series RF 16:1 Transformer 0.3-120 MHz*, M/A-Com, Inc., 1 Page.
*SC1117 0.8 Amp Positive Voltage Regulator*, Semtech Corp., 4 Pages (Apr. 13, 1998).
*NI-488.2M User Manual for Windows 95/Windows NT*, National Instruments Corporation, pp.6-1-6-10.
*Cable-TV And Cable Modem Product Line*, 3 Pages.
"Voltage-Controlled Oscillators," *MiniCircuits*, p. 156.
*Data Sheet:μPC2798GR Bipolar Analog Integrated Circuit*, NEC Corporation, pp. 1-3 (1996).
*SP5668 2.7GHz 3-Wire Bus Controlled Low Phase Noise Frequency Synthesizer*, GEC Plessey Semiconductors, pp. 1-12 (Jan. 1997).
*Data Sheet: 70 MHz Bandpass Filter: 8 MHz Bandwidth: Part No. 855677*, Sawtek Incorporated, 1 Page (Nov. 1, 1999).
*R8 Communications Receiver Owner's Manual*, R.L. Drake Company, pp. i, ii and 1-32 (1994).
*Four-Band Communications Receiver Model SX-122 Operating and Service Instructions*, Hallicrafters, pp. 1-25.
*Communications Receiver Model SX-146 Operating and Service Instructions*, Hallicrafters, pp. 1-23.
*Model R-4C Receiver Instruction Manual*, R.L. Drake Company, pp. i-iii, 1-1-1-3, 2-1-2-6, 3-1-3-9, 4-1-4-3 and 5-1-5-11 (Jun. 1977).
Fontaine, J., *Market Backgrounder: Industry Challenges of the Digital Media Era Require Revolutionary Solutions*, Microtune Inc., pp. 1-3 (1998).
Norsworthy, J., *Technology Backgrounder: World's First Single-Chip TV Tuner*, Microtune Inc., pp. 1-6.
Norsworthy, J., *Technology Backgrounder: World's First Single-Chip TV Tuner*, Microtuner Inc., 6 pages.
*Microtuner™ 2000 (NTSC, PAL or NTSC/PAL) For Cable Applications*, Microtune Inc., 2 Pages (1999).
*Microtuner 2000™:Single Chip TV Tuner-Receiver*, Microtune Inc., 4 Pages (1999).
*Microtuner 2000™:Single-Chip Broadband Tuner-Receiver*, Microtuner Inc., 2 Pages (1999).
*Very High-Speed Digital Subscriber Line (VDSL) Frequently Asked Questions*, Broadcom Corporation, pp. 1-4.
*Feature Comparison of ADSL and VDSL*, Broadcom Corporation, 1 Page (Jun. 2, 1996).
*Broadband access for the next century*, Microtune Inc., 5 Pages (1999).
Okwit, S., "An Historical View of the Evolution of Low-Noise Concepts and Techniques," *IEEE Transactions on Microwave Theory and Techniques*, vol. MTT-32, No. 9, IEEE Microwave Theory and Techniques Society, pp. 1068-1082 (Sep. 1984).
Kuhn, W.B., *Design of Integrated, Low Power, Radio Receivers in BiCMOS Technologies*, Dissertation submitted to Virginia Polytechnic Institute and State University, pp. i-xvii and 1-295 (1995).

*Primary Examiner*—Sherrie Hsia
(74) *Attorney, Agent, or Firm*—Sterne, Kessler, Goldstein & Fox PLLC

(57) ABSTRACT

An integrated receiver with channel selection and image rejection substantially implemented on a single CMOS integrated circuit is described. A receiver front end provides programable attenuation and a programable gain low noise amplifier. Frequency conversion circuitry advantageously uses LC filters integrated onto the substrate in conjunction with image reject mixers to provide sufficient image frequency rejection. Filter tuning and inductor Q compensation over temperature are performed on chip. The filters utilize multi track spiral inductors. The filters are tuned using local oscillators to tune a substitute filter, and frequency scaling during filter component values to those of the filter being tuned. In conjunction with filtering, frequency planning provides additional image rejection. The advantageous choice of local oscillator signal generation methods on chip is by PLL out of band local oscillation and by direct synthesis for in band local oscillator. The VCOs in the PLLs are centered using a control circuit to center the tuning capacitance range. A differential crystal oscillator is advantageously used as a frequency reference. Differential signal transmission is advantageously used throughout the receiver.

16 Claims, 51 Drawing Sheets

DUAL CONVERSION RECEIVER

FIG.21

PPL Xtal REFERENCE=10MHz
LO-1, 10MHz FREQUENCY STEPS
LO-2, 100kHz FREQUENCY STEPS 44MHz IF NOTE
• LO-2 REF=100kHz
  SO DIVIDE RANGE=9216 TO 9280

| Frf (MHz) | 50 | 56 | 62 | 68 | 74 | 80 | 86 | 92 | 98 | 104 | 110 | 116 | 122 | 128 | " | 854 | 860 |
|---|---|---|---|---|---|---|---|---|---|---|---|---|---|---|---|---|---|
| LO-1 (MHz) | 1250 | 1260 | 1260 | 1270 | 1270 | 1280 | 1290 | 1290 | 1300 | 1300 | 1310 | 1320 | 1320 | 1330 | " | 2050 | 2060 |
| IF-1 (MHz) | 1200 | 1204 | 1198 | 1202 | 1196 | 1200 | 1204 | 1198 | 1202 | 1196 | 1200 | 1204 | 1198 | 1202 | " | 1196 | 1200 |
| LO-2 (MHz) | 924.8 | 928.0 | 923.2 | 926.4 | 921.6 | 924.8 | 928.0 | 923.2 | 926.4 | 921.6 | 924.8 | 928.0 | 923.2 | 926.4 | " | 921.6 | 924.8 |
| IF-2 (MHz) | 275.2 | 276 | 274.8 | 275.6 | 274.4 | 275.2 | 276.0 | 274.8 | 275.6 | 274.4 | 275.2 | 276.0 | 274.8 | 275.6 | " | 274.4 | 275.2 |
| LO-3 (MHz) | 231.2 | 232 | 230.8 | 232 | 230 | 231 | 232 | 231 | 232 | 230 | 231 | 232 | 231 | 232 | " | 230 | 231 |
| IF-3 (MHz) | 44.0 | 44.0 | 44.0 | 44.0 | 44.0 | 44.0 | 44.0 | 44.0 | 44.0 | 44.0 | 44.0 | 44.0 | 44.0 | 44.0 | " | 44.0 | 44.0 |

TABLE OF FREQUENCIES BASED ON
COARSE/FINE PLL SOLUTION:

FIG. 22

PPL Xtal REFERENCE=10MHz
LO-1, 10MHz FREQUENCY STEPS
LO-2, 100kHz FREQUENCY STEPS 36MHz IF

TABLE OF FREQUENCIES BASED ON
COARSE/FINE PLL SOLUTION:

| Frf (MHz) | 50 | 58 | 66 | 74 | 82 | 90 | 98 | 106 | 114 | 122 | 130 | 138 | 146 | 154 | " | 852 | 860 |
|---|---|---|---|---|---|---|---|---|---|---|---|---|---|---|---|---|---|
| LO-1 (MHz) | 1250 | 1260 | 1270 | 1270 | 1280 | 1290 | 1300 | 1310 | 1310 | 1320 | 1330 | 1340 | 1350 | 1350 | " | 2050 | 2060 |
| IF-1 (MHz) | 1200 | 1202 | 1204 | 1196 | 1198 | 1200 | 1202 | 1204 | 1196 | 1198 | 1200 | 1202 | 1204 | 1196 | " | 1198 | 1200 |
| LO-2 (MHz) | 931.2 | 932.8 | 934.4 | 928.0 | 930 | 931 | 933 | 934 | 928.0 | 930 | 931 | 933 | 934 | 928.0 | " | 929.60 | 931.2 |
| IF-2 (MHz) | 268.8 | 269.2 | 269.6 | 268.0 | 268.4 | 268.8 | 269.2 | 269.6 | 268.0 | 268.4 | 268.8 | 269.2 | 269.6 | 268.0 | " | 268.4 | 268.8 |
| LO-3 (MHz) | 232.8 | 233.2 | 233.6 | 232 | 232 | 233 | 233 | 234 | 232 | 232 | 233 | 233 | 234 | 232.0 | " | 232.4 | 232.8 |
| IF-3 (MHz) | 36.0 | 36.0 | 36.0 | 36.0 | 36.0 | 36.0 | 36.0 | 36.0 | 36.0 | 36.0 | 36.0 | 36.0 | 36.0 | 36.0 | " | 36.0 | 36.0 |

NOTE
• LO-2 REF=100kHz
SO DIVIDE RANGE=9280 TO 9340

PGA SETTINGS

CLAMPING CONTROL RANGE

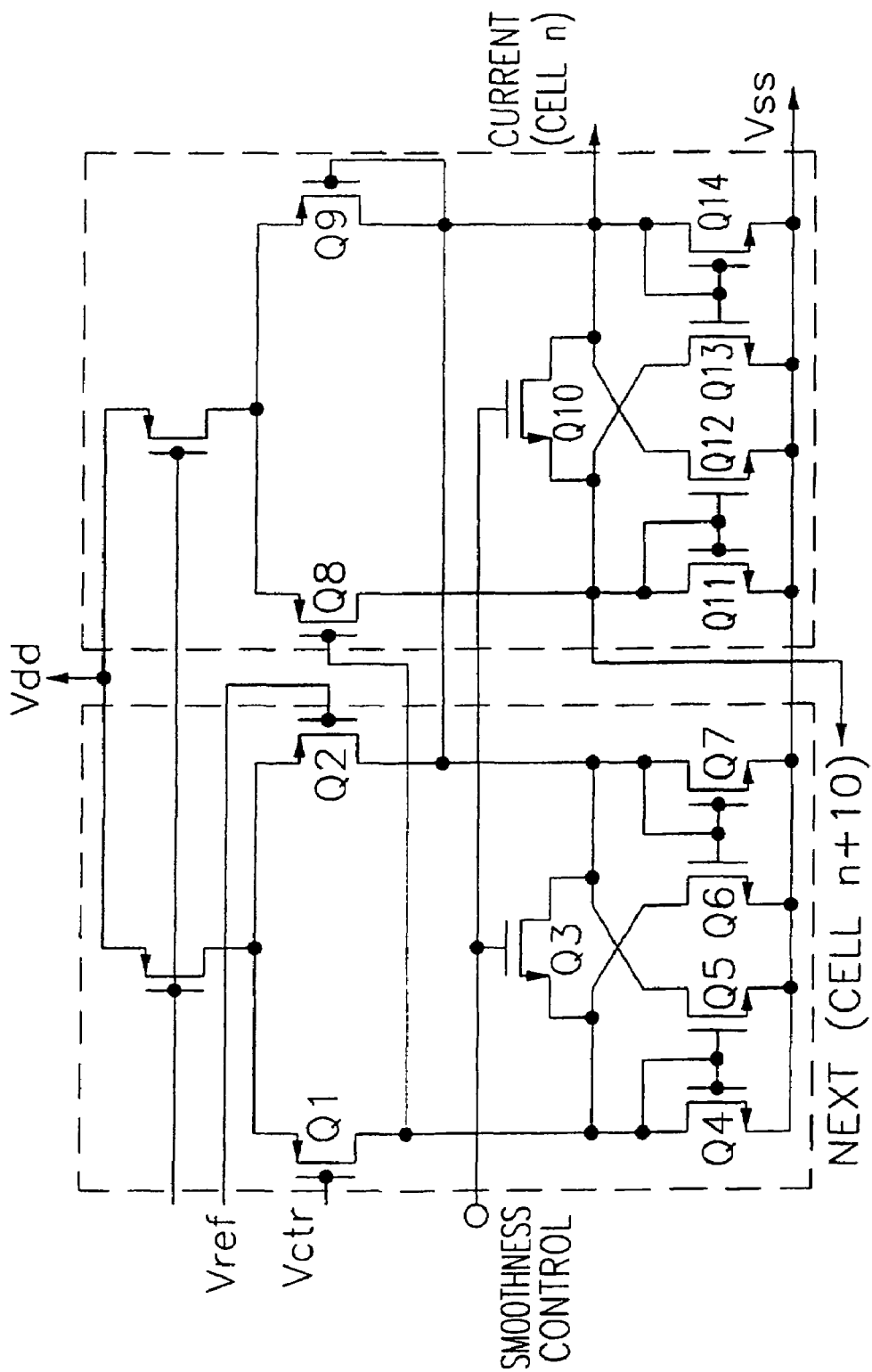
FIG. 44a. CONTROLLED GAIN COMPARATOR

CATV TUNER

SET-TOP BOX

FIG. 56 TELEVISION

VCR BLOCK DIAGRAM

FULLY INTEGRATED TUNER ARCHITECTURE

CROSS-REFERENCE TO RELATED APPLICATIONS

This application is a continuation of U.S. Pat. No. 09/439,101, filed on Nov. 12, 1999, which claims the benefit of U.S. Provisional Patent Application Nos. 60/108,459, 60/108,209, 60/108,210 filed Nov. 12, 1998; U.S. Provisional Application No. 60/117,609 filed Jan. 28, 1999; U.S. Provisional Application Nos. 60/136,115 and 60/136,116 filed May 26, 1999; U.S. Provisional Application No. 60/136,654 filed May 27, 1999; and U.S. Provisional Application No. 60/159,726 filed Oct. 15, 1999; the contents of all of which are hereby incorporated by reference.

FIELD OF THE INVENTION

This application relates generally to receiver circuits and, in particular to a CATV tuner with a frequency plan and architecture that allows the entire receiver, including the filters, to be integrated onto a single integrated circuit.

BACKGROUND OF THE INVENTION

Radio receivers, or tuners, are widely used in applications requiring the reception of electromagnetic energy. Applications can include broadcast receivers such as radio and television, set top boxes for cable television, receivers in local area networks, test and measurement equipment, radar receivers, air traffic control receivers, and microwave communication links among others. Transmission of the electromagnetic energy may be over a transmission line or by electromagnetic radio waves.

The design of a receiver is one of the most complex design tasks in electrical engineering. In the current state of the art, there are many design criteria that must be considered to produce a working radio receiver. Tradeoffs in the design's performance are often utilized to achieve a given objective. There are a multitude of performance characteristics that must be considered in designing the receiver. However, certain performance characteristics are common to all receivers. Distortion and noise are two such parameters. The process of capturing the signal creates distortion that must be accounted for in the design of the radio receiver. Once a radio signal is captured, the noise surrounding the received signal in the receiver must be considered. Radio signals are often extremely weak and if noise is present in the circuit, the signal, even though satisfactorily received, can be easily lost in this noise floor. The current state of the art in receiver design is often directed to overcoming these receiver limitations in a cost effective manner.

SUMMARY OF THE INVENTION

There is therefore provided in a present embodiment of the invention, a fully integrated tuner architecture having all channel selectivity and image rejection integrated onto a single silicon substrate.

An embodiment of a fully integrated tuner architecture comprises a substrate upon which a receiver circuit that utilizes differential signal transmission. A mixer creates a first intermediate frequency that is higher than the received signal. The first up conversion has been performed to provide image frequency rejection for the second mixing stage. Next, a first intermediate frequency filter attenuates the image frequencies and provides channel selectivity. This filter is preferably an LC filter that has inductors disposed upon the substrate. The Q of the inductors is adjusted with an inductor tuning algorithm, and the center frequency of the filter is adjusted by a filter tuning algorithm.

An image reject mixer is next used to reduce the image rejection requirements of the first filter by further attenuating the amplitude of the image frequencies. The second intermediate frequency created by this mixer is lower than the first intermediate frequency. The second intermediate frequency undergoes filtering by a filter that is constructed on the substrate. This filter contains integrated inductors on the substrate with their Q adjusted by an inductor tuning algorithm. The frequency response of the filter is centered using a filter tuning algorithm.

A third image reject mixer converts the second intermediate frequency to the third intermediate frequency. This mixer reduces the image rejection requirements of the previous filter and converts the second intermediate frequency to the third intermediate frequency.

A third intermediate frequency filter further reduces the distortion present with the signal. This filter utilizes tuning algorithms to adjust the quality factor of the integrated inductors and to center the frequency response of the filter.

The frequency synthesizer implemented on the substrate uses a differential crystal oscillator for a reference signal is an on chip synthesizer. The first and second local oscillator signals are produced by indirect synthesis. The third local oscillator signal is produced by direct synthesis, to reduce distortion of this in band local oscillator signal.

The fully integrated tuner architecture advantageously uses differential signal transmission to minimize the introduction of external distortion and noise into the circuit. Differential signal transmission increases noise rejection of noise that has been generated on the semiconductor substrate, and is injected into the receiver signal path.

DESCRIPTION OF THE DRAWINGS

These and other features and advantages of the present invention will be better understood from the following detailed description read in light of the accompanying drawings, wherein.

Oscillator Figures

Figure 6:
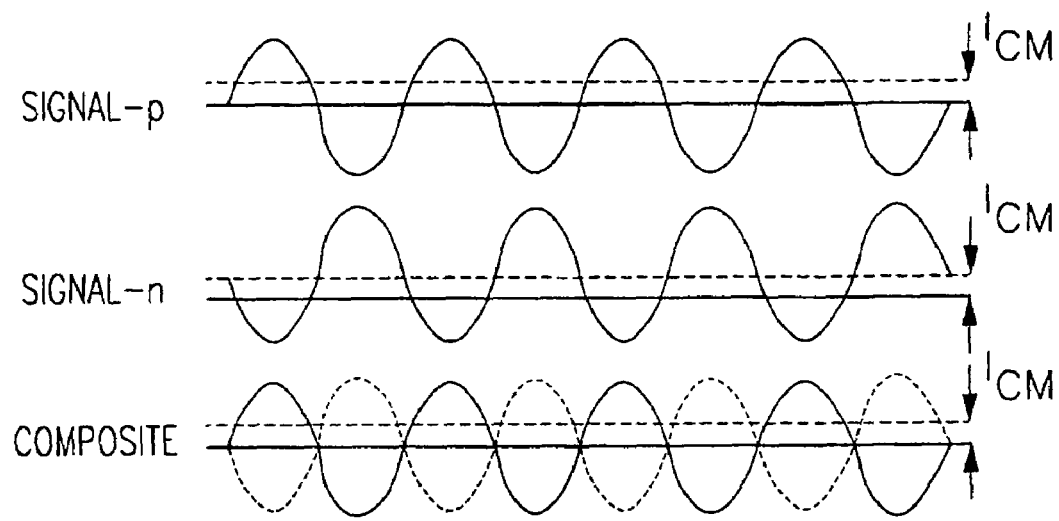
Figure 7:
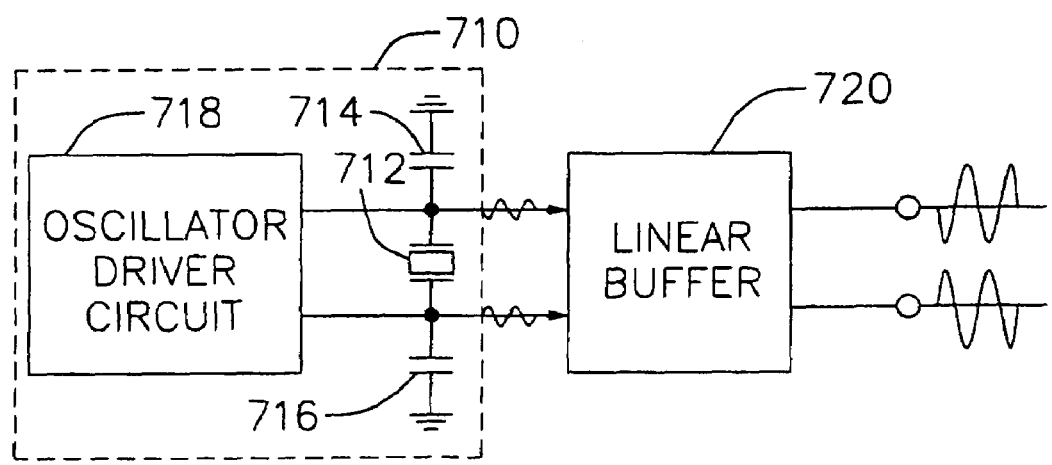
Figure 8:
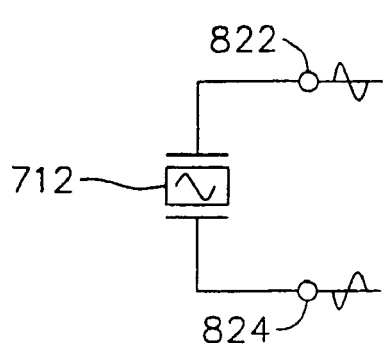
Figure 9:
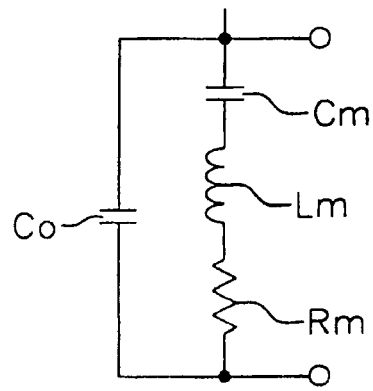
Figure 10:
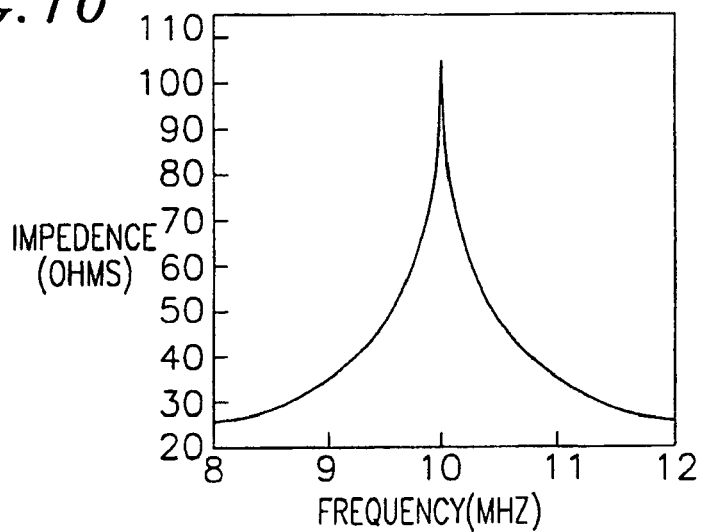
Figure 11:
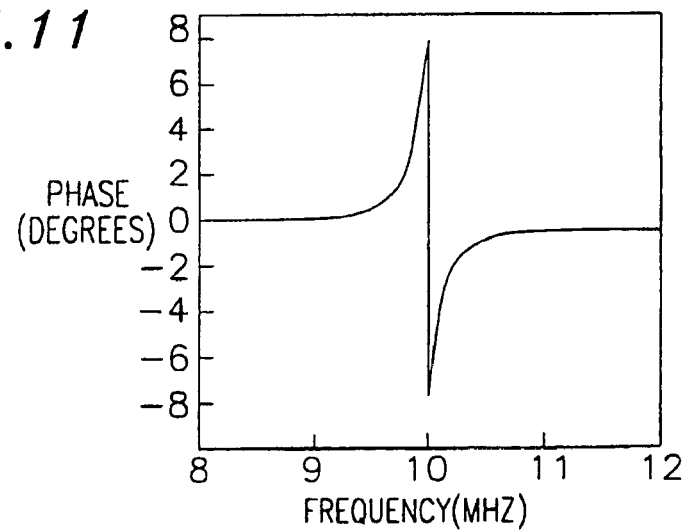
Figure 12:
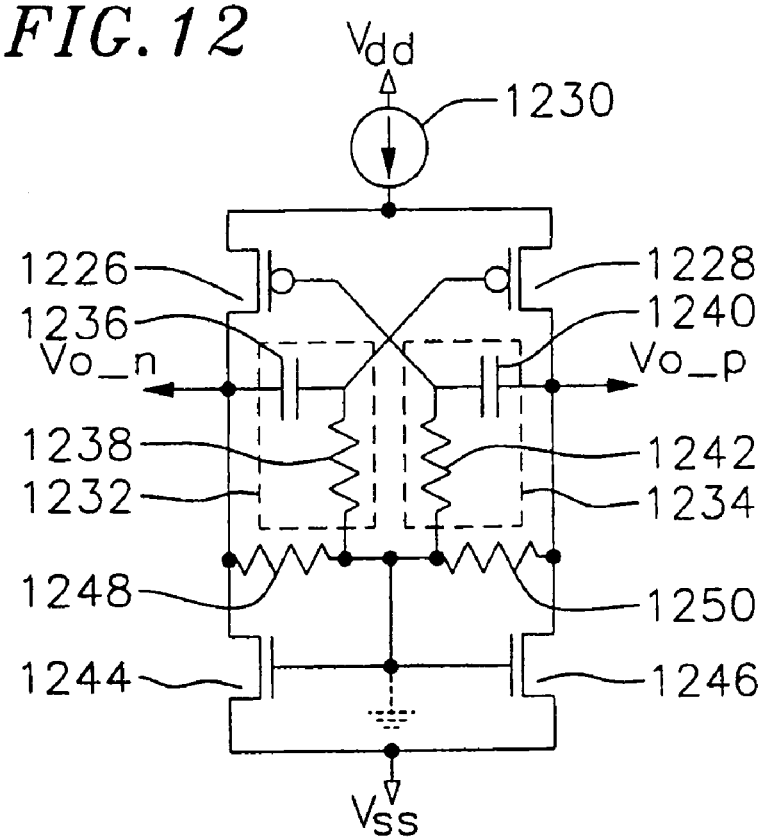
Figure 13:
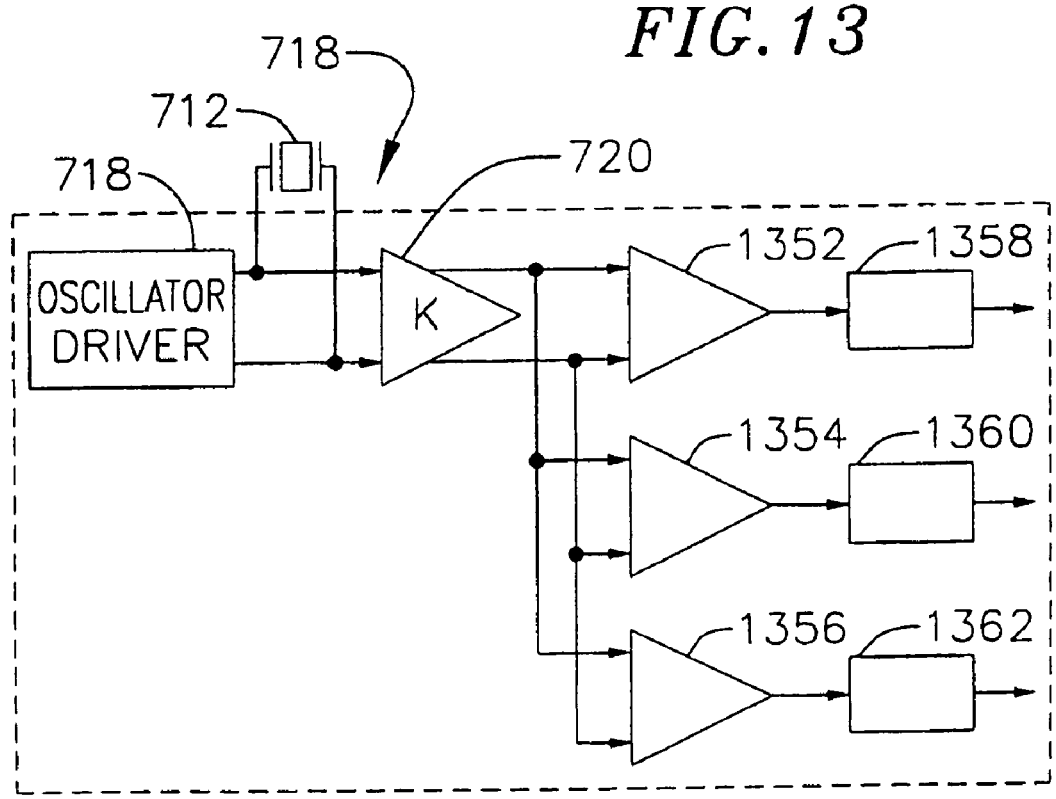
Figure 14:
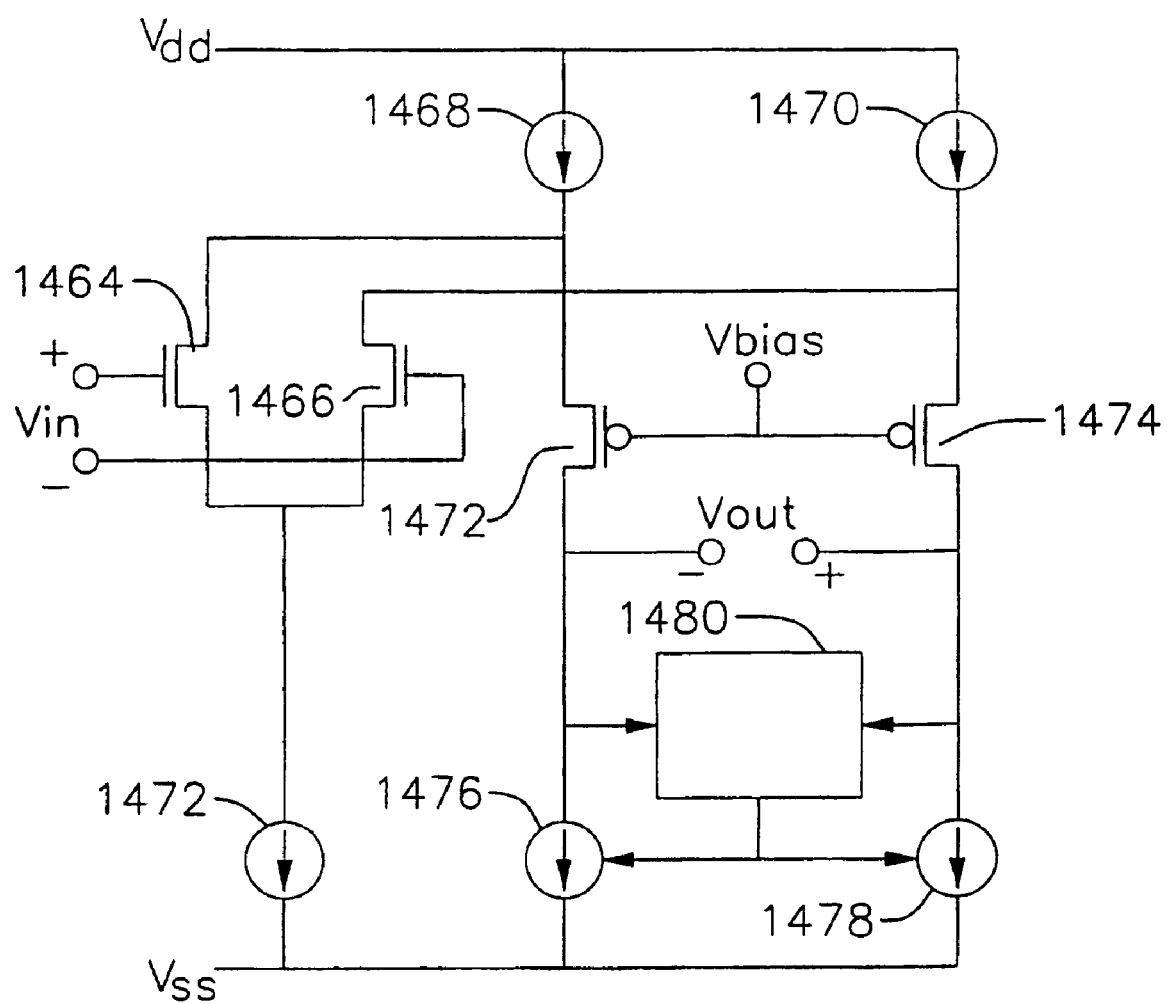
Figure 15:
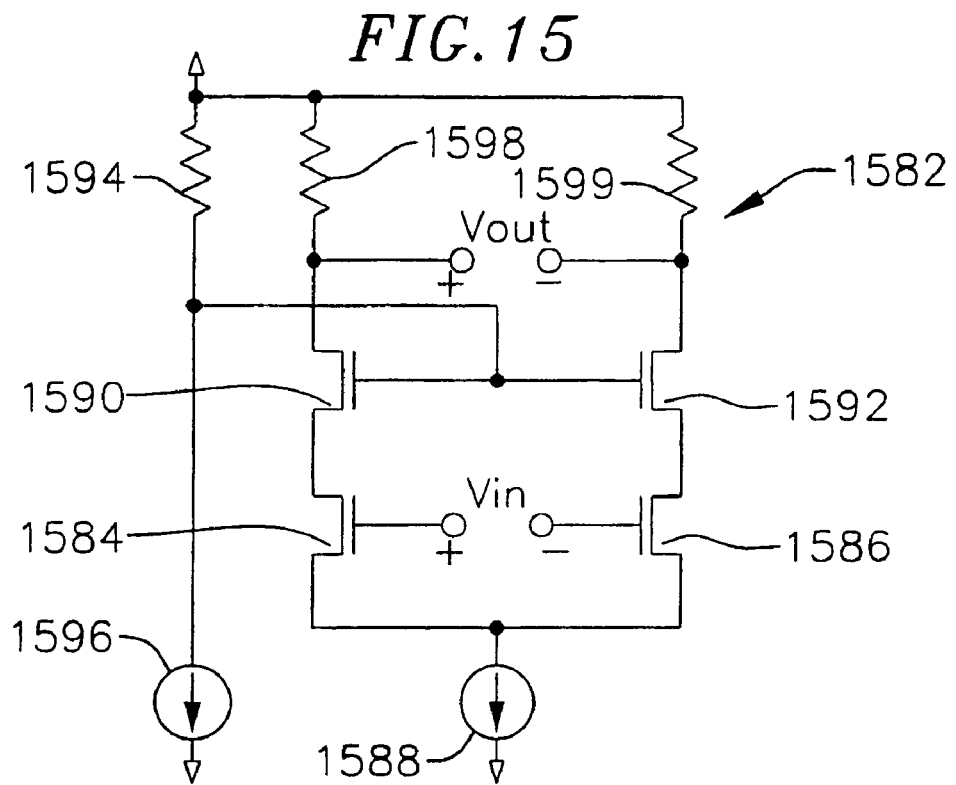
Figure 16:
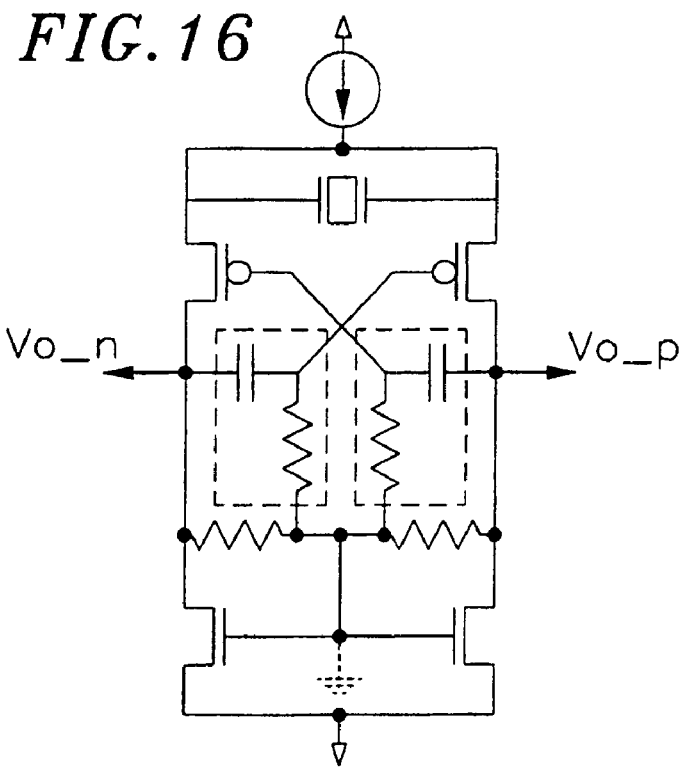
Figure 17:
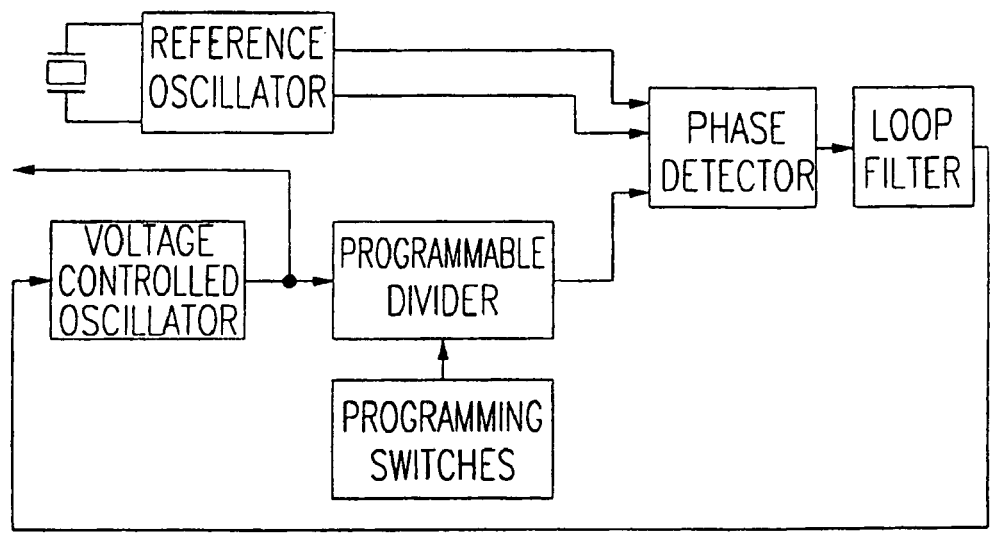
Figure 18:
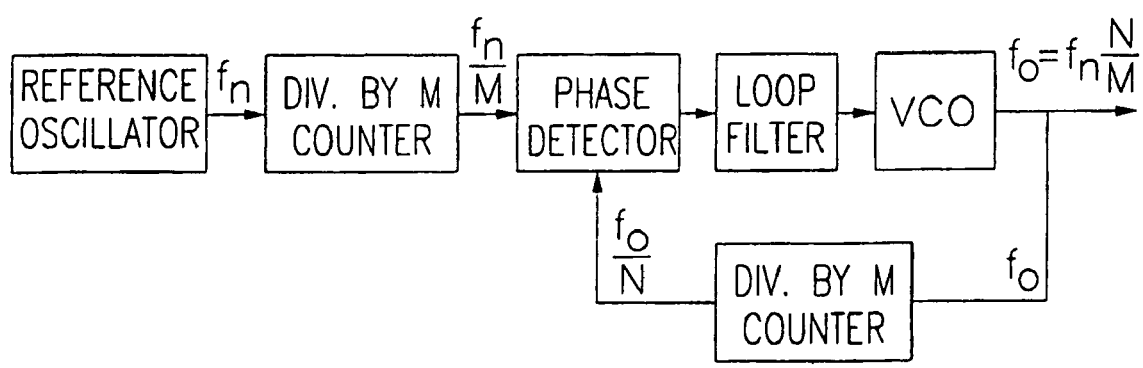

FIG. 6 is a semi-schematic simplified timing diagram of differential signals, including a common mode component, as might be developed by a differential crystal oscillator in accordance with the invention;

FIG. 7 is a semi-schematic block diagram of a differential crystal oscillator, including a quartz crystal resonator and oscillator circuit differentially coupled to a linear buffer amplifier in accordance with the invention;

FIG. 8 is a simplified schematic illustration of differential signals present at the output of a crystal resonator;

FIG. 9 is a simplified schematic diagram of a quartz crystal resonator equivalent circuit;

FIG. 10 is a simplified graphical representation of a plot of impedance vs. frequency for a crystal resonator operating near resonance;

FIG. 11 is a simplified graphical representation of a plot of phase vs. frequency for a crystal resonator operating near resonance;

FIG. 12 is a simplified schematic diagram of the differential oscillator circuit of FIG. 7;

FIG. 13 is a simplified, semi-schematic block diagram of a periodic signal generation circuit including a crystal oscillator having balanced differential outputs driving cascaded linear and non-linear buffer stages;

FIG. 14 is a simplified schematic diagram of a differential folded cascade linear amplifier suitable for use in connection with the present invention;

FIG. 15 is a simplified, semi-schematic diagram of a differential nonlinear buffer amplifier suitable for use as a clock buffer in accordance with the invention;

FIG. 16 is a semi-schematic illustration of an alternative embodiment of the differential oscillator driver circuit;

FIG. 17 is an block diagram of a differential crystal oscillator as a reference signal generator in a phase-lock-loop; and FIG. 18 is a simplified block diagram of an illustrative frequency synthesizer that might incorporate the differential periodic signal generation circuit of the invention.

Coarse/Fine PLL Tuning Figures

Figure 19:
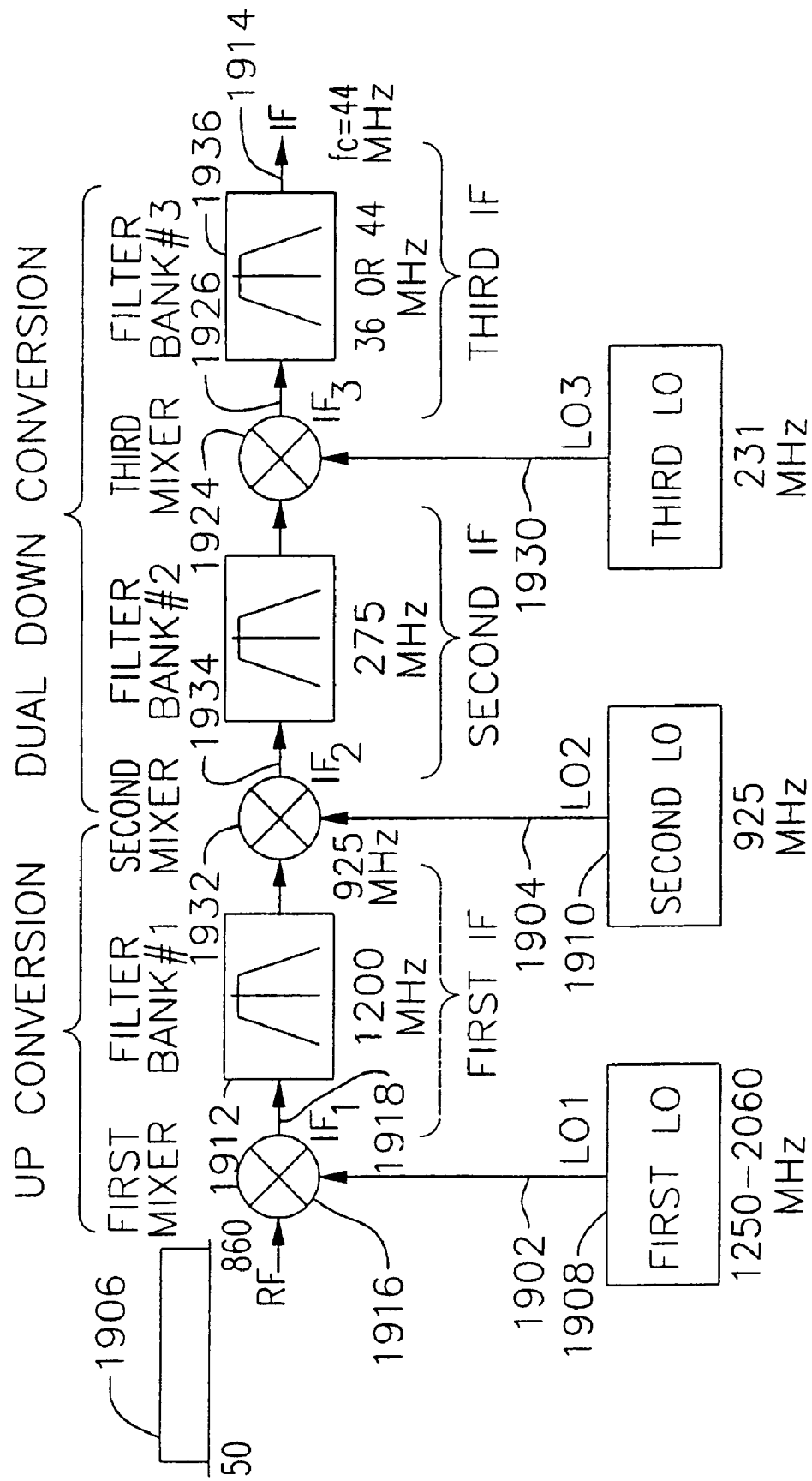
Figure 20:
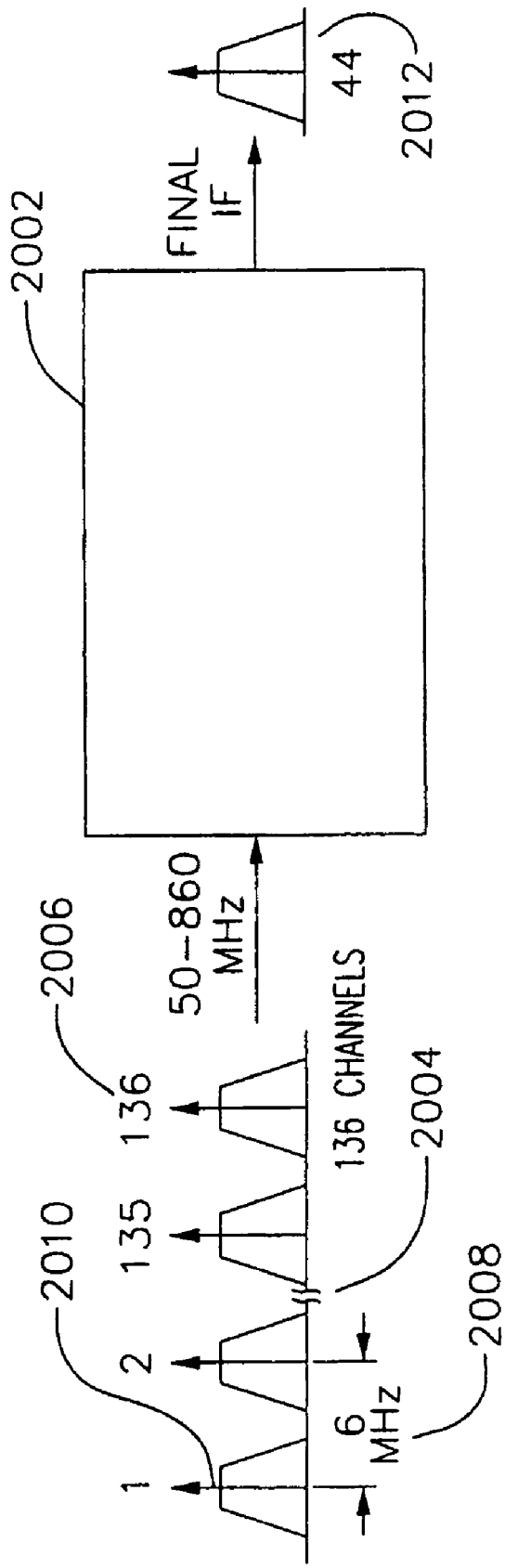
Figure 23:
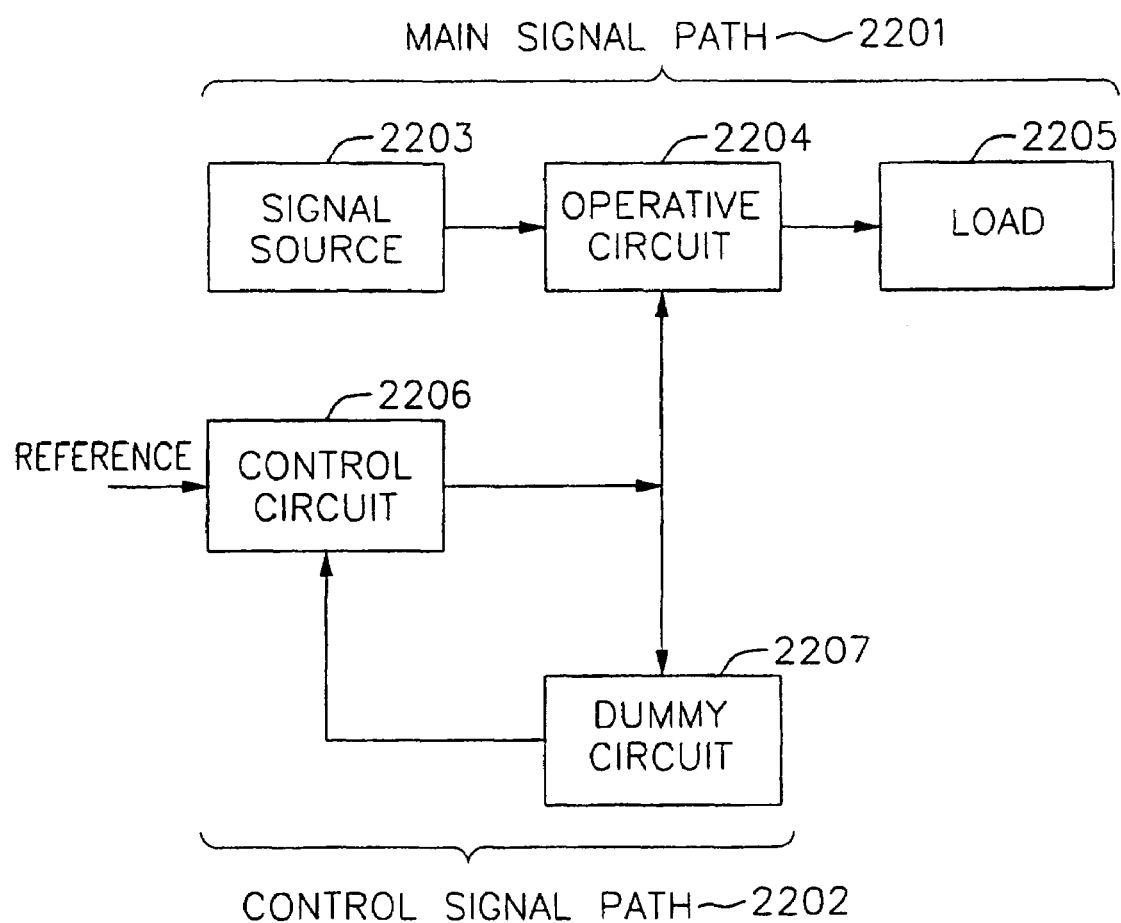

FIG. 19 is a block diagram illustrating the exemplary frequency conversions for receiver tuning utilized in the embodiments of the invention;

FIG. 20 is a block diagram of an exemplary tuner designed to receive a 50 to 860 MHz bandwidth containing a multiplicity of channels;

FIG. 21 is an exemplary table of frequencies utilizing coarse and fine PLL tuning to derive a 44 MHz IF;

FIG. 22 is an illustration of an alternative embodiment of the coarse and fine PLL tuning method to produce an exemplary final IF of 36 MHz;

FIG. 23 is a block diagram of a dummy component used to model an operative component on an integrated circuit chip;

Filter Tuning Figures

Figure 24A:
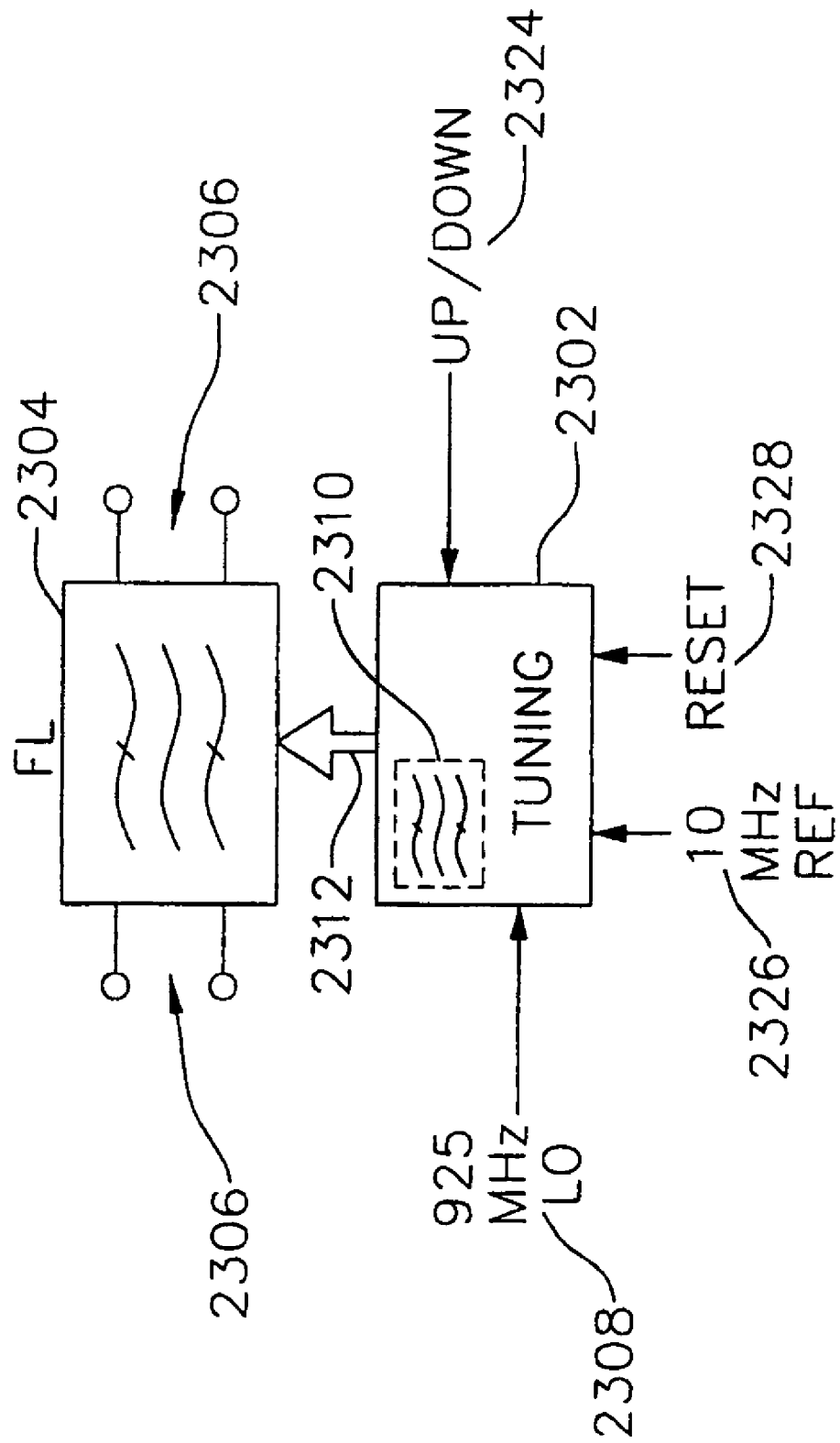
Figure 24B:
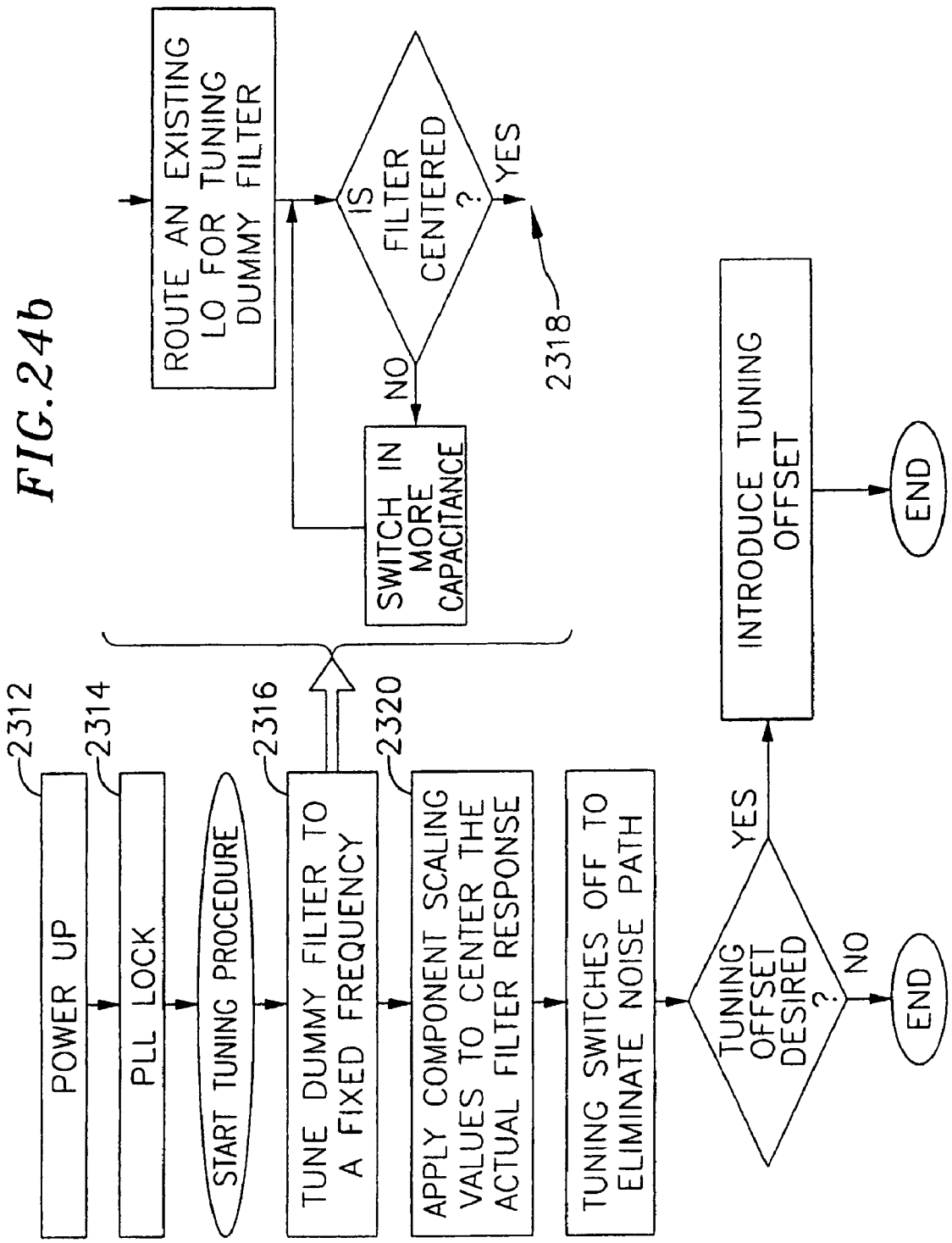
Figure 24C:
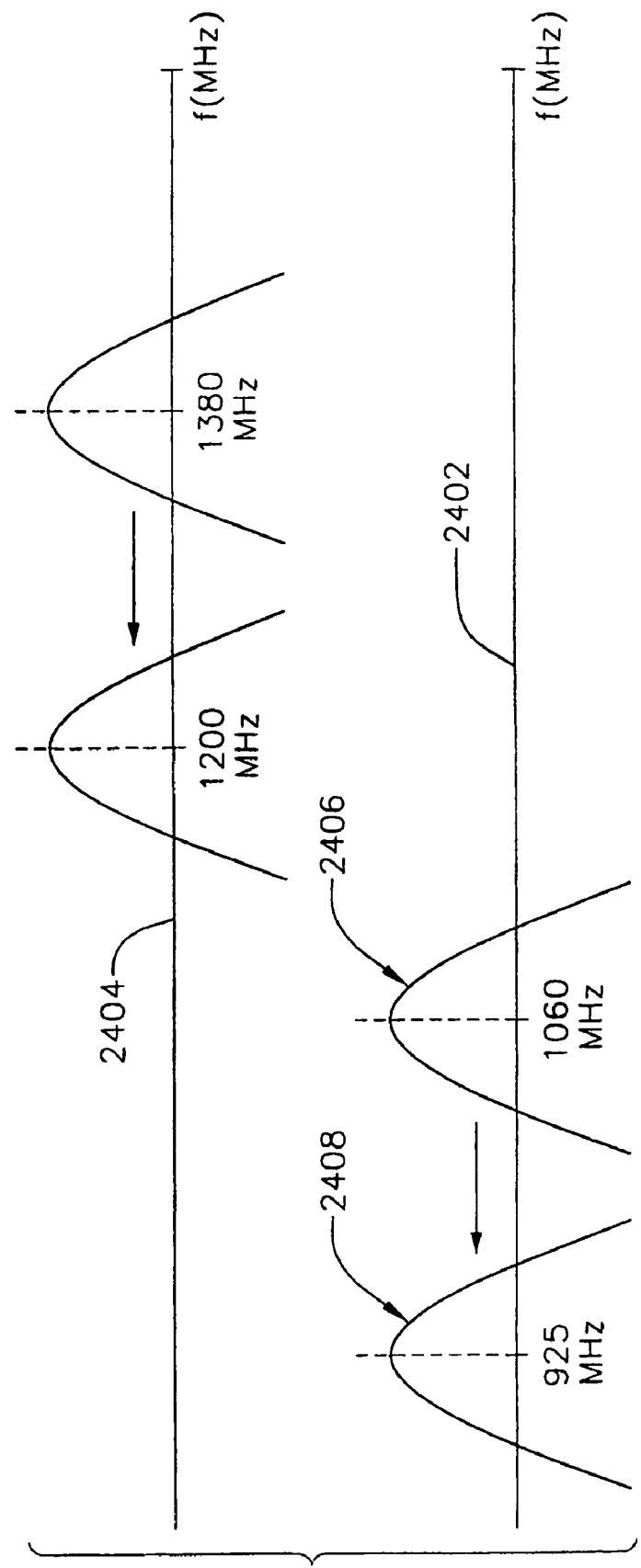
Figure 25:
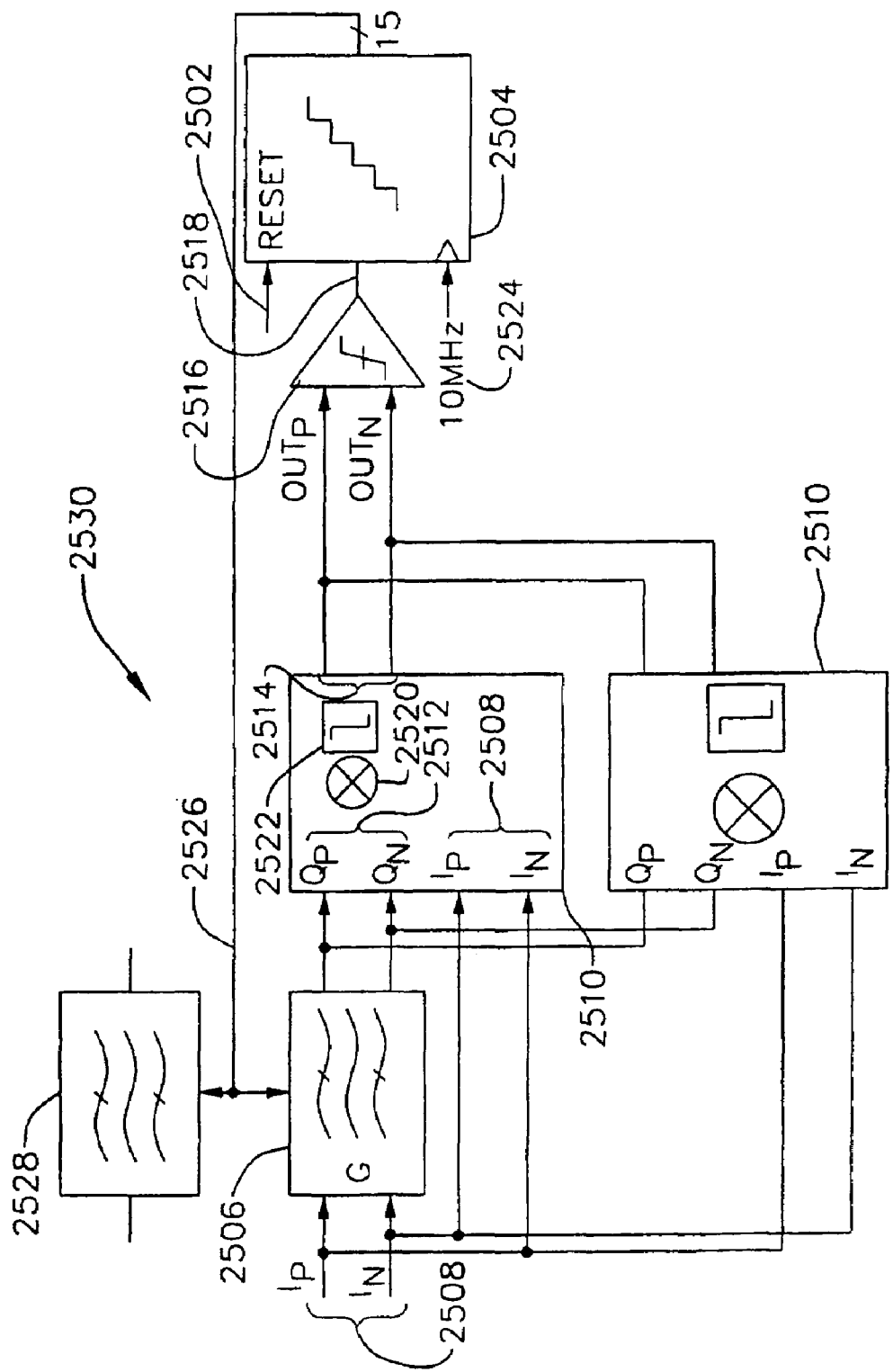
Figure 26:
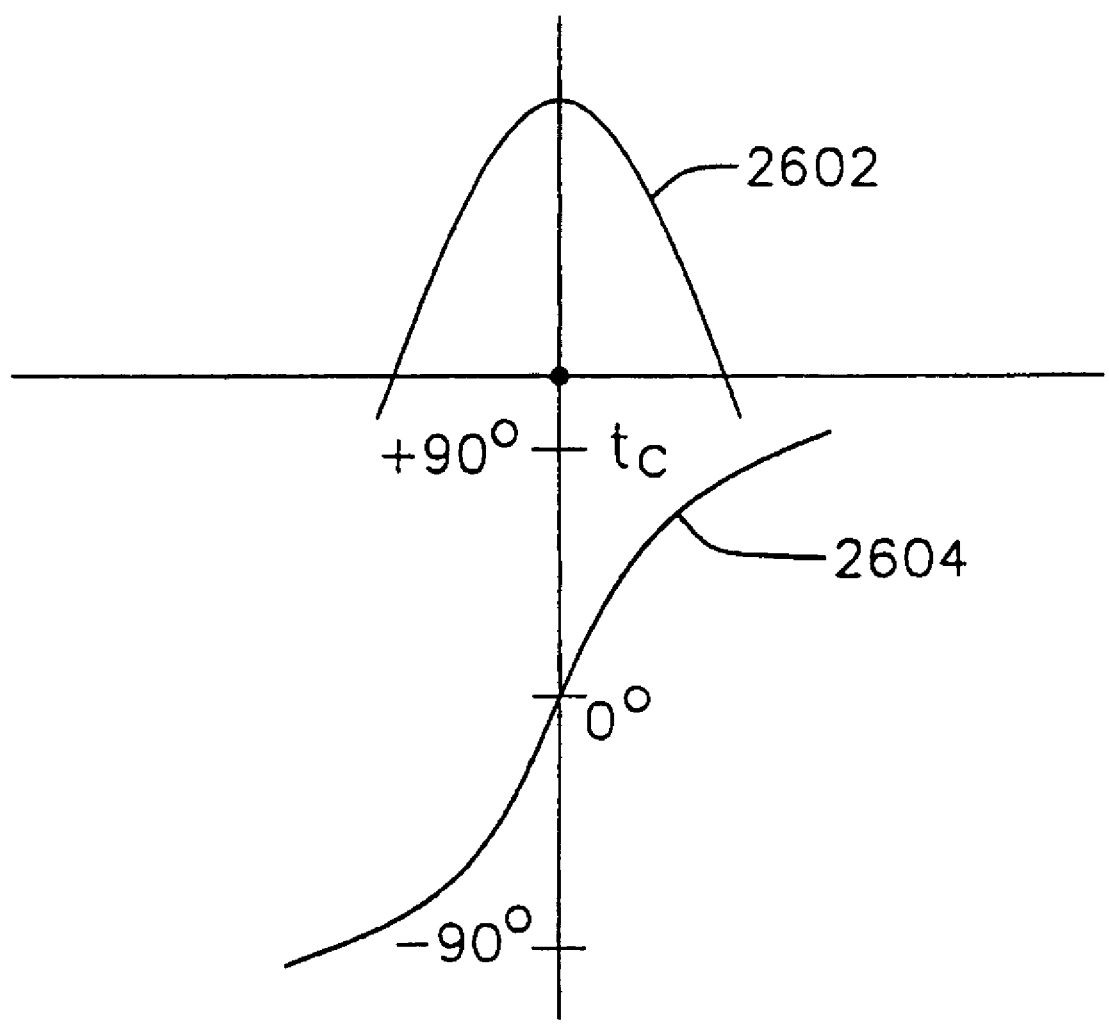
Figure 27:
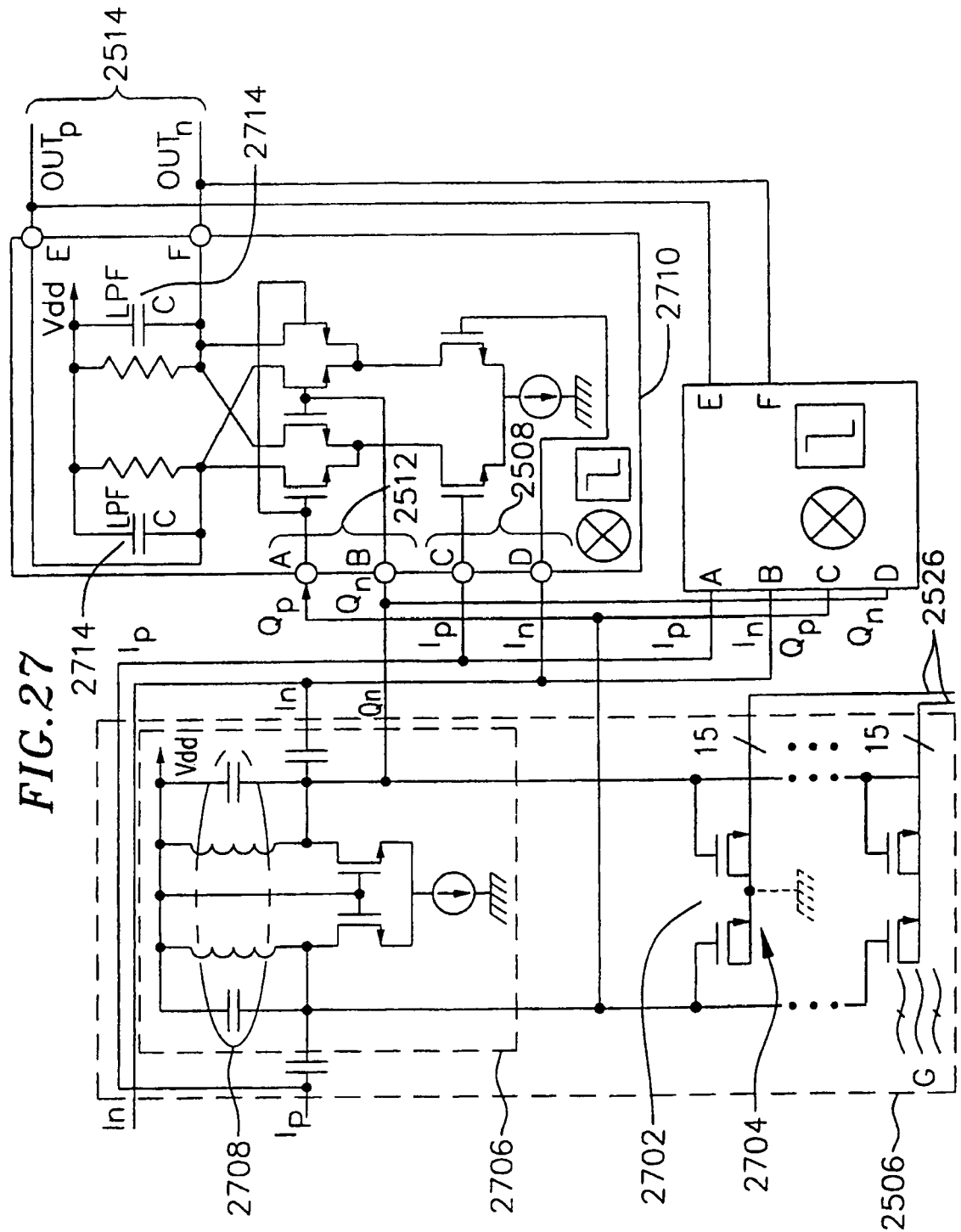

FIG. 24a is a block diagram of a tuning process, FIG. 24b is a flow diagram of the tuning process, and FIG. 24c is an exemplary illustration of the tuning process;

FIG. 25 is a block diagram of an exemplary tuning circuit;

FIG. 26 illustrates the amplitude and phase relationship in an LC filter at resonance;

FIG. 27 is a schematic diagram showing the configuration of switchable capacitors in a differential signal transmission embodiment;

Inductor Q Temperature Compensation Figures

Figure 28:
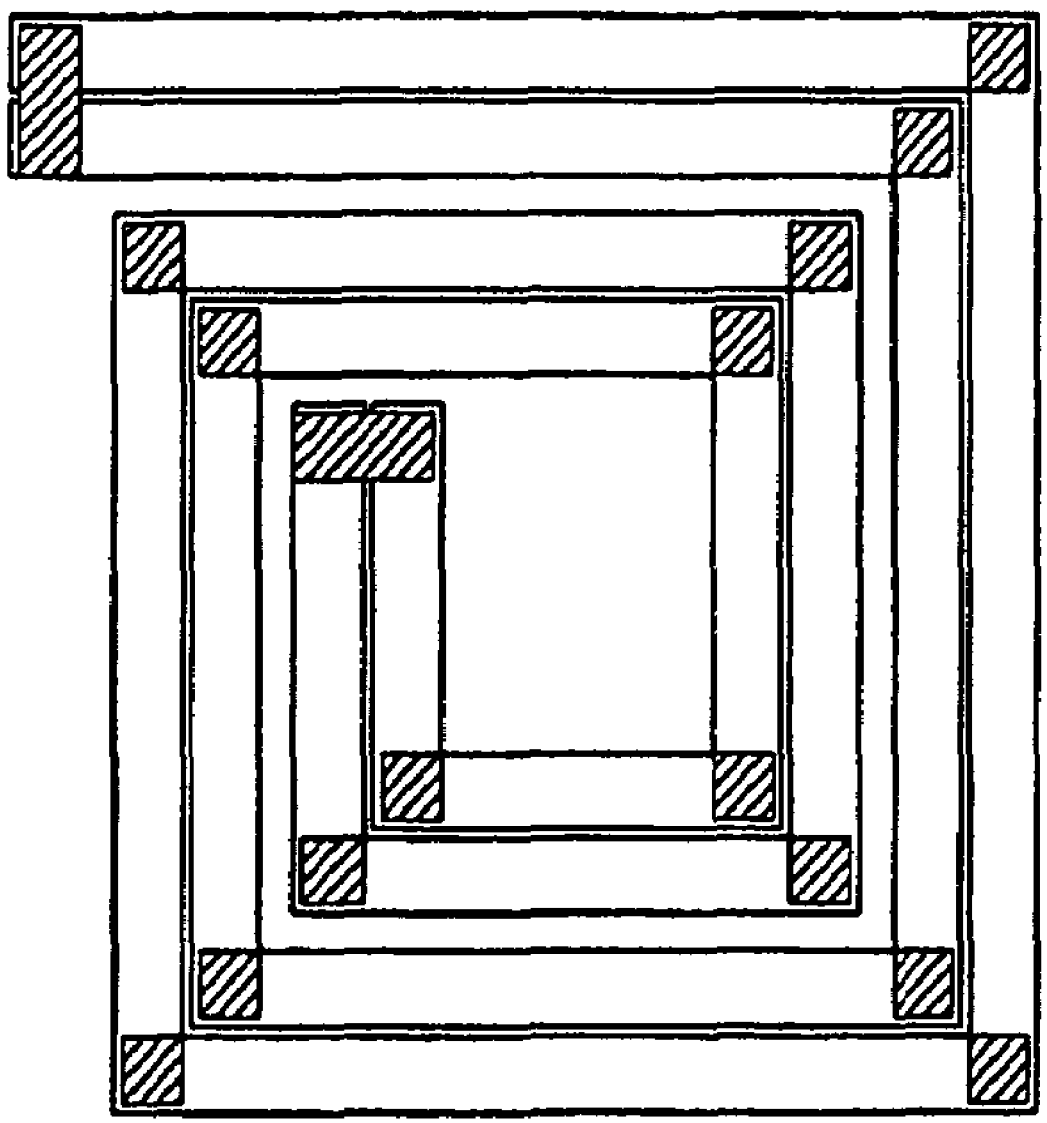
Figure 29:
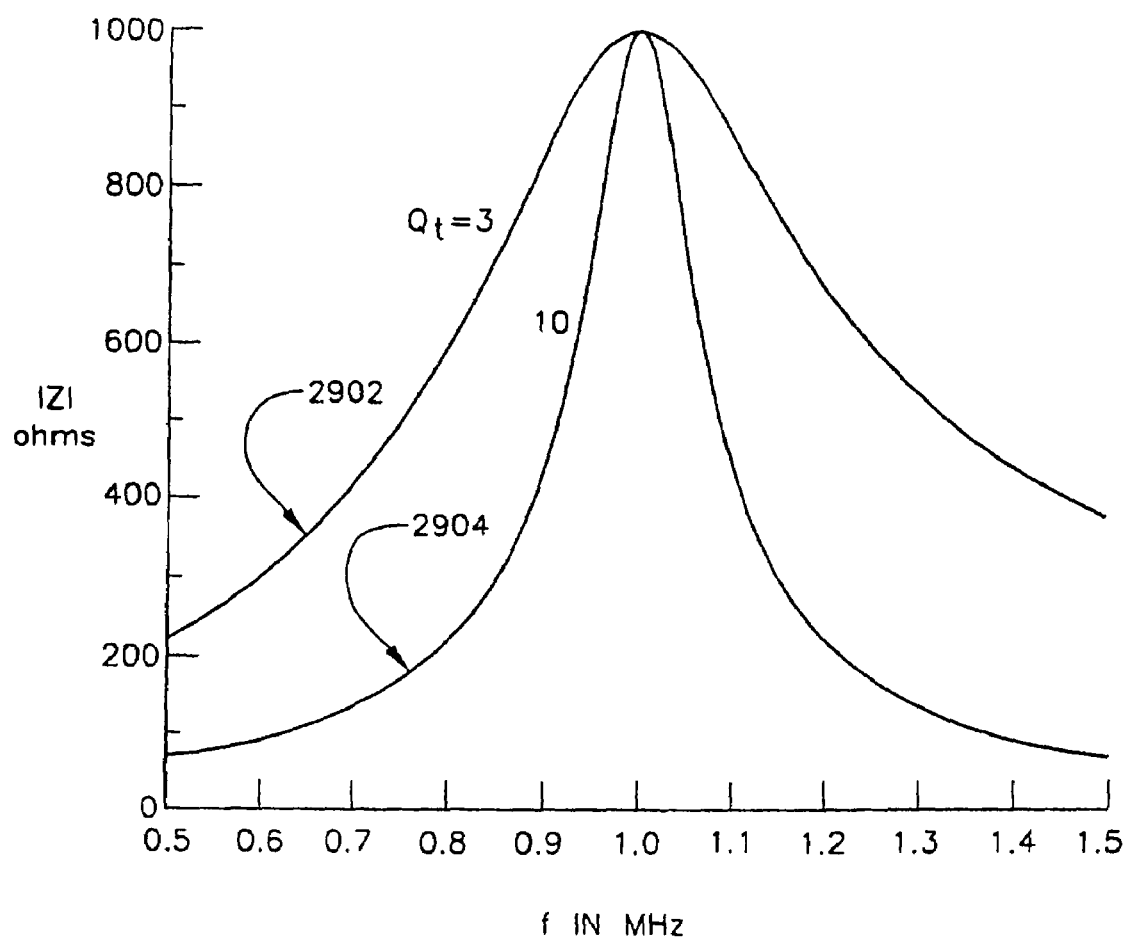
Figure 30:
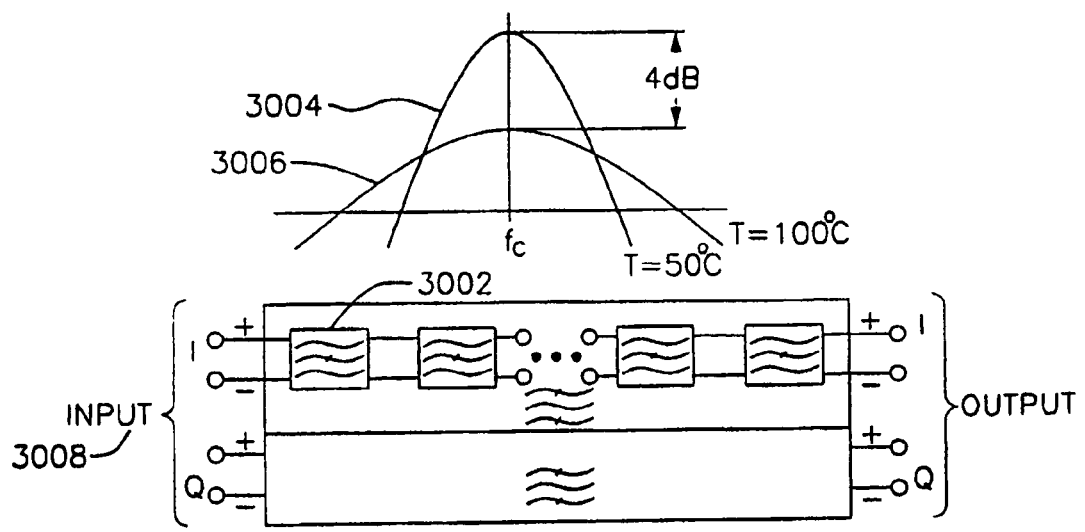
Figure 31:
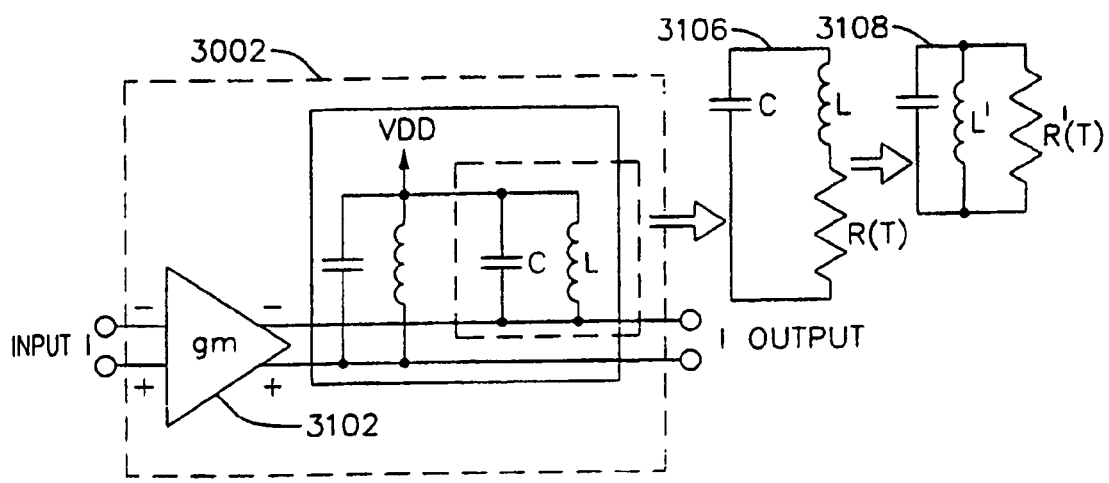
Figure 32:
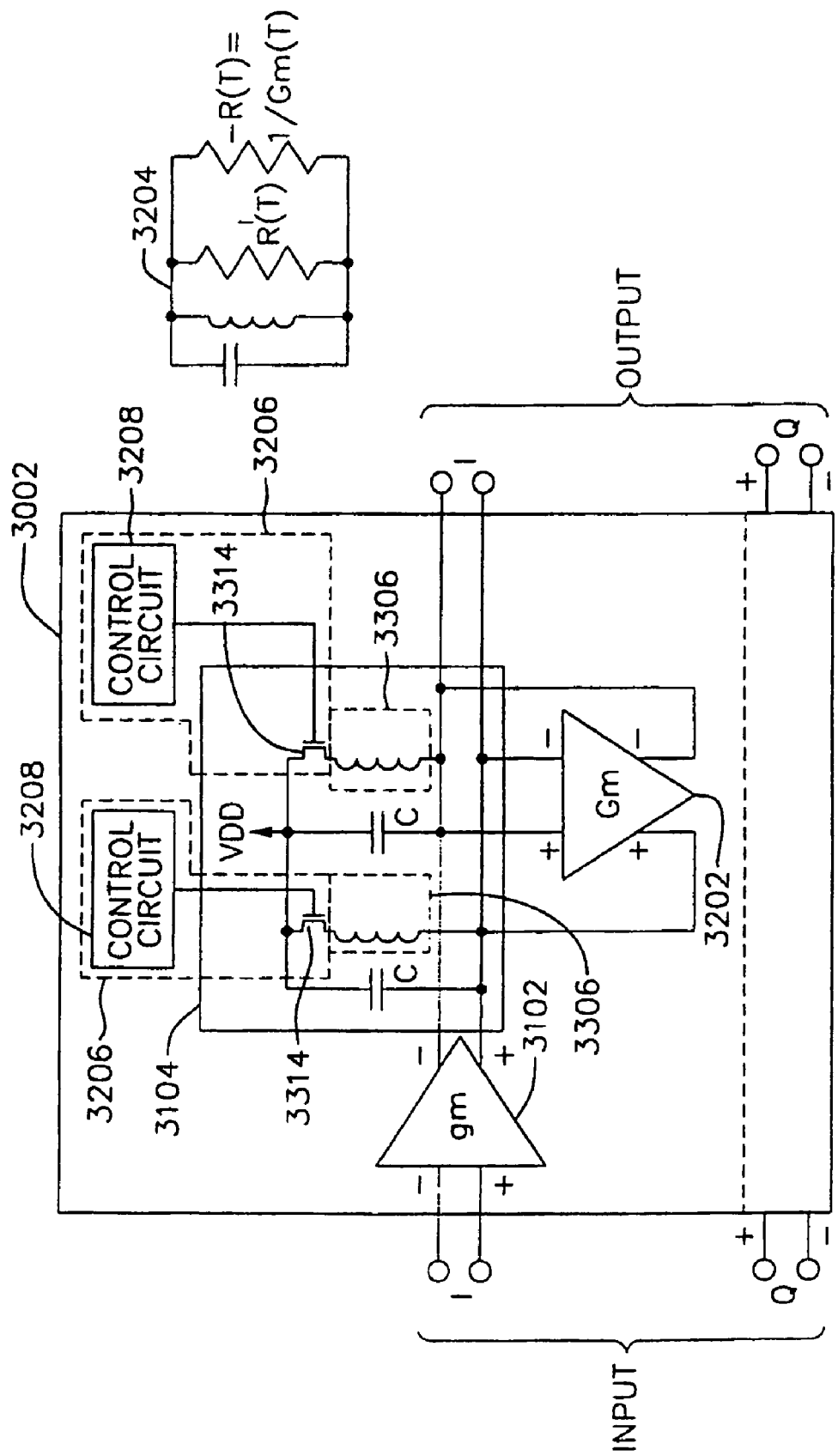
Figure 33:
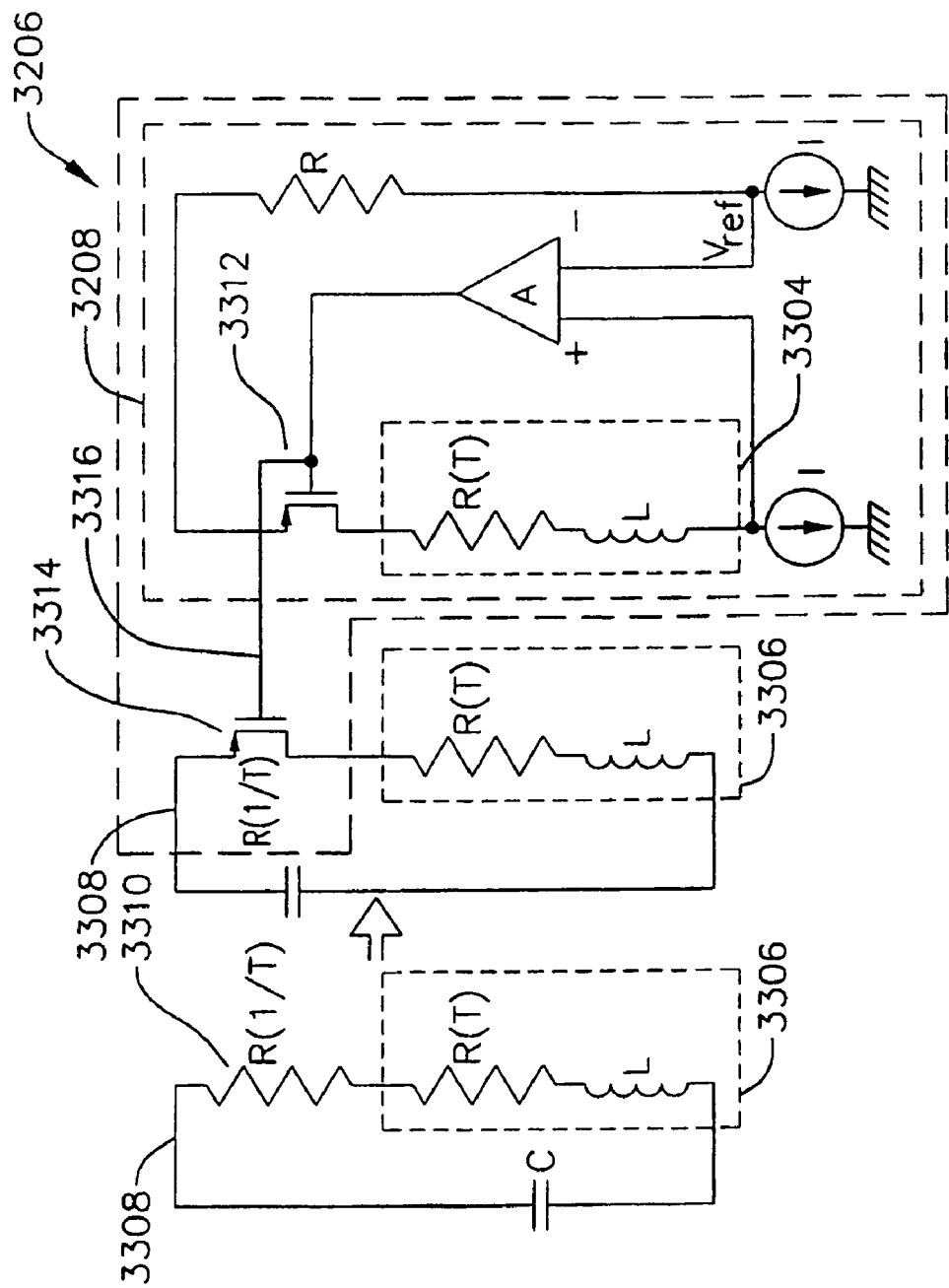

FIG. 28 is an illustration of a typical spiral inductor suitable for integrated circuit applications;

FIG. 29 is an illustration of the effect of decreasing "Q" on the selectivity of a tuned circuit;

FIG. 30 is an illustration of a typical filter bank utilized in embodiments of the invention for filtering I and Q IF signals;

FIG. 31 is a diagram of a transconductance stage with an LC load;

FIG. 32 shows a transconductance stage with an LC load and Q enhancement;

FIG. 33 shows a method of tuning inductor Q over temperature;

Communications Receiver Figures

Figure 34:
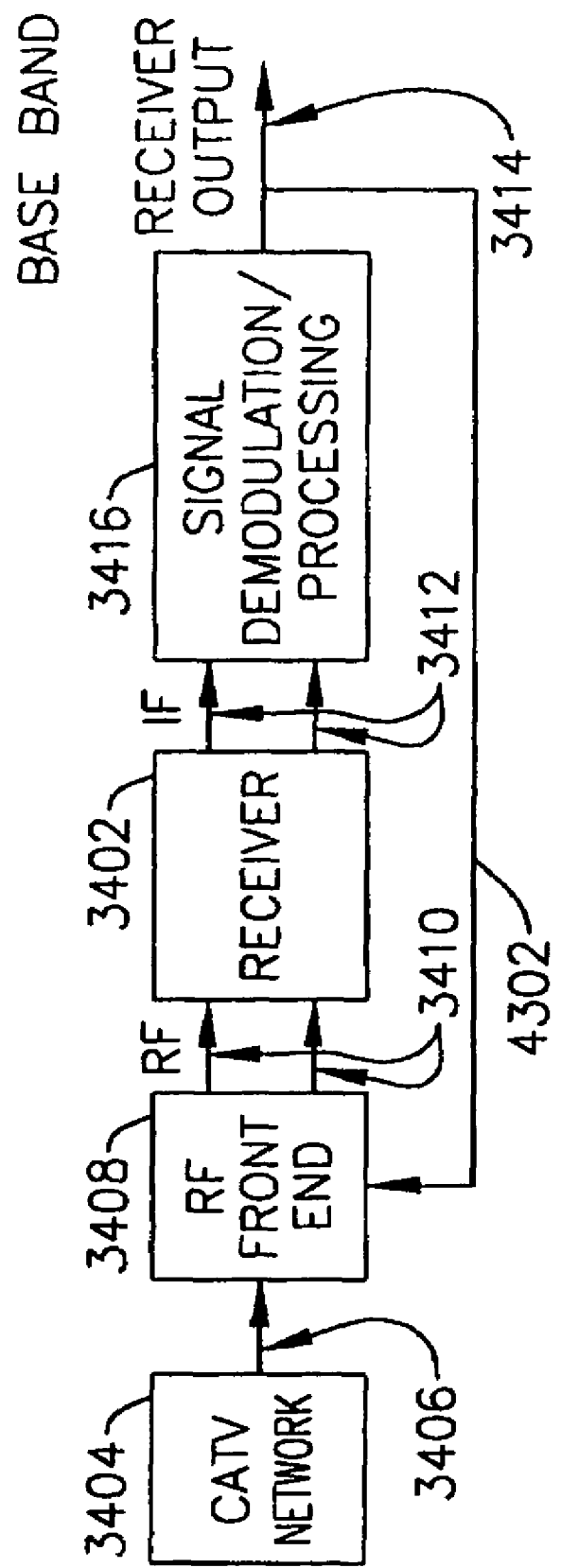

FIG. 34 is a block diagram of a communications network utilizing a receiver according to any one of the exemplary embodiments of the invention;

Receiver Front End-Programable Attenuator and LNA Figures

Figure 5:
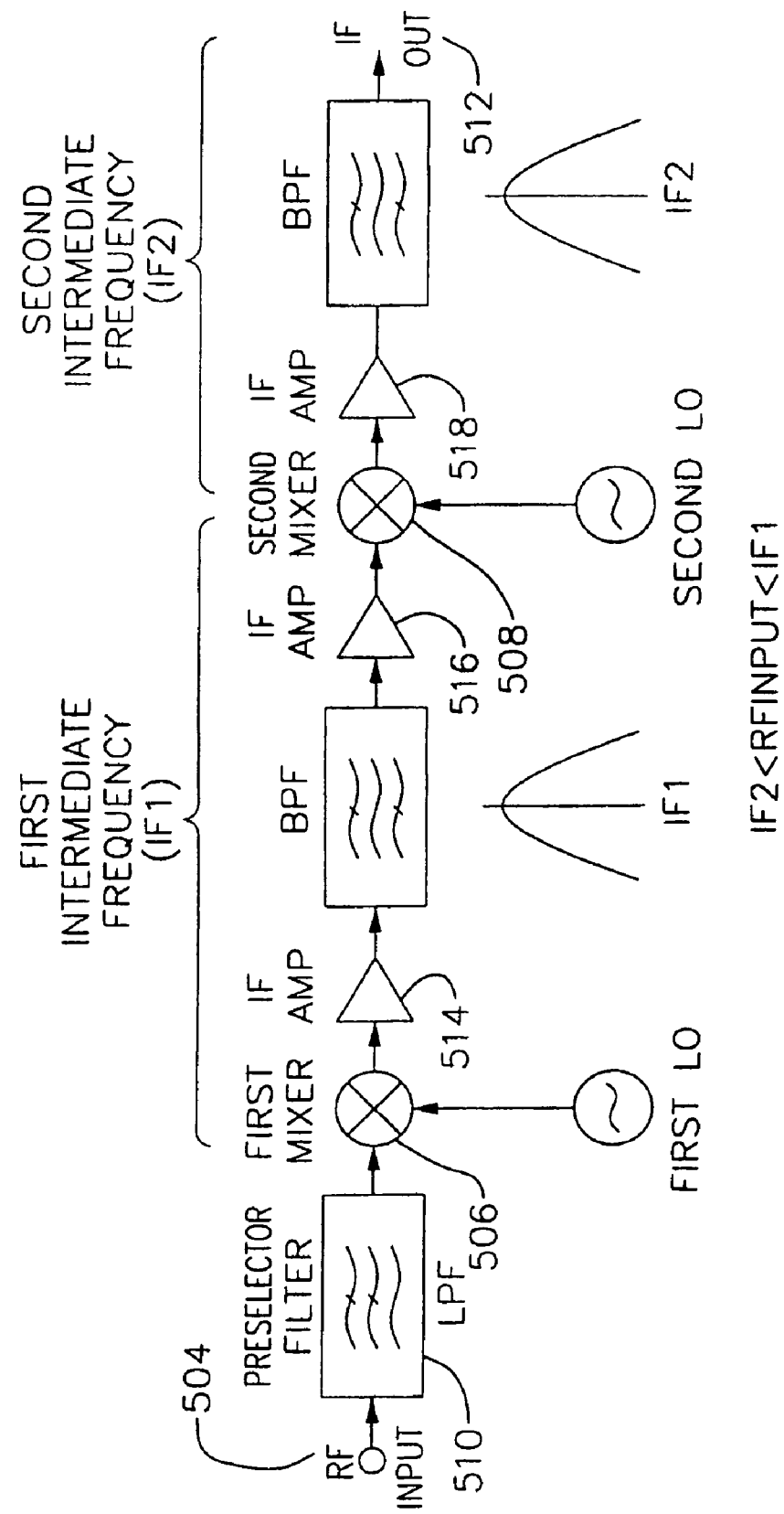
FIG. 5 is an illustration of a typical dual conversion receiver utilizing an up conversion and a subsequent down conversion.
Figure 35:
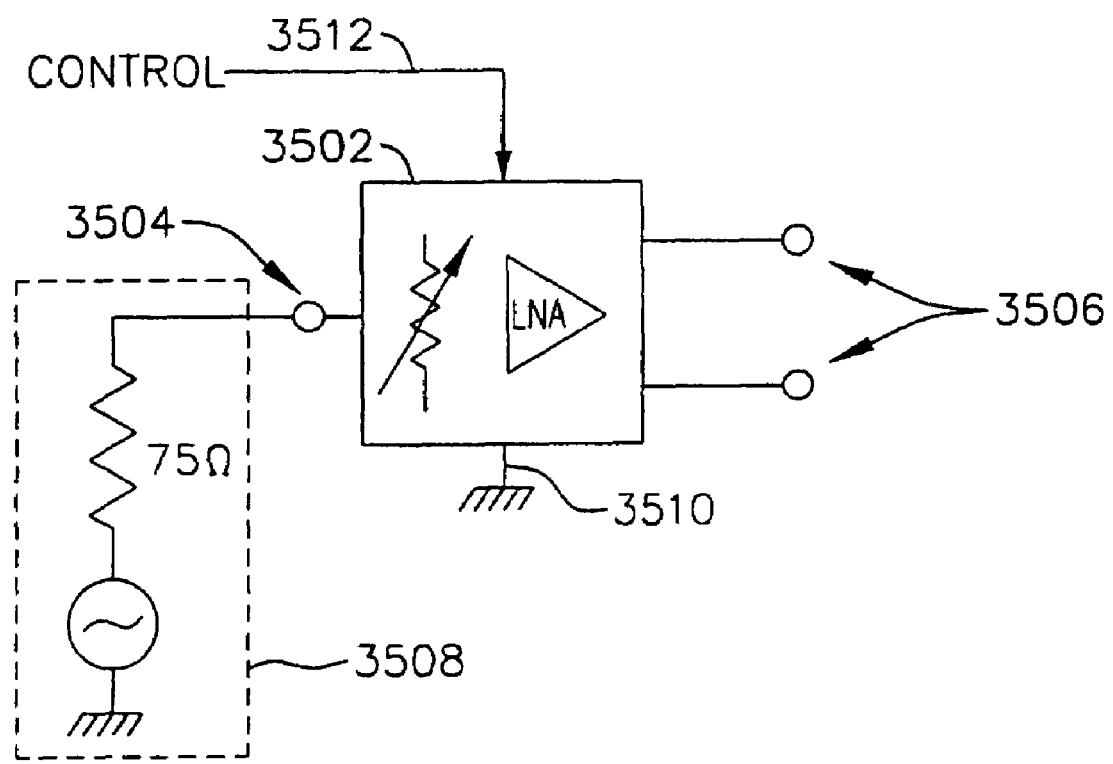
Figure 36:
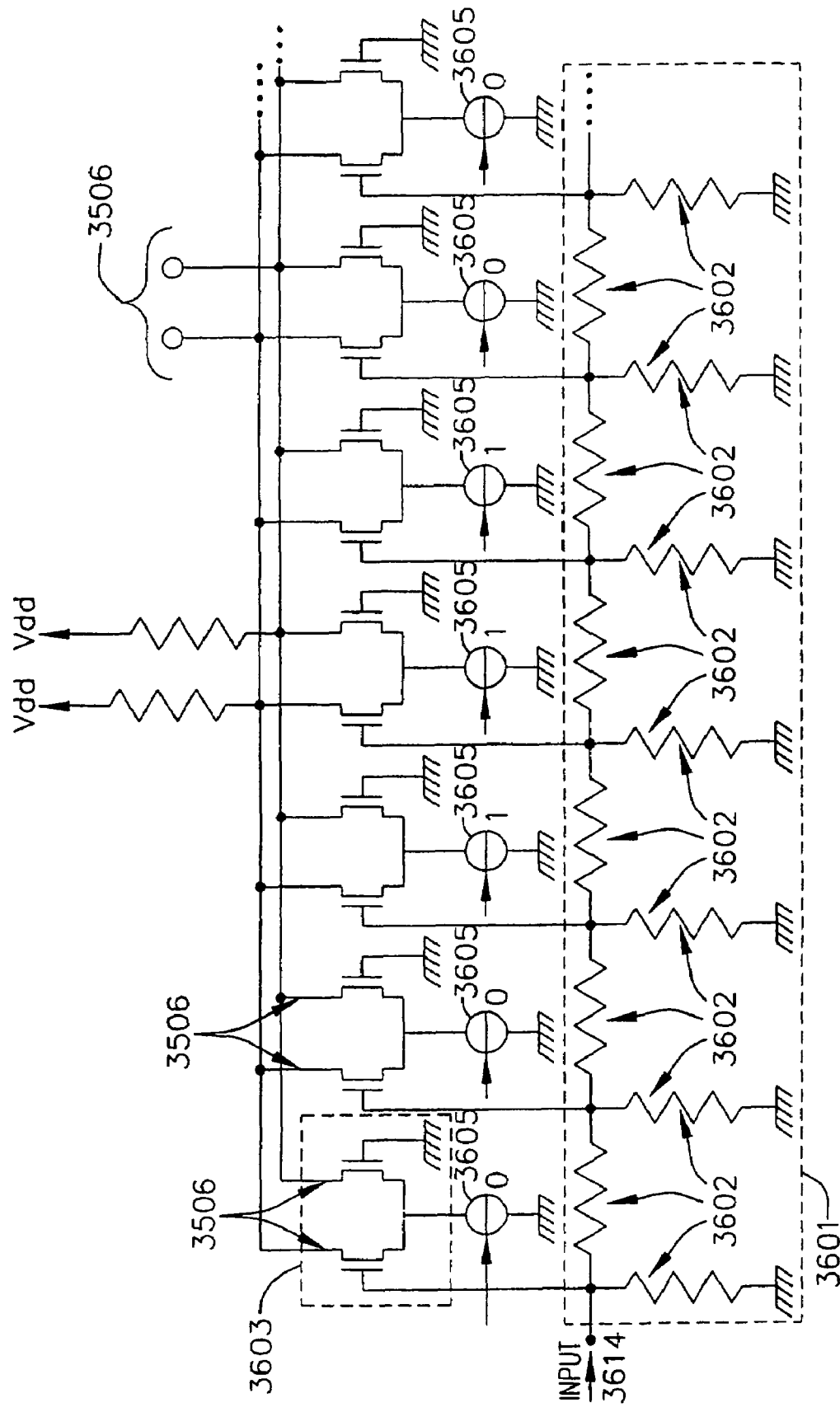
Figure 37:
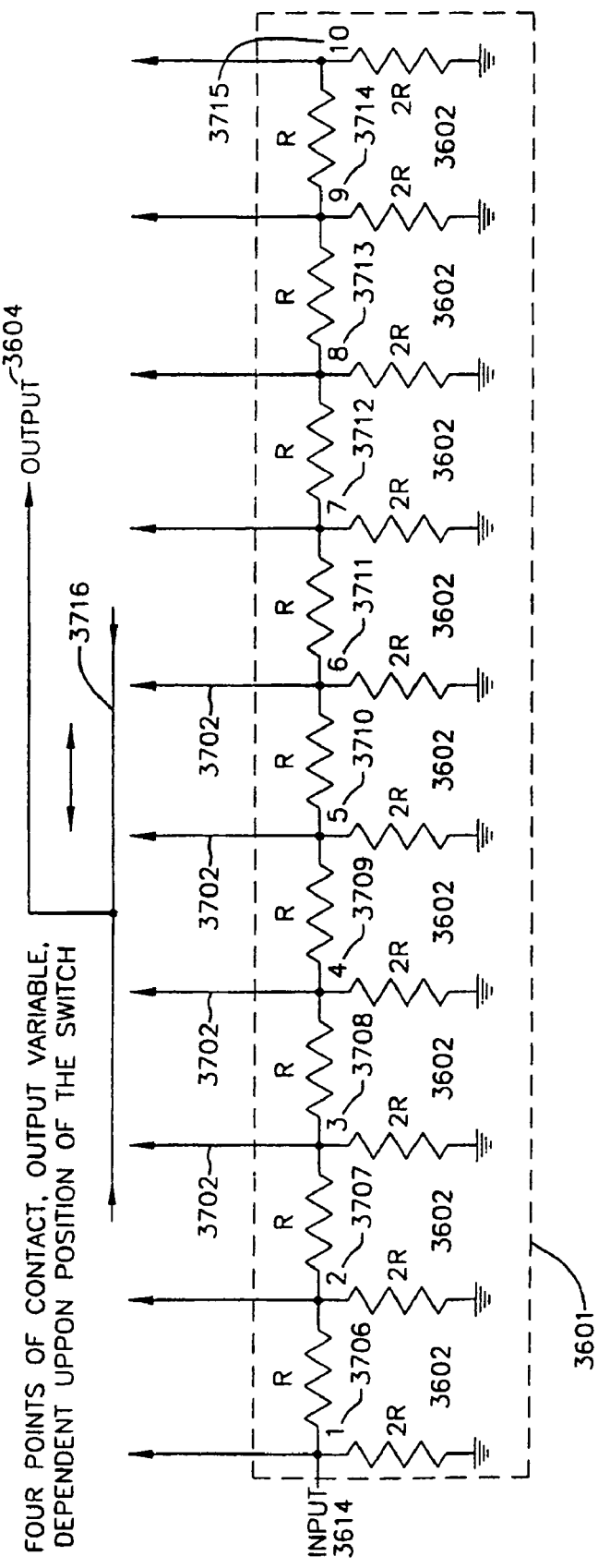
Figure 38:
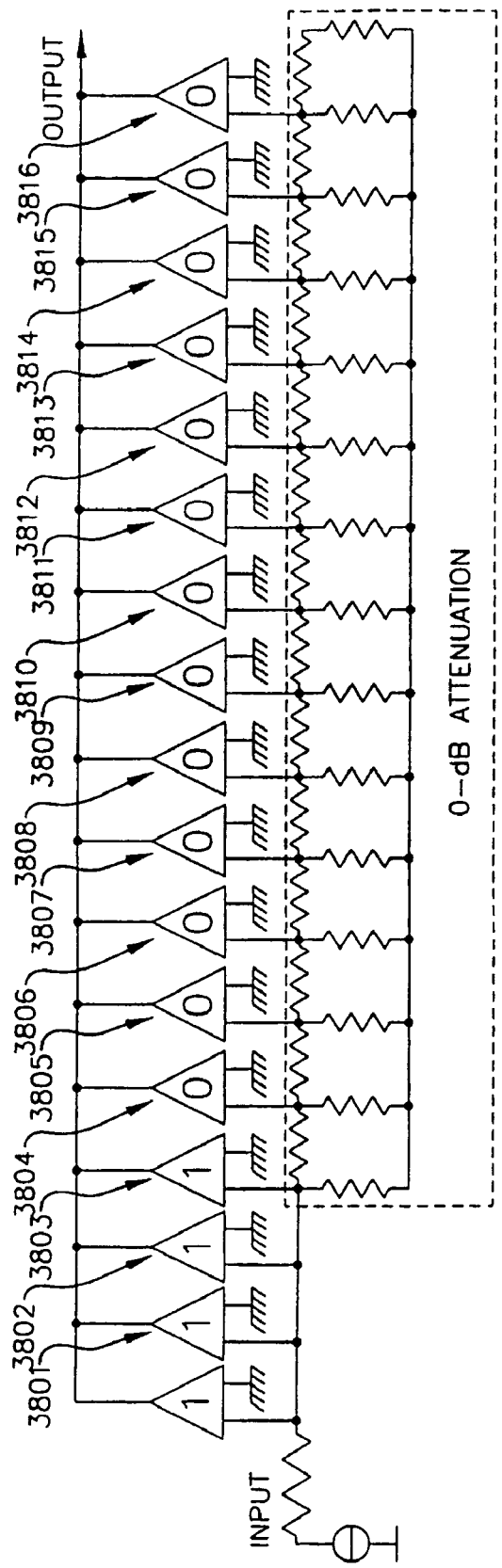
Figure 39:
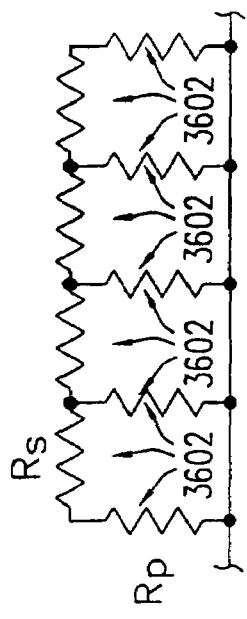
Figure 40:
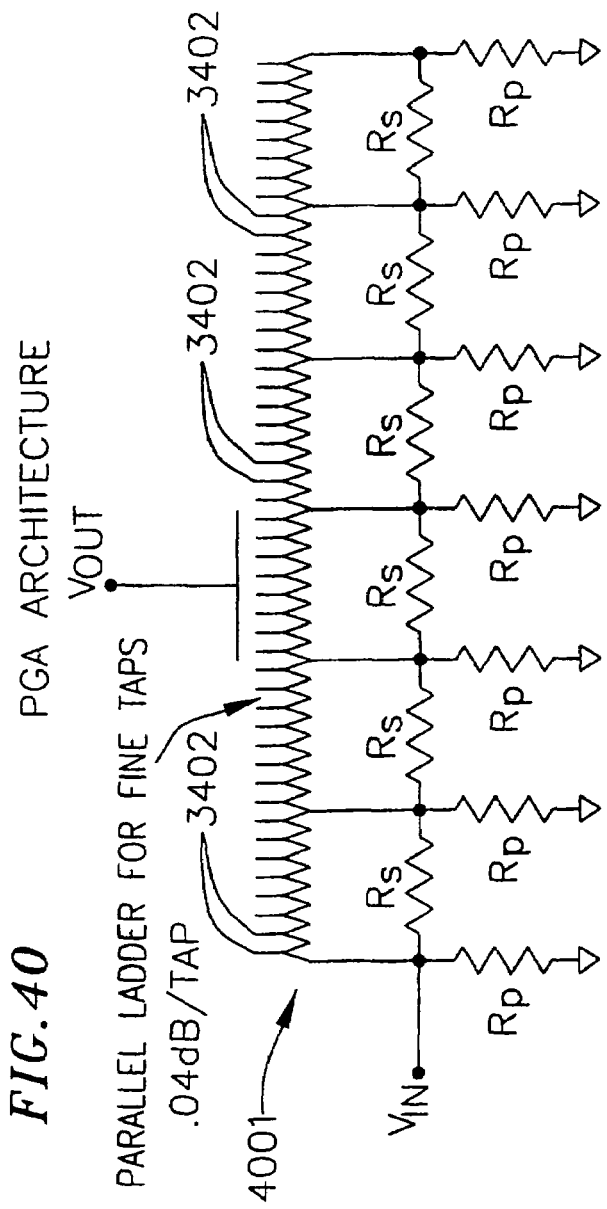
Figure 41:
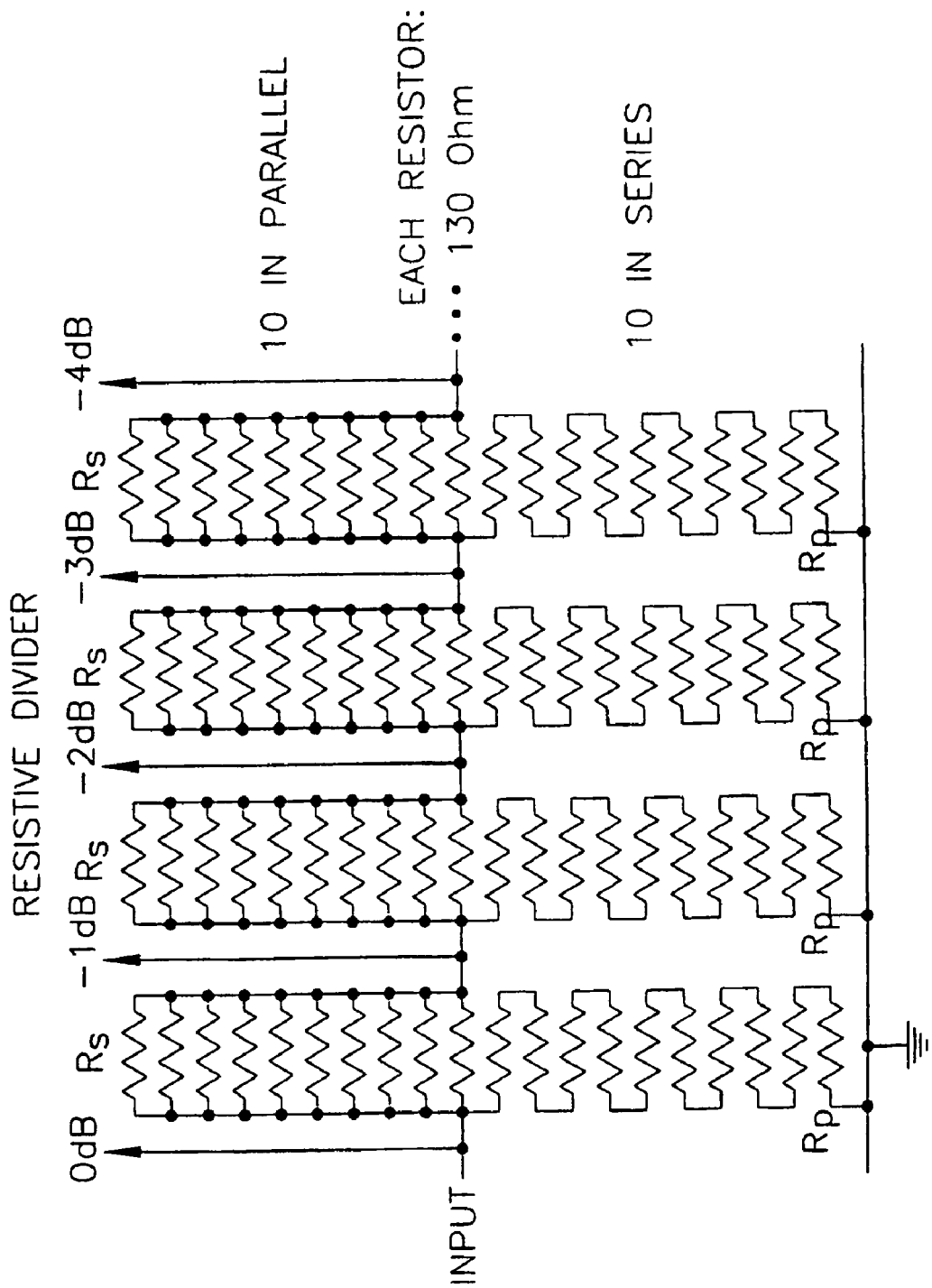
Figure 42:
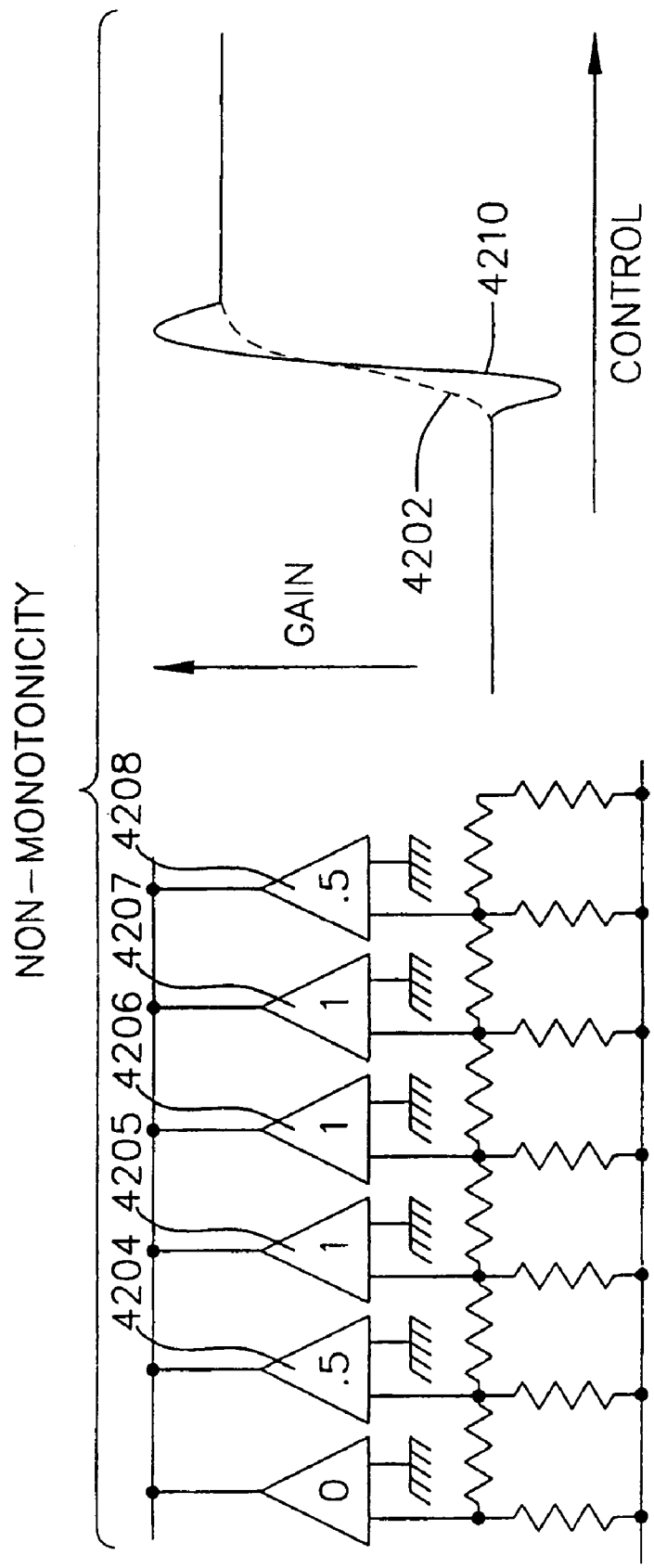
Figure 43:
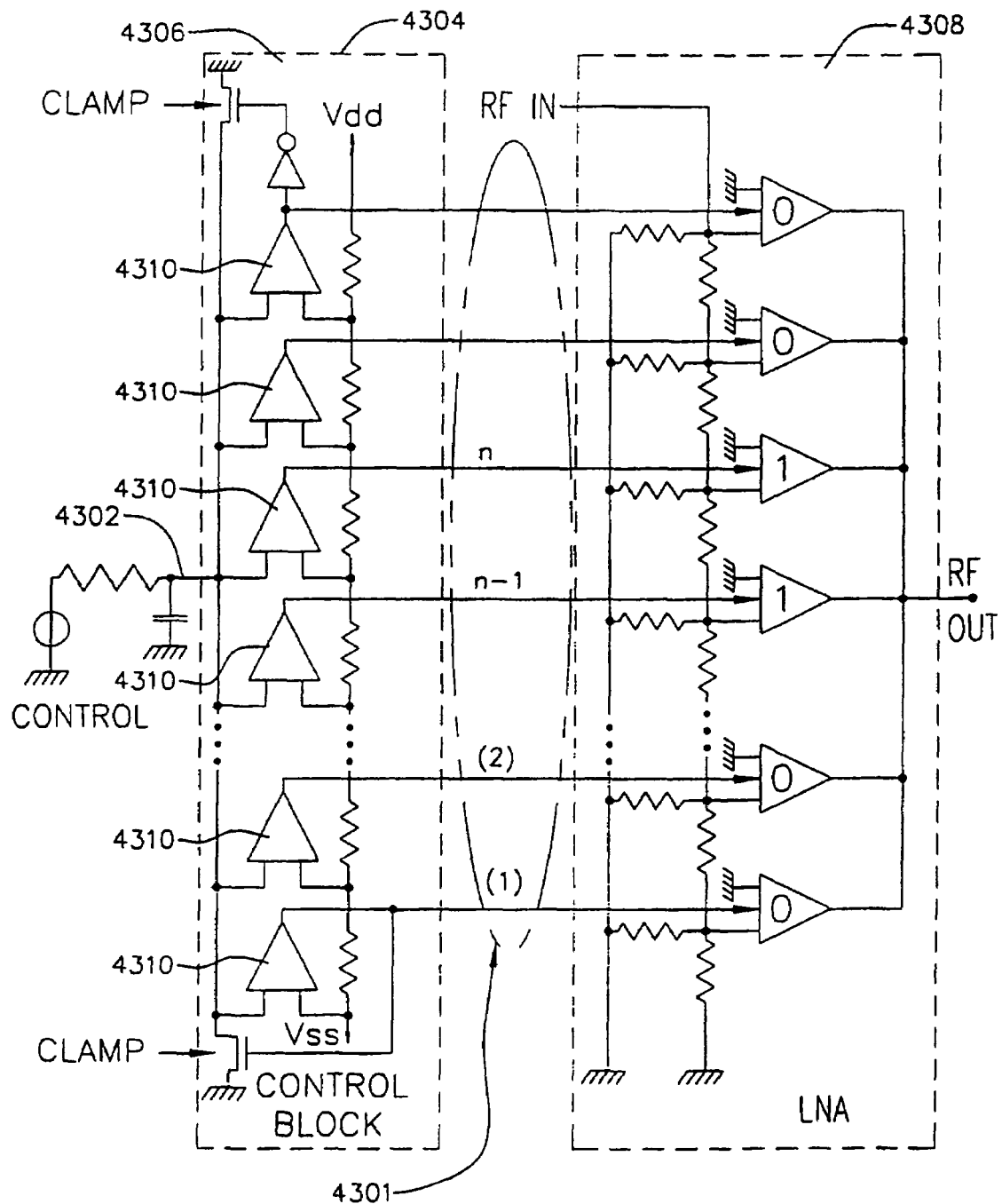
Figure 44B:
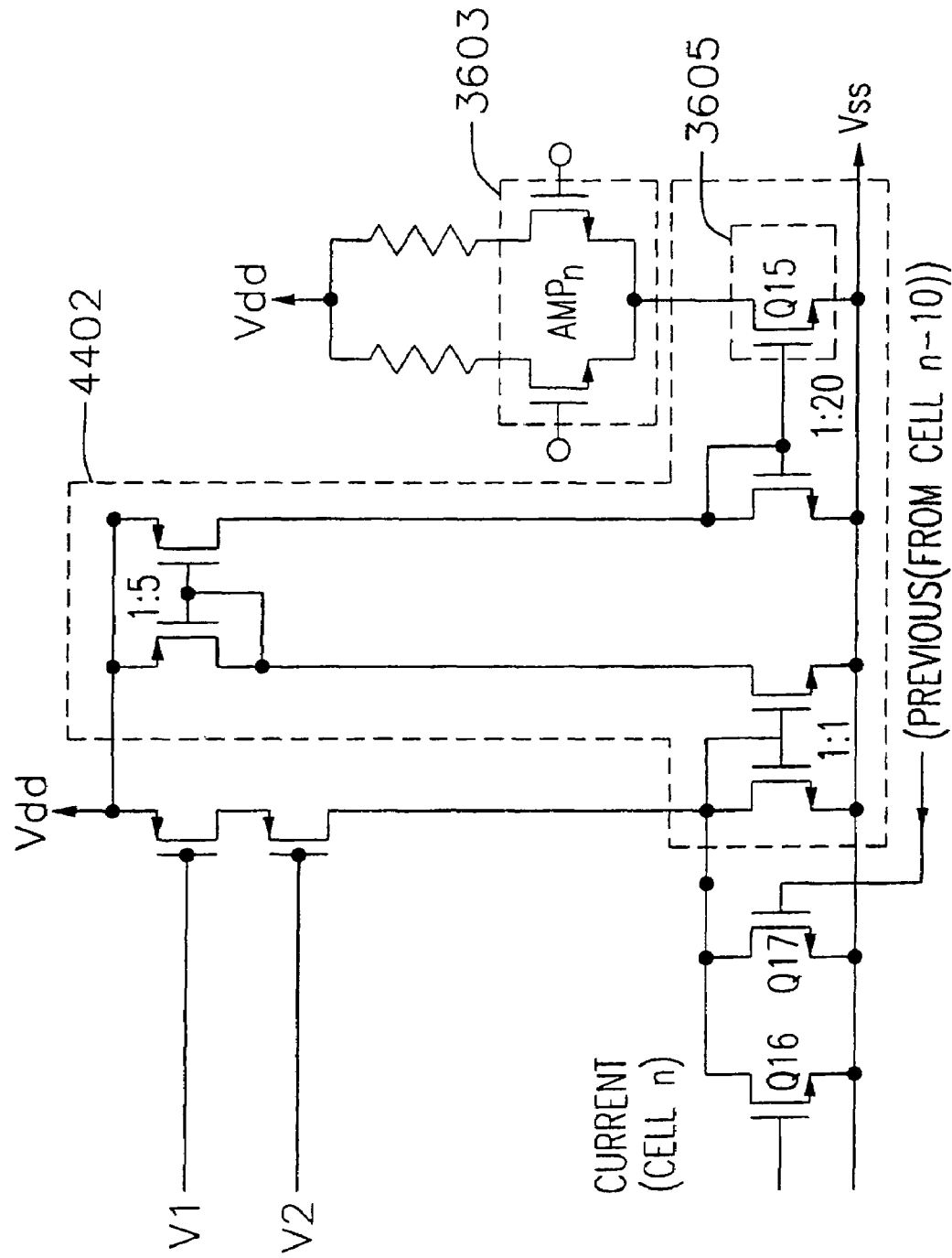

FIG. 35 is an is an illustration of the input and output signals of the integrated switchless programmable attenuator and low noise amplifier;

FIG. 36 is a functional block diagram of the integrated switchless programmable attenuator and low noise amplifier circuit;

FIG. 37 is a simplified diagram showing the connection of multiple attenuator sections to the output of the integrated switchless programmable attenuator and low noise amplifier;

FIG. 38 is an illustration of an exemplary embodiment showing how the attenuator can be removed from the circuit so that only the LNAs are connected;

FIG. 39 is an attenuator circuit used to achieve one dB per step attenuation;

FIG. 40 is an exemplary embodiment of an attenuator for achieving a finer resolution in attenuation then shown in FIG. 5;

FIG. 41 is an illustration of the construction of series and parallel resistors used in the attenuator circuit of the integrated switchless programmable attenuator and low noise amplifier;

FIG. 42 is an illustration of a preferred embodiment utilized to turn on current tails of the differential amplifiers;

FIG. 43 is an illustration of an embodiment showing how the individual control signals used to turn on individual differential pair amplifiers are generated from a single control signal;

FIG. 44 is an illustration of an embodiment of comparator circuitry used to activate individual LNA amplifier stages;

Local Oscillator Generation Figures

Figure 45:
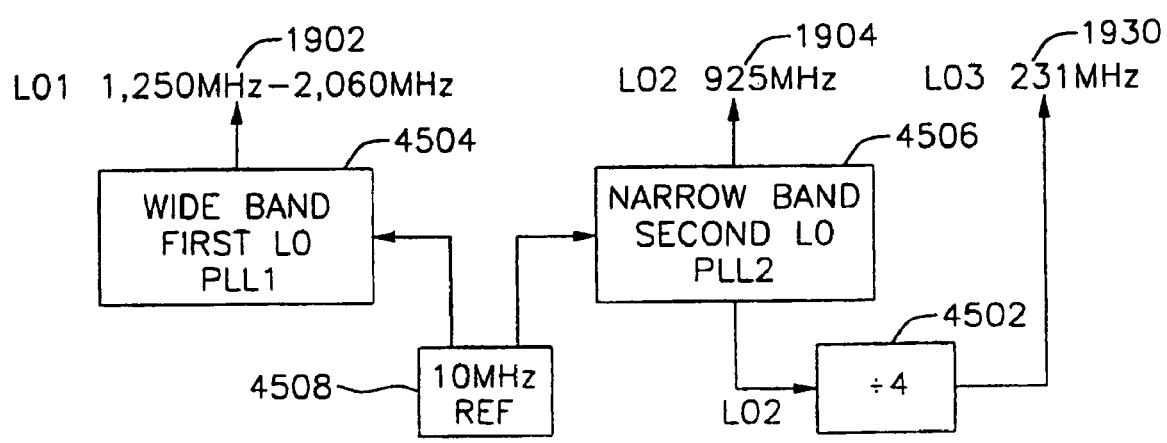

FIG. 45 is a block diagram illustrating the exemplary generation of the local oscillator signals utilized in the embodiments of the invention;

Narrow Band VCO Tuning Figures

Figure 46:
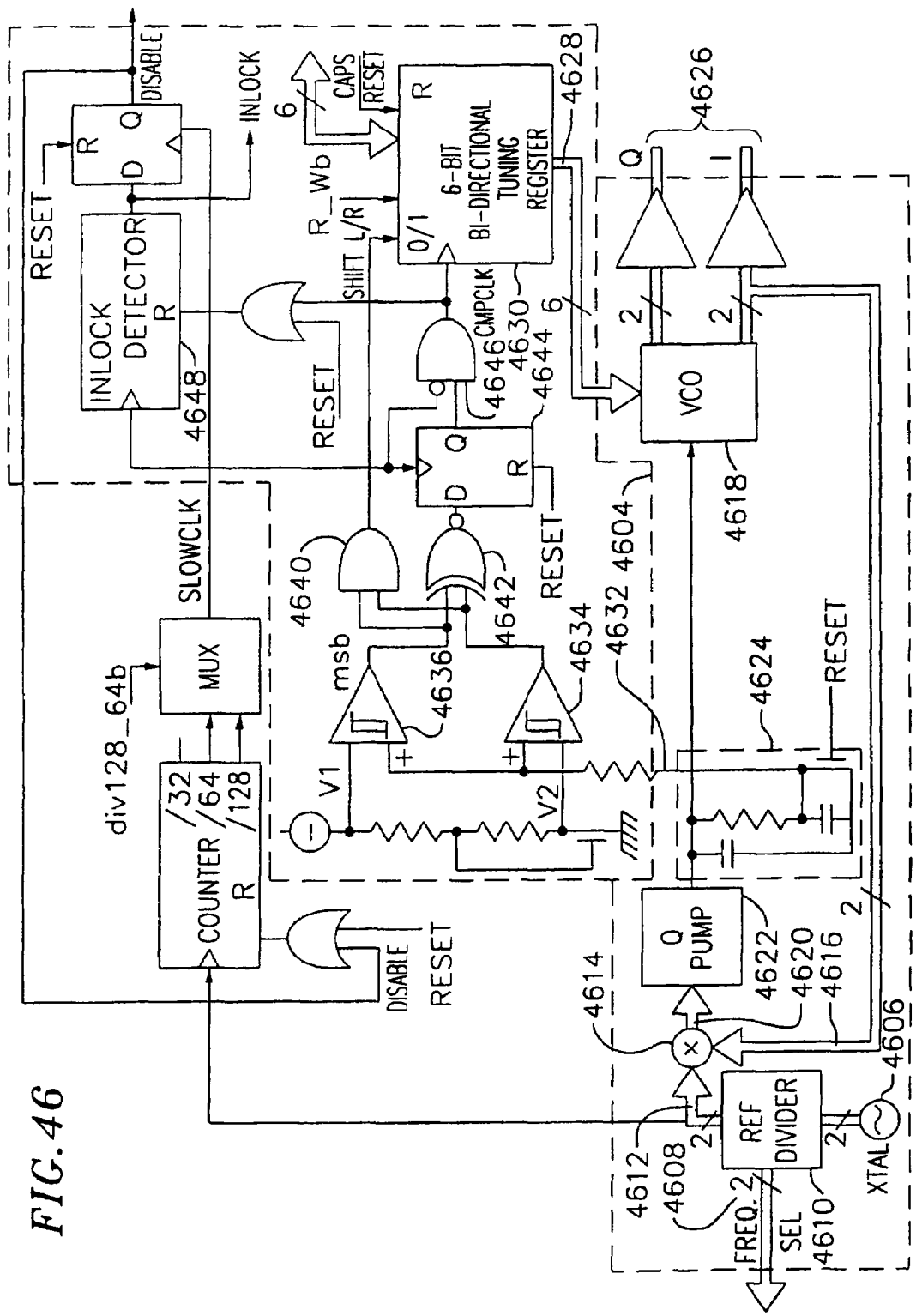
Figure 47:
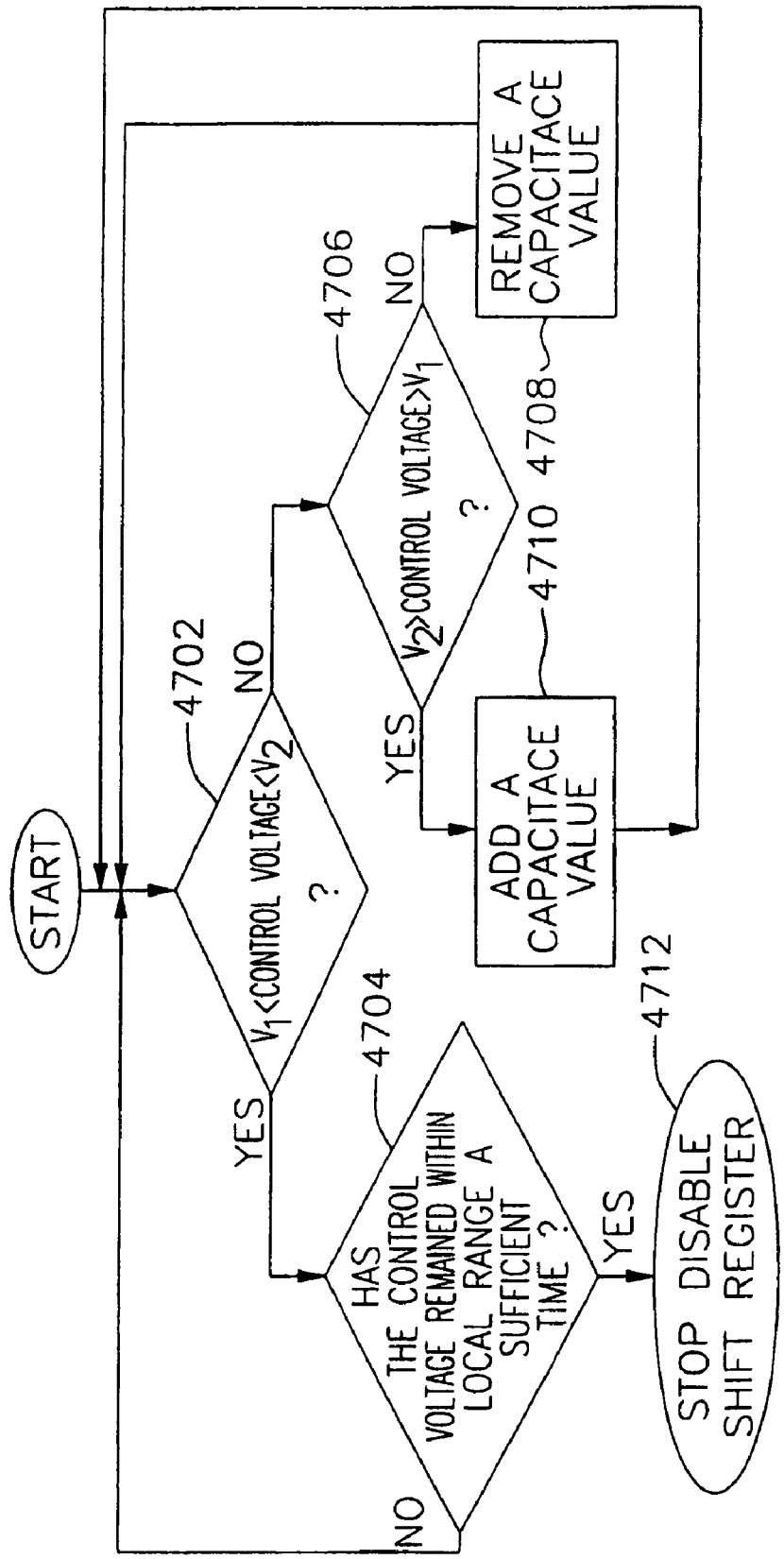

FIG. 46 is a schematic of a PLL having its VCO controlled by an embodiment of a VCO tuning control circuit;

FIG. 47 is a process flow diagram illustrating the process of tuning the VCO with an embodiment of a VCO control circuit;

Receiver Figures

Figure 48:
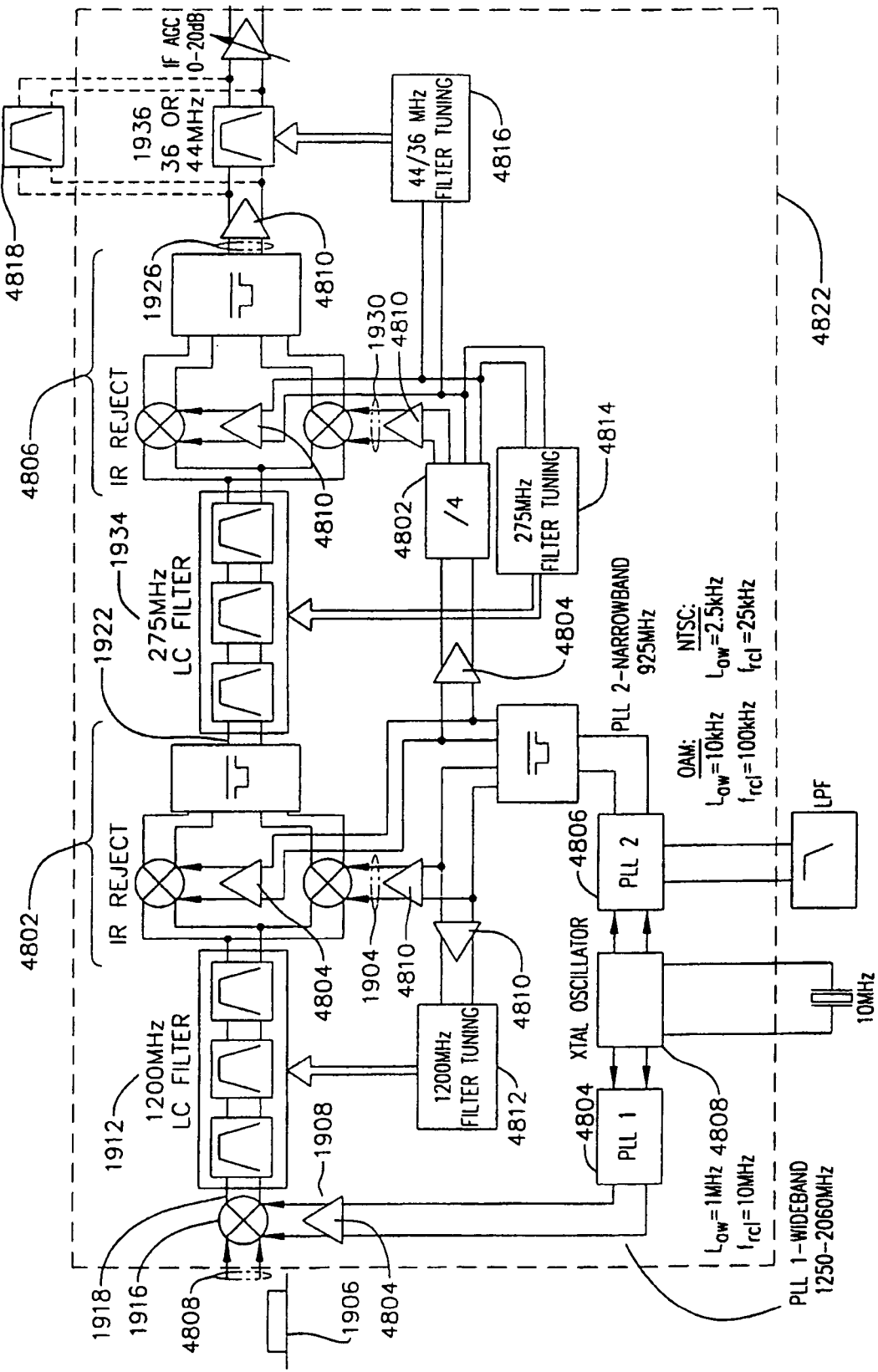
Figure 49:
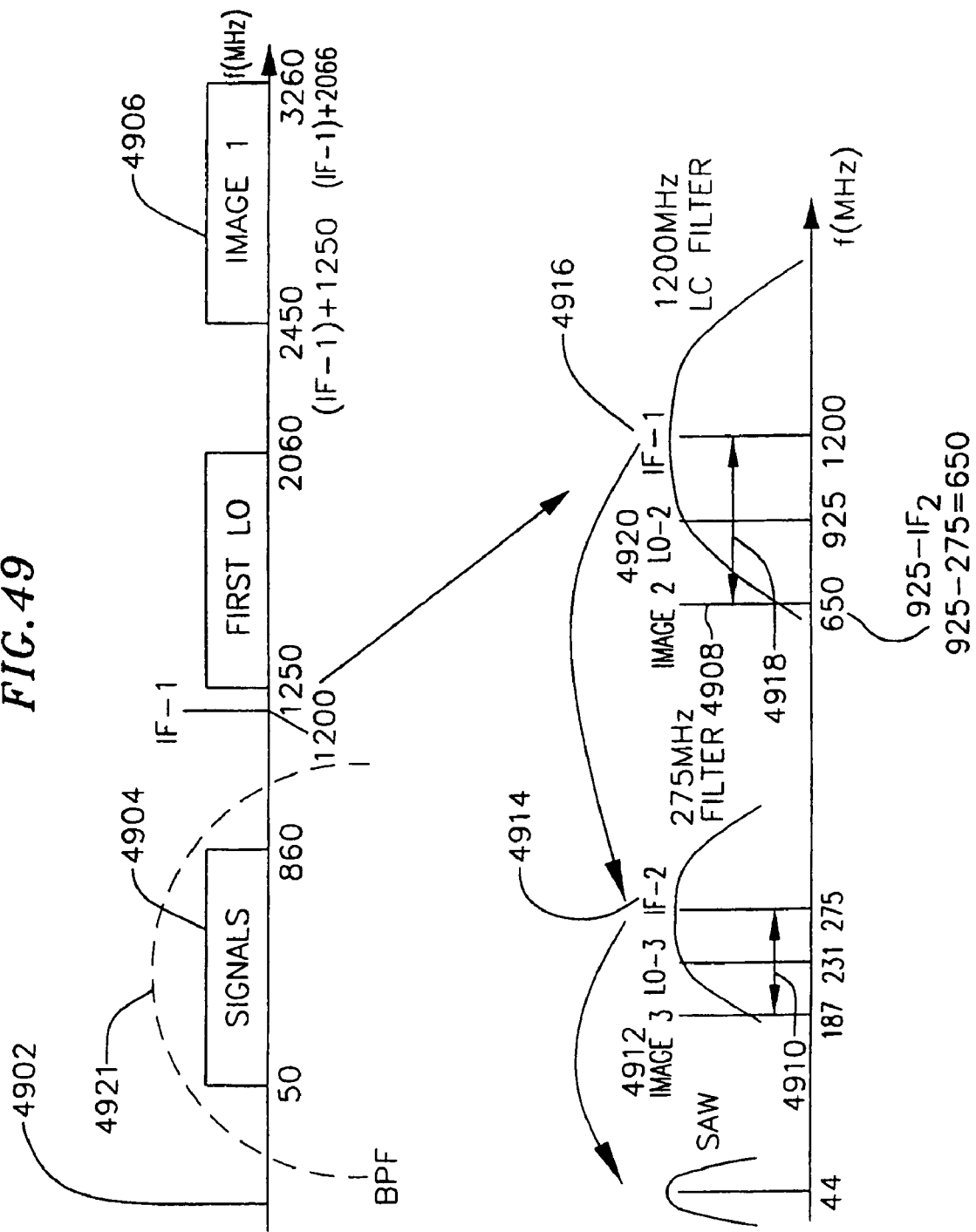
Figure 50:
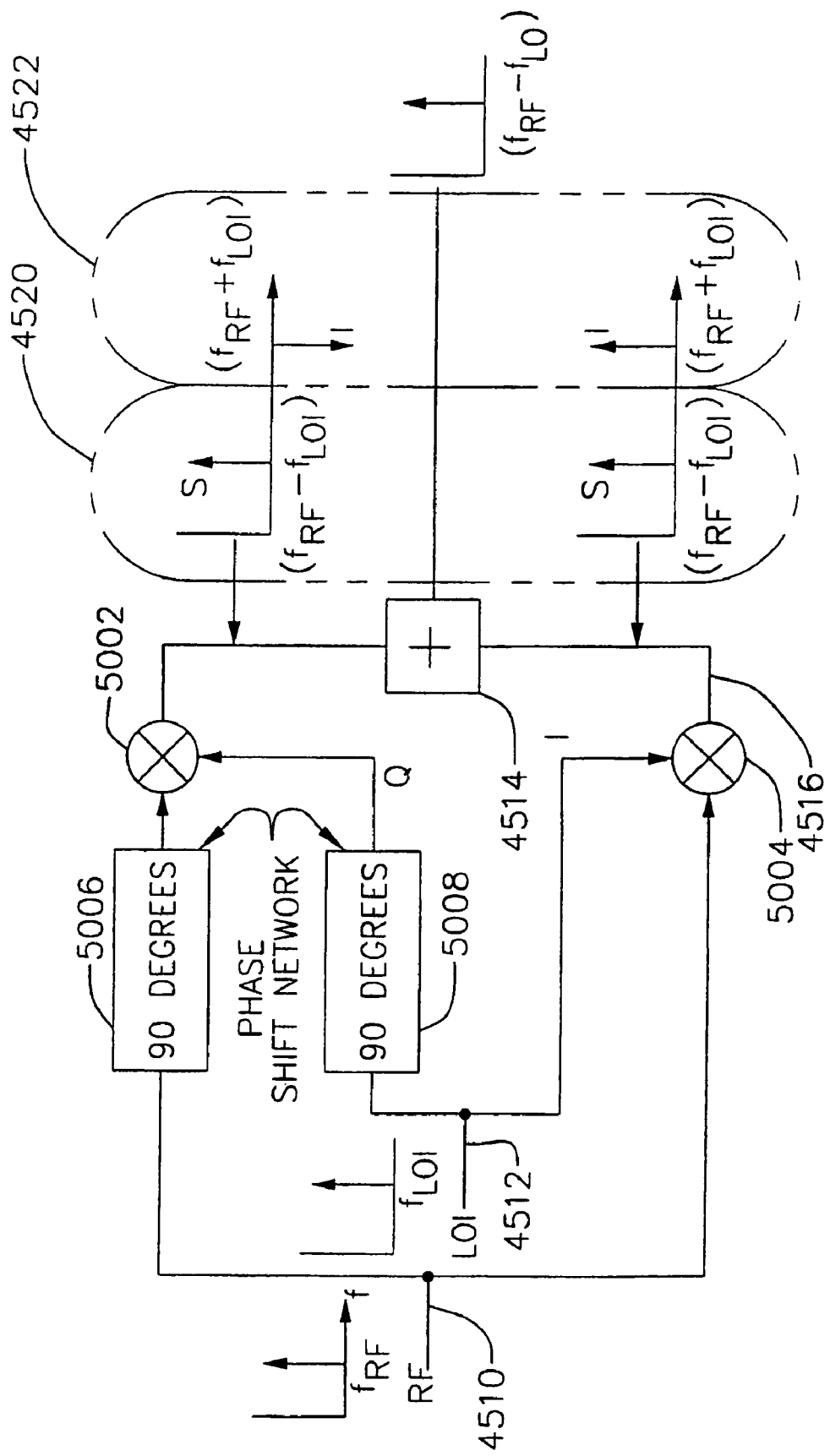
Figure 51:
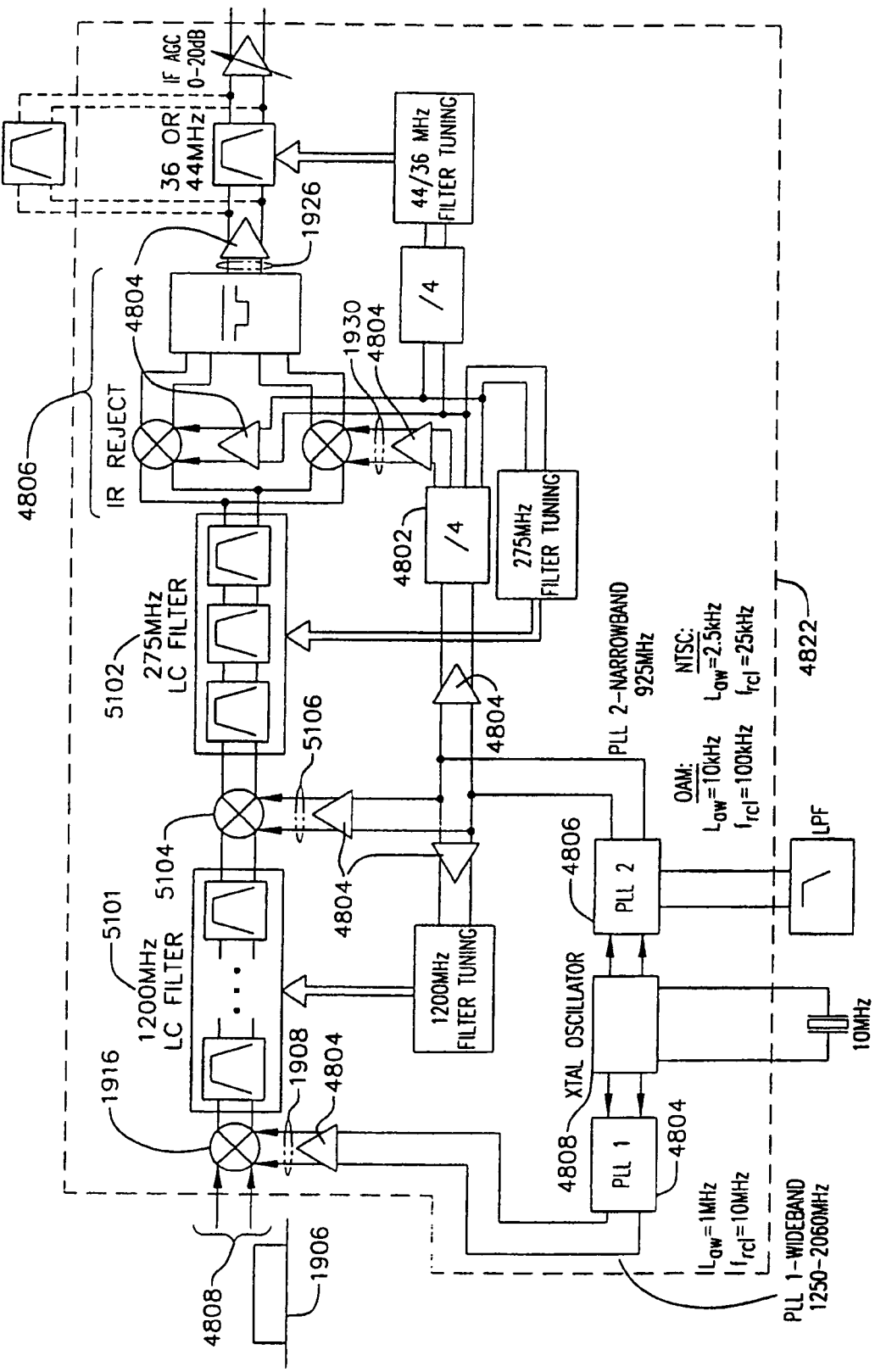
Figure 52:
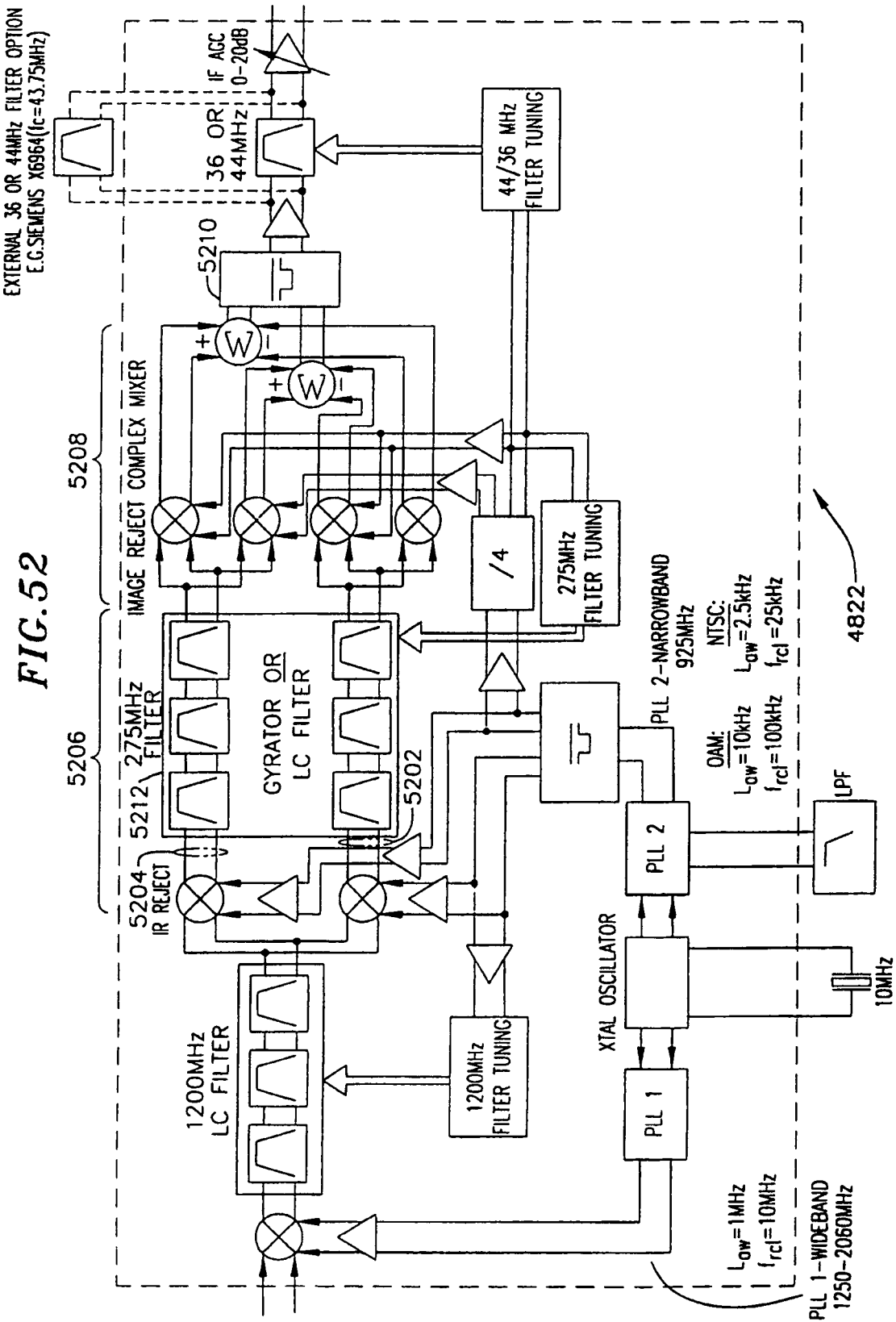
Figure 53:
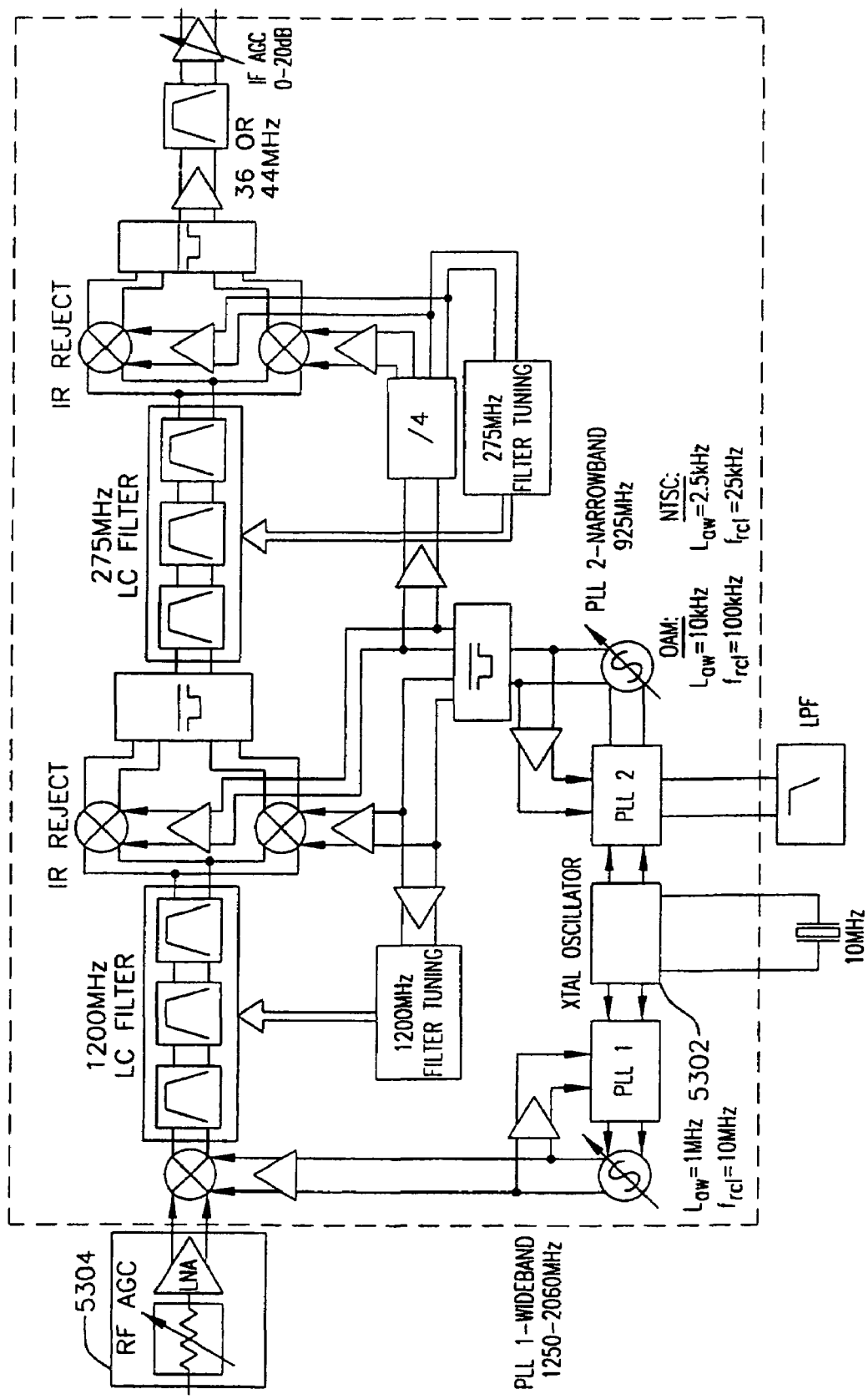
Figure 54:
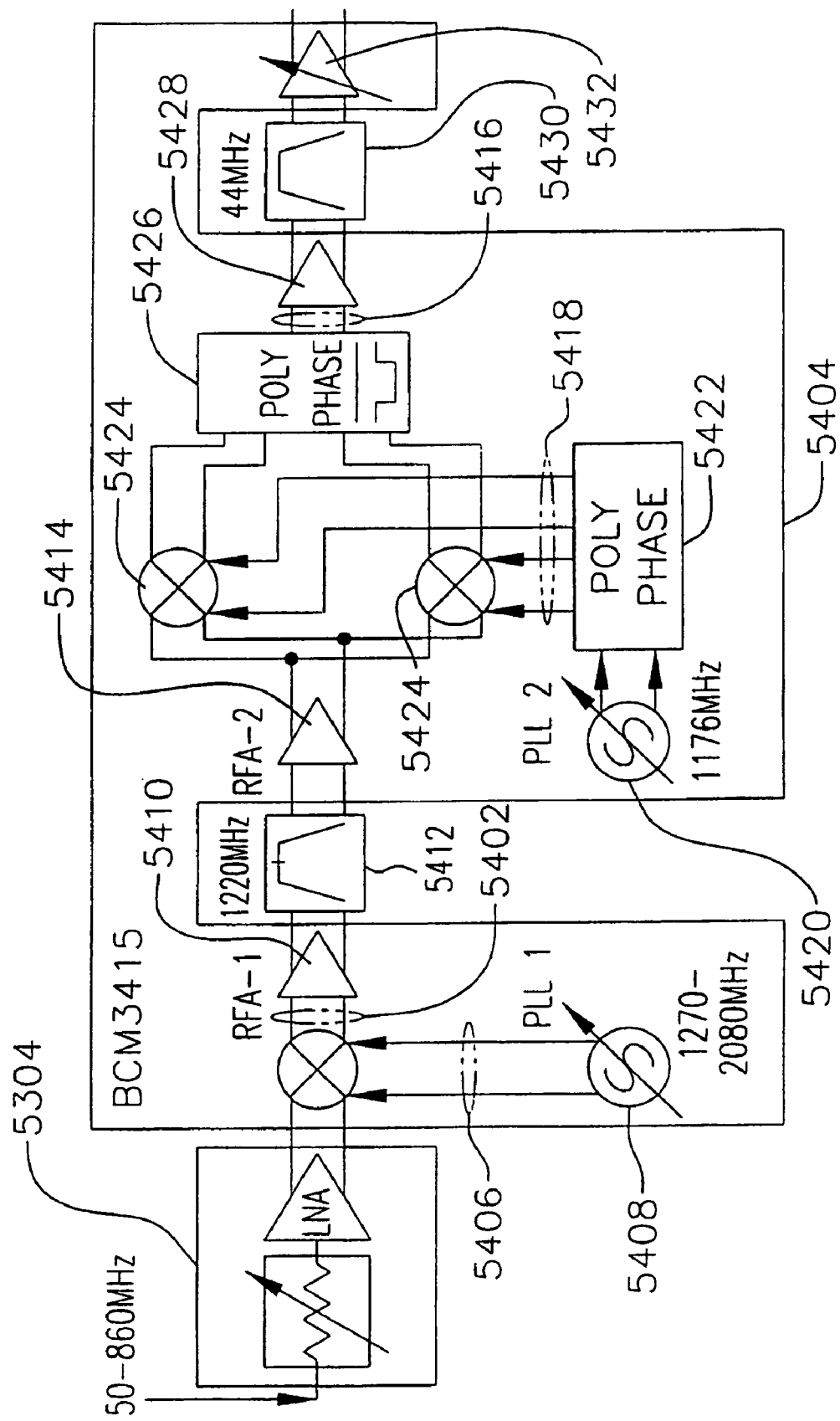

FIG. 48 is a block diagram of the first exemplary embodiment of the invention;

FIG. 49 is an illustration of the frequency planning utilized in the exemplary embodiments of the invention;

FIG. 50 is a block diagram showing how image frequency cancellation is achieved in an I/Q mixer;

FIG. 51 is a block diagram of the second exemplary embodiment of the present invention;

FIG. 52 is a block diagram of the third exemplary embodiment of the present invention;

FIG. 53 is a block diagram of a CATV tuner that incorporates the fully integrated tuner architecture; and Telephony Over Cable Embodiment Figure FIG. 54 is a block diagram of a low power embodiment of the receiver that has been configured to receive cable telephony signals.

Electronic Circuits Incorporating Embodiments of the Receiver FIGURES

Figure 55:
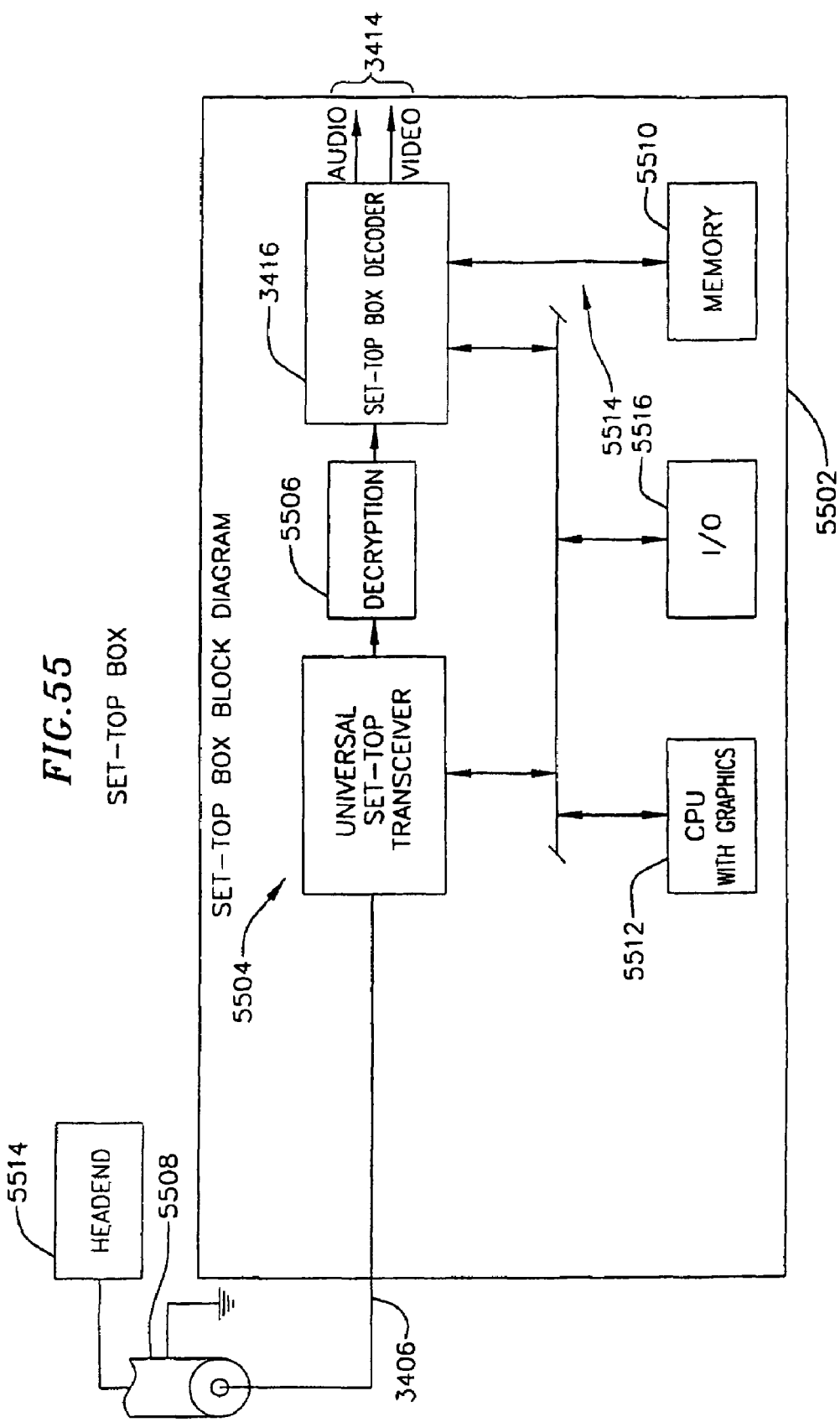
Figure 56:
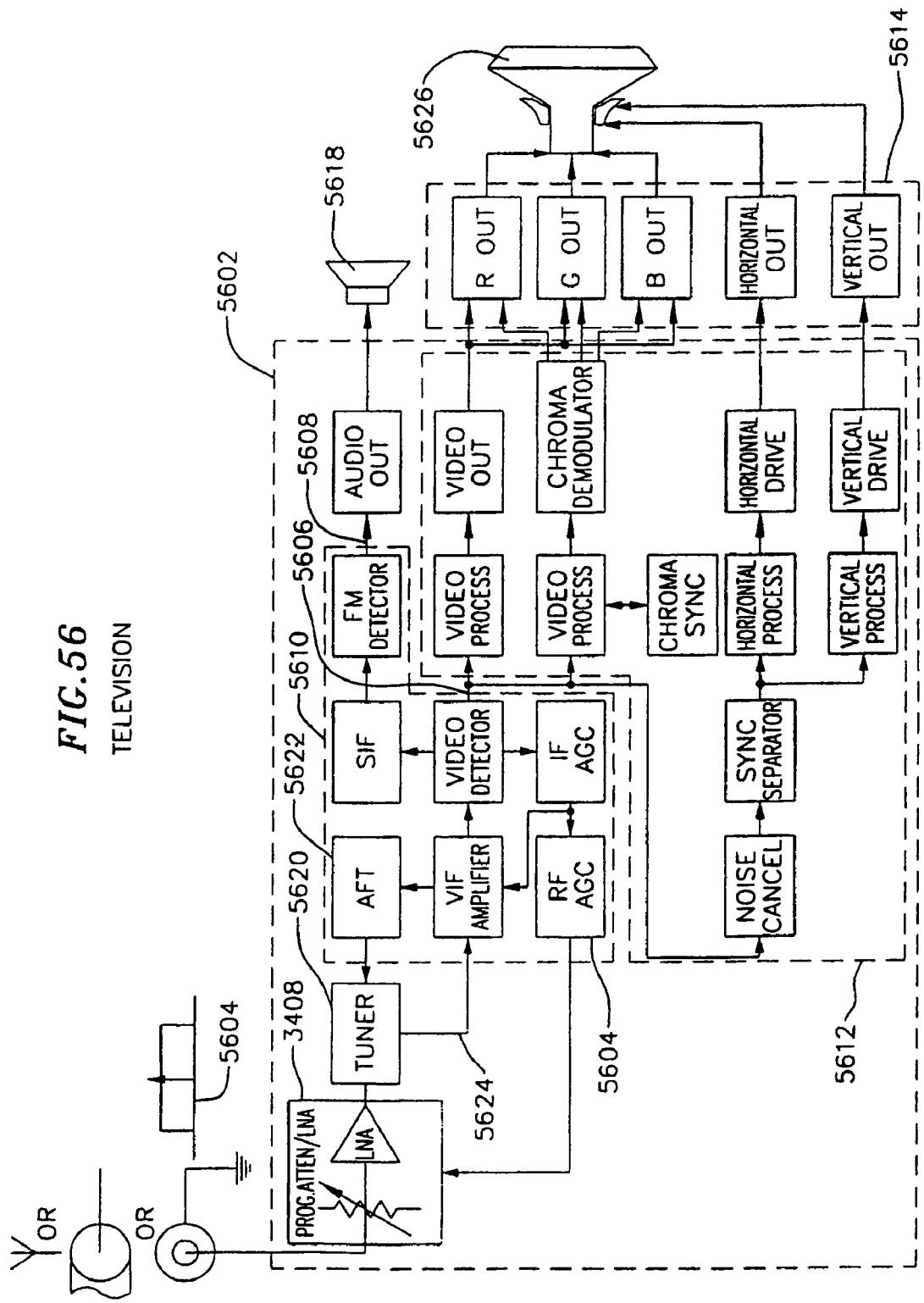
Figure 57:
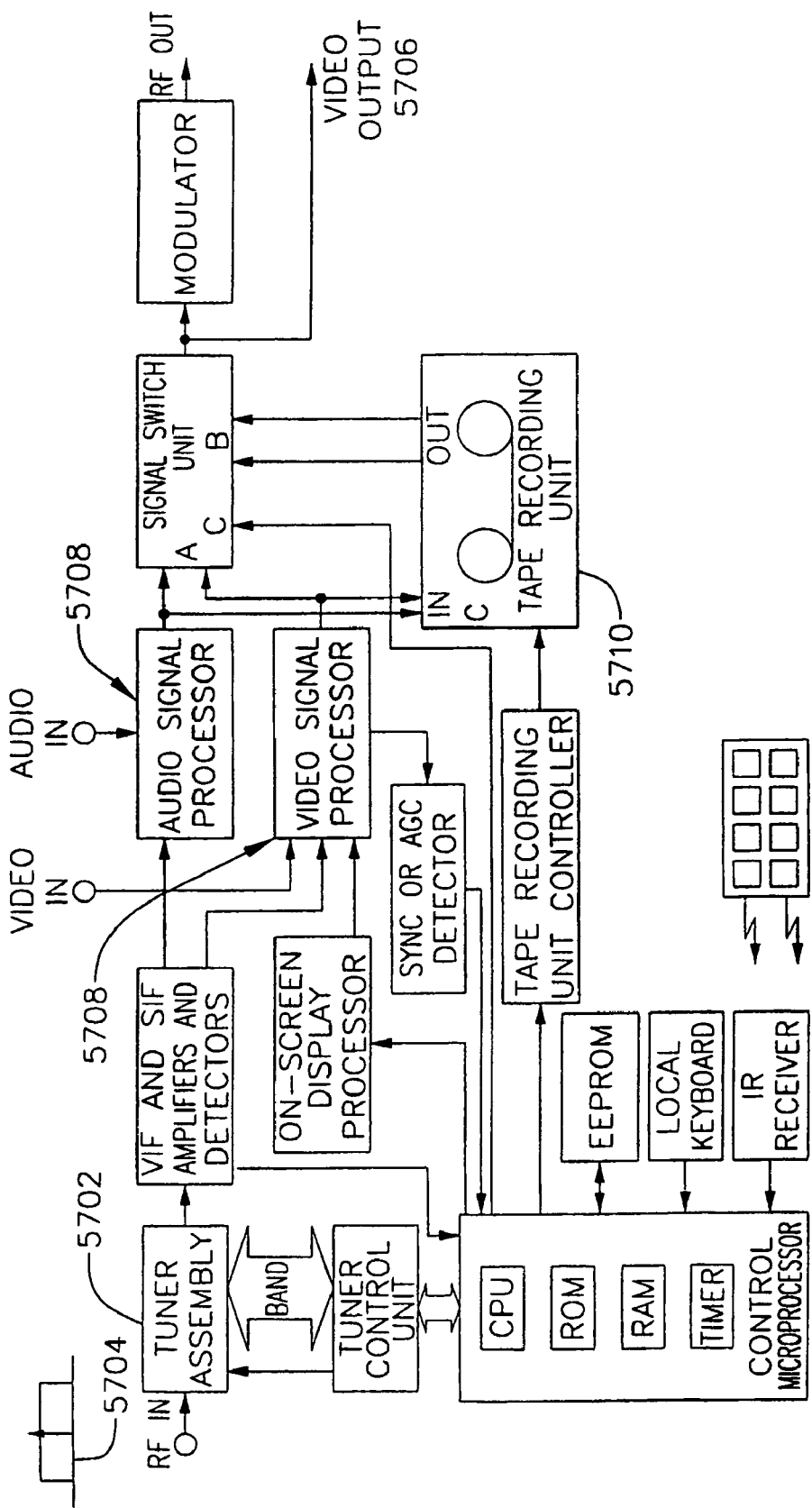
Figure 58:
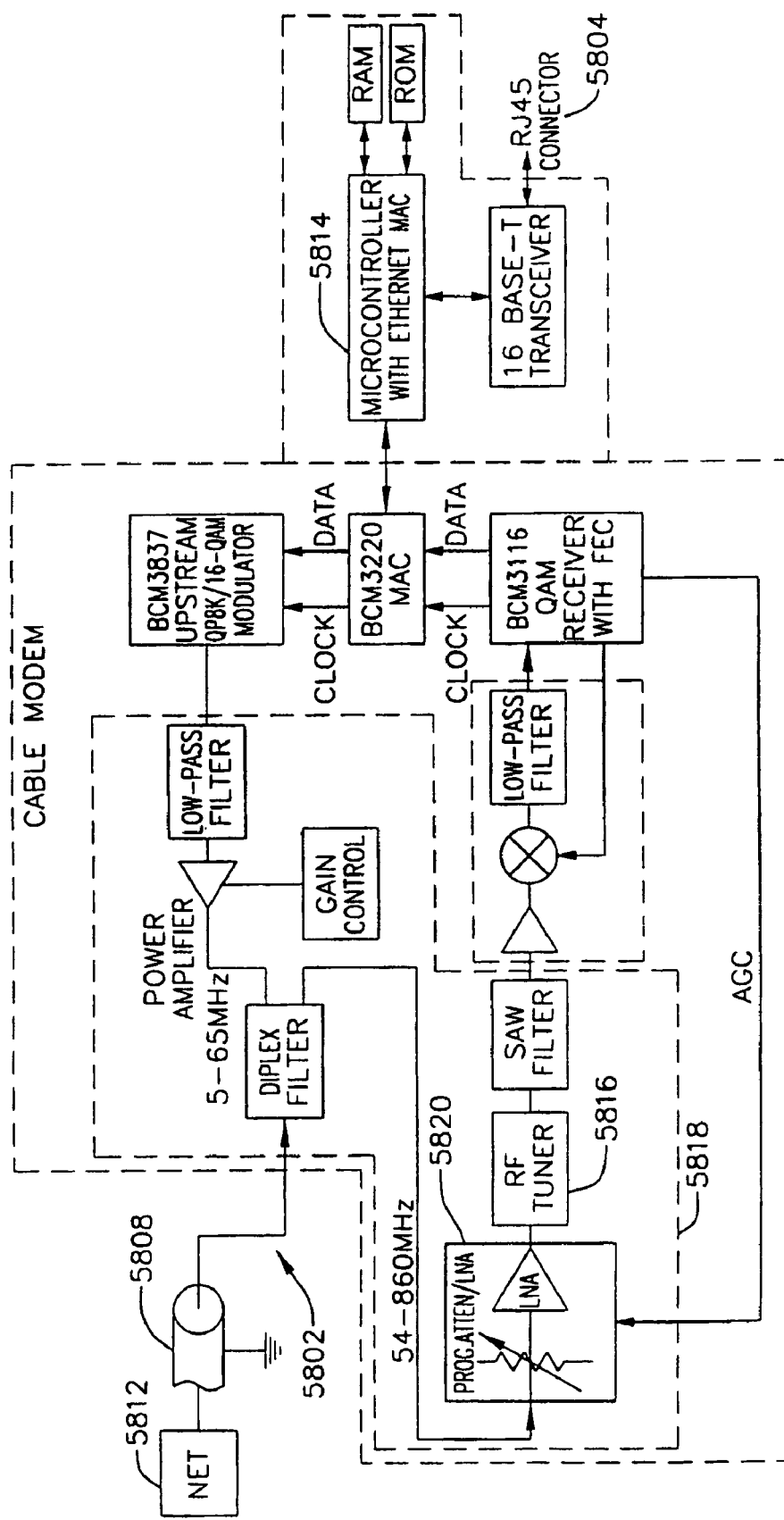

FIG. 55 is a block diagram of a set top box that incorporates the receiver embodiments;

FIG. 56 is a block diagram of a television that incorporates the receiver embodiments;

FIG. 57 is a block diagram of a VCR that incorporates the receiver embodiments; and FIG. 58 is a block diagram of a cable modem that incorporates the integrated switchless programmable attenuator and low noise amplifier.

DETAILED DESCRIPTION OF THE INVENTION

Figure 1:
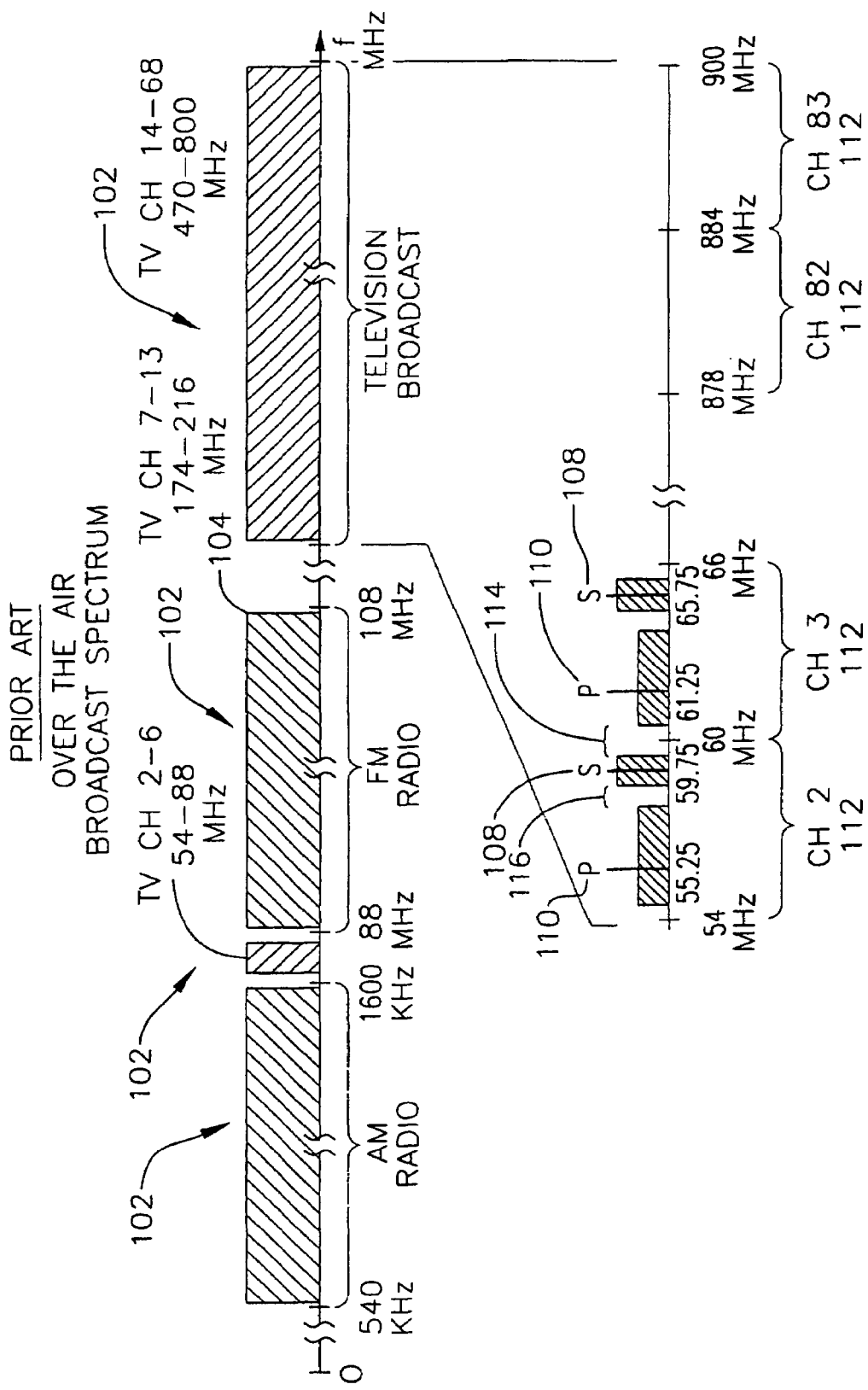
FIG. 1 is an illustration of a portion of the over-the-air broadcast spectrum allocations in the United States.

FIG. 1 is an illustration of a portion of the radio frequency spectrum allocations by the FCC. Transmission over a given media occurs at any one of a given range of frequencies that are suitable for transmission through a medium. A set of frequencies available for transmission over a medium are divided into frequency bands 102. Frequency bands are typically allocations of frequencies for certain types of transmission. For example FM radio broadcasts, FM being a type of modulation, is broadcast on the band of frequencies from 88 MHz to 108 MHz 104. Amplitude modulation (AM), another type of modulation, is allocated the frequency band of 540 kHz to 1,600 kHz 106. The frequency band for a type of transmission is typically subdivided into a number of channels. A channel 112 is a convenient way to refer to a range of frequencies allocated to a single broadcast station. A station broadcasting on a given channel may transmit one or more radio frequency (RF) signals within this band to convey the information of a broadcast. Thus, several frequencies transmitting within a given band may be used to convey information from a transmitter to a broadcast receiver. For example, a television broadcast channel broadcasts its audio signal(s) 108 on a frequency modulated (FM) carrier signal within the given channel. A TV picture (P) 110 is a separate signal broadcast using a type of amplitude modulation (AM) called vestigial side band modulation (VSB), and is transmitted within this channel.

In FIG. 1 channel allocations for a television broadcast band showing the locations of a picture and a sound carrier frequencies within a channel are shown. Each channel 112 for television has an allocated fixed bandwidth of 6 MHz. The picture 110 and sound 108 carriers are assigned a fixed position relative to each other within the 6 MHz band. This positioning is not a random selection. The picture and sound carriers each require a predetermined range of frequencies, or a bandwidth (BW) to sufficiently transmit the desired information. Thus, a channel width is a fixed 6 MHz, with the picture and sound carrier position fixed within that 6 MHz band, and each carrier is allocated a certain bandwidth to transmit its signal.

In FIG. 1 it is seen that there are gaps between channels 114, and also between carrier signals 116. It is necessary to leave gaps of unused frequencies between the carriers and between the channels to prevent interference between channels and between carriers within a given channel. This interference primarily arises in the receiver circuit that is used to receive these radio frequency signals, convert them to a usable frequency, and subsequently demodulate them.

Providing a signal spacing allows the practical design and implementation of a receiver without placing unrealistic requirements on the components in the receiver. The spaces help prevent fluctuations in the transmission frequency or spurious responses that are unwanted byproducts of the transmission not to cause interference and signal degradation within the receiver. Also, signal spacing allows the design requirements of frequency selective circuits in the receiver to be relaxed, so that the receiver may be built economically while still providing satisfactory performance. These spectrum allocations and spacings were primarily formulated when the state of the art in receiver design consisted of discrete components spaced relatively far apart on a printed circuit board. The increasing trend towards miniaturization has challenged these earlier assumptions. The state of the art in integrated circuit receiver design has advanced such that satisfactory performance must be achieved in light of the existing spectrum allocations and circuit component crowding on the integrated circuit. New ways of applying existing technology, as well as new technology are continually being applied to realize a miniaturized integrated receiver that provides satisfactory performance. Selectivity is a principal measure of receiver performance. Designing for sufficient selectivity not only involves rejecting other channels, but the rejection of distortion products that are created in the receiver or are part of the received signal. Design for minimization or elimination of spurious responses is a major objective in state of the art receiver design.

Figure 2:
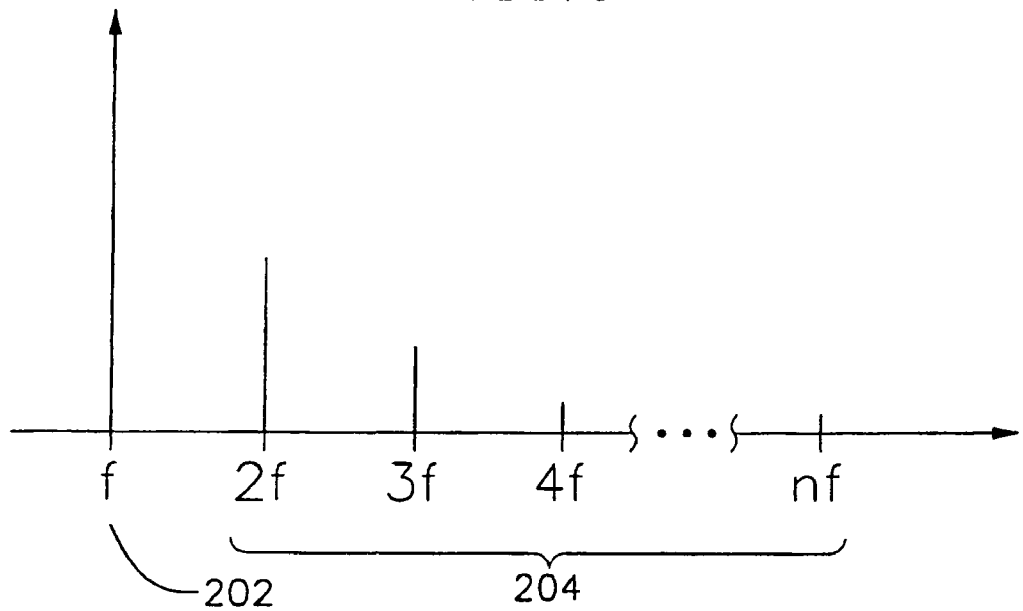
FIG. 2 is an illustration of the frequency spectrum of harmonic distortion products.

FIG. 2 is an illustration of harmonic distortion products. Transmitted spurious signals, and spurious signals generated in a receiver, most commonly consist of harmonics created by one frequency and intermodulation distortion, created by the interaction of multiple frequencies. Spurious signals at other than the desired frequency arise from the inherent nonlinear properties in the circuit components used. These nonlinearities can not be eliminated, but by careful engineering the circuitry can be designed to operate in a substantially linear fashion.

When a single frequency called a fundamental 202 is generated, unwanted spurious signals 204 are always generated with this fundamental. The spurious signals produced as a result of generating a single frequency (f) 202 are called harmonics 204 and occur at integer multiples of the fundamental frequency ($2f, 3f, \ldots$) The signal strength or amplitude of these harmonics decrease with increasing harmonic frequency. Fortunately these distortion products fall one or more octaves away from the desired signal, and can usually be satisfactorily filtered out with a low pass filter that blocks all frequencies above a pre-selected cut-off frequency. However, if the receiver is a wide band or multi octave bandwidth receiver, these harmonics will fall within the bandwidth of the receiver and cannot be low pass filtered, without also filtering out some of the desired signals. In this case, other methods known to those skilled in the art, such as reducing the distortion products produced, must be used to eliminate this distortion.

Radio signals do not exist in isolation. The radio frequency spectrum is populated by many channels within a given band transmitting at various frequencies. When a radio circuit is presented with two or more frequencies, these frequencies interact, or intermodulate, to create distortion products that occur at known frequency locations.

Figure 3:
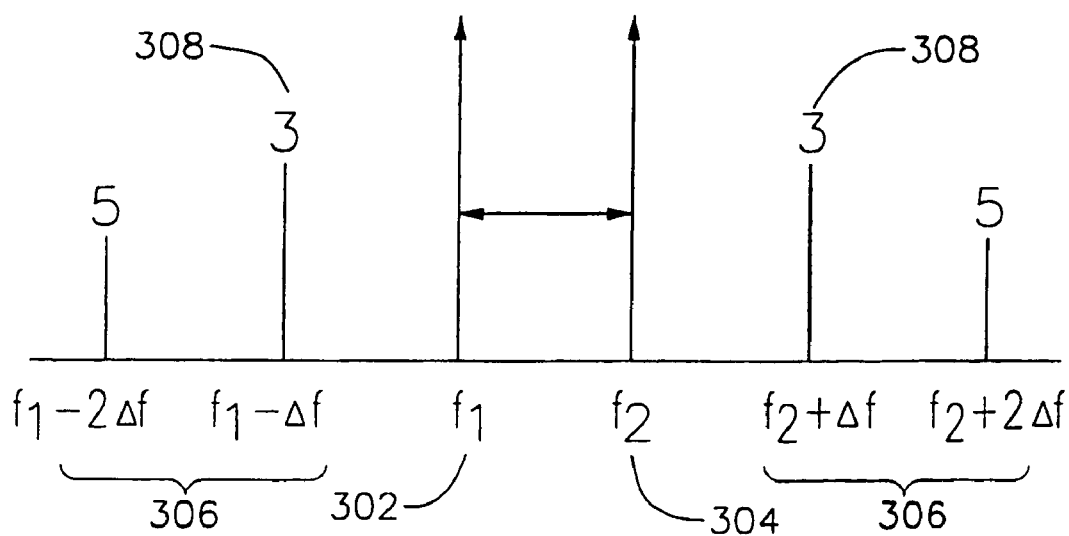
FIG. 3 is an illustration of a spectrum of even and odd order intermodulation distortion products.

FIG. 3 is an illustration of intermodulation distortion products. Whenever two or more frequencies are present they interact to produce additional spurious signals that are undesired. FIG. 3 illustrates a spurious response produced from the interaction of two signals, $f_1$, 302 and $f_2$ 304. This particular type of distortion is called intermodulation distortion (IMD). These intermodulation distortion products 306 are assigned orders, as illustrated. In classifying the distortion the IM products are grouped into two families, even and odd order IM products. Odd order products are shown in FIG. 3.

In a narrow band systems the even order IM products can be easily filtered out, like harmonics, because they occur far from the two original frequencies. The odd order IM products 306 fall close to the two original frequencies 302, 304. In a receiver these frequencies would be two received signals or a received channel and a local oscillator. These products are difficult to remove. The third order products 306 are the most problematic in receiver design because they are typically the strongest, and fall close within a receiver's tuning band close to the desired signal. IM distortion performance specifications are important because they are a measure of the receiver's immunity to strong out of band signal interference.

Third order products 308 occur at $(f_1-\Delta f)$ and at $(f_2+\Delta f)$, where $\Delta f=f_2-f_1$. These unwanted signals may be generated in a transmitter and transmitted along with desired signal or are created in a receiver. Circuitry in the receiver is required to block these signals. These unwanted spurious responses arise from nonlinearities in the circuitry that makes up the receiver.

The circuits that make up the receiver though nonlinear are capable of operating linearly if the signals presented to the receiver circuits are confined to signal levels within a range that does not call for operation of the circuitry in the nonlinear region. This can be achieved by careful design of the receiver.

For example, if an amplifier is over driven by signals presented to it greater than it was designed to amplify, the output signal will be distorted. In an audio amplifier this distortion is heard on a speaker. In a radio receiver the distortion produced in nonlinear circuits, including amplifiers and mixers similarly causes degradation of the signal output of the receiver. On a spectrum analyzer this distortion can be seen; levels of the distortion increase to levels comparable to the desired signal.

While unwanted distortion such as harmonic distortion, can be filtered out because the harmonics most often fall outside of the frequency band received, other distortion such as inter-modulation distortion is more problematic. This distortion falls within a received signal band and cannot be easily filtered out without blocking other desired signals. Thus, frequency planning is often used to control the location of distortion signals that degrade selectivity.

Frequency planning is the selection of local oscillator signals that create the intermediate frequency (IF) signals of the down conversion process. It is an analytical assessment of the frequencies being used and the distortion products associated with these frequencies that have been selected. By evaluating the distortion and its strength, an engineer can select local oscillator and IF frequencies that will yield the best overall receiver performance, such as selectivity and image response. In designing a radio receiver, the primary problems encountered are designing for sufficient sensitivity, selectivity and image response.

Selectivity is a measure of a radio receiver's ability to reject signals outside of the band being tuned by a radio receiver. A way to increase selectivity is to provide a resonant circuit after an antenna and before the receiver's frequency conversion circuitry in a "front end." For example, a parallel resonant circuit after an antenna and before a first mixer that can be tuned to the band desired will produce a high impedance to ground at the center of the band. The high impedance will allow the antenna signal to develop a voltage across this impedance. Signals out of band will not develop the high voltage and are thus attenuated.

The out of band signal rejection is determined by a quality factor or "Q" of components used in the resonant circuit. The higher the Q of a circuit in the preselector, the steeper the slope of the impedance curve that is characteristic of the preselector will be. A steep curve will develop a higher voltage at resonance for signals in band compared to signals out of band. For a resonant circuit with low Q a voltage developed across the resonant circuit at a tuned frequency band will be closer in value to the voltage developed across the resonant circuit out of band. Thus, an out of band signals would be closer in amplitude to an in band signals than if a high Q circuit were constructed.

This type of resonant circuit used as a preselector will increase frequency selectivity of a receiver that has been designed with this stage at its input. If an active preselector circuit is used between an antenna and frequency conversion stages, the sensitivity of the receiver will be increased as well as improving selectivity. If a signal is weak its level will be close to a background noise level that is present on an antenna in addition to a signal. If this signal cannot be separated from the noise, the radio signal will not be able to be converted to a signal usable by the receiver. Within the receiver's signal processing chain, the signal's amplitude is decreased by losses at every stage of the processing. To make up for this loss the signal can be amplified initially before it is processed. Thus, it can be seen why it is desirable to provide a circuit in the receiver that provides frequency selectivity and gain early in the signal processing chain.

Radio frequency tuners are increasingly being designed with major portions of their circuitry implemented as an integrated circuit. In the state of the art to minimize distortion products created in the receiver, exotic materials such as gallium arsenide (GaAs) are used. A receiver implemented on this type of material will typically have lower distortion and noise present than in a similarly constructed receiver constructed on silicon. Silicon, is an attractive material due to its low cost. In addition, a CMOS circuit implemented on silicon has the additional benefit of having known processing characteristics that allow a high degree of repeatability from lot to lot of wafers. The state of the art has not achieved a completely integrated receiver in CMOS circuitry. A reason for this is the difficulty of eliminating receiver distortion and noise.

The distortion products discussed above that are created in the receiver can, in the majority of cases, also be reduced by setting an appropriate drive level in the receiver, and by allowing a sufficient spacing between carriers and channels. These receiver design parameters are dependent upon many other factors as well, such as noise present in the system, frequency, type of modulation, and signal strength among others. Noise is one of the most important of these other parameters that determines the sensitivity of the receiver, or how well a weak signal may be satisfactorily received.

Noise is present with the transmitted signal, and also generated within a receiver. If excessive noise is created in a receiver a weak signal may be lost in a "noise floor". This means that the strength of the received signal is comparable to the strength of the noise present, and the receiver is incapable of satisfactorily separating a signal out of this background noise, or floor. To obtain satisfactory performance a "noise floor" is best reduced early in a receiver's chain of circuit components.

Once a signal is acquired and presented to a receiver, in particularly an integrated receiver with external pins, additional noise may be radiated onto those pins. Thus, additional added noise at the receiver pins can degrade the received signal.

In addition to the noise that is present on an antenna or a cable input to a receiver, noise is generated inside the radio receiver. At a UHF frequency range this internal noise predominates over the noise received with the signal of interest. Thus, for the higher frequencies the weakest signal that can be detected is determined by the noise level in the receiver. To increase the sensitivity of the receiver a "pre-amplifier" is often used after an antenna as a receiver front end to boost the signal level that goes into the receiver. This kind of pre-amplification at the front end of the amplifier will add noise to the receiver due to the noise that is generated inside of this amplifier circuit. However, the noise contribution of this amplifier can be minimized by using an amplifier that is designed to produce minimal noise when it amplifies a signal, such as an LNA. Noise does not simply add from stage to stage; the internal noise of the first amplifier substantially sets the noise floor for the entire receiver.

In calculating a gain in a series of cascaded amplifiers the overall gain is simply the sum of the gains of the individual amplifiers in decibels. For example, the total gain in a series of two amplifiers each having a gain of 10 dB is 20 dB for a overall amplifier. Noise floor is commonly indicated by the noise figure (NF). The larger the NF the higher the noise floor of the circuit.

A Cascaded noise figure is not as easily calculated as amplifier gain; its calculation is non-intuitive. In a series of cascaded amplifiers, gain does not depend upon the positioning of the amplifiers in the chain. However, in achieving a given noise figure for a receiver, the placement of the amplifiers is critical with respect to establishing a receiver's noise floor. In calculating the noise figure for an electronic system Friis' equation is used to calculate the noise figure of the entire system. Friis' equation is $$NF_{total} = NF_1 + \frac{NF_2 - 1}{G_1} + \frac{NF_3 - 1}{G_1 G_2} + \ldots + \frac{NF_n - 1}{G_1 G_2 \ldots G_n} \quad (1)$$

$NF_{total}$=system noise figure
$NF_1$=noise figure of stage-1
$NF_2$=noise figure of stage-2
$NF_n$=noise figure of stage-nth
$G_1$=gain of stage-1
$G_2$=gain of stage-2
$G_n$=gain of nth stage What can be seen from this equation is that the noise figure of a first stage is the predominant contributor to a total noise figure. For example, the noise figure of a system is only increased a small amount when a second amplifier is used. Thus, it can be seen that the noise figure of the first amplifier in a chain of amplifiers or system components is critical in maintaining a low noise floor for an entire system or receiver. A low NF amplifier typically requires a low noise material for transistors, such as gallium arsenide. Later amplifiers that do not contribute significantly to the noise, are constructed of a cheaper and noisier material such as silicon.

The initial low noise amplifiers are typically constructed from expensive materials such as gallium arsenide to achieve sufficient performance. Gallium arsenide requires special processing, further adding to its expense. Additionally, GaAs circuits are not easily integrated with silicon circuits that make up the bulk of the receivers in use. It would be desirable to achieve identical performance with a less costly material, such as silicon. Silicon requires less costly processing. Further it is advantageous if a standard process, such as CMOS, could be used to achieve the required low noise design. Given the trend towards miniaturization and high volume production, it is highly desirable to be able to produce an integrated receiver with a low noise floor on silicon.

Within a receiver the layout and spacing of circuitry is critical to avoid the injection of noise generated in other portions of the circuit onto a received signal. If a tuner is placed on a semiconductor substrate noise generated in the substrate itself will interfere with, and degrade the received signal, this has been a problem preventing complete integration of a receiver on silicon.

Historically low noise substrates, fabricated from exotic and costly materials such as gallium arsenide have been used to reduce noise generated by the semiconductor substrate. However, it would be advantageous to be able to fabricate a receiver on a single CMOS substrate. CMOS advantageously is a known process that may be implemented economically for volume production. Currently a receiver fabricated completely in CMOS has not been available without utilizing external components in the received signal path. Each time the signal is routed on or off of the integrated circuit additional opportunities for the introduction of noise into a signal path are provided. Minimizing this introduction of noise is an ongoing problem in receiver design.

After preselection and low noise amplification that is performed in a front end of a receiver, the signal next enters the receiver's frequency conversion circuitry. This circuitry takes channels that have been passed through the front end and converts one of the selected channel's frequencies down to one or more known frequencies ($f_{IF}$ or IFs). This frequency conversion is accomplished through the use of a circuit called a mixer that utilizes a local oscillator signal ($f_{LO}$), usually generated in the receiver, to tune a received channel to an IF frequency while blocking the other channels. Spurious signals, previously described, are produced in this receiver circuitry, and an additional problem known as "image response" is encountered that must be considered in the receiver's design.

It is well known to those skilled in the art that when two sinusoidal signals of differing frequencies are multiplied together by their application to a nonlinear device, such as a mixer, that signals of a differing frequency are produced. A mixer has three ports: $f_{RF}$ receives a low level radio frequency signal that contains the desired modulation, $f_{LO}$ is a high level signal from a local oscillator, and $f_{IF}$ is the resultant mixer product or intermediate frequency produced. These frequencies are related:

$$f_{IF} = mf_{RF} \pm nf_{LO} \quad (2)$$

where m=0, 1, 2, 3, . . . and
n=0, 1, 2, 3, . . .

In a typical first order circuit (m=n=1) four frequencies are produced: $f_{RF}$, $f_{LO}$, $f_{IFLO}=f_{RF}-f_{LO}$ and $f_{IFHI}=f_{RF}+f_{LO}$. A $f_{IFLO}$ and $f_{IFHI}$ being termed intermediate frequencies. In receivers the common practice is to select either the sum or difference IF frequency by filtering out the undesired one. Since both signals contain the same information, only one is needed in the subsequent circuitry.

One or more mixers are advantageously used in radio receivers to convert a high frequency radio signal which is received into a lower frequency signal that can be easily processed by subsequent circuitry. Mixers are also used to tune multiple channels, so that different tuned circuits are not required for each channel. By changing a local oscillator frequency, differing radio frequencies received can be tuned to produce a constant intermediate frequency value regardless of the frequency of the received channel. This means that circuit components used to process the intermediate frequency may be fixed in value, with no tuning of capacitors or coils required. Thus, circuits in an IF strip are all fixed-tuned at an IF frequency. A receiver constructed in this manner, using one or more frequency conversions, is called a superheterodyne radio receiver.

A disadvantage of a superheterodyne radio receiver is that any of the one or more local oscillators within the receiver also acts as a miniature transmitter. A receiver "front end" alleviates this problem by isolating an antenna from the remaining receiver circuitry.

By positioning a radio frequency amplifier between the antenna and the frequency converting stages of a receiver, additional isolation between the receiver circuitry and the antenna is achieved. The presence of an amplifier stage provides attenuation for any of the one or more local oscillator signals from the frequency conversion stages that are radiated back towards the antenna or a cable distribution network. This increased isolation has the benefit of preventing radiation of a local oscillator signal out the antenna which could cause radio frequency interference from a local oscillator. If radiated these and other signals present could create interference in another receiver present at another location.

Figure 4:
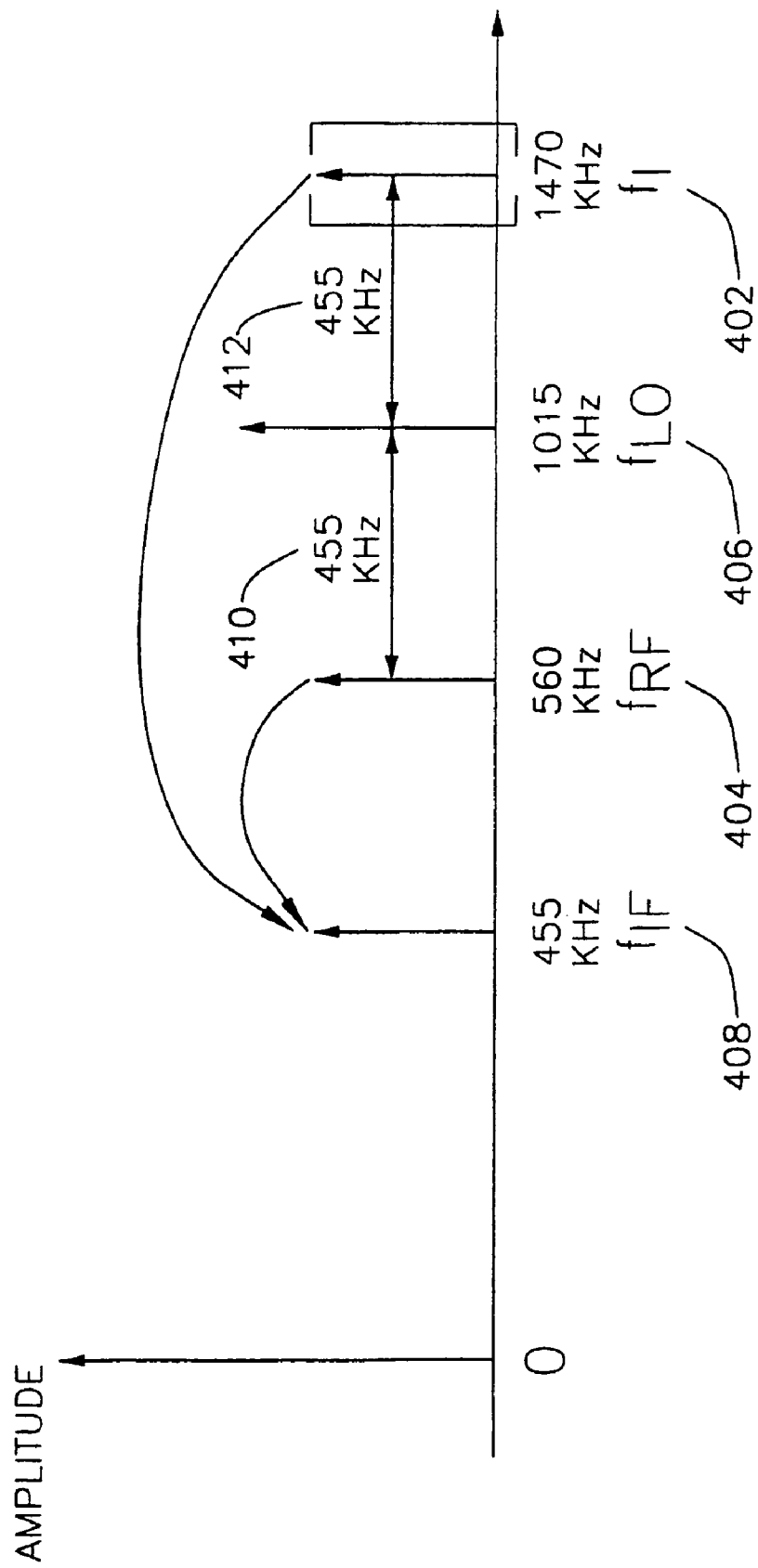
FIG. 4 is an illustration of interference caused at the IF frequency by a signal present at the image frequency.

FIG. 4 is an illustration that shows an image frequency's 402 relation to other signals present 404, 406, 408 at a mixer. Image frequency suppression is an important parameter in a receivers design. In a radio receiver two frequencies input to a radio receiver 404, 406 will yield a signal at the IF frequency 408. A receiver will simultaneously detect signals at the desired frequency 404 and also any signals present at an undesired frequency known as the image frequency 402. If there is a signal present at the image frequency, it will translate down to the IF frequency 408 and cause interference with the reception of the desired channel. Both of these signals will be converted to the IF frequency unless the receiver is designed to prevent this. The image frequency 402 is given by:

$$f_I = f_{RF} + 2f_{IF} \quad (3)$$

where $f_I$ is the image frequency. This is illustrated in FIG. 4. A frequency that is spaced the IF frequency 410 below the local oscillator frequency ($f_{RF}$) 404, and a frequency that is spaced the intermediate frequency 412 above the local oscillator signal ($f_I$) 402, will both be converted down to the intermediate frequency ($f_{IF}$) 408. The usual case is that a frequency that occurs lower than the local oscillator signal is the desired signal. The signal occurring at the local oscillator frequency plus the intermediate frequency 402 is an unwanted signal or noise at that frequency that is converted to the IF frequency causing interference with the desired signal.

In FIG. 4 the exemplary 560 KHz signal 404 is a radio station that the tuner is tuned to receive. The exemplary 1470 KHz signal 402 is another radio station transmitting at that particular frequency. If a designer of the receiver had picked an exemplary local oscillator signal of 1015 KHz 406 then both of these radio stations would be simultaneously converted to an exemplary IF frequency of 455 KHz 408. The person listening to the radio would simultaneously hear both radio programs coming out of his speaker. This illustrates the need for the careful selection of local oscillator frequencies when designing a radio receiver. The selection of local oscillator frequencies is a part of frequency planning and used by those skilled in the art to design a receiver that will provide frequency conversions needed with minimal distortion.

FIG. 5 illustrates a dual (or double) conversion receiver 502. Such a multiple conversion receiver allows selectivity, distortion and stability to be controlled through a judicious frequency planning. In the double conversion receiver 502 a received signal 504 is first mixed 506 to a first intermediate frequency, and then mixed 508 down to a second intermediate frequency. In this type of receiver the first IF frequency is made to be high so that a good image rejection is achieved. The second IF is made low so that good adjacent channel selectivity is achieved.

If the first IF frequency is low an image frequency falls higher in frequency, or closer to the center of a pass band of an RF selectivity curve of a receiver "front end," 510 and undergoes little attenuation. If the IF frequency is high the image frequency falls far down on the skirt of the RF selectivity curve for the receiver "front end" receiving a required attenuation. Thus, the selectivity of the receiver acts to attenuate the image frequency when a high IF frequency is used. As an added benefit a high image frequency provides less of a chance for interference from a high powered station. This is because at higher frequencies transmitted power is often lower due to the difficulties in generating RF power as frequency increases.

A low second IF frequency produces a good adjacent channel selectivity. Frequency spacing between adjacent channels is fixed. To prevent interference from adjacent channels the receiver must possess a good selectivity. Selectivity can be achieved through a RF tuned circuit, and more importantly by the superior selectivity provided by a frequency conversion process. The selectivity improvement given by using a low IF is shown by considering a percent separation of a desired and an undesired signal relative to total signal bandwidth. If a separation between the desired and undesired signals is constant a second IF signal falling at the lower frequency will give a larger percent separation between the signals. As a result it is easier to distinguish between IF signals that are separated by a larger percentage of bandwidth. Thus, the judicious selection of two intermediate frequencies in a double conversion receiver is often used to achieve a given design goal, such as image frequency rejection and selectivity.

Additionally, the use of a second IF frequency allows gain in the receiver to be distributed evenly. Distributing gain helps prevent instability in the receiver. Instability usually is seen as an oscillating output signal 512. Distributing the gain among several IF amplifiers 514, 516, 518 reduces the chance of this undesirable effect. Often to further distribute the gain required in a system design a third frequency conversion, and a third IF frequency, will be utilized.

After a receiver front end that possibly contains a low noise amplifier, additional amplifiers are often seen in the various IF strips. An amplifier in an IF strip does not require frequency tuning and provides signal gain to make up for signal losses, encountered in processing a received signal. Such losses can include conversion loss in mixers and the insertion loss encountered by placing a circuit element, such as a filter or an isolator in the IF strip.

In receivers filters are used liberally to limit unwanted frequencies that have been escaped previous elimination in a "front end," or to eliminate unwanted frequencies that have been created immediately preceding a filter. In addition to attenuating unwanted frequencies, a desired signal will also undergo some attenuation. This attenuation results from an insertion loss of a filter, or some other component, and if uncompensated, will degrade a signal. This is especially true when a series of filters are cascaded, since the effect is additive.

Often a series of multiple filters are cascaded in a given IF strip. These filters typically have an identical response characteristic. The cascaded filters are used to increase the selectivity of the receiver. While it is true that the insertion loss in the pass band is the sum of individual filter insertion losses, as measured in decibels, a rejection improvement obtained outside of the pass band is the sum of the rejections at the given frequency. Thus, three cascaded filters, each having an insertion loss of 0.01 dB at a center frequency, would have a total insertion loss of 0.03 dB. If the rejection in the stop band, a given frequency away from the center frequency of the filter, were 20 dB, then a total rejection for 3 cascaded filters would be 60 dB, a great improvement in filter selectivity.

In choosing intermediate frequencies for IF strips in the receiver, no concrete design guidelines exist. Also because of a wide variance in design goals that are encountered in receiver design, concrete methodologies do not exist. Each receiver must be uniquely engineered to satisfy a series of system design goals taking into consideration design tradeoffs that must be made. In the current state of the art, design tradeoffs, and design methodologies used have been directed to integrating all parts of the receiver except for frequencies selective components. The conventional wisdom in receiver design is that filters are not easily integrated onto a silicon substrate and that filtering is best done off of a chip.

Some general design guidelines exist to aid an RF engineer in designing a receiver. One such rule is that designing for receiver selectivity is more important than designing for receiver sensitivity. Thus, when faced with conflicting design choices, the more desirable choice is to provide a design that will separate adjacent channels that interfere with each other rather than to design a receiver capable of picking up the weakest channels. Another rule of thumb in choosing intermediate frequencies is to choose the first intermediate frequency at twice the highest input frequency anticipated. This is to reduce the possibility of spurious second order intermodulation distortion. Depending upon a system performance desired, this rule can even be more restrictive, requiring an IF at greater than three times the highest input frequency. Thus, it may be seen that a wide variety of performance requirements exist in a receiver circuit, and that the range of choices for a given criteria may be utilized by those skilled in the art to produce a unique design that meets the challenges posed by an increasing trend towards integration.

When more than one IF is present in a receiver there is an image frequency associated with each IF that must be considered in the design. A good receiver provides an image rejection greater than 70 dB.

One of the first considerations in frequency planning a superheterodyne receiver is the selection of IF conversions. A frequency range of the local oscillator needs to be determined to establish the locations of spurious responses of various orders. Two choices are possible for each of two possible LO frequency and the selection is not subject to an easy generalization. The two available frequencies are the absolute value of the quantity $|f_{RF} \pm f_{IF}| = f_{LO}$. Selection depends on RF bands chosen to be received and frequencies present in these bands, the availability of fixed bandwidth filters at a desired IF and constraints imposed upon an engineer by the limitations of a material that will be used to fabricate a receiver.

Receiver planning is a process that is centered upon frequency planning and receiver level diagrams. After initial frequency selections for a frequency plan are made, a receiver level plan is used to calculate noise figures, intercept points (IP) and levels of spurious responses. Each is evaluated in light of design requirements. After each set of selections performance is evaluated and a next set of parameter selections is made until an appropriate compromise in receiver performance is achieved.

Once frequency planning and a level diagram yield a satisfactory design solution these tools are used to guide a detailed receiver design. Once parameters of a section of a receiver are defined, an engineer can use various circuit implementations to achieve a stated design goal. For example a frequency plan and level diagram may require a band pass filter with certain characteristics such as bandwidth, center frequency and insertion loss. The engineer would then either pick a single filter that meets all of these requirements or cascade one or more filters such that a composite response will yield the required design value.

Needless to say experience and knowledge of available technology plays a large part in achieving a successful receiver design blueprint. An engineer must have a rough idea of component availability and design methodologies that will yield a certain performance. If the engineer specifies a portion of the receiver that has performance characteristics that are not achievable with available components or design methods, then an impractical and unproduceable design has been proposed requiring replanning the architecture of the receiver.

A design process and a result achieved is very dependent upon technology available, materials and methodologies known at the time. New improvements in design techniques, computer simulation, processing and a push for increased miniaturization continually fuel achievement of new and innovative receiver designs to solve technological problems.

Once frequency conversions have been chosen and a receiver designed, with the distortion products created in the receiver found acceptable, the next step in receiver design is to design circuitry that will generate one or more local oscillator signals. These signals could be provided by a source that is external to a chip. However, this would not be practical in seeking to miniaturize an overall receiver design. A better approach is to generate the local oscillator frequencies near the receiver. In reducing an entire receiver onto a single chip, problems in maintaining signal purity, and stability are encountered.

An innovation that has allowed increased miniaturization in receiver design is the development of frequency synthesis. Local oscillator signals are required in receivers utilizing frequency conversion. These signals must be tunable and stable. A stable frequency is easily produced by a quartz crystal at a single frequency. A tunable frequency can be produced by an LC type oscillator. However, this LC oscillator does not have sufficient stability. Additionally using a large number of crystals to generate a range of local oscillator signals, or inductors required in an LC oscillator do not allow an easily miniaturized design. Frequency synthesis is space efficient.

Variable frequency local oscillator signals used in a receiver must be generated by appropriate circuits. These frequency synthesis techniques derive variable LO signals from a common stable reference oscillator. A crystal oscillator has a stable frequency suitable for use in a synthesizer.

Oscillators may provide a fixed or a variable output frequency. This fixed or variable frequency may be used for frequency conversion in a receiver as a local oscillator that is used to mix a received radio frequency (RF) input down to an intermediate frequency or a base band signal that is more easily processed in the following circuitry. Another way that a received signal can be converted down to a base band or intermediate frequency signal is by using frequency synthesizer outputs as local oscillator signals to mix the signal down. Synthesizers provide accurate, stable and digitally programmable frequency outputs, without the use of multiple oscillators to tune across a band. Accuracy is maintained by using feed back.

Three general techniques are used for frequencies synthesis. Direct synthesizers use frequency multipliers, dividers and mixers. Indirect synthesizers use phase-locked loops. Direct digital synthesizers use digital logic combined with a digital to analog converter to provide an analog output. Some designs combine the three techniques.

A direct synthesizer will use a frequency reference such as a crystal oscillator as disclosed in FIG. 5 to generate a reference frequency. To achieve a desired output frequency, the reference frequency is multiplied through a series of multipliers. Dividers may be used similarly to reduce the frequency output to the desired lesser value. Additionally, two signals generated from the chain of multipliers and dividers can be fed into a mixer to generate a third frequency. The mix and divide direct synthesis approach permits the use of many identical modules that produce fine resolution with low spurious output.

Indirect synthesis can take several forms. It can use divide by N to produce one or more of the digits, and mix and divide with loops imbedded among circuits. In each form of frequency synthesizer, the loops contained in it are governed by a derivative of a reference frequency. Indirect synthesis can be used to generate a frequency of $$\left(\frac{N}{M}\right)f_{in}.$$

Circuits of this type are often used as local oscillators for digitally tuned radio and television receivers.

Indirect synthesizers make use of a number of phase locked loops (PLLs) in order to create a variety of frequency outputs. Each loop present in the system makes use of a common frequency reference provided by a single oscillator. Frequency synthesizers provide the advantage of being digitally programmable to a desired frequency as well as providing an extremely stable frequency.

Frequency stability in a synthesizer is achieved with phase locked loops. A phase locked loop is programmed to generate a desired frequency. Once it approximates the frequency, the frequency is divided down to the value of a reference frequency, provided by an external oscillator, and compared to that reference frequency. When the difference reaches zero the phase locked loop stops tuning and locks to the frequency that it has just produced. The frequency reference used to tune the phase locked loop is typically provided by a single frequency oscillator circuit.

Frequency synthesizers in a radio frequency receiver often incorporate two phase locked loops. One PLL is used to provide coarse tuning within the frequency band of interest while the second PLL provides fine tuning steps.

In using this scheme, a coarse tuning must be such that a desired channel will initially fall within the selectivity of the receiver to produce a signal output. It would be an advantage in receiver design if tuning speed could be increased so that initially several channels would fall within the selectivity of the receiver. Tuning in this manner would allow an output to be created with an extremely coarse tuning range that could be dynamically adjusted. Currently this type of tuning is not seen in the state of the art.

Typically PLLs use a common reference frequency oscillator. Local oscillator signals produced by a frequency synthesizer's phase locked loops inject noise produced in the reference frequency oscillator and the PLLs into a the signal path by way of a PLL output.

A range of output frequencies from a synthesizer can span many decades, depending on the design. A "resolution" of the synthesizer is the smallest step in frequency that can be made. Resolution is usually a power of 10. A "lock up time" of the synthesizer is the time it takes a new frequency to be produced once a command has been made to change frequencies.

The more accurate the frequency required the longer the lock up time. The reduction of the lock up time is a desirable goal in synthesizer design. A modern trend is to use frequency synthesis in wide band tuners. To tune across a wide band width quickly the lock up time must be minimized. Current state of the art tuning times for jumps in frequencies can be as short as several microseconds. This is difficult to do when the required increment in frequency adjustment is small. In the state of the art indirect synthesis is capable of producing multi digit resolution. However, indirect synthesis is not capable of providing micro second switching speeds. For faster switching speeds direct analog and direct digital technologies are used. Therefore, it is desirable to construct an indirect frequency synthesizer that provides high resolution and improved switching speed.

The present embodiments of the invention allow all channel selectivity and image rejection to be implemented on an integrated circuit. Integration is a achievable by utilizing differential signal transmission, a low phase noise oscillator, integrated low Q filters, filter tuning, frequency planning, local oscillator generation and PLL tuning to achieve a previously unrealized level of receiver integration.

The embodiments of the invention advantageously allow a LC filters to be integrated on a receiver chip, resulting in an integrated circuit that contains substantially the entire receiver. By advantageously selecting a frequency plan, and utilizing the properties of complex mixers, an architecture is achieved that allows LC filters to be integrated on a receiver chip so that acceptable performance is produced when converting a received signal to one having a lower frequency that is easily processed.

The embodiments utilize particular aspects of an arbitrarily defined input spectrum to first shift the received frequencies to a higher frequency in order that interference may be more easily eliminated by filtering and then shifting the spectrum to a nominal IF for processing. This first shifting process advantageously shifts interfering image signals away from a center frequency of a first LC filter bank so that the LC filter bank is more effective in reducing the interfering signal strength. To further reduce the interfering signal strength, multiple LC filters that are tuned to the same frequency are cascaded, further reducing the interfering signal strength.

To reduce degradation of the desired signal the exemplary embodiments of the invention utilize a complex mixing stage following an LC filter bank to reduce the image frequency interference by an additional amount that might be necessary to meet a particular image rejection target (i.e., an about 60 dB to 65 dB rejection target). A complex mixer creates a signal as a result of its normal operation that cancels an image frequency interference by the remaining amount needed to achieve satisfactory performance with LC filters.

The ultimate goal of a receiver is to reduce the frequency of an incoming signal to a frequency that is lower than received, so that processing of the desired signal can be easily achieved. The receiver architecture utilizes two frequency down conversions to achieve this goal. Each frequency conversion is susceptible to interference that requires filtering. Frequency planning as described above used in conjunction with LC filters and complex mixers, provides the required image distortion rejection that allows LC filters to be used advantageously in an integrated receiver.

Radio receivers require one or more local oscillator (LO) signals in order to accomplish frequency conversion to an intermediate (IF) frequency. In a typical receiver these local oscillator signals must be stable and free from noise. When a receiver is fabricated as an integrated circuit, the chances of injecting noise via the LO signals increases. Local oscillator signals for a receiver are typically generated in close proximity to the frequency conversion circuitry. The close proximity of this frequency generation circuitry to the signal path creates an increased likelihood of noise being radiated or conducted to cause interference with the received signal.

In order to achieve improved noise immunity the exemplary embodiments of the invention may utilize circuitry to generate the local oscillator signals that possess superior noise performance. The local oscillator signals may also be advantageously transmitted differentially to the mixers present on the integrated circuit. It should be noted that in alternate embodiments of the invention that a single ended output can be produced from the differential signal by various techniques known in the art. This technique is used advantageously whenever external connections to the receiver are required that are single ended.

Oscillator

An exemplary embodiment of the present invention utilizes a differential oscillator having low phase noise or jitter and high isolation, as a frequency reference that substantially increases the performance of a tuner architecture integrated onto a single silicon substrate.

In accordance with the present invention, a crystal oscillator circuit is provided and constructed so as to define a periodic, sinusoidal, balanced differential signal across two symmetrical terminals of a crystal resonator which are coupled in a parallel configuration across symmetrical, differential terminals of a differential oscillator circuit.

The differential oscillator circuit is configured such that it is constructed of simple active and passive components which are easily implemented in modern integrated circuit technology, thus allowing the differential oscillator circuit to be accommodated on a monolithic integrated circuit chip for which the crystal oscillator (as a whole) is providing a suitable, stable periodic timing reference signal. Similarly, and in contrast to prior art implementations, only the resonating crystal (crystal resonator or quartz crystal resonator) is provided as an off-chip component. This particular configuration allows for considerable savings in component parts costs by partitioning more and more functionality into the integrated circuit chip.

Remote (off chip) mounting of the crystal resonator requires that electrical contact between the crystal resonator and the associated oscillator circuit, be made with interconnecting leads of finite length. In integrated circuit technology, these interconnecting leads are typically implemented as circuit pads and conductive wires formed on a PC board substrate to which package leads are bonded (soldered) in order to effect electrical connection between the crystal resonator and an associated oscillator circuit. External electrical connections of this type are well known as being susceptible to noise and other forms of interference that might be radiated onto the interconnecting leads and, thence, into the oscillator circuit, degrading its overall noise performance.

A sinusoidal signal source, having a differential output configuration, defines a pair of periodic sinusoidal signals, with the signal at one output terminal defined as being 180° out of phase with a similar periodic, sinusoidal signal appearing at the other output terminal. Classical differential signals are termed "balanced" in that both signals exhibit equal peek-to-peek amplitudes although they exhibit a 180° phase relationship. As illustrated in the simplified timing diagram of FIG. 6, differential signals have a particular advantage in that common-mode interference, that is injected on either terminal, is canceled when the signal is converted to single-ended. Such common mode interference is typically of equal amplitude on each pin and is caused by radiation into the circuit from external sources or is often generated in the circuit itself. In FIG. 6, a positive sinusoidal signal, denoted signal-P oscillates about a zero reference, but is shifted by a common-mode interference component, denoted $I_{CM}$. Likewise, a negative sinusoidal signal, denoted at signal-n, also oscillates about a zero reference, exhibiting a 180° phase relationship with signal-p, and is also offset by a common mode interference component denoted $I_{CM}$.

A superposition of the positive and negative periodic signals is illustrated in the timing diagram denoted "composite", which clearly illustrates that the peek-to-peek difference between the positive and negative signals remains the same, even in the presence of a common mode interference component $I_{CM}$.

Turning now to FIG. 7, there is depicted a semi-schematic block diagram of a periodic signal generation circuit including a differential crystal oscillator driving a differential linear buffer amplifier. Advantageously, the present invention contemplates differential signal transmission throughout its architecture to maintain the purity of the derived periodic signal and to minimize any common mode interference components injected into the system. In particular, the present invention incorporates differential signal transmission in the construction of a differential crystal oscillator circuit, including a crystal resonator and its associated oscillator driver circuit. Differential signal transmission is maintained through at least a first linear buffer stage which functions to isolate the differential oscillator circuit switch transients and other forms of noise that might be generated by follow-on digital integrated circuit components.

In FIG. 7, a differential crystal oscillator circuit is configured to function as a source of stable, synchronous and periodic signals. According to the illustrated embodiment, a differential crystal oscillator 710 suitably incorporates a resonating crystal 712 and a pair of symmetrical load capacitors 714 and 716, each load capacitor respectively coupled between ground potential and one of the two symmetrical output terminals of the resonating crystal 712.

Resonating crystal 712 is coupled between differential terminals of a differential oscillator driver circuit 718, in turn connected to differential inputs of a differential linear buffer integrated circuit 720. The symmetrical terminals of the resonating crystal 712 are coupled across differential terminals of the resonator and linear buffer, with a first terminal of the crystal being shunted to ground by the first shunt capacitor 14. The second terminal of the crystal is shunted to ground by the second shunt capacitor 716.

The oscillator driver circuit portion of the differential crystal oscillator 710 functions, in cooperation with the crystal resonator 712, to define a pure sinusoidal and differential signal across the crystal's symmetrical terminals. As will be developed in greater detail below, this pure sinusoidal and differential signal is then used by the linear buffer 720 to develop an amplified representation of periodic signals synchronized to the crystal resonant frequency. These amplified signals are also contemplated as differential inform and are eminently suitable for driving digital wave shaping circuitry to define various digital pulse trains useable by various forms of digital timing circuitry, such as phase-lock-loops (PLLs), frequency tunable digital filters, direct digital frequency synthesizers (DDFS), and the like. In other words, the system depicted in FIG. 7 might be aptly described as a periodic function generator circuit, with the crystal oscillator portion 710 providing the periodicity, and with the buffer portion 720 providing the functionality.

Before entering into a detailed discussion of the construction and operation of the differential oscillator driver circuit and differential linear buffer amplifier, it will be useful to describe characteristics of a resonating crystal, such as might be contemplated for use in the context of the present invention.

FIG. 8 depicts the conventional representation of a resonating crystal 712 having mirror-image and symmetrical terminals 822 and 824, upon which differential periodic signals may be developed at the crystal's resonant frequency. Resonating crystals (also termed crystal resonators) may be formed from a variety of resonating materials, but most commonly are formed from a piece of quartz, precisely cut along certain of its crystalline plane surfaces, and so sized and shaped as to define a particular resonant frequency from the finished piece. Resonating crystals so formed are commonly termed "quartz crystal resonators".

A typical representational model of the equivalent circuit of a quartz crystal resonator 712 is illustrated in simplified, semi-schematic form in FIG. 9. A quartz crystal resonator can be modeled as a two terminal resonator, with an LCR circuit, incorporating a capacitor $C_m$ in series with an inductor $L_m$ and a resistor $R_m$, coupled in parallel fashion with a capacitor $C_o$ across the two terminals. It will be understood that the particular component values of the capacitor, inductor and resistor, forming the LCR filter portion of the circuit, define the resonant characteristics of the crystal. These design values may be easily adjusted by one having skill in the art in order to implement a resonating crystal operating at any reasonably desired frequency.

For example, a particular exemplary embodiment of a crystal resonator might be desired to have a resonant frequency in the range of about 10 megahertz (MHz). In such a case, the equivalent circuit of such a crystal might have a typical value of about 20 femto Farads (fF) for the capacitor $C_m$. The inductor $L_m$ might exhibit a typical value of about 13 milli Henreys (mH), while the resistor might have a typical value of about 50 ohms. When used in a practical oscillator design, oscillation will be achieved for values of the capacitor $C_0$ that are less than a design worst case value. In the exemplary embodiment, worst case values of 7 pico Farads (pF) might be chosen in order to ensure a design that oscillates at the desired resonant frequency over a wide range of crystal equivalent circuit values. In a practical application, the typical range of capacitance values for $C_0$ might be from about 3 to about 4 pF.

FIGS. 10 and 11 are graphical representations depicting response plots of impedance and phase with respect to frequency, respectively, of a crystal resonator circuit constructed in accordance with the equivalent circuit model of FIG. 9 and using the values given above for the component $C_m$, $L_m$, $R_m$, and $C_0$ parts. FIG. 10 is a plot of the real portion of impedance, in ohms, as a function of the resonator's frequency and mega Hertz. FIG. 11 is a representational plot of the imaginary impedance component (expressed as phase), again expressed as a function of frequency in mega Hertz. From the representational plots, it can be understood that an exemplary crystal resonator constructed in accordance with the above values exhibits a resonant frequency in the range of about 10 MHz. Further, simulation results on such a crystal. resonator exhibit a steep rise in the real impedance versus frequency plot of FIG. 10 in the resonance region about 10 MHz. A steep rise in real impedance in the resonance region is indicative of a high quality factor, Q, typically exhibited by quartz crystal resonators.

An example of a quartz crystal resonator having the aforementioned characteristics and exhibiting a resonance fundamental at about 10 MHz is a Fox HC49U, quartz crystal resonator, manufactured and sold by Fox Electronics of Ft. Myers, Florida. It should be noted, however, that the specific values of a quartz crystal resonator, including its resonant frequency, are not particularly important to practice of principles of the invention. Any type of crystal resonator may be used as the resonator component 712 of FIG. 7, so long as it is constructed with generally symmetrical terminals which can be driven, in a manner to be described in greater detail below, by an oscillator driver circuit 718 of FIG. 7 so as to develop a differential, sinusoidal signal with respect to the two terminals. Further, the resonator need not oscillate at a frequency of 10 MHz. The choice of resonant frequency is solely a function of a circuit designer's preference and necessarily depends on the frequency plan of an integrated circuit in which the system of the invention is used to provide periodic timing signals.

Turning now to FIG. 12, there is depicted a simplified schematic diagram of a differential oscillator driver circuit, indicated generally at 718, suitable for differential coupling to a crystal resonator in order to develop balanced, differential sinusoidal signals for use by downstream components.

In the exemplary embodiment of FIG. 12, the differential oscillator driver circuit 718 is constructed using common integrated circuit components and is symmetrical about a central axis. The oscillator driver 718 is constructed with a pair of P-channel transistors 1226 and 1228 having their source terminals coupled in common and to a current source 1230 connected, in turn, between the common source terminals and a positive supply potential $V_{DD}$. The gate terminals of each of the P-channel transistors 1226 and 1228 are coupled to the drain nodes of the opposite transistor, i.e., the gate terminal of P-channel transistor 1228 is coupled to the drain node of P-channel transistor 1226, and vice versa.

Output terminals are defined at each of the transistor's drain nodes, with the drain node of P-channel transistor 1226 defining the "negative" terminal (Von) and the drain terminal of P-channel transistor 1228 defining the "positive" output (Vop). Thus, it will be understood that the circuit is able to operate differentially by cross coupling the transistors 1226 and 1228 in order to provide feedback.

Because transistors exhibit some measure of gain at all frequencies, particularly DC, conventional cross coupled transistors are often implemented as latches in digital circuit applications where large DC components are present. In the differential oscillator driver circuit 718 of the invention, latching is prevented by removing the DC gain component, while retaining the system's high frequency gain, particularly gain in the desirable 10 MHz region.

In order to substantially eliminate the gain component at low frequencies, a high pass filter is interposed between the gate and output terminals of each symmetrical half of the circuit. In particular, a high pass filter 1232 is coupled between the "negative" output terminal and the gate terminal of P-channel transistor 1228. Likewise, the high pass filter 1234 is coupled between the "positive" output terminal and the gate terminal of P-channel transistor 1226. Further, each of the high pass filters 1232 and 1234 are coupled between a virtual ground, identified as Vmid and indicated in phantom in the exemplary embodiment of FIG. 12, and the corresponding gate terminal of the respective one of the differential pair P-channel transistors 1226 and 1228. Each of the high pass filters 1232 and 1234 are implemented as RC filters, each including a resistor and capacitor in a series-parallel configuration. Each capacitor is series-connected between an output terminal and the gate terminal of a corresponding differential pair transistor, while each resistor is coupled between a gate terminal and the virtual ground. Thus, the first high pass filter 1232 includes a capacitor 1236 coupled between the "negative" terminal and the gate terminal of P-channel transistor 1228. A resistor 1238 is coupled between the gate of P-channel transistor 1228 and virtual ground. Similarly, the second high pass filter 1234 includes a capacitor 1240 coupled between the "positive" terminal and the gate terminal of P-channel transistor 1226. A resistor 1242 is coupled between the gate of P-channel transistor 1226 and the virtual ground.

In operation, high pass filter 1232 filters the input from Von prior to applying that signal to the gate of its respective differential pair transistor 1228. In like manner, high pass filter 1234 filters the input from Vop prior to applying that signal to the gate of its respective differential pair transistor 1226. Each of the high pass filters are symmetrically designed and have component values chosen to give cutoff frequencies in the range of about 5 MHz. For example, filter capacitors 1236 and 1240 might have values of about 1.5 pF, and filter resistors 1238 and 1242 might have values in the range of about 718 Kohms. Which would give a filter yielding the desired 5 MHz cutoff. It will be thus understood that the differential oscillator driver circuit 18 will have negligible gain at DC, while exhibiting its design gain values in the desired region of about 10 MHz.

It should be understood that the component values for high pass filters 1232 and 1234 were chosen to give a particular cut off frequency of about 5 MHz, allowing the oscillator driver circuit to exhibit full design gain at a resonate frequency of about 10 MHz. If the resonant frequency of the crystal oscillator circuit were required to have a different value, the components of the high pass filters 1232 and 1234 would necessarily take on different values to accommodate the different operational characteristics of the circuit. Accordingly, the actual component values, as well as the cutoff frequency value of the exemplary embodiment, should not be taken as limiting the differential oscillator driver circuit according to the invention in any way. The values and characteristics of the differential oscillator driver circuit 18 of FIG. 12 are exemplary and have been chosen to illustrate only one particular application.

Because the common mode output signal of a differential amplifier is often undefined, the differential oscillator driver circuit 718 of FIG. 12 is provided with a common mode control circuit which functions to maintain any common mode output signal at reasonable levels. In particular, a differential pair of N-channel transistors 1244 and 1246 is provided with each having its drain terminal coupled to a respective one of the Von and Vop output terminals. The differential N-channel transistors 1244 and 1246 further have their source terminals tied together in common and to a negative supply potential $V_{ss}$. Their gate terminals are tied together in common and are further coupled, in feedback fashion, to each transistor's drain node through a respective bias resistor 1248 and 1250. The bias resistors 1248 and 1250 each have a value, in the exemplary embodiment, of about 100 Kohms, with the gate terminals of the N-channel differential pair 1244 and 1246 coupled to a center tab between the resistors. This center tab defines the virtual ground Vmid which corresponds to a signal midpoint about which the sinusoidal signals Von and Vop oscillate. Any common mode component present at the outputs will cause a voltage excursion to appear at the gates of the N-channel differential pair 1244 and 1246. In other words, virtual ground Vmid can be thought of as an operational threshold for the current mode control differential pair 1244 and 1246. Common mode excursions above or below Vmid will cause a common mode control differential pair to adjust the circuit's operational characteristics so as to maintain Vmid at a virtual ground level, thus minimizing any common mode component.

In operation, noise in such a linear differential oscillator driver circuit is filtered mainly by the crystal resonator, but also by the operational characteristics of the driver circuit. For example, noise at 10 MHz is amplified by the positive feedback characteristics of the circuit and will continue to grow unless it is limited. In the exemplary embodiment of FIG. 12, signals in the 10 MHz region will continue to grow in amplitude until limited by a non-linear self-limiting gain compression mechanism.

As the amplitude of the amplified signal becomes large, the effective transconductance $g_m$ of the P-channel differential pair transistors 1226 and 1228 fall off, thus limiting the gain of the differential amplifier. Amplifier gain falloff with increasing gate voltage excursions is a well understood principle, and need not be described in any further detail herein. However, it should be mentioned that as the gain of the oscillator driver circuit trends to 1 the crystal resonator begins to self-limit, thus defining a constant output amplitude sinusoidal signal. Constancy of the amplitude excursions are reflected to the control (gate) terminals of the P-channel differential pair 1226 and 1228 where the feedback mechanism ensures stability about unity gain.

It should be understood therefore that the differential oscillator driver circuit 718 in combination with a crystal resonator (712 of FIG. 7) function to define periodic, sinusoidal and differential signals across the terminals of the crystal resonator. The signals are differential in that they maintain a 180° phase relationship. Signal quality is promoted because the exemplary differential oscillator driver circuit is designed to be highly linear with a relatively low gain, thus reducing phase noise (phase jitter) to a significantly better degree than has been achieved in the prior art. Signal quality and symmetry is further enhanced by the symmetrical nature of the two halves of the oscillator driver circuit. Specifically, the oscillator driver circuit is symmetrical about a central axis and, when implemented in integrated circuit technology, that symmetry is maintained during design and layout. Thus, conductive signal paths and the spatial orientation of the driver's active and passive components are identical with respect to the "negative" and "positive" outputs, thereby enhancing signal symmetry and further minimizing phase jitter.

In accordance with the invention, differential crystal oscillator circuit is able to provide a periodic clock signal (approximately 10 MHz) that exhibits stable and robust timing characteristics with very low jitter. As depicted in the simplified semi-schematic block diagram of FIG. 13, a particular exemplary embodiment of a periodic signal generator circuit incorporates a differential crystal oscillator circuit according to the present invention, including a crystal resonator 12 and differential oscillator driver circuit 718. A resonant crystal circuit 12 includes first and second timing capacitors (714 and 716 of FIG. 7) which are not shown merely for convenience in ease of explanation. The resonant crystal circuit 712 is coupled, in parallel fashion, across the output terminals of the oscillator driver circuit 718 which incorporates the active device circuitry for pumping energy into the circuit in order to sustain oscillation. This parallel combination is coupled, differentially, into a linear buffer amplifier 720, which functions to provide a linear gain factor K to the differential signal provided by the crystal oscillator circuit.

Linear buffer amplifier 720 provides signal isolation, through high input impedance, as well as amplification of the oscillating (10 MHz) signal produced by the crystal resonator/oscillator driver combination. Linear buffer amplifier 720 is configured to output differential mode signals characterized by linear amplification of the input differential signals, that may then be used to drive one or more additional wave shaping-type devices, such as nonlinear buffer amplifiers 1352, 1354 and 1356.

In the exemplary embodiment of FIG. 13, the nonlinear buffers 1352, 1354 and 1356 function in order to provide signal translation (wave shaping) from the differential sign wave periodic signal present at the output of the linear buffer 720 to a digital pulse train at characteristic logic levels suitable for driving fall-on digital circuit blocks 1358, 1360 and 1362. In addition to its signal translation function, nonlinear buffers 1352, 1354 and 1356 also provide a measure of signal conditioning, transforming the purely sinusoidal signal at their inputs to a very low jittergetter square wave output.

Following digital circuitry 1358, 1360 and 1362 illustrated in the exemplary embodiment of FIG. 13 might be any type of digital circuitry that requires a stable periodic clock, such as a phase-lock-loop, a tunable filter, a digital frequency synthesizer, and the like. Characteristically, high speed switching circuits of these types generate a great deal of noise, particularly as a result of ground bounce, switch transients and ringing. In order to minimize feed through coupling of these noise sources back to the crystal oscillator circuit, and in contrast to the prior art, the system of the present invention utilizes two stages of buffering.

In the prior art, signal transformation from a sinusoidal signal to a square wave output is typically implemented by using an inverter to square sinusoidal input signal. A digital inverter function might be characterized as a nonlinear amplifier of a transformed sinusoidal input signal to a square wave by providing an extremely high gain, such that the input signal is driven to the rail during amplification (i.e., clipping). Thus, the output signal of a typical inverter might be characterized as a clipped sine wave. This particular nonlinearity characteristic of the inverter further provides opportunities for phase noise to be added to the output signal.

Phase noise (phase jitter) can also be introduced when the slope of a signal waveform going through a zero transition is not sharp. Thus, in the present invention, phase noise is minimized in the nonlinear buffer amplifiers 1352, 1354 and 1356 by amplifying the differential signal provided by the crystal oscillator circuit through the linear amplifier 720 in order to increase the amplitude, and thus the slew rate, of the signal prior to its conversion to a square wave. Phase noise resulting from zero crossings of the nonlinear buffer amplifiers is thereby minimized.

Further, in a very large scale integrated circuit, there are a great number of digital logic elements coupled to a common power supply. Switching of these digital logic elements causes the power supply voltage to move up and down, causing digital switching noise. This movement in the power supply induces a jitter component at each inverter that is used as a buffer in a conventional oscillator circuit. According to the present invention, maintaining a differential signal throughout the oscillator circuit, including the wave shaping buffers, allows the effects of power supply noise to be substantially eliminated from the oscillator, thus maintaining signal quality. In addition, the use of a differential signal throughout the oscillator's architecture allows common mode noise radiated onto the pins of the crystal resonator to be rejected.

The number of nonlinear buffers which might be cascaded in order to produce a suitable clock signal is an additional important feature in the design of a low phase noise oscillator circuit. In conventional oscillator circuits, multiple cascaded invertors are used to provide high isolation of the final, squared output signal. In such cases, each time the signal passes through a nonlinear inverter, zero crossing occurs which offers an additional opportunity for phase noise to be added to the circuit. In order to minimize phase noise, the present invention contemplates a single stage of nonlinear buffering which presents a high input impedance to the linear buffer 720 which proceeds it. Additionally, the linear buffer 720 is further provided with a high input impedance to further isolate the crystal resonator and its associated differential oscillator driver circuitry from noise loading.

An exemplary embodiment of a linear buffer suitable for use in connection-with the periodic signal generation circuit of FIG. 13 is illustrated in simplified, semi-schematic form in FIG. 14. The exemplary embodiment of FIG. 14 illustrates the conceptual implementation of a differential-in differential-out amplifier. The differential implementation has several advantages when considered in practical applications. In particular, maximum signal swing is improved by a factor of 2 because of the differential configuration. Additionally, because the signal path is balanced, signals injected due to power supply variation and switch transient noise are greatly reduced.

The exemplary implementation of a differential-in, differential-out amplifier (indicated generally at 720) of FIG. 14 uses a folded cascade configuration to produce a differential output signal, denoted $V_{out}$. Since the common-mode output signal of amplifiers having a differential output can often be indeterminate, and thus cause the amplifier to drift from the region where high gain is achieved, it is desirable to provide some form of common-mode feedback in order to stabilize the common-mode output signal. In the embodiment of FIG. 14, the common-mode output signal is sampled, at each of the terminals comprising the output $V_{out}$ and fed back to the current-sink loads of the folded cascade.

Differential input signals $V_{in}$ are provided to the control terminals of a differential input pair 1464 and 1466, themselves coupled between respective current sources 1468 and 1470 and to a common current-sink load 1472 to $V_{ss}$. Two additional transistors (P-channel transistors in the exemplary embodiment of FIG. 14) define the cascade elements for current-sources 1468 and 1470 and provide bias current to the amplifier circuit.

High impedance current-sink loads at the output of the amplifier 1476 and 1478 might be implemented by cascoded current sink transistors (N-channel transistors for example) resulting in an output impedance in the region of about 1 Mohm. The common mode feedback circuit 1480 might be implemented as an N-channel differential pair, biased in their active regions and which sample the common-mode output signal and feedback a correcting, common-mode signal into the source terminals of the cascoded transistors forming the current-sinks 1476 and 1478. The cascade devices amplify this compensating signal in order to restore the common-mode output voltage to its original level.

It should be noted that the exemplary linear amplifier of FIG. 14 might be implemented as any one of a number of appropriate alternative amplifiers. For example, it need not be implemented as a fully differential folded cascade amplifier, but might rather be implemented as a differential-in, differential-out op amp using two differential-in single-ended out op amps. Further, the actual circuit implementation might certainly vary depending on the particular choices and prejudices of an analog integrated circuit designer. The input differential pair might be either an N-channel or a P-channel pair, MOS devices might be used differentially as active resistors or alternatively, passive resistor components might be provided, and the like. All that is required is that the linear amplifier 720 amplifies a differential input signal to produce a differential, sinusoidal signal at its output. Thus, the only frequency components reflected back through the linear amplifier 720 will be sinusoidal in nature and thus, will not affect the operational parameters of the differential crystal oscillator frequency. Further, the linear buffer 720 will necessarily have a relatively high output impedance in order to attenuate noise that might be reflected back from the square wave output of the following nonlinear amplifier stages.

Turning now to FIG. 15, there is depicted a simplified semi-schematic diagram of a nonlinear buffer, indicated generally at 1582, such as might be implemented as a wave shaping or-squaring circuit 1352, 1354 or 1356 of FIG. 13. The nonlinear buffer 1582 receives a differential, sinusoidal input signal at the gate terminals of an input differential transistor pair 1584 and 1586. Drain terminals of the differential pair 1584 and 1586 are connected together in common and to a current sink supply 1588 which is coupled to a negative potential. Each of the differential pairs' respective source terminals are coupled to a bias network, including a pair of differential bias transistors 1590 and 1592 having their gate terminals tied together in common and coupled to a parallel connected bias network. The bias network is suitably constructed of a resistor 1594 and a current sink 1596 connected in series between a positive voltage potential such as Vdd and Vss. A bias node between the resistor 1594 and current sink 1596 is coupled to the common gate terminals of the bias transistor network 1590 and 1592 and defines a bias voltage for the bias network which will be understood to be the positive supply value minus the IR drop across bias resistor 1594. The current promoting the IR drop across the bias resistor 1594 is, necessarily, the current I developed by the current sink 1596.

A differential, square wave-type output (Vout) is developed at two output nodes disposed between the respective source terminals of the bias network transistors 1590 and 1592 and a respective pair of pull-up resistors 1598 and 1599 coupled, in turn, to the positive supply potential. It should be noted, that the bias network, including transistors 1590 and 1592, function to control the non-linear amplifier's common mode response in a manner similar to the linear amplifier's common mode network (transistors 1244 and 1246 and resistors 1248 and 1250 of FIG. 12).

Although depicted and constructed so as to generate a differential square wave-type output in response to a differential sinusoidal input signal, the non-linear buffer 1582 of FIG. 15 is well suited for single-ended applications as well as for differential applications. If a single-ended output is desired, one need only take a signal from one of the two symmetric outputs. The choice of whether to implement the non-linear buffer as a single-ended or a differential buffer will depend solely on the input requirements of any follow-on digital circuitry which the periodic signal generation circuit in accordance with the invention is intended to clock. This option is solely at the discretion of the system designer and has no particular bearing on practice of principles of the invention.

FIG. 16 is a semi-schematic illustration of an alternative embodiment of the differential oscillator driver circuit (718 of FIG. 12). From the exemplary embodiment of FIG. 16, it can be understood that the oscillator driver circuit is constructed in a manner substantially similar to the exemplary embodiment of FIG. 12, except that a crystal resonator is coupled across the circuit halves above the differential transistor pair, as opposed to being coupled across a circuit from the Von to Vop output terminals. The alternative configuration of FIG. 16 operates in substantially the same manner as the embodiment of FIG. 12 and produces the same benefits as the earlier disclosed oscillator. It is offered here as an alternative embodiment only for purposes of completeness and to illustrate that the specific arrangement of the embodiment of FIG. 12 need not be followed with slavish precision.

It should be understood that oscillator circuits with low phase noise are highly desirable in many particular applications. FIG. 17 illustrates one such application as a reference signal generator in a phase-lock-loop. The phase-lock-loop uses a low phase noise periodic signal generation circuit in accordance with the invention in order to generate a reference signal for use by a phase detector. Providing a clean reference signal to the phase detector is fundamental to providing a clean RF output from the PLL. Since noise and nonlinearities induced by signal generation circuit are carried through the PLL circuit, thus degrading the RF output, reducing phase noise and providing noise rejection early on in the signal processing chain is advantageous to maintaining a clean RF output. A differential crystal oscillator (710 of FIG. 7) advantageously provides this claim signal by maintaining a differential signal across the terminals of the resonating crystal, an improvement not currently available in state-of-the-art crystal oscillators. Additionally, the use of linear buffer amplifiers followed by nonlinear amplification in a reference oscillator circuit is a unique improvement over the prior art in reducing phase noise.

Since PLLs have become available in integrated circuit form, they have been found to be useful in many applications. Certain examples of advantageous application of phase-lock-loop technology include tracking filters, FSK decoders, FM stereo decoders, FM demodulators, frequency synthesizers and frequency multipliers and dividers. PLLs are used extensively for the generation of local oscillator frequencies in TV and radio tuners. The attractiveness of the PLL lies in the fact that it may be used to generate signals which are phase-locked to a crystal reference and which exhibit the same stability as the crystal reference. In addition, a PLL is able to act as a narrow band filter, i.e., tracking a signal whose frequency may be varying.

A PLL uses a frequency reference source in the control loop in order to control the frequency and phase of a voltage control oscillator (VCO) in the loop. The VCO frequency may be the same as the reference frequency or may be a multiple of the reference frequency. With a programmable divider inserted into the loop, a VCO is able to generate a multiple of the input frequency with a precise phase relationship between a reference frequency and an RF output. In order to maintain such a precise phase and frequency relationship, the frequency reference provided to the PLL must, necessarily, also be precise and stable.

FIG. 18 is a simplified block diagram of an illustrative frequency synthesizer that might incorporate the differential periodic signal generation circuit of the invention. The frequency synthesizer is a signal generator that can be switched to output any one of a discrete set of frequencies and whose frequency stability is derived from a crystal oscillator circuit.

Frequency synthesizers might be chosen over other forms of frequency sources when the design goal is to produce a pure frequency that is relatively free of spurious outputs. Particular design goals in frequency synthesizer design might include suppression of unwanted frequencies and the suppression of noise in a region close to the resonant frequency of the crystal that is a typical source of unwanted phase modulation. Synonymous terms for this type of noise are broadband phase noise, spectral density distribution of phase noise, residual FM, and short term fractional frequency deviation.

To reduce the noise produced in a synthesizer, crystal oscillators are commonly used due to their stability and low noise output. The use of a periodic signal generation circuit incorporating a differential crystal oscillator according to an embodiment of the present invention advantageously improves these performance parameters. Improved phase noise is achieved through the use of linear buffering followed by nonlinear amplification, while noise rejection is provided by the differential design utilized throughout the circuitry architecture.

It should be evident that a periodic signal generation circuit according to the invention has many uses in modern, state-of-the-art timing circuits and systems. The periodic signal generation circuit is constructed of simple active and passive components which are easily implemented in modern integrated circuit technology. Thus allowing substantially all of the components to be accommodated on one monolithic integrated circuit chip for which the crystal oscillator portion is providing a suitable, stable periodic timing reference signal. Only the resonating crystal portion (crystal resonator or quartz crystal resonator) is provided as an off-chip component. This particular configuration allows for considerable savings in component parts costs by partitioning more and more functionality into the integrated circuit chip itself.

A more detailed description of the oscillator is provided in U.S. patent application Ser. No. 09/438,689, entitled "Differential Crystal Oscillator," filed Nov. 12, 1999,now U.S. Pat. No. 6,696,898, the subject matter of which is incorporated in its entirety by reference. The oscillator's output is a differential signal that exhibits high common mode noise rejection. Use of a low noise reference oscillator with differential signal transmission allows the synthesis of stable low noise local oscillator signals. Advantageously in the present exemplary embodiment of the invention a unique generation of the local oscillator signals allows complete integration of a receiver circuit on a CMOS integrated circuit by reducing noise in the signal path.

Frequency synthesizers and a radio frequency receiver often incorporate phase locked loops that make use of a crystal oscillator as a frequency reference. A PLL is used to provide coarse tuning within the frequency band of interest while a second PLL provides fine tuning steps. Advantageously, the present embodiments of the invention utilize a method of coarse/fine PLL adjustment to improve the performance of the integrated tuner.

Coarse/Fine PLL Adjustment

FIG. 19 is a diagram illustrating receiver tuning. The combination of a wide band PLL 1908 and a narrow band PLL 1910 tuning provides a capability to fine tune a receiver's LOS 1902, 1904 over a large bandwidth in small frequency steps. For the exemplary embodiments of QAM modulation a small frequency step is 100 kHz, and 25 kHz for NTSC modulation. Fine tuning is available over an entire exemplary 50 MHz to 860 MHz impact frequency band width 1906. The first PLL 1908 tunes a first LO 1902 in large 10 MHz frequency steps and the second PLL 1910 tunes a second LO 1904 in much smaller steps. The first intermediate frequency (IF) filter 1912 has a sufficiently wide band width to allow up to 10 MHz frequency error in tuning the first intermediate frequency, with the narrow band PLL providing final fine frequency tuning to achieve the desired final IF frequency 1914.

FIG. 20 is a block diagram of an exemplary tuner 2002 designed to receive a 50 to 860 MHz bandwidth signal 2004 containing a multiplicity of channels. In this exemplary band of frequencies, there are 136 channels with a spacing between channel center frequencies of six megahertz 2008. The tuner selects one of these 136 channels 2006 that are at a frequency between 50 and 860 MHz by tuning to the center frequency of the selected channel 2010. Once a channel is selected the receiver rejects the other channels and distortion presented to it. The selected channel is down converted to produce a channel centered about a 44 MHz intermediate frequency (IF) 2012. Alternatively the value of the intermediate frequency ultimately produced by the tuner may be selected utilizing the method of the invention to provide any suitable final IF frequency, such as 36 MHz In selecting one of these 136 channels, a maximum frequency error in the local oscillator (LO) frequency used to tune the channel to a given IF of plus or minus 50 kHz is allowable. Using one frequency conversion to directly tune any one of the 136 channels to 44 MHz would require a tuning range in the local oscillator of 810 MHz. This would require a local oscillator that tunes from 94 to 854 MHz, if utilizing high side conversion.

Achieving this with a single LO is impractical. Tuning range in local oscillators is provided by varactor diodes that typically require 33 volts to tune them across their tuning range. Additionally, within this tuning range a frequency tuning step of 100 kHz is required to ensure that the center frequency of a tuned channel is tuned within plus or minus 50 kHz. Thus, a large range of frequencies would have to be tuned in small increments over a 33 volt tuning signal range.

Returning to FIG. 19 illustrating the frequency tuning method of the invention an exemplary 50 to 860 MHz signal 1906 is presented to a first mixer 1916 that is tuned with a wide band PLL 1908 that tunes a first LO 1902 in frequency steps of 10 MHz. This local oscillator 1902 is set to a frequency that will nominally center a channels that has been selected at a first IF of 1,200 MHz 1918. The first IF 1918 is then mixed 1920 to the second IF of 275 MHz 1922. This is done by the narrow band PLL 1910 that tunes a second LO 1904 in frequency steps of 100 kHz. The second IF 1922 is next mixed 1924 down to a third IF 1926 of 44 MHz by a third local oscillator signal 1928. This third local oscillator signal 1930 is derived from the second local oscillator or narrow band PLL signal by dividing its frequency by a factor of four.

FIG. 21 is an exemplary table of frequencies utilizing coarse and fine PLL tuning to derive a 44 MHz IF ("IF-3"). A process is utilized to determine the wide and narrow band PLL frequencies. The relationship between the wideband PLL and narrowband PLL frequencies to yield the desired intermediate frequency is found from:

$$FLO1 - Fsig - (5/4 \cdot FLO2) = Fif \qquad (4)$$

where:
FLO1: PLL1 frequency (10 MHz steps)
FL02: PLL2 frequency
   (e.g., 25 kHz/100 kHz/200 kHz or 400 kHz step)
Fsig: Input signal
Fif (e.g., 44 MHz or 36 MHz or whatever IF is required)

EXAMPLE

1250M−50M−(5/4*924.8M)=44M where: Fsig=50 MHz
FLO1=1250 MHz
FLO2=924.8 MHz
Fif=44 MHz FIG. 21 and 22 utilized this formula to derive the values entered into them to tune the exemplary cable TV signals "Frf". For example the first column 2102 of the table lists the frequencies needed to tune a signal centered at 50 MHz ("Frf") to a 44 MHz final IF ("IF-3"). To tune a received channel centered at 50 MHz a first LO of 1,250 MHz ("LO-1") is provided by a wide band, or coarse, PLL. This produces a first IF of 1,200 MHz ("IF-1"). Next utilizing 100 kHz tuning steps to adjust LO 2, it is set to 924.8 MHz ("LO-2"). Note this is not exactly 925 MHz. Dividing the second LO by 4 in this instance yields 231.2 MHz for a third LO ("LO-3"). When LO 3 is applied to the second IF of 275.2 a third IF of 44 MHz ("IF-3") is produced. This tuning arrangement is illustrated for received channels having a six MHz channel spacing as can be seen from the line entitled "Frf". In each case the coarse fine tuning approach yields a third IF ("IF-3") of 44 MHz.

FIG. 22 is an illustration of an alternative embodiment of the coarse and fine PLL tuning method to produce an exemplary final IF of 36 MHz. In this case as previously, a first IF (IF-1)is tuned to 1,200 MHz plus or minus 4 MHz. And second LO (LO-2) is close to 930 MHz, utilizing a small offset to yield a third IF of 36 MHz (IF-3). These predetermined tuning frequencies are stored in a memory and applied when a command is given to tune a given channel. Alternatively an algorithm may be supplied to produce the tuning frequencies. It is understood that these frequencies are exemplary and other frequencies that utilize this method are possible.

Thus, it can be seen that the interaction of course and fine PLL frequencies are utilized to produce a third IF of 44 MHz. A second LO (LO-2) is maintained close to a frequency of 925 MHz to tune each of the channels. However, it is slightly off by a very small tuning step of 100 kHz. Note that the first IF (IF-1) is not always right at 1,200 MHz. Sometime it is off by as much as 4 MHz either above or below 1,200 MHz. This error will still result in signal transmission through a first IF filter. The maximum error utilizing this scheme is plus or minus 4 MHz.

This method of PLL adjustment is described in more detail in U.S. patent application Ser. No. 09/438,688, entitled "System and Method for Coarse/Fine PLL Adjustment," filed Nov. 12, 1999, now U.S. Pat. No. 6,591,091, the subject matter of which is incorporated in its entirety by reference.

A coarse, and a fine PLL use a common reference frequency oscillator. Local oscillator signals produced by the frequency synthesizer's phase locked loops inject noise produced in the reference frequency oscillator and the PLLs into a signal path through the PLL output. Noise injected can be characterized as either phase noise or jitter. Phase noise is the frequency domain representation of noise that, in the time domain is characterized as jitter. Phase noise is typically specified as a power level below the carrier per Hertz at a given frequency away from the carrier. Phase noise can be mathematically transformed to approximate a jitter at a given frequency for a time domain signal. In a clock signal jitter refers to the uncertainty in the time length between zero crossings of the clock signal. It is desirable to minimize the jitter produced in an oscillator circuit and transmitted through the signal chain into the signal path to prevent noise degradation in the receiver path. Equivalently, any oscillator producing a stable output frequency will suffice to produce a reference frequency for the PLL circuitry.

Another obstacle to integrating an entire receiver on a single CMOS chip has been the inability to fabricate a satisfactory filter structure on the chip. As previously described, a multitude of unwanted frequencies created through circuit non linearities are a major obstacle in achieving satisfactory receiver performance. Filtering is one method of eliminating these unwanted spurious signals. An integrated filter's center frequency tends to drift, and needs calibration to maintain performance. To successfully use filtering on chip, an auto calibration loop is needed to center the filter response.

FIG. 23 is a block diagram of a dummy component used to model an operative component on an integrated circuit chip.s According to one aspect of the invention, a dummy circuit on an integrated circuit chip is used to model an operative circuit that lies in a main, e.g. RF, signal path on the chip. Adjustments are made to the dummy circuit in a control signal path outside the main signal path. Once the dummy circuit has been adjusted, its state is transferred to the operative circuit in the main signal path. Specifically, as shown in FIG. 23, there is a main signal path 2201 and a control signal path 2202 on an -integrated circuit chip. In main signal path 2201, a signal source 2203 is coupled by an operative circuit 2204 to be adjusted to a load 2205. Main signal path 2201 carries RF signals. Signal source 2203 generally represents the portion of the integrated circuit chip upstream of operative circuit 2204 and load 2205 generally represents the portion of the integrated circuit chip downstream of operative circuit 2204. In control signal path 2202, a control circuit 2206 is connected to a dummy circuit 2207 and to operative circuit 2204. Dummy circuit 2207 is connected to control circuit 2206 to establish a feedback loop. Dummy circuit 2207 replicates operative circuit 2204 in the main signal path in the sense that, having been formed in the same integrated circuit process as operative circuit 2204, its parameters, e.g., capacitance, inductance, resistance, are equal to or related to the parameters of operative circuit 2204. To adjust operative circuit 2204, a signal is applied by control circuit 2206 to dummy circuit 2207. The feedback loop formed by control circuit 2206 and dummy circuit 2207 adjusts dummy circuit 2207 until it meets a prescribed criterion. By means of the open loop connection between control circuit 2206 and operative circuit 2204 the state of dummy circuit 2207 is also transferred to operative circuit 2204, either on a one-to-one or a scaled basis. Thus, operative circuit 2204 is indirectly adjusted to satisfy the prescribed criterion, without having to be switched out of the main signal path and without causing disruptions or perturbations in the main signal path.

In one implementation of this dummy circuit technique described below in connection with FIGS. 24a-c and FIGS. 25-27, operative circuit 2204 to be adjusted is a bank of capacitors in one or more operative bandpass filters in an RF signal path, dummy circuit 2207 is a bank of related capacitors in a dummy bandpass filter, and control circuit 2206 is a phase detector and an on-chip local oscillator to which the operative filter is to be tuned. The output of the local oscillator is coupled to the dummy filter. The output of the dummy filter and the output of the local oscillator are coupled to the inputs of the phase detector to sense the difference between the frequency of the local oscillator and the frequency to which the dummy filter is tuned. The output of the phase detector is coupled to the dummy filter to adjust its bank of capacitors so as to tune the dummy filter to the local oscillator frequency. After the dummy filter is tuned, the state of its capacitor bank is transferred, either on a one-to-one or scaled basis, to the operative filter. Since the capacitor bank in the dummy filter replicates that of the operative filter, the frequency to which the operative filter is tuned can be easily scaled to the frequency of the dummy filter.

In another implementation of the dummy circuit technique described below in connection with FIGS. 28 to 33, operative circuit 2204 to be adjusted is a filter having a spiral inductor that has a temperature sensitive internal resistance. Dummy circuit 2207 has an identical spiral inductor. Control circuit 2206 has a controllable variable resistor in series with the inductor of dummy circuit 2207. The controllable resistor is driven by a feedback loop to offset changes in the internal resistance of the inductor of dummy circuit 2207. Operative circuit 2204 has a similar controlled resistor in series with its inductor to transfer the resistance value of the controllable resistor in control circuit 2206 to the resistor of the operative circuit 2204 in open loop fashion.

Filter Tuning FIG. 23*a* is a block diagram illustrating the use of a tuning circuit outside of a signal path to tune bandpass filters present in a receiver. A tuning circuit 2302 utilizes a substitute or "dummy" filter stage 2310 to derive tuning parameters for a filter bank 2304 present in a signal path 2306. The tuning circuit utilizes a local oscillator signal 2308 available in the receiver to tune the dummy filter 2310 to the center frequency of the local oscillator. Once tuned, the dummy filters 2310 tuned component values that result in a tuned response at the local oscillator frequency are scaled in frequency and applied to the bandpass filter 2312. The filters are tuned at startup, and the tuning circuitry is turned off during normal operation. This prevents the injection of additional noise into the signal path during operation.

FIG. 23*b* is a flow diagram of the tuning process in operation receiver is initially powered up 2312 and local oscillator signals generated by PLLs are centered at their design frequency 2314. Once the PLLs are locked their frequency is a known condition. Next substitute filter tuning is initiated 2316 and performed. When finished a signal is received back from the filter tuning network indicating that it is ready 2318. Information from the tuning network is copied to the receive path filter circuit 2320. Next the filter tuning circuit is turned off 2322 disconnecting it from the filter circuit. In the embodiments of the invention the narrow band PLL (2308, of FIG. 23*a*) is used as reference frequency in the tuning circuit. However, it is understood that this tuning technique may be utilized with any readily available signal.

Returning to FIG. 23*a*, in an exemplary embodiment of the invention a 925 MHz signal is directly available from the narrow band PLL 2308. It is used to tune the dummy filter 2310 contained in the tuning circuit 2302 associated with the 1,200 MHz filter 2304. After the dummy filter is tuned to 925 MHz, frequency scaling is used to obtain the proper component values for the 1,200 MHz filter response to be centered. The exemplary 925 MHz signal generated by the narrow band PLL is divided by 4 to yield a 231 MHz third LO signal utilized in additional tuning circuitry.

Other divisions or multiplications may be equivalently used to tune dummy filters. A second exemplary filter tuning circuit 2302 for a 275 MHz filter contains a dummy filter 2310 that is tuned to a center frequency of 231 MHz. Once tuned, the component values used to center the 231 MHz dummy filter 2310 are scaled to yield a centered response for the 275 MHz filter 2304. At this point in time the tuning circuits 2302 are switched off. It is especially important to turn off the exemplary tuning circuits on the 275 MHz filter since the 231 MHz signal used to tune its dummy filter falls in an exemplary 50-860 MHz band.

It is to be understood that any available frequency may be used to tune a substitute filter so that another filter, that does not have an appropriate tuning signal present, may be tuned. This is done by scaling the component values of the tuned dummy filter to values appropriate for the filter not having the tuning frequency present. Tuning values obtained for a dummy filter may be applied to all filters present in a bank of filters having a common center frequency. Also tuning values obtained for a dummy filter may be applied to multiple filters present having differing center frequencies by applying differing scaling factors. Finally multiple filters at different locations in a signal path that have common center frequencies may be tuned by a common tuning circuit.

Capacitors disposed on an integrated circuit vary in capacitance value by as much as +/−20%. Thus, to provide a satisfactory receiver performance a method of tuning integrated filters that removes this variation in capacitance is needed. In an LC filter circuit either an inductance or a capacitance can be tuned. However, inductors are difficult to tune. Therefore, in the embodiments of the invention values of capacitance present in the filters are tuned. In tuning the exemplary embodiments, one or more capacitors are switched in and out of an LC filter circuit to tune it.

These capacitors are switched in and out of a filter circuit electronically-. Capacitors with the same dimensions are provided in a bandpass filter and a dummy filter to provide satisfactory matching between the devices. Switchable caps in the embodiments of the invention are MOS caps that are all of the same value and from factor. However, it is to be recognized that other weighting of capacitor values could be provided to achieve an equivalent function. For example, binary or 1/x weighted values of capacitors could be disposed in each filter to provide tuning. In the embodiments of the invention a bank of fixed capacitors and a bank of electronically tunable capacitors are provided. The adjustable capacitors in the exemplary embodiment represent 40% of the total capacitance provided. This is done to provide for the ±20% variance in center frequency due to manufacturing variances. To accommodate other ranges of manufacturing variations or alternative tuning schemes any fraction or all of the capacitors may be switchable. It is also understood that any type of switchable capacitor, in addition to a MOS capacitor type may be utilized.

FIG. 24 is an exemplary illustration of a tuning process utilizing switched capacitors. Filter responses shown at the bottom plot 2402 illustrate a tuning of a dummy filter 2310 that is contained in a tuning circuit 2302 of FIG. 23*a*. A frequency response being tuned in the upper graph 2404 shows the tuning of the exemplary 1,200 MHz bandpass filter 2304 of FIG. 23*a*. Initially none of the switched capacitors are applied in a dummy filter circuit. This places the filter response initially 2406 above the final desired tuned response frequency 2408. In this example capacitors are added until the filter response of the dummy filter is centered about 925 MHz. However, the tuned response of the 925 MHz dummy filter 2408 is not the desired center frequency of the bandpass filter in the signal path. The values used in to tune the dummy filter would not tune the 1,200 MHz filter to the correct response. Frequency scaling is used to tune the desired response. This can be achieved because identical capacitors disposed on a chip are very well matched in value and parasitics. In particular capacitor matching is easy to achieve by maintaining similar dimensions between groups of capacitors. In scaling a response to determine a capacitance to apply in a bandpass filter, identical inductance values have been maintained in the dummy and bandpass circuits. Thus, only a scaling of the capacitors is necessary. The frequency relation in the exemplary embodiment is given by the ratio:

$$\frac{1}{2} \approx \sqrt{\frac{(L_2)(C_2)}{(L_1)(C_1)}} \quad (5)$$

For this particular embodiment utilizing identical inductor values $L_1=L_2$. This reduces to:

$$\frac{f_1}{f_2} \approx \sqrt{\frac{(C_2)}{(C_1)}} \quad (6)$$

For the exemplary embodiment this is equal to 925/1200, or a capacitance ratio of 3:5. However, it is understood that other ratios will allow tuning to be performed equivalently.

Returning to FIG. 23a various control signals applied to the tuning circuit are shown. In the event that the tuning is slightly off after the tuning procedure, an offset control circuit is provided within the tuning circuit of FIG. 23 to move the tuning of the filters up or down slightly by providing a manual means of adding or removing a capacitor. This control is shown by an "up/down" control line 2324 of FIG. 23a. The exemplary tuning circuit of FIG. 23 is additionally provided with a "LO" 2308 tuning frequency to tune the dummy filter. The "10 MHz reference" signal 2326 is utilized as a clock in the tuning circuit that controls the sequence of adding capacitors. The "reset" signal 2328 resets the tuning circuit for the next tuning cycle.

FIG. 25 is a block diagram of an exemplary tuning circuit. A reset signal 2502 is utilized to eliminate all the capacitors from the circuit at power up by resetting a counter 2504 that controls the application of the switched capacitors. The reset signal may be initiated by a controller or generated locally. This provides a known starting point for filter tuning. Next a filter figure of merit is examined to determine iteratively when to stop tuning.

FIG. 26 illustrates the amplitude 2602 and phase 2604 relationship in an LC filter tuned to its center frequency, fc. In tuning a filter to a center frequency two responses are available for examination. Amplitude and phase response are parameters that may be used to tune the filter. For a wide band LC filter amplitude response 2602 is not the optimal parameter to monitor. At the center frequency the top of the response curve is flat making it difficult to judge if the response is exactly centered. The phase response 2604 however, has a rather pronounced slope at the center frequency. The steep slope of the phase signal provides an easily discernable transition for determining when the center frequency has been reached.

Returning to FIG. 25, phase detection is used to detect when a dummy filter 2506 has been tuned. An exemplary 925 MHz input from a narrow band PLL is input 2508 to a phase detector 2510. The phase detector compares the phase of a signal input to a dummy filter 2508 to a phase of the output 2512 of that filter 2506. The phase detector produces a signal that is internally low pass filtered to produce a DC signal 2514 proportional to the phase difference of the two input signals 2512, 2508. When tuned there is a 90 degree phase shift across capacitors internal to the phase detector, that corresponds to 0 degrees of phase shift across the filter. Zero (0) degrees of phase shift produces a 0 volt output. Since it is known that with the capacitors switched out of the filter circuit 2506 that the center frequency of the filter is high, the comparator 2516 following the low pass filter is designed to output 2518 a high signal that enables filter capacitors to be switched in until the phase detector 2510 indicates no phase difference is present across the filter 2506 at the tuned frequency. With a zero degree phase shift detected the comparator 2516 disables the counter preventing any further capacitors from being switched into the filter circuit.

The phase detector 2510 of the exemplary embodiment utilizes a gilbert cell mixer 2512 and an integral low pan filter 2525 to detect phase. However, other phase detectors may be equivalently substituted for the mixer circuit. The 90° phase shift between an i port 2508 and a q port 2512 is being detected by the mixer. A 90° phase shift between the i and the q signals in the mixer provides a 0 volt output indicating that those signals are in quadrature relation to each other. The signals are shown as differential signals, however single ended signals may equivalently be used.

The phase detector out 2514 is next fed into a comparator 2516 that is set to trip on a zero crossing detected at its input. When a zero crossing is encountered as the phase detector output approaches zero, the comparator latches and a counter 2504 is shut off and reset 2518. The comparator function is equivalently provided by any standard comparator circuit known by those skilled in the art.

The counter 2504 counts based on the 10 MHz reference clock 2524, although many periodic signals will suffice as a clock. As the counter advances more filter capacitors are switched into the circuit. In the embodiments of the invention 15 control lines 2526 are used to simultaneously switch the capacitors into the dummy filter and the bandpass filter bank. The control lines remain hard wired to both filters 2528, 2506, and are not switched off. However, once the comparator 2516 shuts the counter 2504 off the tuning circuit 2530 is inactive and does not affect the band pass filter 2520 in the signal path.

FIG. 27 is a schematic diagram showing the internal configuration of switchable capacitors in a differential signal transmission embodiment of the dummy filter 2506 and the construction of the phase detector 2510. A set of fifteen control lines 2526 are utilized to switch fifteen pair of MOS capacitors 2702 on and off. The capacitors are switched in and out by applying a given control signal to a virtual ground point 2704 in this configuration. Thus, when the capacitors are connected as shown the control signal is being applied at a virtual ground. Thus, parasitic capacitances at this point will not affect the filter 2506 performance. A gain producing LC stage 2706 of the dummy filter is of a differential configuration and has its LC elements 2708 connected in parallel with the MOS capacitors 2702.

Thus, with a capacitance ratio of 3:5 being utilized in the exemplary one line of embodiment a hard wired bus 2526 going to the dummy filter 2506 will switch in 5 unit capacitors, while the other end of the line that goes to the bandpass filter (2528 of FIG. 25) in the signal path will switch in 3 unit capacitors.

In the mixer circuit that is used as a phase detector 2710 in the exemplary embodiment, differential image ("i") signals $I_P$ and $I_N$ and differential quadrature ("q") signals $Q_P$ and $Q_N$ are input to the phase detector. A conventional Gilbert cell mixer configured as a phase detector 2710, as shown, has delay between the i port 2508 and q port 2512 to the output 2514. The i delay to the output tends to be longer due to the fact that it must travel through a greater number of transistors than the q input to output path. Thus, even if i and q are exactly 90 degrees out of phase a DC offset tends to produced due to the path length differences causing a phase error. To remedy this situation a second Gilbert cell mixer is duplicated 2710 and connected in parallel with the first 2710. However, the i port and the q port connected to the mixer 2712 are swapped to average out the delay thus tending to reduce the offset. This results in an almost 0° output phase error that is independent of frequency. Other types of phase detectors and other means of equalizing the delay, such as a delay line are understood by those skilled in the art to provide an equivalent function.

In the embodiment shown, the loss pass filter is implemented by a single capacitor 2714 at each output. However, other equivalent methods of achieving a low pass filter known to those skilled in the art are acceptable as well.

A method of filter tuning the advantageously uses the frequency synthesizer output is fully described in U.S. patent application Ser. No. 09/438,234, entitled "System and Method for On-Chip Filter Tuning," filed Nov. 12, 1999, now U.S. Pat. No. 6,285,865, the subject matter of which is incorporated in its entirety by reference.

Filters contain circuit elements whose values are frequency and temperature dependent. The lower the frequency, the larger the size of the element required to realize a given value. These frequency dependent circuit elements are capacitors and inductors. The fabrication of capacitors is not as problematic as the fabrication of inductors on an integrated circuit. Inductors require relatively more space, and because of their size has a temperature dependent Q.

Compensation for Inductor Q Drift with Temperature

FIG. 28 is a plan view of a multi-track spiral inductor. An inductor of this type is made from several long narrow strips of metal connect in parallel and disposed upon an integrated circuit substrate. A multi-track integrated spiral inductor tends to produce an inductance with a high Q. High Q is desirable to achieve lower noise floors, lower phase noise and when used in filters, a better selectivity. To reduce series resistance and thus Q of a spiral inductor, wide track widths in the spiral are used. However, when track width is increased beyond 10-15 μm the skin affect causes the series resistance of a spiral inductor to increase at high frequencies. Thus, Q is reduced even though a wide track has been used. This trend tends to limit the maximum Q achievable in integrated spiral inductors.

An exemplary embodiment of the invention utilizes a spiral inductor that is wound with several narrow tracks disposed in parallel upon a substrate. By splitting an exemplary 30 μm wide track into two 15 μm tracks disposed in parallel on the substrate, the inductor Q tends to increase. Alternative embodiments of the invention by utilize single track spiral inductors or multiple track inductors containing one or more tracks disposed in parallel upon a substrate. In the multiple track inductors described, the tracks are joined together at the beginning of a winding and again joined together at the end of the winding by a conductive material. An exemplary inductor suitable for integration is described in more detail in U.S. patent application Ser. No. 09/493,942, entitled "Multi-Track Integrated Spiral Inductor," filed Jan. 28, 2000, now U.S. Pat. No. 6,885,275, which is incorporated herein in its entirety by reference thereto.

One or more spirals of metal have a series resistance associated with them. A spiral can be quite long, thus, the series resistance of the inductor is not negligible in the design of the circuit even with a parallel connection of tracks. As the temperature of the circuit rises, such as would occur after the initial power-up of an integrated circuit, the series resistance of the inductor increases, thus causing the Q to decrease. Circuitry is provided to continuously compensate for this increasing series resistance.

An inductor, or coil, has always been a fabrication problem in integrated circuitry. Inductors are typically not used in integrated circuits due to the difficulty of fabricating these devices and due to the large amount of area required to fabricate them. A given inductance may be realized by a single strip or metallic ribbon of a given width and thickness suspended over a ground plane. A multiple track inductor also requires more space than a simple track device.

It is a rule of thumb that the higher the frequency the smaller the dimensions of the integrated circuit component required in a filter to achieve a given set of circuit values. A spiral inductor of the type described in the embodiments of the invention allows an inductance to be satisfactorily fabricated on a CMOS substrate. Many alternative embodiments of the spiral are known to those skilled in the art. The realization of inductance required in any embodiment of the invention is not limited to a particular type of integrated inductor.

FIG. 29 is an exemplary illustration of the possible effects of inductor Q on filter selectivity in a parallel LC circuit, such as shown in 2706 of FIG. 27. The Q of a spiral inductor tends to be low. In order to advantageously control the Q so that the maximum performance of an integrated filter may be obtained, calibration of inductor Q is used.

The overall effect of this is that when a device with high series resistance and thus, low Q is used as a component in a filter that the overall filter Q is low 2902. A high Q filter response is sharper 2984. The goal of a filter is to achieve frequency selectivity. The filter selectivity is the same electrical property as selectivity in the "front end" of the receiver previously described. If the filter has a low Q frequencies outside the pass band of the filter will not achieve as great of an attenuation as if the filter contained high Q components. The high degree of selectivity is required to reject the multitude of undesirable distortion products present in a receiver that fall close to the tuned signal. Satisfactory inductor dimensions and device Q have been obstacles in integrating filters on a CMOS substrate.

Prediction of the inductance yielded by the spiral is closely approximated by formula. However, prediction of the inductor's Q is more difficult. Three mechanisms contribute to loss in a monolithically implemented inductor. The mechanisms are metal wire resistance, capacitive coupling to the substrate, and magnetic coupling to the substrate. Magnetic coupling becomes more significant in CMOS technologies with heavily doped substrates, because the effect of substrate resistance appears in parallel with the inductor. The first four or five turns at the center of the spiral inductor contribute little inductance and their removal helps to increase the Q. In spite of extensive research inductors implemented in CMOS possess Qs after limited to less than five.

FIG. 30 is an illustration of a typical filter bank 3002 utilized in embodiments of the invention for filtering I and Q IF signals 3208. Band pass filters utilized in the embodiments of the invention have a center frequency $f_c$ and are designed to provide a given selectivity outside of the pass bond. The exemplary filters 3002 also incorporate gain. Gain and selectivity are provided by a transconductance stage with an LC load resulting in an active filter configuration that gives the filter response shown. Over temperature the filter response degrades as indicated. This degradation is attributed to inductors. With the spiral inductors utilized in the embodiments of the invention the gain of this filter stage is substantially determined by the Q or quality factor of the inductor. The Q is in turn substantially determined by the series resistance of the metal in the spiral of the inductor. The Q decreases as temperature increases causes an increase in inductor series resistance. The decrease in Q with increasing temperature adversely affects the filter characteristics. As can be seen in 306 at FIG. 30 as the temperature increases from 50° C. 3004 to 100° C. 3006 overall gain decreases, and selectivity is degraded.

FIG. 31 is a diagram of an exemplary differential transconductance stage 3102 with an LC load 3104. This figure comprises elements of one of the filter gain stages that are a part of one of the filters that comprise the filter bank 3002 of FIG. 30 . Two forms of the LC load's equivalent circuit are shown in the FIG. 3106, 3108. Resistor R(T) has been added 3106 to account for the series resistance of inductor L that tends to increase in direct proportion to the temperature of the inductor. The circuit may in turn be represented in parallel form 3108 to yield an equivalent response using the elements L' and R' (T). A method of compensating for the parallel R' (T) is desirable. It is done by increasing the Q of the filters with Q enhancement, and by stabilizing the enhanced value of Q obtained over the range of temperatures encountered in circuit operation. First the implementation of Q enhanced filters is explained.

FIG. 32 shows a transconductance stage 3102 with an LC load 3104 that is provided with Q enhancement 3202 and Q compensation over temperature 3206. Q enhancement 3202 tends to increase the circuit Q thus, increasing the frequency selectivity of the circuit. A Q enhancement is provided by the transconductance element's $G_m$, 3202 connected as shown. Addition of this transconductance element is equivalent to adding a negative resistance 3024 that is temperature dependent in parallel with R' (T). This negative resistance tends to cause cancellation of the parasitic resistance thus, tending to increase the circuit Q. The details of Q enhanced filters are disclosed in more detail in U.S. patent application Ser. No. 09/493,942, entitled "System and Method for Linearizing a CMOS Differential Pair," filed May 17, 2000, now U.S. Pat. No. 6,985,035, the subject matter of which is incorporated in this application in its entirety by reference. Once an improved Q is achieved it is desirable to maintain it over the range of temperatures encountered in circuit operation with temperature compensation circuitry 3206.

Due to a large positive temperature coefficient inductor quality factor (Q) is proportional to temperature. As temperature increases the resistance in the spiral increases, degrading the Q. The addition of transconductance from the $G_m$ stage 3102 tends to increase the Q of the filter. However, the effects of temperature on quality factor tends to cause wide gain variation tending to need further improvement. In an embodiment of the invention for a temperature range from 0 to 100° C., Q and gain vary +/−15% in an unenhanced filter. In an embodiment with a Q enhanced filter, the Q and gain variation is doubled. In multiple stages of filtering used in the embodiments, over 20 db of gain variation is thus encountered over temperature with the Q enhanced filters. This results in an unacceptable change in the conversion gain of the receiver. A further means of reducing the variation in Q (and thus gain) over temperature is desirable 3206.

FIG. 33 shows a method of stabilizing inductor Q over temperature 3206. This method advantageously uses a DC calibration loop 3202 and a dummy inductor 3304 to control the value of inductor series resistance R(T) and a resistive element R(1/T) 3314 to produce a net constant resistance. Thus, Q induced variation in filter response due to temperature are controlled. This method advantageously does not require the use of any high frequency signals in the tuning process. An inductor 3306 as utilized in the filters of FIG. 30's filter bank 3002 with its associated series resistance R(T) is shown as an element in a temperature compensation circuit 3208. An electronic device that supplies a variable resistance 3310 of an amount inversely proportional to temperature is added into the circuit 3314. The decreasing resistance of the additional resistance 3314 with increasing temperature counteracts the increasing resistance of the inductor's series resistance R(T). In the circuit diagram this decreasing resistance is shown schematically as R(1/T). This resistance is provided by the active resistance of a PMOS transistor biased accordingly 3314. However any device capable of producing the desired resistance characteristic described above is an acceptable substitute.

A PMOS resistor is used in two places 3312,3314 to place the control element 3314 in the circuit and remove the control circuit 3208 from a main circuit 3308. In the embodiment shown, the PMOS transistor's gate to source connection is placed in series with the spiral inductor 3306 of the LC circuit 3308 making up an active filter stage. The active filter stage is controlled from a remotely located control circuit 3208 that contains a duplicate PMOS resistor 3312 and inductor 3304. Inductor 3304 is advantageously fabricated with the same mask pattern as used for inductor 3306. The control circuitry 3208 is not a part of the filter circuitry 3308 in order to prevent undesirable interactions with the radio frequency signals present in the filter. In the control circuit shown, the active resistor 3312 in series with the spiral inductor 3304 is duplicated remotely from the filter circuit 3308. To communicate the control signal 3316 the gate of the PMOS resistor 3312 is coupled to the gate of the PMOS resistor in the filter 3314.

The control circuit provides a conventional constant current and a conventional constant voltage source function to maintain a constant current through and voltage across the dummy spiral inductor 3304 duplicated in the control circuit. An exemplary constant current and constant voltage source is shown 3302 incorporating a dummy inductor 3304. However, any circuit that maintains a constant voltage across, and current through the inductor 3304 in the control circuit 3208 is sufficient for the design.

As gate voltage 3316 changes to maintain the constant current and voltage across the inductor in the control circuit 3304, the gate control signal 3316 is simultaneously fed to the LC filter stage 3308 PMOS transmitter 3314 to control the resistance, and thus the Q, of the inductor in the filter circuit 3308.

An exemplary constant current and voltage source is illustrated 3302 comprising dummy inductor 3304. A temperature independent voltage reference $V_{ref}$ is established by resistor R and conventional current sources I. Amplifier A's negative. input is connected to the voltage reference, and its positive input is connected to a symmetrical point between an identical current source and the dummy inductor. The output of amplifier A is fed into the gate of the transistor functioning as a variable resistor 3312. The constant voltage drop over temperature at the node $V_{ref}$ is compared to the voltage at the positive amplifier terminal. The amplifier controls the resistance of the PMOS transistor so that a constant current and constant voltage are maintained across the dummy inductor.

The calibration of inductor Q is described in more detail in U.S. patent application Ser. No. 09/439,156, entitled "Temperature Compensation for Internal Inductor Resistance," filed Nov. 12, 1999, now U.S. Pat. No. 6,504,420, the subject matter of which is incorporated in its entirety by reference.

Communications Receiver

FIG. 34 is a block diagram of a communications network utilizing a receiver 3402 according to an exemplary embodiment of the invention. A communications network, such as a cable TV network 3404, capable of generating signals provides radio frequency signals 3406 over the air waves, through a cable or other transmission. A receiver front end 3408 next converts the RF single ended signal to a differential signal. A receiver front end, or a Balun may be used to convert a single ended signal 3406 to a differential signal or vise versa 3410. The receiver block which contains an exemplary embodiment of the invention next converts the differential radio frequency signal 3410 to a differential intermediate frequency (IF) 3412. The IF signal 3412 is next converted down to PC and demodulated into a base band signal 3414 by a demodulator 3416. At this point the base band signal 3414 is suitable for presentation to the video input of a television receiver, the audio inputs to a stereo, a set top box, or other such circuitry that converts the base band signal into the intended information output.

The communication system described is contemplated to provide the function described above in one or more circuit assemblies, integrated circuits or a mixture of these implementations. In particular, the RF front end 3408 may be integrated in a single chip with receiver 3402. Alternatively, the front end and receiver may be implemented as individual integrated circuits, on any suitable material such as CMOS.

In addition, the receiving system described utilizes additional exemplary embodiments that incorporate one or more transmitters and one or more receivers to form a "transceiver" or "multiband transceiver." The transceiver contemplated may transmit and receive on differing frequencies or the same frequency with appropriate diplexer, transmit receive switching or functionally equivalent circuitry.

The frequency bands and modulation described in the specification are exemplary with the inventions not being limited in scope to any particular frequency band or modulation type.

Receiver Front End-programable Attenuator and LNA

To achieve a low noise figure what is left out of the circuit is often as important as what is included in it to achieve a low noise figure. A circuit containing few components in desirable since each component in a circuit adds to noise generated in the circuit. Switches are often included early in a signal path to switch in attenuator sections, reducing the level of a signal present. The reduction in signal level is necessary to prevent a following receiver circuit from being over driven into distortion.

Additionally, the circuit described as a front end circuit may also be employed as an automatic gain control ("AGC") amplifier. The AGC amplifier may advantageously be used at any point in the signal processing chain where an adjustable gain and adjustable attenuation according to an external control signal is desired. In one specific embodiment, a control signal 4302 representative of the signal level of base band signal 3414 (FIG. 34) is fedback from block 3416 to RF front end 3408. By way of example, control signal 4302 could be formed by sampling the sync pulses of the base band television signal and averaging the amplitude of the sync pulses over a period of time.

Advantageously, the present invention has eliminated the need for switches, reducing a major contributor to increased noise figure. In an integrated switchless programmable attenuator and low noise amplifier only two elements are present in the signal path to contribute to the noise figure. First an attenuator is present in the circuit path. The next element in series with the attenuator in the signal path is a differential pair low noise (LNA) amplifier. In the differential pair noise figure is lowered by introducing a sufficient bias current to increase a transconductance $g_m$ associated with the amplifier. The increased $g_m$ decreases the noise contribution of the differential pair.

By eliminating the need for switches it is possible to integrate the programmable attenuator and LNA onto a single CMOS integrated circuit. An additional advantage can be realized in using an integrated programmable attenuator and LNA as a "front end" of an integrated receiver. A single integrated circuit can be economically fabricated on CMOS that contains an entire tuner circuit including the front end and the tuner. Alternatively, the front end and tuner circuits may be on separate interconnected substrates.

FIG. 35 is an illustration of the input and output characteristics of an integrated switchless programmable attenuator and low noise amplifier 3502. Attenuator/amplifier 3502 simulates a continuously variable potentiometer that feed a linear amplifier. As the potentiometer setting changes the signal level at the input to the amplifier changes, and the output of the amplifier changes accordingly. The exemplary embodiment is a two radio frequency (RF) port device—the input port 3504 is configured to receive a single ended input signal from a source 3508 and the output port 3506 is configured to present a differential signal. In the single ended input configuration one terminal upon which a signal is carried is above ground reference 3510. In the differential output configuration the signal is divided and carried on two terminals above ground reference 3510.

In the exemplary embodiment multiple control signals 3512 are applied to the integrated switchless attenuator and LNA 3502. For example these signals are used to program the attenuator to various levels of attenuation, and for an output smoothness control.

In the exemplary embodiment the differential output 3506 advantageously tends to provide noise rejection. In a differential output configuration, the signal at one terminal is 180° out of phase from the signal at the other terminal and both signals are of substantially equal amplitude. Differential signals have the advantage that noise that is injected on either terminal tends to be canceled when the signal is converted back to a single ended signal. Such common mode noise is typically of equal amplitude on each pin and is typically caused by radiation into the circuit from external sources, or it is often generated in the circuit substrate itself. Advantageously, the present invention uses differential signal transmission at its output. It should be noted that in alternate embodiments of the invention, that a signal ended output can be produced from the differential signal by various techniques known in the art. Also, equivalently a differential input may be substituted for the single ended input shown.

FIG. 36 is a functional block diagram of the integrated switchless programmable attenuator and low noise amplifier circuit. This embodiment illustrates how it is possible to eliminate switches that would be required in a conventional attenuator and LNA.

A resistive attenuator 3601 is configured as a ladder circuit made up of resistors configured as multiple pi sections 3602. A method of selecting resistor values such that a constant impedance is presented to the signal source is accomplished as is conventionally known in the art. An exemplary embodiment utilizes an R/2R configuration. Each pi section 3602 of the attenuator 3601 is connected to one input to a differential pair amplifier 3603. The other input to amplifier 3603 is grounded. The resulting attenuation produced at the output 3604 is controlled by the number of differential amplifier stages that are turned on and the degree to which they are turned on.

Individual amplifiers 3603 are turned on or off by tail-current generators 3605 associated with each stage 3603, respectively. Generation of the tail currents is discussed in more detail below in connection with FIG. 44a and 44b. In FIG. 36 a zero or one is used to indicate if the corresponding tail-current generator 3605 is turned on or off, that is whether or not a tail-current is present. For example, a zero is used to show that no tail-current is present and the corresponding generator 3605 is turned off. A one represents a tail-current generator 3605 that is turned on rendering the corresponding amplifier 3603 functional. The zeroes or ones are provided by the control lines 3512 of FIG. 35 in a manner described in more detail in FIG. 43. All of the individual amplifier outputs 3506 are differential. Differential outputs 3506 are tied in parallel with each other. The resulting output 3604 is the parallel combination of the one or more amplifiers 3608, 3610, 3612 that are turned on. In an exemplary embodiment of the circuit 55 amplifiers have been implemented, with various combinations turned on successively. By using tail currents to selectively turn amplifiers 3603 on and off, the use of switches is avoided.

In this configuration any combination of amplifiers 3603 could be turned on or off to achieve a given attenuation before amplification of the signal. However, in a exemplary embodiment of the circuit, adjacent pairs of amplifiers are turned on and off. Groupings of amplifiers in the on state can be of any number. In an embodiment ten contiguous amplifiers are turned on. The attenuation is adjusted up or down by turning an amplifier tail current off at one end of a chain of amplifiers, and on at the other to move the attenuation in the desired direction. The exemplary circuit is controlled such that a group of amplifiers that are turned on slides up and down the chain according to the control signals 3512 of FIG. 35.

Any number of amplifiers 3603 can be grouped together to achieve the desired resolution in attenuation. By using the sliding configuration, input signals 3614 that are presented to attenuator pi sections 3602 whose amplifiers are not turned on do not contribute to the output signal 3604. It can be seen from FIG. 36 that the signal strength of the output is dependent upon where the grouping of generators 3605 are turned on.

FIG. 37 is a simplified diagram showing the connection 3702 of multiple attenuator sections 3602 to the output 3604. An attenuator 3601 is made up of multiple pi sections 3602 cascaded together. Each pi section consists of two resistances of 2R shunted to ground, with a resistor of value R connected between the non grounded nodes. Tap points 3702 are available at the nodes of the resistor R. In FIG. 37 the first set of nodes available for tap points in the first pi section would be nodes 3706 and 3708. After cascading all of the pi sections to form a ladder network, a variety of tap points are available, these are noted as node numbers 3706-37150 in FIG. 37. A path from the input 3614 to any of the tap points, or nodes on the ladder network yields a known value of attenuation at the output 3604. If multiple tap points are simultaneously connected to the attenuator, the resulting attenuation is the parallel combination of each connection. The combined or average attenuation at the output terminal can be calculated mathematically or, it can be determined using circuit simulation techniques available in computer analysis programs.

In addition it can be seen from FIG. 37 that by providing multiple tap points on a ladder network that in effect a sliding multiple contact action can be implemented contacting a fixed number of contacts, for any given position of the simulated slide 3716. The slide 3716 is implemented electronically in the embodiments of the invention The average attenuation by contacting a fixed number of these tap points 3706-3715 will increase as the slide or switch is moved from the left to the right on the ladder network. For example, minimum attenuation will be present when the slider 3716 contacts the force tap points 3706, 3707, 3708, 3709 at the far left of the ladder network 3601. The maximum attenuation will be achieved when the slider 3716 is positioned to contact tap points 3712, 3713, 3714, 3715 at the far right of the network. In the exemplary embodiment 4, contacts are shown, however, in practice any number of contacts may be utilized.

Mechanical switches are noisy. Mechanical switches are also unreliable and difficult to integrate on a semiconductor device. Returning to FIG. 36, in order to be able to integrate a switching function, and to eliminate mechanical parts., a predetermined number of attenuator taps are switched to the output by using tail current switching of differential amplifiers 3603, 3605. The differential amplifiers have the advantage of being able to be switched electronically with low noise and reliability. The differential amplifiers also provide the opportunity to introduce a gain into the circuit thereby increasing the signal strength available at the output to produce a low noise amplification. The gain achieved depends upon the number of amplifiers switched in. By changing the values of resistance in the ladder network and also by increasing or decreasing the number of amplifier stages that are turned on, the resolution of the attenuator can be varied to suit the needs of the system that an integrated switchless programmable gain attenuator and LNA is used in.

FIG. 38 is an illustration of an exemplary embodiment showing how the attenuator 3601 can be removed from the circuit, so that only the LNAs or differential stages 3605 are connected. Reference numerals 3801 to 3816 each represent a differential amplifier 3603 and a generator 3605 in FIG. 36. In the 0 dB attenuation case shown the signal strength of the output would be equal to the gain of the parallel combination of the four amplifiers that are turned on 3801, 3802, 3803, 3804. The four activated amplifiers are indicated by a "1" placed on the circuit diagram. In an exemplary embodiment in which the sliding tap arrangement is used such that a given number of amplifiers are always turned on the configuration of FIG. 38 is necessary such that zero decibels of attenuation can be achieved when the required number of amplifiers are always turned on.

In an exemplary embodiment according to FIG. 38, a full 14 dB gain from a combination of ten amplifiers is seen when a ten tap configuration is used with the top set to the 0 dB attenuation position. As the attenuation is "clicked" so that one amplifier at a time is switched, a 1 dB per pi section attenuator is placed in series with an amplifier, a full 1 dB of attenuation is not seen/click. In a graph of the control voltage versus attenuation curve this would be seen as a change in slope after the tenth amplifier is switched in. After the 10th amplifier is switched in the curve will show a 1 dB/adjustment step.

FIG. 39 shows an exemplary attenuator circuit used to achieve 1 dB/step attenuation. Each resistive pi section 3602 makes up one step. The characteristic impedance of the embodiment shown is 130 ohms. Using calculation methods well known in the art of attenuator design a pi pad having a characteristic impedance of 130 ohms may be realized utilizing series resistors $R_s$ of 14 ohms or parallel or shunt resistors of 1,300 ohms $R_p$.

FIG. 40 illustrates an exemplary embodiment of an attenuator for achieving a finer resolution in attenuation. In this embodiment a resolution of 0.04 dB/tap is achieved. In the embodiment shown each series resistor $R_s$, connected between the shunt resistors in the ladder network has a string of series resistors connected in parallel with it. Each interconnection point between the added resistors 3402 provides a tap point that provides a finer adjustment in attenuation values.

In implementing an integrated, switchless, programmable attenuator and low noise amplifier, calculating the overall gain of a parallel combination of amplified and attenuated signals is analytically complex to calculate. For example, consider an embodiment utilizing 10 differential pair amplifiers in the output, connected to 10 different tap points. Ten signals receiving varying attenuations are fed into individual differential pair amplifiers. Gain of the amplifiers varies according to an adjustment for monotonicity. The amplified signals are then combined in parallel to yield the output signal.

Tail currents in the differential output amplifiers are not all equal. The tail currents determine the gain of a differential pair, and are adjusted to provide a specific degree of monotonicity. Thus, the gain of each of the differential pair amplifiers varies across the 10 interconnected amplifier. The attenuation varies since each tap is taken at a different point to be fed into each of the differential amplifiers. In such an arrangement it would be expected that the middle signal line would represent the average, yielding an approximate figure for the attenuation and gain of the combination of 10 signal lines. However, this is not the result. Through the use of computer simulation the behavior of this network has been simulated. In simulating behavior of this network it is found that the first tap predominates in defining a response from the sum of the 10 taps. The first tap has the least attenuation and this yields the predominant signal characteristics.

In an embodiment utilizing 10 sliding taps the amplifier gain is a constant 14 dB. The attenuator range is from 0-25 dB in 1 dB steps. This yields an overall range of −11 dB to +14 dB for the combination of attenuator and amplifiers.

FIG. 41 illustrates the construction of the series and parallel resistors used an integrated attenuator. In this embodiment all of the resistors used are 130 ohms. This is done to control the repeatability of the resistor values during fabrication. Ten of these resistors are connected in parallel to yield the 13 ohm resistor used as the series attenuator element $R_s$, of FIG. 39. Ten of these 130 ohm resistors are connected in series to yield 1,300 ohms to realize the parallel resistance legs $R_p$ of FIG. 39 of the attenuator. Building the attenuator from unit resistors of 130 ohms also, provides improved matching. By matching resistor values in this method ariability is minimized to that of the interconnections between the resistors. This allows the ratio between series and parallel resistances to remain constant from pi section to pi section 3602 in the ladder network that makes up the attenuator 3601 of FIG. 36.

FIG. 42 is an illustration of an exemplary embodiment utilized to turn on each of the differential amplifiers. This arrangement produces a monotonically increasing output verses control voltage 4202. In this illustration, five amplifiers 4204-4208 grouped together make up the electronically sliding tap arrangement. Numbers on the illustration indicate the fractions of tail-currents relative to the full value used to turn on each amplifier. Amplifiers are partially turned on at the ends of the group. Gradual turn on of the amplifiers at the ends of the group is done to control overshoots and undershoots in the amplifier gain. These over shoots and under shoots are seen upon the application of a control voltage applied.

Varying a smoothness control provided in a programmable attentuator and LNA to one extreme yields good linearity in the frequency response but overshoots in gain with increases in control voltage. Varying the smoothness control to the other extreme yields a very smooth gain verses control voltage curve with more nonlinearity. The optimum value for the smoothness control yields a value of monotonicity that is the maximum that the system can tolerate in the form of data loss throughout the circuit.

If all five amplifiers of FIG. 42 were turned on with the full value of tail-currents, the gain versus control voltage curve would be as shown in the solid line 4210. By not fully turning on some of the differential pair amplifiers the overshoot and undershoot in the gain versus control voltage curve may be minimized. With the tail-currents configured on the sliding tap as shown in FIG. 42, the gain versus control voltage curve will appear as shown by the dotted line 4202. In this configuration, the middle three amplifiers have their tail-currents fully turned on with the remaining two amplifiers at the beginning and end of the chain only having their tail-currents half turned on. Equivalently, other weighing of total currents may be used to achieve substantially the same effect.

A plot of gain versus control voltage for the entire integrated switchless programmable attenuator and low noise amplifier would preferably appear as a staircase over the entire control voltage range. By controlling the turn on of the tail-current, the non-monotonicity of the gain versus the control voltage curve is reduced so that the gain monotonically increases with the application of an increasing control voltage to yield the desired stair step shape response, where FIG. 42 illustrates one "step" 4202 in the response. Non-monotonicity in gain versus control voltage is not a time dependent phenomenon. The shape of the curve tends to depends on the physical implementation of a circuit and a switching arrangement for turning tail-currents on and off.

Non-monotonicity is an undesirable characteristic tends to degrade overall systems performance. In receiving QAM data the degradation is seen as a loss in received data. By improving the monotonicity characteristic of an amplifier linearity of the amplifier is degraded. Gradual switching of the tail-currents causes some differential pairs to only partially turn on. Differential pairs that are partially turned on introduce more nonlinearities into the circuit output than a fully turned on differential pair.

A transistor that is only partially turned on is only capable of handling a smaller signal than one that is more fully turned on. A transistor that is only partially turned on receiving a large input signal over drives the transistor producing a distorted output. Thus, by gradually turning on the tail-currents in some of the differential pair amplifiers, the linearity tends to be degraded, however, this degradation in linearity allows a monotonically increasing gain versus control voltage curve to be achieved.

Monotonic increase of gain versus control voltage tends to improve system performance. In the case of the QAM television signal being transmitted through the amplifier a view of a QAM constellation would actually be seen to wiggle with tail-currents of all differential pair amplifiers simultaneously and fully turned on. With gradual tail-current switching, the constellation is not seen to wiggle, and data is not lost. The problem with the non-monotonicity causing the constellation to wiggle is that each time an attenuator value is switched into the circuit QAM data tends to be lost, thus degrading overall system performance of the signal transmitted through the circuit.

As part of an exemplary embodiment's operation, an automatic gain control (AGC) 3512 of FIG. 35 would be generated as one of the control signals by external receiver circuitry to adjust the input signal level presented to the receiver. This AGC control voltage would be fed into a control voltage input 3512 to select a value of attenuation through the circuit assembly. It is desirable to switch the attenuator such that when the attenuation is adjusted, the data is not lost due to the switching period. In an exemplary embodiment of the present invention it is necessary to switch a maximum of 0.04 dB per step in attenuation value.

FIG. 43 is an illustration of an embodiment showing how individual control signals 4301 used to turn on individual differential pair amplifiers are generated from a single control signal 4302. There are many ways to generate control signals to turn on the differential pair amplifiers, individual control lines may be utilized, or a digital to analog converter may be used to transform a digital address to an analog control voltage.

In the embodiment of FIG. 44 to generate the control signals resistors 4304 are connected in series between a power supply voltage and ground to create a series of reference voltages at each interconnecting node. The voltages at each node between the resistors is the reference input for one of a series of comparators 4306. The reference input of the comparator connects to a node providing the reference voltage setting. The other input of the comparator is connected to the control voltage 4302. When the value of the control voltage exceeds that of the reference voltage for a given comparator the comparator goes from a zero state to a one state at its output. The zero state is typically zero volts and the one state is typically some voltage above zero. The voltage generated to produce the logic one state is such that when applied to a gate of a transistor making up the current tail 4308 it is sufficient to turn on the differential pair of amplifiers that constitute the low noise amplifier (LNA) controlled by that current tail.

As can be seen from FIG. 43, all the LNA amplifiers set to be activated with a control voltage of the current setting will be turned on. In this arrangement simply increasing the control voltage simply turns on more LNA amplifier stages. Additional circuitry is required to deactivate previously activated amplifiers such that only a fixed number of amplifiers remain turned on as the control voltage increases. This is done so that the sliding potentiometer function can be implemented with this circuit.

FIG. 44 is an illustration of an embodiment of one of the individual comparator stages 4308 of FIG. 43 used to turn on or off individual LNA amplifier stages. In the integrated switchless programmable attenuator and low noise amplifier the circuitry used to activate individual cells is duplicated at each attenuator's tap point and interconnected so that a sliding tap can be simulated using a single control voltage, $V_{ctr}$ 4302. In describing a cell's operation it is convenient to start with the control voltage 4302 that is being applied to achieve a given attenuation value.

To illustrate the comparators operation, a control voltage is applied to each of a series of comparators, as is shown in FIG. 43. The circuit of FIG. 44 makes up one of these comparators. FIG. 44 shows the control voltage as $V_{ctr}$, and the reference voltage as $V_{ref}$. These voltages are applied to the gates of a differential pair of transistors (Q1 Q2). The circuit in FIG. 44 surrounding Q1 and Q2, functions as a comparator with low gain. The gain of the comparator is kept low to control the switching on and off the tail-currents of the low noise amplifiers.

In FIG. 44 when the control voltage input $V_{ctr}$ passes the reference level set at $V_{ref}$ the amplifier with its reference set closest to, but less than $V_{ctr}$ remains deactivated. (The n+1 amplifiers where $V_{ctr}$ has not exceeded $V_{ref}$ remain turned off, until activated by $V_{ctr}$.) First the comparator output "current (cell n)" goes high. When "current (cell n)", which is connected to the gate of Q15, goes high it switches the transistor on. Transistors Q16 and Q17 are used to deactivate the adjoining current mirror circuit. Amplifier, $Amp_n$ is turned off by shunting current away from the current mirror 4402, shutting off the tail current Q15. Thus, the current amplifier cell with a comparator that has just been tripped remains turned off.

Comparator output signal "next (cell n+10)" is the opposite state of "Current (cell n)". A cell 10 cells away is turned off by the control signal "next (cell n+10)". These cells have not yet had their comparators tripped by the control voltage present on their inputs. Thus the bottom of the sliding tap is pushed up and down by the control voltage, $V_{ctr}$. In this state transistors Q16 and Q17 in the next 10 cells are not conducting current away from the current mirror. This allows the current tails of each amplifier, Q15 to conduct causing amplifier $Amp_n$ to be turned on in each of the 10 cells.

Note that as a larger number of cells are grouped together, for simultaneous turn on, a larger number of differential amplifier cells in the integrated switchless programmable attenuator and low noise amplifier are required to achieve the same attenuation range.

Once the control voltage has been exceeded for a given cell, the default state for all the previous amplifiers $Amp_n$ is to be turned on, unless the cell is deactivated by either Q1 or Q2 being activated.

The signal "previous (from cell n−10)" deactivates amplifier cells when it is in the high state. This signal is supplied from the previous identical comparator.

In FIG. 44 a provision for adjusting the abruptness of amplifier gain is provided. Transistors Q3 and Q10 are being used as variable resistors. These variable resistors are used to change the gain of the comparator. Varying the gain of the comparator allows the abruptness in the overall amplifier gain to be controlled. Putting a high voltage on "smoothness control" causes the drain of Q5 and Q6 to be shorted together. The gain is reduced and a very gradual transition between states is provided by doing this.

A receiver front end such as previously here is described in more detail in U.S. patent application Ser. No. 09/438,687, entitled "Integrated Switchless Programmable Attenuator and Low Noise Amplifier," filed Nov. 12, 1999, now U.S. Pat. No. 6,879,816, the subject matter of which is incorporated in its entirety by reference, may be used before the fully integrated tuner architecture.

Receiver Frequency Plan and Frequency Conversion

Returning to FIG. 19 a block diagram illustrating the exemplary frequency conversions utilized in the embodiments of the invention. An RF signal 1906 from 50 MHz to 860 MHz that is made up of a plurality of CATV channels is mixed 1916 down by a first LO (LO$_1$) 1912 that ranges from 1250 MHz to 2060 MHz, depending upon the channel tuned, to a first IF signal 1918 that is centered at 1,200 MHz. This 1,200 MHz first IF signal is passed through a first filter bank 1912 of cascaded band pass filters to remove undesired spurious signals. The first frequency conversion in the receiver is an up conversion to a first intermediate frequency 1918 higher than the received RF frequency 1906. The first intermediate frequency is next mixed 1932 down to a second IF 1922.

A second local oscillator signal at 925 MHz (LO$_2$) 1904, is used to mix 1932 the first IF 1918 down to a second IF 1922 signal centered at 275 MHz. A second bank of band pass filters 1934 removes spurious outputs from this second IF signal 1922, that have been generated in the first two frequency conversions.

A third frequency conversion 1924, or the second down conversion to the third IF 1926 is accomplished with a third LO (LO$_3$) 1930 of 231 MHz. A third filter 1936 removes any spurious responses created by the third frequency conversion and any remaining spurious responses that have escaped rejection through the previous two filter banks. This third band pass filter 1936 may have its response centered at 36 or 44 MHz. A 44 MHz IF produced by the 231 MHz LO is used in the United States while a 36 MHz IF is used in Europe. The $LO_3$ is adjusted accordingly to produce the 36 MHz IF. The local oscillator's signals are advantageously generated on chip in the described embodiments. However, the receiver implementation need not necessarily be limited to on chip frequency generation.

Local Oscillator Generation

FIG. 45 is a block diagram illustrating the exemplary generation of local oscillator signals utilized in the embodiments of the invention. The frequency plan utilized in the embodiments utilizes a pure third local oscillator signal ($LO_3$) 1930, created by direct synthesis 4502 that falls within the band of received signals. The first two local oscillator $LO_1$ 1902, $LO_2$ 1904 signals are generated using indirect synthesis achieved by a phase locked loops 4504,4506. The third local oscillator signal ($LO_3$) uses direct synthesis, to divide the second local oscillator down to create the third local oscillator ($LO_3$). The indirect synthesis of the first and second LOs utilizes a frequency reference 4508 provided by a 10 MHz crystal oscillator. The 10 MHz crystal oscillator utilizes the previously disclosed differential signal transmission and a unique design that advantageously tends to provide an extremely low phase noise reference signal. The first local oscillator ($LO_1$) 1902 is produced by wide band tuning. The second local oscillator ($LO_2$) 1904 is produced by narrow band tuning. The exemplary embodiments advantageously utilize a narrow band tuning circuit and method to achieve frequency lock in an exemplary narrow band PLL.

Narrow Band VCO Tuning

FIG. 46 is a schematic of a PLL having its VCO controlled by an embodiment of the VCO tuning control circuit. A VCO tuning control circuit is provided to tune a VCO that is contained in an exemplary narrow band PLL that generates a 925 MHz local oscillator signal. This device makes use of a temperature and process dependent window of voltage ranges to optimally choose a range of valid control voltages for the PLL. The control circuit uses a window to center a varactor diode's tuning range by adding or removing capacitance, thus tending to avoid gross varactor non-linearities. The circuit tends to mitigate dead band conditions and tends to improve loop stability over process and temperature variations.

A VCO integrated on a chip can be up to ±20% off in its frequency range. Immediate calibration at power up is done to center the varactor diodes that provide a variable tuning capacitance to the middle of the varactor diode's tuning range. This is done by switching in capacitors and monitoring loop voltage. To center the VCO's tuning capacitance range of the varactors, the embodiments of the invention immediately calibrate the VCO by adding or removing capacitance. Switching capacitors in or out of the circuit centers the varactor's capacitance into the middle of the VCO's tuning range. To monitor centering of the varactors a window comparator is used to look at the state of a control voltage that is used to tune the VCO. The window comparator determines when the control voltage is within. its desired range.

FIG. 46 illustrates the VCO tuning control circuitry 4604 applied to a conventional PLL 4602. PLL 4602 comprises a crystal oscillator 4606 that inputs a stable frequency to a programmable 4608 reference divider 4610 that outputs a frequency 4612 based upon the reference frequency to the input of a phase detector 4614, a second input 4616 to the phase detector is the current output of a VCO 4618. The phases of the two inputs 4612,4616 are compared and a DC value representing the phase difference is output 4620 to the input of a charge pump 4622. The output of the charge pump is fed into a low pass filter 4624. The output of low pass filter 4624 is fed into the control voltage input of the VCO 4618. The VCO outputs an image and quadrature signal 4626 at a frequency as set by the frequency select line 4608.

The voltage controlled oscillator 4618 is conventionally constructed, and comprises a variable capacitance used to tune the output frequency. VCO 4618 additionally comprises a series of switchable capacitors utilized to center the tuning range of the variable capacitance elements comprising the VCO. The switchable capacitors are controlled by signals emanating from the VCO tuning control circuitry 4604. The control signals 4628 are routed from tuning register 4630 to VCO 4618.

The VCO tuning control circuitry utilizes a control signal 4632 taken from low pass filter 4624. Control voltage 4632 is input to the positive inputs of a first comparator 4634 and the positive input of a second comparator 4636. The negative inputs of comparators 4634 and 4636 are coupled to DC reference voltages V1 and V2. Comparator 4634 outputs signal lsb and comparator 4636 output signal msb. Voltages $V_1$ and $V_2$ set thresholds to form a sliding window which monitors the state of the closed PLL by monitoring voltage at low pass filter 4624. Control voltage 4632 is taken as the voltage across a capacitor in the low pass filter that induces a zero in the loop filter 4624. Thus, the control voltage is a filtered version of the control voltage of the PLL loop, and thus tends to have eliminated spurious components present on the VCO control line.

Signals msb and lsb are fed in parallel to an AND gate 4640 and an exclusive NOR gate 4642. The output of exclusive NOR gate 4642 is fed into the D input of a DQ flip-flop 4644. The Q output of the flip-flop is fed into an AND gate 4646, whose output is in turn fed into the clock input of a 6-bit bi-directional tuning register 4630.

Returning to AND gate 1940 its output is fed into the shift left or right input port of the 6-bit bi-directional tuning register 4630. Additionally, DQ flip-flop 4644 receives a reset signal based on the output of low pass filter 4624. flip-flop 4644 is also clocked by a signal based on the divided reference oscillator signal 4612.

FIG. 47 is a process flow diagram illustrating the process of tuning the VCO with an embodiment of a VCO control circuit. Initially the control voltage (4632 of FIG. 46) is evaluated to see if it falls within a predetermined window 4702. If the voltage is within the desired range, the time it has remained so is determined 4704. The PLL tends to be in a state of lock when the control voltage applied to the VCO has remained unchanged for a predetermined period of time. If the voltage does not remain in range for the predetermined time, the process is reinitiated by looping back to the beginning. If the control voltage remains in the range for the predetermined time, the loop is deemed in lock, and the process is ended 4712.

Returning to block 4702, if the control voltage is out of range a decision is made 4706 based on, whether the control voltage is above or below the desired range. If the control voltage is greater than the control voltage range, a capacitance is removed from the VCO circuit 4708. The process flow is routed to the beginning of the process, where the control voltage is again reevaluated 4702.

Returning to block 4706, if the control voltage is below the desired range a capacitor is added 4710. Next, the process routes the flow back to the beginning of the process where the control voltage is reevaluated 4702.

The VCO tuning control circuitry 4604 of FIG. 46 functions to carry out the process of FIG. 47. If the voltage of the loop lies outside the window defined by the threshold voltages $V_1$ and $V_2$. The clock input to the 6-bit bi-directional tuning register 4630 is enabled. This register function may be provided by a conventional circuitry known in the art to provide this function and is not limited to the circuitry depicted. A "lock time out" circuit 4648 of FIG. 46 is reset on the rising edge of the clock signal to the 6-bit bi-directional tuning register 4630 of FIG. 46. The "lock time out" circuit is conventionally constructed and is not limited to the components depicted in FIG. 46.

If control voltage 4632 exceeds the upper threshold set by the comparators, zeros are shifted through the register 4630. A zero voltage decreases the capacitance in the VCO tuning circuitry by switching out a capacitance controlled by one of the 6 control lines 4628. Alternatively, any suitable number of control lines may be used other then the exemplary six. This shifting of values in a register allows one of six exemplary capacitor switch control lines to be activated or deactivated, an evaluation made and another line activated or deactivated so that the previous tuning setting is not lost. This function may be implemented by passing a value (on or off) down a line of capacitors by shifting or by activating a capacitor associated with a given line and then a next capacitor without shifting the capacitance control signal.

If the control voltage 4632 is less than the lower threshold voltage of the comparator 4634 is are shifted through the 6-bit bi-directional tuning register. The is increase the capacitance applied in the VCO tuning circuit by switching in a capacitance controlled by one of the 6 control lines 4628.

Once control voltage 4632 enters the predetermined valid range of operation as set by voltages $V_1$ and $V_2$ the shift register 4630 is disabled. At this time the locked time out circuit 4648 is enabled. If the lock time out circuit remains enabled for the predetermined time period, that satisfies the in lock condition for the PLL, the clock to the DQ flip-flop 4644 is disabled, thus disengaging the control circuit. The functions described in this paragraph are constructed from standard logic components known to those skilled in the art, and are not limited to those components depicted in FIG. 46.

A more detailed description of the VCO tuning scheme is provided in U.S. patent application Ser. No. 09/580,014, entitled "System and Method for Narrow Band PLL Tuning," filed May 26, 2000, now U.S. Pat. No. 6,426,680, the subject matter which is incorporated in its entirety by reference. Once the fine, or narrow band PLL has been tuned such that is has been locked its frequency may be used in conjunction with the frequency generated by the coarse PLL to provide channel tuning as previously described for the coarse/fine PLL tuning of FIGS. 21 and 22.

Receiver

FIG. 48 is a block diagram of a first exemplary embodiment of a receiver. FIGS. 48, 51, 52, 53 and 54 are embodiments of receivers that utilize band pass filters and image reject mixers to achieve image rejection that tend to reduce the distortion previously described. The embodiments advantageously convert an input signal (1906 of FIGS. 19, 48, 51, 52, 53 and 54) to a final IF frequency (1914 of FIGS. 19 48, 51, 52, 53 and 54) by processing the input signal substantially as shown in FIG. 19. Image rejection is measured relative to the signal strength of the desired signal. The strength of the unwanted image frequency is measured in units of decibels below the desired carrier ($dB_c$). In the exemplary embodiments of the invention an image frequency rejection of 60 to 65 $dB_c$ is required. In the embodiments of the invention this requirement has been split more or less equally among a series of cascaded filter banks and mixers following the filters. The filter banks 1912,1934 provide 30 to 35 $dB_c$ image rejection and complex mixers 4802,4806 used provide an additional 30 to 35 $dB_c$ of image rejection yielding an overall image rejection of 60 to 70 $dB_c$ for the combination. The use of complex mixing, advantageously allows the rejection requirements on the filters to be relaxed. First, a channel of an input spectrum is centered about a first IF frequency.

FIG. 49 is an exemplary illustration of the frequency planning utilized in the embodiments of the invention for the reception of CATV signals. The frequency spectrum at the top of the FIG. 4902 illustrates exemplary received RF signals ranging from 50 to 860 MHz 4904. The received RF signals are applied to a band pass filter 4921 to eliminate out of band distortion products Image1 4906. The frequency plan advantageously utilizes a trade off between image rejection achievable by filters and mixers at different frequencies. The processing of the first IF and the second IF have many features in common and will be discussed together in the following paragraphs.

For example, the second mixer 4802 and second bank of IF filters 4834 of FIG. 48 achieve 35 dB and 35 dB of image rejection, respectively. The third mixer 4806 and the third IF filter bank 1936 of FIG. 48 achieve 25 dB and 40 dB of image rejection respectively. The last distribution reflects the fact that at the lower third IF frequency the Q of the filters tend to be lower, and the image rejection of the mixers tend to be improved at lower frequencies.

For example, returning to FIG. 48, a signal 1906 in the 50 to 860 MHz range is up converted by mixer 1916 and LO2 1908 to 1,200 MHz IF-1 1918. The presence of LO-2 1904 at 925 MHz that is required to mix the signal IF-1 1918 down to the 275 MHz IF-2 1922 has an image frequency Image2 (4908 as shown in FIG. 49) at 650 MHz. The filter Q of the 1,200 MHz center frequency LC filter 1912 causes Image2 to undergo 35 dB of rejection thus, attenuating it. To achieve 70 dB of image rejection another 35 dB of rejection must be provided by the second mixer (4702 of FIG. 48) that converts the signal from 1,200 MHz to 275 MHz.

Continuing with FIG. 48, the same structure as described in the preceding paragraph is again encountered, but at a lower frequency for the second IF 4914. Image rejection of the 275 MHz filter (1934 of FIG. 48) is less due to its lower Q and the fact that the image frequency Image3 4912 is spaced only 88 MHz 4910 from the signal IF-2 4914. In the previous. first IF stage the image frequency Image2 4908 was spaced 550 MHz 4918 from the signal IF-1 4916, providing better image attenuation by filter stop bands. In this situation 25 dB of selectivity can be achieved in the filter, requiring 40 dB of rejection in the mixer to achieve at least 65 dB of attenuation of Image3.

Phase matching at lower frequencies is more accurate allowing better image rejection to be obtained from the third mixer. The method of trading off filter selectivity against mixer image rejection at different frequencies advantageously allows a receiver to successful integrate the filters on chip with the desired image frequency rejection. This process is described in detail in the following paragraphs.

Returning to FIG. 48, it is desired to up convert a channel received in this band of signals 1906 to a channel centered at an intermediate frequency of 1,200 MHz 1918. A local oscillator 1908 produces frequencies from 1,250 MHz to 2060 MHz. For example, a channel centered at 50 MHz is mixed with the local oscillator set at 1,250 MHz to produce first IF frequency components 1918 at 1,200 MHz and 1,300 MHz. Only one of the two frequency components containing identical information produced by the mixing process is needed; the low side 1,200 MHz component is kept. Filtering 1912 tends to remove the unneeded high side component and other desired signals.

Choosing the first IF 1918 to be centered at 1,200 MHz makes the first IF susceptible to interference from a range of first image frequencies from 2,450 MHz to 3,260 MHz (4906 as shown in FIG. 49), depending upon the channel tuned. The lower image frequency of 2,450 MHz results from the first IF of 1,200 MHz being added to the lowest first LO present at 1,250 MHz to yield 2,450 MHz. The highest image frequency results from the first IF of 1,200 MHz being added to the highest first LO of 2,060 MHz to yield 3,260 MHz as the highest first image. Choosing the first IF 1918 at 1,200 MHz yields image frequencies (4906 of FIG. 49) that are well out of the band of the receiver. The result tends to place undesired frequencies far down on the filter skirts of filters present in the receiver, attenuating them.

After a channel is up conversion to a first IF 1918 of 1,200 MHz, it is next filtered by a bank of 3 LC band pass filters 1912 each having its response centered at 1,200 MHz in the embodiment. These filters in conjunction with the second mixer 4802 provide 70 dB of image frequency rejection (4908 of FIG. 49). Filters are advantageously integrated onto the CMOS substrate. An LC filter comprises inductors (or coils) and capacitors. An inductor implemented on a CMOS substrate tends to have a low Q. The low Q has the effect of reducing the selectivity and thus the attenuation of signals out of band.

The attenuation of signals out of band can be increased by cascading one or more filters. Cascading filters with identical response curves has the effect of increasing the selectivity, or further attenuating out of band signals. The embodiments of the invention advantageously incorporate active $g_m$ stage filters 1912, 1934 to increase selectivity. and provide circuit gain to boost in band signal strength. Three cascaded active LC filters implemented on a CMOS substrate yield a satisfactory in band gain, and provide approximately 35 dB of out of band image signal rejection in the embodiment described. However, the filters need not be limited to active LC filters, other characteristics and passive filters are contemplate equivalents.

The remaining 35 dB of image frequency rejection needed must be achieved in the other circuitry. Hence, differential I/Q mixers 4802, 4806 are advantageously used to achieve this approximate 35 dB of additional image rejection required in the first IF.

FIG. 50 is a block diagram illustrating how image frequency cancellation is achieved in an I/Q mixer. An I/Q mixer is a device previously developed to achieve single side band signal transmission. It is one of three known methods for eliminating one of two side bands. This type of mixer is able to transmit one signal while eliminating or canceling another signal. An I/Q mixer advantageously possesses the properties of image frequency cancellation in addition to frequency conversion. For example, returning to FIG. 48, a second LO 1904 of 925 MHz is used to create the down conversion to a second IF 1922 of 275 MHz, while rejecting image frequencies from the previous frequency conversion by LO1 1908.

The I/Q mixers are implemented in several ways in the invention. However the overall function is maintained. An interconnection of components that achieves I/Q mixing is illustrated in the exemplary I/Q mixer 4802 shown in FIG. 48.

First an input signal 1918 is input to a mixer assembly comprising two conventional mixers 4828, 4830 of either a differential (as shown) or single ended construction.

Local oscillator signals 1904, that need not necessarily be buffered to achieve I/Q mixing, are applied to each mixer. The local oscillator signals applied to each mixer are of the same frequency, but 90 degrees out of phase with each other. Thus, one signal is a sine function, and the other is a cosine at the local oscillator frequency. The 90 degree phase shift can be generated in the I/Q mixer or externally. In the circuit of FIG. 48 a conventional poly phase circuit 4832 provides the phase shift and splitting of a local oscillator signal generated by PLL2 4806.

Two IF signals, an I IF signal and a. Q IF signal, are output from the mixers and fed into another conventional poly phase circuit 4834. The poly phase circuit outputs a single differential output IF signal.

Returning to FIG. 50, the I/Q mixer uses two multipliers 5002, 5004 and two phase shift networks 5006, 5008 to implement a trigonometric identity that results in passing one signal and canceling the other. The trigonometric identity utilized is:

$$\cos(2\pi f_{RF} t)\cos(2\pi f_{LO1} t) \pm \sin(2\pi f_{RF} t)\sin(2\pi f_{LO1} t)$$
$$=\cos[2\pi(f_{RF}-f_{LO1})t] \qquad (7)$$

where $f_{RF}$ is an input signal 5010

$f_{LO1}$ is the first LO 5012

The signals produced and blocks showing operations to create signal transformation of these signals to yield the desired final result is shown in FIG. 50. The process makes use of a hardware implementation of the trigonometric identities:

$$\sin(u)\sin(v)=\tfrac{1}{2}[\cos(u-v)-\cos(u+v)] \qquad (8)$$

and $$\cos(u)\cos(v)=\tfrac{1}{2}[\cos(u-v)+\cos(u+v)] \qquad (9)$$

By applying these trigonometric identities to the signals created by the two mixers, the product of the sine waves 5014 is:

$$1/2[\cos(2\pi f_{LO1} t - 2\pi f_{RF} t) - \cos(2\pi f_{LO1} t + 2\pi f_{RF} t)] \qquad (10)$$

and the product of the cosines 5016 is:

$$1/2[\cos(2\pi f_{LO1} t - 2\pi f_{RF} t) + \cos(2\pi f_{LO1} t + 2\pi f_{RF} t)] \qquad (11)$$

Thus, two frequencies are created by each multiplication. Two of the frequencies have the same sign and frequency, so that when they are added together 5018 the resultant signal is a positive sum 5020. The other frequency created cancels itself out 5022. The sum frequency component created by the product of the sines is a negative quantity. The same sum frequency component created by the multiplication of the cosines is positive and of equal magnitude. Thus, when these signals are added together one frequency component, the difference, that is present in each signal has twice the amplitude of the individual signals and the second, sum frequency created is of opposite polarity of the other signal created and cancels out when the signals are added together. Thus, the difference frequency is passed to the output while the sum frequency component is canceled.

The implementation of this trigonometric identity by a circuit is very useful for canceling image frequencies. As shown in FIG. 4 signal, S and image signal I are equally spaced by the IF frequency from the local oscillator frequency. The signal frequency would be represented by the term $(2\pi f_{LO1} t - 2\pi f_{RF} t)$ and the image frequency would be represented by $(2\pi f_{LO1} t + 2\pi f_{RF} t)$. In the embodiments of the invention, the phase shifting and summing functions are performed utilizing standard polyphase or other circuits known in the art.

Mathematically exact cancellation can be achieved. However, real circuit components are not able to achieve exact cancellation of the image frequency. Errors in phase occur in the circuitry. A phase error of 3° can yield an image frequency suppression of 31.4 $dB_c$ and a phase error of 4° can yield an image frequency suppression of 28.9 $dB_c$. These phase errors tend to be achievable in an integrated circuit on CMOS. To attempt to achieve the entire 70 $dB_c$ of image rejection tends to be undesirable, thus necessitating the filters. For example, to achieve 59 $dB_c$ of image frequency rejection a phase error tending to be of no more than 0.125° in the mixer would be allowable.

By combining image frequency rejection achievable by an LC filter implemented in CMOS with an I/Q mixer's image rejection properties, properties that tend to be achievable in a CMOS integrated circuit, a required image frequency rejection is obtained. Additionally, the frequency of a first up conversion has been advantageously selected to place an image frequency of a first LO well down the filter skirts of a 1,200 MHz LC filter bank, thus achieving the desired image frequency rejection.

Returning to FIG. 48, buffer amplifiers 4810 are used to recondition the amplitudes of LO signals 1908,1904,1930 that drive the I/Q ports of mixers 4802,4806. A distance of several millimeters across a chip from where LOs are generated 4504,4506,4508,4502 to where it is applied at the mixers 1916,4802,4806 tends to require reconditioning of the slopes of the local oscillator signals. Buffering also tends to prevent loading of the PLLs 4504,4806.

Eliminating any preselection filtering requiring tunable band pass filters is desirable. To do this image frequency response and local oscillator (LO) signals are set to fall outside of a received signals bandwidth. The first signal conversion tends to eliminate any requirements for channel selectivity filtering in the receiver front end. Because of the integrated circuit approach to this design it is desirable to locate an LO outside of the signal bandwidth to reduce distortion created by the interaction of the received signals and the first local oscillator signals.

An approximately 35 dB of out-of-band channel rejection in the first IF stage's filter 1912 is insufficient. The additional 35 dB of selectivity provided by a mixer 4802 increases selectivity. However, it is desirable to mix down a received signal as quickly as possible. This is desirable because at lower frequencies filters tend to have better selectivity than at the higher IF frequencies. By converting a received signal to as low a frequency as possible as quickly as possible better filtering tends to be obtained. Two frequency down conversions are next performed.

Filters are available that will achieve a better rejection than an LC filter at a given frequency, for example a SAW filter. While better filtering of the intermediate frequencies could be obtained with a filter such as a SAW filter at a higher frequency, a fully integrated receiver would not be achievable. A SAW filter is a piezoelectric device that converts an electrical signal to a mechanical vibration signal and then back to an electrical signal. Filtering is achieved through the interaction of signal transducers in the conversion process. A filter of this type is typically constructed on a zinc oxide ($ZnO_2$), a material that is incompatible with integration on a CMOS circuit utilizing a silicon (Si) substrate. However in alternative embodiments of the invention, SAW or other filter types known in the art including external LC filters are contemplate embodiments. In particular, a hybrid construction utilizing receiver integrated circuit bonded to a hybrid substrate and filters disposed on the substrate is contemplated.

Returning to the frequency plan of FIG. 49, there is an image response (Image2) 4908 associated with the second local oscillator signal ($LO_2$) 4920. Returning to the embodiment of FIG. 48, this Image2 signal occurs at $f_{LO2}-f_{IF2}=925$ MHz–275 MHz, which is 650 MHz. If there is a signal of 650 MHz at the receiver's input 4808 it is possible that a 650 MHz signal will be mixed down to the second IF frequency ($IF_2$) (1922 of FIG. 48) causing interference with the desired received signal which is now located at the second IF frequency. To reduce interference from this signal the receiver has been designed to produce greater than 65 dB of rejection of Image2 by the mechanism previously described for the 1,200 MHz LC filter bank 1912 of FIG. 48.

Returning to FIG. 48, the third IF is next generated. The third LO 1930 is created by direct synthesis. The divide by 4 block 4802 creates a 231 MHz third LO ($LO_3$) consisting of I and Q signals required to mix the 275 MHz second IF 1922 down to the third and final IF frequency of 44 MHz 1926. A second down conversion to the 275 MHz third IF is used in the design. If a 1,200 MHz first IF signal were down converted directly to 44 MHz a local oscillator signal of 1156 MHz (1,200 MHz–44 MHz) would be required. A resulting image frequency for this local oscillator would be at 1,112 MHz (1,200 MHz–88 MHz). A 1,112 MHz image would fall within the band of the 1,200 MHz LC filter. Thus, there would be no rejection of this image frequency from the first IF's filter since it falls in the pass hand. Therefore, the intermediate frequency conversion to a second IF of 275 MHz is used to reduce the effects of the problem.

The 231 MHz third LO 1936 falls close to the center of the received signal band width 1906. With the three frequency conversions of the design the third LO necessarily falls within the received signal band. This is undesirable from a design standpoint. This is because any spurious responses created by a third local oscillator signal fall within the received signal bandwidth. The present embodiment of this invention advantageously minimizes these undesirable effects.

In generating the third LO signal of 231 MHz, typically a phase lock loop containing a voltage controlled oscillator would be used. However, these frequency components tend to be primary generators of spurious products that tend to be problematic. The present embodiments of the invention advantageously avoids the use of a PLL and the attendant VCO in producing the third LO signal 1930 at 231 MHz. A divide by 4 circuit 4802 utilizes two flip-flops that create the I and Q third LO signals 1930 from the 925 MHz second LO 1904. This simple direct synthesis of the third LO tends to produce a clean signal. The reduced generation of distortion within the signal band tends to be important in an integrated circuit design where all components are in close physical proximity. If a PLL were used to generate the 231 MHz signal an external loop filter for the PLL would be utilized, providing another possible path for noise injection. By elegantly generating this third LO, that necessarily falls within the received signal bandwidth, noise and interference injection through the substrate into the received signal path tends to be minimized.

LC filter tuning 4812,4814,4816 in the embodiment is advantageously performed at startup of the chip. A "1,200 MHz filter tuning" circuit 4812 tunes the 1,200 MHz low pass filters 1912; a "275 MHz filter tuning" circuit 4814 tunes the 275 MHz low pass filter 1934; and a "44/36 MHz filter tuning" circuit 4816 alternatively tunes a final LC filter 1936 to one of two possible third IF frequencies (44 MHz or 36 MHz) depending upon the application. Alternatively, in this embodiment, the filtering of the third IF frequencies is done by an external filter 4818. This external filter may have a saw device or other type of filter that provides satisfactory filtering of the third IF frequency.

As previously described, the filter tuning circuits 4812, 4814, 4816 utilize tuning signals based on the PLL2 signal 4806, with the "44/36 MHz filter tuning" circuit utilizing the PLL2 frequency divided by four 4802. However, the tuning signals selected may vary. Any or all of the PLLs 4804, 4806, 4802 or reference oscillator 4808 may be used to generate a filter tuning-signal. Also a single frequency can be used to tune all filters with the appropriate frequency scaling applied. In tuning the LC filters, first the chip is turned on and PLL2 4806 must lock. PLL2 must first lock at 925 MHz as previously described. A VCO in the PLL 4806 is centered by adjusting its resonant circuit with tunable capacitors as previously described.

Once the PLL2 is adjusted to 925 MHz a write signal is sent out to indicate that a stable reference for filter tuning is available. Once a stable 925 MHz reference for tuning is available the 1,200 MHz filter, the 275 MHz filter tuning previously described takes place. Once the filter tuning is finished the filter tuning circuitry sends out a signal over an internal control bus structure, linking the receiver to a controller indicating that the tuning has finished. The receiver is now ready to select and tune a channel.

Frequency tuning of received channels is accomplished in the embodiment with a coarse and fine PLL adjustment as previously described. The tuning is performed in such a way that there is always a third IF present at the output during the tuning process. PLL1 4804 is the coarse tuning PLL that tunes in 10 MHz steps. PLL2 4806 is the fine tuning PLL that tunes in 100 KHz steps. Exemplary tuning steps can be made as small as 25 KHz. A 100 kHz step is used for QAM modulation, and a 25 KHz step is used for NTSC modulation.

At the input of the tuner each exemplary channel is separated by 6 MHz. PLL1 jumps in tuning steps of 10 MHz. Therefore, + or −4 MHz is the maximum tuning error. If the filters used had a narrow band pass characteristic this tuning approach tends to become less desirable. For example, if the filter bandwidth was one channel, 6 MHz, wide and the first IF could be 1204 MHz or 1196 MHz. Thus, the selected channel would not be tuned. The bandwidth of the cascaded filters in the first IF strip is approximately 260 MHz. The bandwidth of the filters centered at 275 MHz in the second IF strip is approximately 50 MHz. The bandwidths are set to be several channels wide, a characteristic that advantageously takes advantage of the low Q in the LC filters built on the chip. The two PLLs guarantee that a third IF output is always obtained. The first PLL that tunes coarsely must tune from 1,250 to 2,060 MHz, a wide bandwidth. PLL2, the fine tuning PLL, must tune from + to −4 MHz, which tends to be easier to implement.

FIG. 51 shows a second exemplary embodiment of the invention. This embodiment is similar to the embodiment of FIG. 48, however it eliminates the first IR reject mixer (4802 of FIG. 48). The approximately 35 dB of image rejection that has been eliminated due to the removal of the IR reject mixer is made up by increased filter rejection provided by a 1,200 MHz LC filter bank 5101. The IR reject mixer is replaced with a conventional differential mixer 5104. The IO required is a single differential LO signal 5106 rather than the differential I and Q signals previously described. Better filters are used or alternatively an additional series of three 1,200 MHz LC filters 1912 for a total of six cascaded filters 5101 to provide sufficient image rejection are provided. This design provides the advantage of being simpler to implement on an integrated circuit.

If a higher Q or better filter selectivity is realized on the integrated circuit 65 dB of image frequency rejection at 650 MHz is required. In an alternate embodiment of the invention the third down conversion can be accomplished in a similar manner by eliminating the third I/Q mixer 4806 and increasing the selectivity of the 275 MHz filter bank 5102. The mixer 4806 is replaced with a conventional mixer requiring only a single differential third LO.

FIG. 52 shows a third alternate embodiment of the invention that tends to provide continuous tuning of the filter over temperature, and tends to more accurately keeps the response curve of the filter centered on the desired frequency. This embodiment of the invention preserves the separation of I 5202 and Q 5204 signals through the second IF stage 5206. In the third frequency conversion stage 5208 the I and Q signals are transformed into I', $\bar{I}$, Q, and $\bar{Q}$ signals. This alternate embodiment of the invention relies on a "three-stage poly phase" 5210 to provide image cancellation. The advantage of using a gyrator in place of dual LC filter bank 5212 is that a close relationship between I and Q tends to be maintained throughout the circuit. The phase relationship at the output of the gyrator filter tends to be very close to 90°. If an LC filter is utilized there is no cross-coupling to maintain the phase relationship as in the gyrator. In the LC filter configuration complete reliance upon phase and amplitude matching is relied upon to maintain the I and Q signal integrity. The gyrator circuit has the additional advantage of tending to improve the phase relationship of signals initially presented to it that are not exactly in quadrature phase. For example, an I signal that is initially presented to the gyrator that is 80° out of phase with its Q component has the phase relation continuously improved throughout the gyrator such that when the signals exit the gyrator quadrature phase of 90° tends to be established between the I and Q signals, such as in a polyphase circuit element. This present embodiment of the invention provides the additional benefit of being easily integrated onto a CMOS substrate since the gyrator eliminates the inductors that an LC filter would require. Filter timing and frequency generation utilize the methods previously described.

FIG. 53 is a block diagram of an exemplary CATV tuner that incorporates an embodiment of the present invention. The exemplary embodiments of the receiver are for terrestrial and cable television reception of signals from 50 to 860 MHz. Television signals in this exemplary band are frequency QAM or NTSC modulated signals. A receiver as described performs equally well in receiving digital or analog signals. However, it is to be understood that the receiver architecture disclosed will function equally well regardless of the frequencies used, the type of transmission, or the type of signal being transmitted. With regard to signal levels input to the receiver, the dynamic range of the devices used in the receiver may be adjusted accordingly. Thus, in a wide-band receiver distortion products are particularly problematic. The receiver disclosed in the exemplary embodiments of the present invention tends to advantageously reduces interference problems created by this type of distortion.

In the exemplary embodiments of the invention signals input to the receiver may range from +10 to +15 $dB_m$. Where, zero $dB_m$=10 log (1 mV/1 mV). It should be noted that in the case of a cable transmitting the RF signals, that an attenuation envelope impressed on the signals will have a downward or negative slope. This downward or negative slope is a result of a low pass filter characteristic of the coaxial cable. This effect may be compensated for by introducing a gain element in the signal chain that has positive slope, to compensate for the negative slope resulting from cable transmission.

In a wide band receiver designed to process signals received over multiple octaves of band width, this transmission characteristic can present a problem. For example, in the cable television band going from 50 to 860 MHz it is possible for distortion products created by the lower frequency signals in this band width to fall upon one of the higher tuned frequencies, for example 860 MHz. In a multi octave band-width receiver harmonic signals are problematic since they also fall within the receiver band-width, and cannot be low pass filtered out. If a channel at one of the higher frequencies is the desired signal that the receiver is tuned to, the low pass filter characteristic of the cable, or transmission medium, reduces the strength of this desired tuned signal relative to the lower frequency untuned signals. Because of the relatively greater strength of the lower frequency signal, the strength of the distortion products generated by them, are comparable in strength to the desired tuned signal. Thus, these distortion products can cause a great deal of interference with the desired received signal when one of their harmonics coincidentally occurs at the same frequency as the tuned signal.

The frequency plan of this tuner allows it to be implemented in a single CMOS integrated circuit 4822 and functions as previously described in FIG. 48. This exemplary single up-conversion dual down conversion CATV tuner utilizes two PLLs that run off of a common 10 MHz crystal oscillator 5302. From the 10 MHz crystal oscillator references the PLLs generate two local oscillator signals that are used to mix down a received radio frequency to an intermediate frequency. This integrated CATV tuner advantageously uses differential signals throughout its architecture to achieve superior noise rejection and reduced phase noise. The receiver of the present invention advantageously provides channel selectivity and image rejection on the chip to minimize the noise injected into the received signal path. The differential configuration also tends to suppress noise generated on the CMOS substrate as well as external noise that is radiated into the differential leads of the 10 MHz crystal that connect it to the substrate. In this embodiment, an external front end as previously described is supplied on a separate chip 5304 and an external filter 5306 is utilized.

Telephony Over Cable Embodiment

FIG. 54 is a block diagram of a low power embodiment of the receiver that has been configured to receive cable telephony signals. These services among other cable services offered make use of RF receivers. A cable telephone receiver converts an RF signals present on the cable to a baseband signal suitable for processing to an audio, or other type of signal routed to a telephone system and a subscriber via two way transmission. When such services are widely offered, and are packaged into a common device, per unit cost and power dissipation tend to become concerns. It is desirable to provide a low cost and power efficient receiver.

Receivers integrated onto a single chip that incorporates filters on the chip reduce cost. However, placing filters onto a an integrated circuit results in a high power consumption by the chip. On chip filters require tuning circuitry that tends to consume significant amounts of power. Removal of this circuitry allows reduction of power levels to below 2 Watts per receiver. Each time that a signal is routed off of an integrated circuit the chances of increasing system noise are increased due to the susceptibility of the external connections to the pick up of noise. Careful signal routing and the proper frequency planning of the present embodiment are calculated to reduce these undesired effects.

First, an input signal is passed through an RF front end chip 5304 as previously described. The first frequency up conversion to the first IF 5402 is performed on the integrated receiver chip. After passing a 50-860 MHz signal through a receiver front end 5304 that provides a differential output to the receiver chip 5404 the signal is down converted to 1,220 MHz 5402. The 1,270 to 2,080 MHz LO 5406 is generated on chip by a first PLL circuit, PLL1 5408. The 1220 MHz differential signal is passed through buffer amplifiers 5410 and is applied to an off chip differential signal filter 5412, with a center frequency at 1,220 MHz having a characteristic impedance of 200 Ohms. The differential signal tends to provide the necessary noise rejection when routing the signal off and subsequently back onto the chip. Next the signal is routed back on to the integrated circuit 5404 where it is again passed through a send buffer amplifier 5414.

The second frequency down conversion to the second IF 5416 is performed on the integrated receiver chip. An 1,176 MHz differential I and Q LO 5418 is generated on the integrated circuit by a second PLL, PLL2 5420 and polyphase 5422. The resulting second IF frequency 5616 is 44 MHz. The mixer used to generate the second IF is an I/Q type mixer 5424 that subsequently passes the signal through a polyphase circuit 5426. The second IF is then passed through a third buffer amplifier 5428. The signal is next routed off chip to a differential filter centered at 44 MHz 5430. After filtering the signal is returned to the integrated circuit where it undergoes amplification by a variable gain amplifier 5432.

The details of a low power receiver design are disclosed in more detail U.S. patent application Ser. No. 09/439,102, entitled "System and Method for Providing a Low Power Receiver Design," filed Nov. 12, 1999, now U.S. Pat. No. 6,377,315, the subject of which is incorporated in this application in its entirety by reference.

Electronic Circuits Incorporating Embodiments of the Receiver

FIG. 55 shows a set top box 5502 used in receiving cable television (CATV) signals. These boxes typically incorporate a receiver 5504 and a descrambling unit 5506 to allow the subscriber to receive premium programming. Additionally, on a pay for view basis subscribers can order programming through their set top boxes. This function additionally requires modulation circuitry and a radio frequency transmitter to transmit the signal over the CATV network 5508.

Set top boxes can, depending on the nature of the network, provide other services as well. These devices include, IP telephones, digital set-top cards that fit into PCs, modems that hook up to PCs, Internet TVs, and video conferencing systems.

The set-top box is the device that interfaces subscribers with the network and lets them execute the applications that reside on the network. Other devices in the home that may eventually connect with the network include IP telephones, digital set-top cards that fit into PCs, modems that hook up to PCs, Internet TVs, and video conferencing systems.

To satisfactorily provide digital services requiring high bandwidth, set top boxes must provide a easy to use interface between the user and CATV provider. Memory 5510 and graphics driven by a CPU 5512 tend to make the application as appealing as possible to a user when interfaced with a set top box 5514.

Also the set-top can receive data in Internet Protocol format and has an IP address assigned to it. Also, satisfactory methods of handling reverse path communications are required to provide interactive digital services. All of these services utilize an operating system resident in the set top box 5502 for providing a user interface and communicating with the head end 5514 where the services are provided.

To receive services, and transmit requests for service, bidirectionally across a CATV network the data signal must be modulated on a RF carrier signal. The set top box is a convenient place to modulate the carrier for transmission, or to convert the modulated carrier to a base band signal for use at the user's location.

This is accomplished with a radio frequency (RF) transmitter and receiver, commonly referred to in combination as a transceiver 5508. A bidirectional signal from a cable head end 5514 is transmitted over a cable network that comprises cable and wireless data transmission. At the subscriber's location a signal 3406 is received an input to the subscriber's set top box 5502. The signal 3406 is input to a set top box transceiver 5504. The set top box transceiver 5504 comprises one or more receiver and transmitter circuits. The receiver circuits utilized are constructed according to an embodiment of the invention. From the set top box transceiver, received data is passed to a decryption box 5506. If the television signal has been encrypted, this box performs a necessary descrambling operation on the signal. After being passed through the decryption box, the signal next is presented to a set top box decoder 3416 where the signal is demodulated into audio and video outputs 3414. The set top box incorporates a CPU 5512 with graphics capabilities and a memory 5510 to provide an interface and control the set top box through a data transfer structure 5514. An optional input output capability 5516 provided for a direct user interface with the set top box. To transmit instructions from the user to the head end, information is transmitted over data transfer structure 5514 into the transceiver module to the internal transmitter via the cable TV network to the head end.

FIG. 56 is an illustration of the integrated television receiver 5602. This television could be one that processes digital or analog broadcast signals 5604. An exemplary integrated switchless attenuator and low noise amplifier 3408 is the first stage in a receiver contained in a television set. The integrated switchless attenuator and low noise amplifier is used as a "front end" of the receiver to adjust the amplitude of the incoming signal. Incoming television signals whether received from a cable or antenna vary widely in strength, from received channel to channel. Differences in signal strength are due to losses in the transmission path, distance from the transmitter, or head end, obstructions in the signal path, among others.

The front end adjusts the received signal level to an optimum value. A signal that is too strong produces distortion in the subsequent circuitry by over driving it into a non linear operating region. A signal that is too week will be lost in the noise floor when subsequent high noise figure circuitry is used in an attempt to boost the signal strength. When used in conjunction with "automatic level control" (5604) circuitry the integrated switchless attenuator and low noise amplifier responds to a generated feed back signal input to its control voltage terminal to adjust the input signal level to provide optimum performance.

After passing through the front end 3408, the RF signals 5604 are input to tuner 5620. This tuner circuit is as described in the previous embodiments where a single channel is selected from a variety of channels presented in-the input signal 5604. An automatic fine tuning circuit ("AFT") 4622 is provided to adjust the level of the final IF signal 5624 being output to the television signal processing circuitry 5610. The signal processing circuitry splits the audio signal 5602 off of the final IF signal 5624 and outputs it to an audio output circuit such as an amplifier and then to a speaker 5618. The video signal split from IF signal 5624 is delivered via video signal 5606 to video processing circuitry 5612. Here the analog or digital video signal is processed for application as control signals to the circuitry 5614 that controls the generation of an image on a display device 5626. Such a receiver would typically be contained in a television set, a set top box, a VCR, a cable modem, or any kind of tuner arrangement.

FIG. 57 is a block diagram of a VCR that incorporates an integrated receiver embodiment 5702 in its circuitry. VCRs are manufactured with connections that allow reception and conversion of a television broadcast signal 5704 to a video signal 5706. The broadcast signals are demodulated 5708 in the VCR and recorded 5710 on a recording media such as a tape, or output as a video signal directly. VCRs are a commodity item. Cost pressures require economical high performance circuitry for these units to provide additional more features as the prices decline in the marketplace.

FIG. 58 shows a block diagram of a typical cable modem. A "Cable Modem" is a device that allows high speed data connection (such as to the Internet) via a cable TV (CATV) network 5812. A cable modem commonly has two connections, one to the cable TV wall outlet 5802 and the other to a computer 5804.

There are several methods for connecting cable modems to computers, Ethernet 10 BaseT is an example. The coax cable 5808 connects to the cable modem 5806, which in turn connects to an Ethernet card 5814 in a PC. The function of the cable modem is to connect broadband (i.e., the cable television network) to Ethernet. Once the Ethernet card has been installed, the TCP/IP software is typically used to manage the connection.

On-line access through cable modems allows PC users to download information at a speeds approximately 1,000 times faster than with telephone modems. Cable modem speeds range from 500 Kbps to 10 Mbps. Typically, a cable modem sends and receives data in two slightly different, or asynchronous fashions.

Data transmitted downstream, to the user, is digital data modulated onto a typical 6 MHz channel on a television carrier, between 42 MHz and 750 MHz. Two possible modulation techniques are QPSK (allowing data transmission of up to 10 Mbps) and QAM64 (allowing data transmission of up to 36 Mbps). The data signal can be placed in a 6 MHz channel adjacent to an existing TV signals without disturbing the cable television video signals.

The upstream channel to the ISP provider is transmitted at a rate between 5 and 40 MHz. This transmission path tends to inject more noise than the downstream path. Due to this problem, QPSK or a similar modulation scheme in the upstream direction is desirable due to noise immunity above that available in other modulation schemes. However, QPSK is "slower" than QAM.

Cable modems can be configured to incorporate many desirable features in addition to high speed. Cable modems can be configured to include, but are not limited to, a modem, a tuner 5816, an encryption/decryption device, a bridge, a router, a NIC card, SNMP agent, and an Ethernet hub.

To transmit and receive the data onto the cable television channel it must be modulated and demodulated respectively. This is accomplished with a radio frequency (RF) transmitter and receiver, commonly referred to in combination as a transceiver 5818. The receiver's front end 5820 is advantageously provided as previously described.

The invention claimed is:

1. An integrated receiver comprising:
   a substrate providing a physical medium upon which a receiver circuit is disposed;
   a mixer having its circuit elements disposed upon the substrate for converting a received signal to a first IF;
   a first filter bank having its circuit elements disposed upon the substrate for removing an image distortion from the first IF and removing unwanted channels; and
   an I/Q mixer disposed upon the substrate for converting the first IF to a second IF and rejecting a first IF image distortion.

2. The integrated receiver of claim 1, further comprising:
   a second filter bank having its circuit elements disposed upon the substrate for removing an image distortion and unwanted channels from the second IF; whereby frequency conversion, channel selectivity and all image rejection are performed on an integrated circuit.

3. The integrated receiver of claim 1, wherein the mixer, the first filter, and the I/Q mixer are configured for differential signal processing.

4. The integrated receiver of claim 1, further comprising:
   a first LO generator disposed on the integrated receiver substrate, configured to provide a first local oscillator signal to the mixer; and
   a second LO generator disposed on the integrated receiver substrate, configured to provide a second local oscillator signal.

5. The integrated receiver of claim 4, wherein the first LO generator comprises a wide band phase lock loop (PLL) coupled to a reference signal generator.

6. The integrated receiver of claim 4, wherein the second LO generator comprises:
   a reference signal generator;
   a narrow band PLL coupled to the reference signal generator; and
   a poly phase circuit coupled to the narrow band PLL producing image and quadrature second LO signals from the narrow band PLL signal.

7. The integrated receive of claim 1, wherein the filter bank comprises:
   a multi-track spiral inductor; and
   a compensation circuit that compensates for variations in the multi-track spiral inductor Q over temperature.

8. The integrated receiver of claim 7, wherein the compensation circuit includes:
   a first field effect transistor in series with the multi-track spiral inductor;
   a dummy multi-track spiral inductor; and
   a second field effect transistor in series with the dummy multi-track spiral inductor acting as a control element to maintain a constant voltage across the dummy multi-track spiral inductor, the gate of the second field effect transistor coupled to the gate of the first field effect transistor.

9. The integrated circuit of claim 8, wherein the dummy multi-track spiral inductor has a temperature characteristic that tracks that of the multi-track spiral inductor.

10. The integrated receiver of claim 7, wherein the multi-track spiral inductor includes a series resistance that varies proportionally with temperature, wherein said compensation circuit includes:
    an amplifier having a positive input terminal, a negative input terminal, and an output terminal;
    first and second variable resistors each having a first terminal, a second terminal, and a control terminal, wherein the respective control terminals are coupled to the output terminal of the amplifier;
    a resistor coupled in series between the negative input terminal of the amplifier and the first terminal of the second variable resistor; and
    a dummy filter element coupled in series between the positive input terminal of the amplifier and the second terminal of the second variable resistor.

11. A method for processing a RF signal having a plurality of channels, comprising:
    (1) mixing the RF signal with a first differential local oscillator signal to produce a first differential IF signal;
    (2) filtering the first differential IF signal using a differential filter having a passband that is higher in frequency than the RF signal to produce a second differential IF signal;
    (3) adjusting the first local oscillator signal so that a selected channel in the plurality of channels is shifted into a passband of the differential filter;
    (4) generating a second differential local oscillator signal having I and Q components; and
    (5) mixing the second differential IF signal with a second differential local oscillator signal to produce a second differential IF signal,
    wherein steps (1)-(5) are performed on a common substrate.

12. The method of claim 11, wherein the plurality of channels are television channels.

13. The method of claim 11, further comprising the step of:
    (6) filtering the second differential IF signal on the common substrate to remove at least one unwanted channel from the second differential IF signal.

14. The method of claim 11, further comprising the step of:
    (6) performing automatic gain control on the second IF signal on the common substrate.

15. The method of claim 14, wherein step (6) includes the step of removing at least one unwanted image from the second differential IF signal.

16. The method of claim 11, wherein the differential filter includes a multi-track spiral inductor, the method further comprising the step of:
    compensating for variations in the multi-track spiral inductor Q over temperature.

* * * * *

UNITED STATES PATENT AND TRADEMARK OFFICE
CERTIFICATE OF CORRECTION

PATENT NO. : 7,423,699 B2  Page 1 of 1
APPLICATION NO. : 11/393899
DATED : September 9, 2008
INVENTOR(S) : Vorenkamp et al.

It is certified that error appears in the above-identified patent and that said Letters Patent is hereby corrected as shown below:

On Title Page
Item (56), References Cited, Other Publications section, please add: --Thomas, V. et al., "A One-Chip 2GHz Single Superhet Receiver for 2Mb/s FSK Radio Communication," IEEE International Solid-State Circuits Conference, IEEE, pp. 42-43 (1994).--

Signed and Sealed this

Sixth Day of January, 2009

JON W. DUDAS
*Director of the United States Patent and Trademark Office*

UNITED STATES PATENT AND TRADEMARK OFFICE
CERTIFICATE OF CORRECTION

PATENT NO.       : 7,423,699 B2                                   Page 1 of 1
APPLICATION NO.  : 11/393899
DATED            : September 9, 2008
INVENTOR(S)      : Vorenkamp et al.

It is certified that error appears in the above-identified patent and that said Letters Patent is hereby corrected as shown below:

Title Page
Item (56), References Cited, Other Publications section, please add: --Thomas, V. et al., "A One-Chip 2GHz Single Superhet Receiver for 2Mb/s FSK Radio Communication," IEEE International Solid-State Circuits Conference, IEEE, pp. 42-43 (1994).--

Signed and Sealed this

Twentieth Day of January, 2009

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,423,699 B2 |
| APPLICATION NO. | : 11/393899 |
| DATED | : September 9, 2008 |
| INVENTOR(S) | : Pieter Vorenkamp et al. |

It is certified that error appears in the above-identified patent and that said Letters Patent is hereby corrected as shown below:

This certificate vacates the Certificate of Correction issued January 20, 2009. The certificate is a duplicate of the Certificate of Correction issued January 6, 2009. All requested changes were included in the Certificate of Correction issued January 6, 2009.

Signed and Sealed this

Seventeenth Day of February, 2009

JOHN DOLL
*Acting Director of the United States Patent and Trademark Office*